(12) United States Patent
Rawlins et al.

(10) Patent No.: US 7,653,158 B2
(45) Date of Patent: Jan. 26, 2010

(54) GAIN CONTROL IN A COMMUNICATION CHANNEL

(75) Inventors: Gregory S. Rawlins, Heathrow, FL (US); Kevin Brown, Clermont, FL (US); Michael W. Rawlins, Lake Mary, FL (US); David F. Sorrells, Middleburg, FL (US)

(73) Assignee: ParkerVision, Inc., Jacksonville, FL (US)

( * ) Notice: Subject to any disclaimer, the term of this patent is extended or adjusted under 35 U.S.C. 154(b) by 34 days.

(21) Appl. No.: 11/356,419

(22) Filed: Feb. 17, 2006

(65) Prior Publication Data

US 2007/0086548 A1 Apr. 19, 2007

Related U.S. Application Data

(60) Division of application No. 09/986,764, filed on Nov. 9, 2001, now Pat. No. 7,085,335, and a continuation of application No. 10/289,377, filed on Nov. 7, 2002, now Pat. No. 7,072,427, which is a continuation-in-part of application No. 09/986,764.

(60) Provisional application No. 60/384,840, filed on Jun. 4, 2002.

(51) Int. Cl.
*H04L 27/08* (2006.01)
(52) U.S. Cl. ...................................... 375/345
(58) Field of Classification Search ................. 375/316, 375/345; 455/234.1
See application file for complete search history.

(56) References Cited

U.S. PATENT DOCUMENTS 2,057,613 A 10/1936 Gardner (Continued)

FOREIGN PATENT DOCUMENTS

DE 1936252 1/1971

(Continued)

OTHER PUBLICATIONS

English-language Computer Translation of Japanese Patent Publication No. JP 10-173563, provided by the JPO, 10 pages (Jun. 26, 1998—Date of publication of application) and cited in U.S. Appl. No. 10/305,299, directed to related subject matter.

(Continued)

*Primary Examiner*—Don N Vo
(74) *Attorney, Agent, or Firm*—Sterne, Kessler, Goldstein & Fox PLLC

(57) ABSTRACT

Methods and apparatuses for reducing DC offsets in a communication system are described. In a first aspect, a feedback loop circuit reduces DC offset in a wireless local area network (WLAN) receiver channel. The frequency response of the feedback loop circuit can be variable. In a second aspect, a circuit provides gain control in a WLAN receiver channel. The stored DC offset is subtracted from the receiver channel. First and second automatic gain control (AGC) amplifiers are coupled in respective portions of the receiver channel. In a third aspect, a feedback loop circuit reduces DC offset in a WLAN receiver channel. The feedback loop circuit includes a storage element that samples and stores receiver channel DC offset. The loop is opened, and the DC offset stored in the storage element is subtracted from the receiver channel. Circuits for monitoring DC offset, and for providing control signals for controlling the frequency response of the DC offset reducing circuits are also provided.

15 Claims, 81 Drawing Sheets

U.S. PATENT DOCUMENTS

| | | |
|---|---|---|
| 2,241,078 A | 5/1941 | Vreeland |
| 2,270,385 A | 1/1942 | Skillman |
| 2,283,575 A | 5/1942 | Roberts |
| 2,358,152 A | 9/1944 | Earp |
| 2,410,350 A | 10/1946 | Labin et al. |
| 2,451,430 A | 10/1948 | Barone |
| 2,462,069 A | 2/1949 | Chatterjea et al. |
| 2,462,181 A | 2/1949 | Grosselfinger |
| 2,472,798 A | 6/1949 | Fredendall |
| 2,497,859 A | 2/1950 | Boughtwood et al. |
| 2,499,279 A | 2/1950 | Peterson |
| 2,530,824 A | 11/1950 | King |
| 2,802,208 A | 8/1957 | Hobbs |
| 2,985,875 A | 5/1961 | Grisdale et al. |
| 3,023,309 A | 2/1962 | Foulkes |
| 3,069,679 A | 12/1962 | Sweeney et al. |
| 3,104,393 A | 9/1963 | Vogelman |
| 3,114,106 A | 12/1963 | McManus |
| 3,118,117 A | 1/1964 | King et al. |
| 3,226,643 A | 12/1965 | McNair |
| 3,246,084 A | 4/1966 | Kryter |
| 3,258,694 A | 6/1966 | Shepherd |
| 3,383,598 A | 5/1968 | Sanders |
| 3,384,822 A | 5/1968 | Miyagi |
| 3,454,718 A | 7/1969 | Perreault |
| 3,523,291 A | 8/1970 | Pierret |
| 3,548,342 A | 12/1970 | Maxey |
| 3,555,428 A | 1/1971 | Perreault |
| 3,614,627 A | 10/1971 | Runyan et al. |
| 3,614,630 A | 10/1971 | Rorden |
| 3,617,892 A | 11/1971 | Hawley et al. |
| 3,617,898 A | 11/1971 | Janning, Jr. |
| 3,621,402 A | 11/1971 | Gardner |
| 3,622,885 A | 11/1971 | Oberdorf et al. |
| 3,623,160 A | 11/1971 | Giles et al. |
| 3,626,417 A | 12/1971 | Gilbert |
| 3,629,696 A | 12/1971 | Bartelink |
| 3,641,442 A | 2/1972 | Boucher |
| 3,643,168 A | 2/1972 | Manicki |
| 3,662,268 A | 5/1972 | Gans et al. |
| 3,689,841 A | 9/1972 | Bello et al. |
| 3,694,754 A | 9/1972 | Baltzer |
| 3,702,440 A | 11/1972 | Moore |
| 3,714,577 A | 1/1973 | Hayes |
| 3,716,730 A | 2/1973 | Cerny, Jr. |
| 3,717,844 A | 2/1973 | Barret et al. |
| 3,719,903 A | 3/1973 | Goodson |
| 3,735,048 A | 5/1973 | Tomsa et al. |
| 3,736,513 A | 5/1973 | Wilson |
| 3,737,778 A | 6/1973 | Van Gerwen et al. |
| 3,739,282 A | 6/1973 | Bruch et al. |
| 3,764,921 A | 10/1973 | Huard |
| 3,767,984 A | 10/1973 | Shinoda et al. |
| 3,806,811 A | 4/1974 | Thompson |
| 3,809,821 A | 5/1974 | Melvin |
| 3,852,530 A | 12/1974 | Shen |
| 3,868,601 A | 2/1975 | MacAfee |
| 3,940,697 A | 2/1976 | Morgan |
| 3,949,300 A | 4/1976 | Sadler |
| 3,967,202 A | 6/1976 | Batz |
| 3,980,945 A | 9/1976 | Bickford |
| 3,987,280 A | 10/1976 | Bauer |
| 3,991,277 A | 11/1976 | Hirata |
| 4,003,002 A | 1/1977 | Snijders et al. |
| 4,004,237 A | 1/1977 | Kratzer |
| 4,013,966 A | 3/1977 | Campbell |
| 4,016,366 A | 4/1977 | Kurata |
| 4,017,798 A | 4/1977 | Gordy et al. |
| 4,019,140 A | 4/1977 | Swerdlow |
| 4,032,847 A | 6/1977 | Unkauf |
| 4,035,732 A | 7/1977 | Lohrmann |
| 4,045,740 A | 8/1977 | Baker |
| 4,047,121 A | 9/1977 | Campbell |
| 4,048,598 A | 9/1977 | Knight |
| 4,051,475 A | 9/1977 | Campbell |
| 4,066,841 A | 1/1978 | Young |
| 4,066,919 A | 1/1978 | Huntington |
| 4,080,573 A | 3/1978 | Howell |
| 4,081,748 A | 3/1978 | Batz |
| 4,115,737 A | 9/1978 | Hongu et al. |
| 4,130,765 A | 12/1978 | Arakelian et al. |
| 4,130,806 A | 12/1978 | Van Gerwen et al. |
| 4,132,952 A | 1/1979 | Hongu et al. |
| 4,142,155 A | 2/1979 | Adachi |
| 4,143,322 A | 3/1979 | Shimamura |
| 4,145,659 A | 3/1979 | Wolfram |
| 4,158,149 A | 6/1979 | Otofuji |
| 4,170,764 A | 10/1979 | Salz et al. |
| 4,173,164 A | 11/1979 | Adachi et al. |
| 4,204,171 A | 5/1980 | Sutphin, Jr. |
| 4,210,872 A | 7/1980 | Gregorian |
| 4,220,977 A | 9/1980 | Yamanaka |
| 4,241,451 A | 12/1980 | Maixner et al. |
| 4,245,355 A | 1/1981 | Pascoe et al. |
| 4,250,458 A | 2/1981 | Richmond et al. |
| 4,253,066 A | 2/1981 | Fisher et al. |
| 4,253,067 A | 2/1981 | Caples et al. |
| 4,253,069 A | 2/1981 | Nossek |
| 4,286,283 A | 8/1981 | Clemens |
| 4,308,614 A | 12/1981 | Fisher et al. |
| 4,313,222 A | 1/1982 | Katthan |
| 4,320,361 A | 3/1982 | Kikkert |
| 4,320,536 A | 3/1982 | Dietrich |
| 4,334,324 A | 6/1982 | Hoover |
| 4,346,477 A | 8/1982 | Gordy |
| 4,355,401 A | 10/1982 | Ikoma et al. |
| 4,356,558 A | 10/1982 | Owen et al. |
| 4,360,867 A | 11/1982 | Gonda |
| 4,363,132 A | 12/1982 | Collin |
| 4,363,976 A | 12/1982 | Minor |
| 4,365,217 A | 12/1982 | Berger et al. |
| 4,369,522 A | 1/1983 | Cerny, Jr. et al. |
| 4,370,572 A | 1/1983 | Cosand et al. |
| 4,380,828 A | 4/1983 | Moon |
| 4,384,357 A | 5/1983 | deBuda et al. |
| 4,389,579 A | 6/1983 | Stein |
| 4,392,255 A | 7/1983 | Del Giudice |
| 4,393,352 A | 7/1983 | Volpe et al. |
| 4,393,395 A | 7/1983 | Hacke et al. |
| 4,405,835 A | 9/1983 | Jansen et al. |
| 4,409,877 A | 10/1983 | Budelman |
| 4,430,629 A | 2/1984 | Betzl et al. |
| 4,439,787 A | 3/1984 | Mogi et al. |
| 4,441,080 A | 4/1984 | Saari |
| 4,446,438 A | 5/1984 | Chang et al. |
| 4,456,990 A | 6/1984 | Fisher et al. |
| 4,463,320 A | 7/1984 | Dawson |
| 4,470,145 A | 9/1984 | Williams |
| 4,472,785 A | 9/1984 | Kasuga |
| 4,479,226 A | 10/1984 | Prabhu et al. |
| 4,481,490 A | 11/1984 | Huntley |
| 4,481,642 A | 11/1984 | Hanson |
| 4,483,017 A | 11/1984 | Hampel et al. |
| 4,484,143 A | 11/1984 | French et al. |
| 4,485,347 A | 11/1984 | Hirasawa et al. |
| 4,485,488 A | 11/1984 | Houdart |
| 4,488,119 A | 12/1984 | Marshall |
| 4,504,803 A | 3/1985 | Lee et al. |
| 4,510,467 A | 4/1985 | Chang et al. |
| 4,517,519 A | 5/1985 | Mukaiyama |
| 4,517,520 A | 5/1985 | Ogawa |
| 4,518,935 A | 5/1985 | van Roermund |
| 4,521,892 A | 6/1985 | Vance et al. |
| 4,562,414 A | 12/1985 | Linder et al. |

| | | | | | |
|---|---|---|---|---|---|
| 4,563,773 A | 1/1986 | Dixon, Jr. et al. | 4,894,766 A | 1/1990 | De Agro |
| 4,571,738 A | 2/1986 | Vance | 4,896,152 A | 1/1990 | Tiemann |
| 4,577,157 A | 3/1986 | Reed | 4,902,979 A | 2/1990 | Puckette, IV |
| 4,583,239 A | 4/1986 | Vance | 4,908,579 A | 3/1990 | Tawfik et al. |
| 4,591,736 A | 5/1986 | Hirao et al. | 4,910,752 A | 3/1990 | Yester, Jr. et al. |
| 4,591,930 A | 5/1986 | Baumeister | 4,914,405 A | 4/1990 | Wells |
| 4,596,046 A | 6/1986 | Richardson et al. | 4,920,510 A | 4/1990 | Senderowicz et al. |
| 4,602,220 A | 7/1986 | Kurihara | 4,922,452 A | 5/1990 | Larsen et al. |
| 4,603,300 A | 7/1986 | Welles, II et al. | 4,931,716 A | 6/1990 | Jovanovic et al. |
| 4,612,464 A | 9/1986 | Ishikawa et al. | 4,931,921 A | 6/1990 | Anderson |
| 4,612,518 A | 9/1986 | Gans et al. | 4,943,974 A | 7/1990 | Motamedi |
| 4,616,191 A | 10/1986 | Galani et al. | 4,944,025 A | 7/1990 | Gehring et al. |
| 4,621,217 A | 11/1986 | Saxe et al. | 4,955,079 A | 9/1990 | Connerney et al. |
| 4,628,517 A | 12/1986 | Schwarz et al. | 4,965,467 A | 10/1990 | Bilterijst |
| 4,633,510 A | 12/1986 | Suzuki et al. | 4,967,160 A | 10/1990 | Quievy et al. |
| 4,634,998 A | 1/1987 | Crawford | 4,968,958 A | 11/1990 | Hoare |
| 4,648,021 A | 3/1987 | Alberkrack | 4,970,703 A | 11/1990 | Hariharan et al. |
| 4,651,034 A | 3/1987 | Sato | 4,972,436 A | 11/1990 | Halim et al. |
| 4,651,210 A * | 3/1987 | Olson .................... 348/677 | 4,982,353 A | 1/1991 | Jacob et al. |
| 4,653,117 A | 3/1987 | Heck | 4,984,077 A | 1/1991 | Uchida |
| 4,660,164 A | 4/1987 | Leibowitz | 4,995,055 A | 2/1991 | Weinberger et al. |
| 4,663,744 A | 5/1987 | Russell et al. | 5,003,621 A | 3/1991 | Gailus |
| 4,675,882 A | 6/1987 | Lillie et al. | 5,005,169 A | 4/1991 | Bronder et al. |
| 4,688,237 A | 8/1987 | Brault | 5,006,810 A | 4/1991 | Popescu |
| 4,688,253 A | 8/1987 | Gumm | 5,006,854 A | 4/1991 | White et al. |
| 4,716,376 A | 12/1987 | Daudelin | 5,010,585 A | 4/1991 | Garcia |
| 4,716,388 A | 12/1987 | Jacobs | 5,012,245 A | 4/1991 | Scott et al. |
| 4,718,113 A | 1/1988 | Rother et al. | 5,014,130 A | 5/1991 | Heister et al. |
| 4,726,041 A | 2/1988 | Prohaska et al. | 5,014,304 A | 5/1991 | Nicollini et al. |
| 4,733,403 A | 3/1988 | Simone | 5,015,963 A | 5/1991 | Sutton |
| 4,734,591 A | 3/1988 | Ichitsubo | 5,016,242 A | 5/1991 | Tang |
| 4,737,969 A | 4/1988 | Steel et al. | 5,017,924 A | 5/1991 | Guiberteau et al. |
| 4,740,675 A | 4/1988 | Brosnan et al. | 5,020,149 A | 5/1991 | Hemmie |
| 4,740,792 A | 4/1988 | Sagey et al. | 5,020,154 A | 5/1991 | Zierhut |
| 4,743,858 A | 5/1988 | Everard | 5,052,050 A | 9/1991 | Collier et al. |
| 4,745,463 A | 5/1988 | Lu | 5,058,107 A | 10/1991 | Stone et al. |
| 4,751,468 A | 6/1988 | Agoston | 5,062,122 A | 10/1991 | Pham et al. |
| 4,757,538 A | 7/1988 | Zink | 5,063,387 A | 11/1991 | Mower |
| 4,761,798 A | 8/1988 | Griswold, Jr. et al. | 5,065,409 A | 11/1991 | Hughes et al. |
| 4,768,187 A | 8/1988 | Marshall | 5,083,050 A | 1/1992 | Vasile |
| 4,769,612 A | 9/1988 | Tamakoshi et al. | 5,091,921 A | 2/1992 | Minami |
| 4,771,265 A | 9/1988 | Okui et al. | 5,095,533 A | 3/1992 | Loper et al. |
| 4,772,853 A | 9/1988 | Hart | 5,095,536 A | 3/1992 | Loper |
| 4,785,463 A | 11/1988 | Janc et al. | 5,111,152 A | 5/1992 | Makino |
| 4,789,837 A | 12/1988 | Ridgers | 5,113,094 A | 5/1992 | Grace et al. |
| 4,791,584 A | 12/1988 | Greivenkamp, Jr. | 5,113,129 A | 5/1992 | Hughes |
| 4,801,823 A | 1/1989 | Yokoyama | 5,115,409 A | 5/1992 | Stepp |
| 4,806,790 A | 2/1989 | Sone | 5,122,765 A | 6/1992 | Pataut |
| 4,810,904 A | 3/1989 | Crawford | 5,124,592 A | 6/1992 | Hagino |
| 4,810,976 A | 3/1989 | Cowley et al. | 5,126,682 A | 6/1992 | Weinberg et al. |
| 4,811,362 A | 3/1989 | Yester, Jr. et al. | 5,131,014 A | 7/1992 | White |
| 4,811,422 A | 3/1989 | Kahn | 5,136,267 A | 8/1992 | Cabot |
| 4,814,649 A | 3/1989 | Young | 5,140,699 A | 8/1992 | Kozak |
| 4,816,704 A | 3/1989 | Fiori, Jr. | 5,140,705 A | 8/1992 | Kosuga |
| 4,819,252 A | 4/1989 | Christopher | 5,150,124 A | 9/1992 | Moore et al. |
| 4,833,445 A | 5/1989 | Buchele | 5,151,661 A | 9/1992 | Caldwell et al. |
| 4,841,265 A | 6/1989 | Watanabe et al. | 5,157,687 A | 10/1992 | Tymes |
| 4,845,389 A | 7/1989 | Pyndiah et al. | 5,159,710 A | 10/1992 | Cusdin |
| 4,855,894 A | 8/1989 | Asahi et al. | 5,164,985 A | 11/1992 | Nysen et al. |
| 4,857,928 A | 8/1989 | Gailus et al. | 5,170,414 A | 12/1992 | Silvian |
| 4,862,121 A | 8/1989 | Hochschild et al. | 5,172,019 A | 12/1992 | Naylor et al. |
| 4,866,441 A | 9/1989 | Conway et al. | 5,172,070 A | 12/1992 | Hiraiwa et al. |
| 4,868,654 A | 9/1989 | Juri et al. | 5,179,731 A | 1/1993 | Trankle et al. |
| 4,870,659 A | 9/1989 | Oishi et al. | 5,191,459 A | 3/1993 | Thompson et al. |
| 4,871,987 A | 10/1989 | Kawase | 5,196,806 A | 3/1993 | Ichihara |
| 4,873,492 A | 10/1989 | Myer | 5,204,642 A | 4/1993 | Asghar et al. |
| 4,885,587 A | 12/1989 | Wiegand et al. | 5,212,827 A | 5/1993 | Meszko et al. |
| 4,885,671 A | 12/1989 | Peil | 5,214,787 A | 5/1993 | Karkota, Jr. |
| 4,885,756 A | 12/1989 | Fontanes et al. | 5,218,562 A | 6/1993 | Basehore et al. |
| 4,888,557 A | 12/1989 | Puckette, IV et al. | 5,220,583 A | 6/1993 | Solomon |
| 4,890,302 A | 12/1989 | Muilwijk | 5,220,680 A | 6/1993 | Lee |
| 4,893,316 A | 1/1990 | Janc et al. | 5,222,144 A | 6/1993 | Whikehart |
| 4,893,341 A | 1/1990 | Gehring | 5,230,097 A | 7/1993 | Currie et al. |

| | | | | | | |
|---|---|---|---|---|---|---|
| 5,239,496 A | 8/1993 | Vancraeynest | | 5,465,410 A | 11/1995 | Hiben et al. |
| 5,239,686 A | 8/1993 | Downey | | 5,465,415 A | 11/1995 | Bien |
| 5,239,687 A | 8/1993 | Chen | | 5,465,418 A | 11/1995 | Zhou et al. |
| 5,241,561 A | 8/1993 | Barnard | | 5,471,162 A | 11/1995 | McEwan |
| 5,249,203 A | 9/1993 | Loper | | 5,471,665 A | 11/1995 | Pace et al. |
| 5,251,218 A | 10/1993 | Stone et al. | | 5,479,120 A | 12/1995 | McEwan |
| 5,251,232 A | 10/1993 | Nonami | | 5,479,447 A | 12/1995 | Chow et al. |
| 5,260,970 A | 11/1993 | Henry et al. | | 5,481,570 A | 1/1996 | Winters |
| 5,260,973 A | 11/1993 | Watanabe | | 5,483,193 A | 1/1996 | Kennedy et al. |
| 5,263,194 A | 11/1993 | Ragan | | 5,483,245 A | 1/1996 | Ruinet |
| 5,263,196 A | 11/1993 | Jasper | | 5,483,549 A | 1/1996 | Weinberg et al. |
| 5,263,198 A | 11/1993 | Geddes et al. | | 5,483,600 A | 1/1996 | Werrbach |
| 5,267,023 A | 11/1993 | Kawasaki | | 5,483,691 A * | 1/1996 | Heck et al. ............... 455/234.2 |
| 5,278,826 A | 1/1994 | Murphy et al. | | 5,483,695 A | 1/1996 | Pardoen |
| 5,282,023 A | 1/1994 | Scarpa | | 5,490,173 A | 2/1996 | Whikehart et al. |
| 5,282,222 A | 1/1994 | Fattouche et al. | | 5,490,176 A | 2/1996 | Peltier |
| 5,287,516 A | 2/1994 | Schaub | | 5,493,581 A | 2/1996 | Young et al. |
| 5,293,398 A | 3/1994 | Hamao et al. | | 5,493,721 A | 2/1996 | Reis |
| 5,303,417 A | 4/1994 | Laws | | 5,495,200 A | 2/1996 | Kwan et al. |
| 5,307,517 A | 4/1994 | Rich | | 5,495,202 A | 2/1996 | Hsu |
| 5,315,583 A | 5/1994 | Murphy et al. | | 5,495,500 A | 2/1996 | Jovanovich et al. |
| 5,319,799 A | 6/1994 | Morita | | 5,499,267 A | 3/1996 | Ohe et al. |
| 5,321,852 A | 6/1994 | Seong | | 5,500,758 A | 3/1996 | Thompson et al. |
| 5,325,204 A | 6/1994 | Scarpa | | 5,512,946 A | 4/1996 | Murata et al. |
| 5,337,014 A | 8/1994 | Najle et al. | | 5,513,389 A | 4/1996 | Reeser et al. |
| 5,339,054 A | 8/1994 | Taguchi | | 5,515,014 A | 5/1996 | Troutman |
| 5,339,395 A | 8/1994 | Pickett et al. | | 5,517,688 A | 5/1996 | Fajen et al. |
| 5,339,459 A | 8/1994 | Schiltz et al. | | 5,519,890 A | 5/1996 | Pinckley |
| 5,345,239 A | 9/1994 | Madni et al. | | 5,523,719 A | 6/1996 | Longo et al. |
| 5,353,306 A | 10/1994 | Yamamoto | | 5,523,726 A | 6/1996 | Kroeger et al. |
| 5,355,114 A | 10/1994 | Sutterlin et al. | | 5,523,760 A | 6/1996 | McEwan |
| 5,361,408 A | 11/1994 | Watanabe et al. | | 5,535,402 A | 7/1996 | Leibowitz et al. |
| 5,369,404 A | 11/1994 | Galton | | 5,539,770 A | 7/1996 | Ishigaki |
| 5,369,789 A | 11/1994 | Kosugi et al. | | 5,551,076 A | 8/1996 | Bonn |
| 5,369,800 A | 11/1994 | Takagi et al. | | 5,552,789 A | 9/1996 | Schuermann |
| 5,375,146 A | 12/1994 | Chalmers | | 5,555,453 A | 9/1996 | Kajimoto et al. |
| 5,379,040 A | 1/1995 | Mizomoto et al. | | 5,557,641 A | 9/1996 | Weinberg |
| 5,379,141 A | 1/1995 | Thompson et al. | | 5,557,642 A | 9/1996 | Williams |
| 5,388,063 A | 2/1995 | Takatori et al. | | 5,559,809 A | 9/1996 | Jeon et al. |
| 5,389,839 A | 2/1995 | Heck | | 5,563,550 A | 10/1996 | Toth |
| 5,390,215 A | 2/1995 | Antia et al. | | 5,564,097 A | 10/1996 | Swanke |
| 5,390,364 A | 2/1995 | Webster et al. | | 5,574,755 A | 11/1996 | Persico |
| 5,400,084 A | 3/1995 | Scarpa | | 5,579,341 A | 11/1996 | Smith et al. |
| 5,404,127 A | 4/1995 | Lee et al. | | 5,579,347 A | 11/1996 | Lindquist et al. |
| 5,410,195 A | 4/1995 | Ichihara | | 5,584,068 A | 12/1996 | Mohindra |
| 5,410,270 A | 4/1995 | Rybicki et al. | | 5,589,793 A | 12/1996 | Kassapian |
| 5,410,541 A | 4/1995 | Hotto | | 5,592,131 A | 1/1997 | Labreche et al. |
| 5,410,743 A | 4/1995 | Seely et al. | | 5,600,680 A | 2/1997 | Mishima et al. |
| 5,412,352 A | 5/1995 | Graham | | 5,602,847 A | 2/1997 | Pagano et al. |
| 5,416,449 A | 5/1995 | Joshi | | 5,602,868 A | 2/1997 | Wilson |
| 5,416,803 A | 5/1995 | Janer | | 5,604,592 A | 2/1997 | Kotidis et al. |
| 5,422,909 A | 6/1995 | Love et al. | | 5,604,732 A | 2/1997 | Kim et al. |
| 5,422,913 A | 6/1995 | Wilkinson | | 5,606,731 A | 2/1997 | Pace et al. |
| 5,423,082 A | 6/1995 | Cygan et al. | | 5,608,531 A | 3/1997 | Honda et al. |
| 5,428,638 A | 6/1995 | Cioffi et al. | | 5,610,946 A | 3/1997 | Tanaka et al. |
| 5,428,640 A | 6/1995 | Townley | | RE35,494 E | 4/1997 | Nicollini |
| 5,434,546 A | 7/1995 | Palmer | | 5,617,451 A | 4/1997 | Mimura et al. |
| 5,438,329 A | 8/1995 | Gastouniotis et al. | | 5,619,538 A | 4/1997 | Sempel et al. |
| 5,438,692 A | 8/1995 | Mohindra | | 5,621,455 A | 4/1997 | Rogers et al. |
| 5,440,311 A | 8/1995 | Gallagher et al. | | 5,628,055 A | 5/1997 | Stein |
| 5,444,415 A | 8/1995 | Dent et al. | | 5,630,227 A | 5/1997 | Bella et al. |
| 5,444,416 A | 8/1995 | Ishikawa et al. | | 5,633,610 A | 5/1997 | Maekawa et al. |
| 5,444,865 A | 8/1995 | Heck et al. | | 5,633,815 A | 5/1997 | Young |
| 5,446,421 A | 8/1995 | Kechkaylo | | 5,634,207 A | 5/1997 | Yamaji et al. |
| 5,446,422 A | 8/1995 | Mattila et al. | | 5,636,140 A | 6/1997 | Lee et al. |
| 5,448,602 A | 9/1995 | Ohmori et al. | | 5,638,396 A | 6/1997 | Klimek |
| 5,451,899 A | 9/1995 | Lawton | | 5,640,415 A | 6/1997 | Pandula |
| 5,454,007 A | 9/1995 | Dutta | | 5,640,424 A | 6/1997 | Banavong et al. |
| 5,454,009 A | 9/1995 | Fruit et al. | | 5,640,428 A | 6/1997 | Abe et al. |
| 5,461,646 A | 10/1995 | Anvari | | 5,640,698 A | 6/1997 | Shen et al. |
| 5,463,356 A | 10/1995 | Palmer | | 5,642,071 A | 6/1997 | Sevenhans et al. |
| 5,463,357 A | 10/1995 | Hobden | | 5,648,985 A | 7/1997 | Bjerede et al. |
| 5,465,071 A | 11/1995 | Kobayashi et al. | | 5,650,785 A | 7/1997 | Rodal |

| | | | | | |
|---|---|---|---|---|---|
| 5,659,372 A * | 8/1997 | Patel et al. .......... 348/731 | 5,844,449 A | 12/1998 | Abeno et al. |
| 5,661,424 A | 8/1997 | Tang | 5,844,868 A | 12/1998 | Takahashi et al. |
| 5,663,878 A | 9/1997 | Walker | 5,847,594 A | 12/1998 | Mizuno |
| 5,663,986 A | 9/1997 | Striffler | 5,859,878 A | 1/1999 | Phillips et al. |
| 5,668,836 A | 9/1997 | Smith et al. | 5,864,754 A | 1/1999 | Hotto |
| 5,675,392 A | 10/1997 | Nayebi et al. | 5,870,670 A | 2/1999 | Ripley et al. |
| 5,678,220 A | 10/1997 | Fournier | 5,872,446 A | 2/1999 | Cranford, Jr. et al. |
| 5,678,226 A | 10/1997 | Li et al. | 5,878,088 A | 3/1999 | Knutson et al. |
| 5,680,078 A | 10/1997 | Ariie | 5,881,375 A | 3/1999 | Bonds |
| 5,680,418 A | 10/1997 | Croft et al. | 5,883,548 A | 3/1999 | Assard et al. |
| 5,682,099 A | 10/1997 | Thompson et al. | 5,884,154 A | 3/1999 | Sano et al. |
| 5,689,413 A | 11/1997 | Jaramillo et al. | 5,887,001 A | 3/1999 | Russell |
| 5,694,096 A | 12/1997 | Ushiroku et al. | 5,892,380 A | 4/1999 | Quist |
| 5,697,074 A | 12/1997 | Makikallio et al. | 5,894,239 A | 4/1999 | Bonaccio et al. |
| 5,699,006 A | 12/1997 | Zele et al. | 5,894,496 A | 4/1999 | Jones |
| 5,703,584 A | 12/1997 | Hill | 5,896,304 A | 4/1999 | Tiemann et al. |
| 5,705,949 A | 1/1998 | Alelyunas et al. | 5,896,347 A | 4/1999 | Tomita et al. |
| 5,705,955 A | 1/1998 | Freeburg et al. | 5,896,562 A | 4/1999 | Heinonen |
| 5,710,992 A | 1/1998 | Sawada et al. | 5,898,912 A | 4/1999 | Heck et al. |
| 5,710,998 A | 1/1998 | Opas | 5,900,746 A | 5/1999 | Sheahan |
| 5,714,910 A | 2/1998 | Skoczen et al. | 5,900,747 A | 5/1999 | Brauns |
| 5,715,281 A | 2/1998 | Bly et al. | 5,901,054 A | 5/1999 | Leu et al. |
| 5,721,514 A | 2/1998 | Crockett et al. | 5,901,187 A | 5/1999 | Iinuma |
| 5,724,002 A | 3/1998 | Hulick | 5,901,344 A | 5/1999 | Opas |
| 5,724,041 A | 3/1998 | Inoue et al. | 5,901,347 A | 5/1999 | Chambers et al. |
| 5,724,653 A | 3/1998 | Baker et al. | 5,901,348 A | 5/1999 | Bang et al. |
| 5,729,577 A | 3/1998 | Chen | 5,901,349 A | 5/1999 | Guegnaud et al. |
| 5,729,829 A | 3/1998 | Talwar et al. | 5,903,178 A | 5/1999 | Miyatsuji et al. |
| 5,732,333 A | 3/1998 | Cox et al. | 5,903,187 A | 5/1999 | Claverie et al. |
| 5,734,683 A | 3/1998 | Hulkko et al. | 5,903,196 A | 5/1999 | Salvi et al. |
| 5,736,895 A | 4/1998 | Yu et al. | 5,903,421 A | 5/1999 | Furutani et al. |
| 5,737,035 A | 4/1998 | Rotzoll | 5,903,553 A | 5/1999 | Sakamoto et al. |
| 5,742,189 A | 4/1998 | Yoshida et al. | 5,903,595 A | 5/1999 | Suzuki |
| 5,745,846 A | 4/1998 | Myer et al. | 5,903,609 A | 5/1999 | Kool et al. |
| 5,748,683 A | 5/1998 | Smith et al. | 5,903,827 A | 5/1999 | Kennan et al. |
| 5,751,154 A | 5/1998 | Tsugai | 5,903,854 A | 5/1999 | Abe et al. |
| 5,757,858 A | 5/1998 | Black et al. | 5,905,433 A | 5/1999 | Wortham |
| 5,757,870 A | 5/1998 | Miya et al. | 5,905,449 A | 5/1999 | Tsubouchi et al. |
| RE35,829 E | 6/1998 | Sanderford, Jr. | 5,907,149 A | 5/1999 | Marckini |
| 5,760,629 A | 6/1998 | Urabe et al. | 5,907,197 A | 5/1999 | Faulk |
| 5,760,632 A | 6/1998 | Kawakami et al. | 5,909,447 A | 6/1999 | Cox et al. |
| 5,760,645 A | 6/1998 | Comte et al. | 5,909,460 A | 6/1999 | Dent |
| 5,764,087 A | 6/1998 | Clark | 5,911,116 A | 6/1999 | Nosswitz |
| 5,767,726 A | 6/1998 | Wang | 5,911,123 A | 6/1999 | Shaffer et al. |
| 5,768,118 A | 6/1998 | Faulk et al. | 5,914,622 A | 6/1999 | Inoue |
| 5,768,323 A | 6/1998 | Kroeger et al. | 5,915,278 A | 6/1999 | Mallick |
| 5,770,985 A | 6/1998 | Ushiroku et al. | 5,918,167 A | 6/1999 | Tiller et al. |
| 5,771,442 A | 6/1998 | Wang et al. | 5,920,199 A | 7/1999 | Sauer |
| 5,777,692 A | 7/1998 | Ghosh | 5,926,065 A | 7/1999 | Wakai et al. |
| 5,777,771 A | 7/1998 | Smith | 5,926,513 A | 7/1999 | Suominen et al. |
| 5,778,022 A | 7/1998 | Walley | 5,933,467 A | 8/1999 | Sehier et al. |
| 5,781,600 A | 7/1998 | Reeve et al. | 5,937,013 A | 8/1999 | Lam et al. |
| 5,784,689 A | 7/1998 | Kobayashi | 5,943,370 A | 8/1999 | Smith |
| 5,786,844 A | 7/1998 | Rogers et al. | 5,945,660 A | 8/1999 | Nakasuji et al. |
| 5,787,125 A | 7/1998 | Mittel | 5,949,827 A | 9/1999 | DeLuca et al. |
| 5,790,587 A | 8/1998 | Smith et al. | 5,952,895 A | 9/1999 | McCune, Jr. et al. |
| 5,793,801 A | 8/1998 | Fertner | 5,953,642 A | 9/1999 | Feldtkeller et al. |
| 5,793,817 A | 8/1998 | Wilson | 5,955,992 A | 9/1999 | Shattil |
| 5,793,818 A | 8/1998 | Claydon et al. | 5,959,850 A | 9/1999 | Lim |
| 5,801,654 A | 9/1998 | Traylor | 5,960,033 A | 9/1999 | Shibano et al. |
| 5,802,463 A | 9/1998 | Zuckerman | 5,970,053 A | 10/1999 | Schick et al. |
| 5,805,460 A | 9/1998 | Greene et al. | 5,973,570 A | 10/1999 | Salvi et al. |
| 5,809,060 A | 9/1998 | Cafarella et al. | 5,982,315 A | 11/1999 | Bazarjani et al. |
| 5,812,546 A | 9/1998 | Zhou et al. | 5,982,329 A | 11/1999 | Pittman et al. |
| 5,818,582 A | 10/1998 | Fernandez et al. | 5,982,810 A | 11/1999 | Nishimori |
| 5,818,869 A | 10/1998 | Miya et al. | 5,986,600 A | 11/1999 | McEwan |
| 5,825,254 A | 10/1998 | Lee | 5,994,689 A | 11/1999 | Charrier |
| 5,825,257 A | 10/1998 | Klymyshyn et al. | 5,995,030 A | 11/1999 | Cabler |
| 5,834,979 A | 11/1998 | Yatsuka | 5,999,561 A | 12/1999 | Naden et al. |
| 5,834,985 A | 11/1998 | Sundegård | 6,005,506 A | 12/1999 | Bazarjani et al. |
| 5,834,987 A | 11/1998 | Dent | 6,005,903 A | 12/1999 | Mendelovicz |
| 5,841,324 A | 11/1998 | Williams | 6,011,435 A | 1/2000 | Takeyabu et al. |
| 5,841,811 A | 11/1998 | Song | 6,014,176 A | 1/2000 | Nayebi et al. |

| | | | |
|---|---|---|---|
| 6,014,551 A | 1/2000 | Pesola et al. | |
| 6,018,262 A | 1/2000 | Noro et al. | |
| 6,018,553 A | 1/2000 | Sanielevici et al. | |
| 6,026,286 A | 2/2000 | Long | |
| 6,028,887 A | 2/2000 | Harrison et al. | |
| 6,031,217 A | 2/2000 | Aswell et al. | |
| 6,034,566 A | 3/2000 | Ohe | |
| 6,038,265 A | 3/2000 | Pan et al. | |
| 6,041,073 A | 3/2000 | Davidovici et al. | |
| 6,047,026 A | 4/2000 | Chao et al. | |
| 6,049,573 A | 4/2000 | Song | |
| 6,049,706 A | 4/2000 | Cook et al. | |
| 6,054,889 A | 4/2000 | Kobayashi | |
| 6,057,714 A | 5/2000 | Andrys et al. | |
| 6,061,551 A | 5/2000 | Sorrells et al. | |
| 6,061,555 A | 5/2000 | Bultman et al. | |
| 6,064,054 A | 5/2000 | Waczynski et al. | |
| 6,067,329 A | 5/2000 | Kato et al. | |
| 6,072,996 A | 6/2000 | Smith | |
| 6,073,001 A | 6/2000 | Sokoler | |
| 6,076,015 A | 6/2000 | Hartley et al. | |
| 6,078,630 A | 6/2000 | Prasanna | |
| 6,081,691 A | 6/2000 | Renard et al. | |
| 6,084,465 A | 7/2000 | Dasgupta | |
| 6,084,922 A | 7/2000 | Zhou et al. | |
| 6,085,073 A | 7/2000 | Palermo et al. | |
| 6,088,348 A | 7/2000 | Bell, III et al. | |
| 6,091,289 A | 7/2000 | Song et al. | |
| 6,091,939 A | 7/2000 | Banh | |
| 6,091,940 A | 7/2000 | Sorrells et al. | |
| 6,091,941 A | 7/2000 | Moriyama et al. | |
| 6,094,084 A | 7/2000 | Abou-Allam et al. | |
| 6,097,762 A | 8/2000 | Suzuki et al. | |
| 6,098,046 A | 8/2000 | Cooper et al. | |
| 6,098,886 A | 8/2000 | Swift et al. | |
| 6,112,061 A | 8/2000 | Rapeli | |
| 6,121,819 A | 9/2000 | Traylor | |
| 6,125,271 A | 9/2000 | Rowland et al. | |
| 6,128,746 A | 10/2000 | Clark et al. | |
| 6,137,321 A | 10/2000 | Bazarjani | |
| 6,144,236 A | 11/2000 | Vice et al. | |
| 6,144,331 A | 11/2000 | Jiang | |
| 6,144,846 A | 11/2000 | Durec | |
| 6,147,340 A | 11/2000 | Levy | |
| 6,147,763 A | 11/2000 | Steinlechner | |
| 6,150,890 A | 11/2000 | Damgaard et al. | |
| 6,151,354 A | 11/2000 | Abbey | |
| 6,160,280 A | 12/2000 | Bonn et al. | |
| 6,167,247 A | 12/2000 | Kannell et al. | |
| 6,169,733 B1 | 1/2001 | Lee | |
| 6,175,728 B1 | 1/2001 | Mitama | |
| 6,178,319 B1 | 1/2001 | Kashima | |
| 6,182,011 B1 | 1/2001 | Ward | |
| 6,192,225 B1 | 2/2001 | Arpaia et al. | |
| 6,195,539 B1 | 2/2001 | Galal et al. | |
| 6,198,941 B1 | 3/2001 | Aho et al. | |
| 6,204,789 B1 | 3/2001 | Nagata | |
| 6,208,636 B1 | 3/2001 | Tawil et al. | |
| RE37,138 E | 4/2001 | Dent | |
| 6,211,718 B1 | 4/2001 | Souetinov | |
| 6,212,369 B1 | 4/2001 | Avasarala | |
| 6,215,475 B1 | 4/2001 | Meyerson et al. | |
| 6,215,828 B1 | 4/2001 | Signell et al. | |
| 6,223,061 B1 | 4/2001 | Dacus et al. | |
| 6,225,848 B1 | 5/2001 | Tilley et al. | |
| 6,230,000 B1 | 5/2001 | Tayloe | |
| 6,246,695 B1 | 6/2001 | Seazholtz et al. | |
| 6,259,293 B1 | 7/2001 | Hayase et al. | |
| 6,266,518 B1 | 7/2001 | Sorrells et al. | |
| 6,275,542 B1 | 8/2001 | Katayama et al. | |
| 6,298,065 B1 | 10/2001 | Dombkowski et al. | |
| 6,307,894 B2 | 10/2001 | Eidson et al. | |
| 6,308,058 B1 | 10/2001 | Souetinov et al. | |
| 6,313,685 B1 | 11/2001 | Rabii | |
| 6,313,700 B1 | 11/2001 | Nishijima et al. | |
| 6,314,279 B1 | 11/2001 | Mohindra | |
| 6,317,589 B1 | 11/2001 | Nash | |
| 6,321,073 B1 | 11/2001 | Luz et al. | |
| 6,327,313 B1 | 12/2001 | Traylor et al. | |
| 6,330,244 B1 | 12/2001 | Swartz et al. | |
| 6,335,656 B1 | 1/2002 | Goldfarb et al. | |
| 6,353,735 B1 | 3/2002 | Sorrells et al. | |
| 6,363,262 B1 | 3/2002 | McNicol | |
| 6,366,622 B1 | 4/2002 | Brown et al. | |
| 6,366,765 B1 | 4/2002 | Hongo et al. | |
| 6,370,371 B1 | 4/2002 | Sorrells et al. | |
| 6,385,439 B1 | 5/2002 | Hellberg | |
| 6,393,070 B1 | 5/2002 | Reber | |
| 6,400,963 B1 | 6/2002 | Glöckler et al. | |
| 6,404,758 B1 | 6/2002 | Wang | |
| 6,404,823 B1 | 6/2002 | Grange et al. | |
| 6,421,534 B1 | 7/2002 | Cook et al. | |
| 6,437,639 B1 | 8/2002 | Nguyen et al. | |
| 6,438,366 B1 | 8/2002 | Lindfors et al. | |
| 6,441,659 B1 | 8/2002 | Demone | |
| 6,441,694 B1 | 8/2002 | Turcotte et al. | |
| 6,445,726 B1 | 9/2002 | Gharpurey | |
| 6,459,721 B1 | 10/2002 | Mochizuki et al. | |
| 6,509,777 B2 | 1/2003 | Razavi et al. | |
| 6,512,544 B1 | 1/2003 | Merrill et al. | |
| 6,512,785 B1 | 1/2003 | Zhou et al. | |
| 6,512,798 B1 | 1/2003 | Akiyama et al. | |
| 6,516,185 B1 | 2/2003 | MacNally | |
| 6,531,979 B1 | 3/2003 | Hynes | |
| 6,542,722 B1 | 4/2003 | Sorrells et al. | |
| 6,546,061 B2 | 4/2003 | Signell et al. | |
| 6,560,301 B1 | 5/2003 | Cook et al. | |
| 6,560,451 B1 | 5/2003 | Somayajula | |
| 6,567,483 B1 | 5/2003 | Dent et al. | |
| 6,580,902 B1 | 6/2003 | Sorrells et al. | |
| 6,591,310 B1 | 7/2003 | Johnson | |
| 6,597,240 B1 | 7/2003 | Walburger et al. | |
| 6,600,795 B1 | 7/2003 | Ohta et al. | |
| 6,600,911 B1 | 7/2003 | Morishige et al. | |
| 6,608,647 B1 | 8/2003 | King | |
| 6,611,569 B1 | 8/2003 | Schier et al. | |
| 6,618,579 B1 | 9/2003 | Smith et al. | |
| 6,625,470 B1 | 9/2003 | Fourtet et al. | |
| 6,628,328 B1 | 9/2003 | Yokouchi et al. | |
| 6,633,194 B2 | 10/2003 | Arnborg et al. | |
| 6,634,555 B1 | 10/2003 | Sorrells et al. | |
| 6,639,939 B1 | 10/2003 | Naden et al. | |
| 6,647,250 B1 | 11/2003 | Bultman et al. | |
| 6,647,270 B1 | 11/2003 | Himmelstein | |
| 6,686,879 B2 | 2/2004 | Shattil | |
| 6,687,493 B1 | 2/2004 | Sorrells et al. | |
| 6,690,232 B2 | 2/2004 | Ueno et al. | |
| 6,690,741 B1 | 2/2004 | Larrick, Jr. et al. | |
| 6,694,128 B1 | 2/2004 | Sorrells et al. | |
| 6,697,603 B1 | 2/2004 | Lovinggood et al. | |
| 6,704,549 B1 | 3/2004 | Sorrells et al. | |
| 6,704,558 B1 | 3/2004 | Sorrells et al. | |
| 6,731,146 B1 | 5/2004 | Gallardo | |
| 6,738,609 B1 | 5/2004 | Clifford | |
| 6,741,139 B2 | 5/2004 | Pleasant et al. | |
| 6,741,650 B1 | 5/2004 | Painchaud et al. | |
| 6,775,684 B1 | 8/2004 | Toyoyama et al. | |
| 6,798,351 B1 | 9/2004 | Sorrells et al. | |
| 6,801,253 B1 | 10/2004 | Yonemoto et al. | |
| 6,813,320 B1 * | 11/2004 | Claxton et al. | 375/316 |
| 6,813,485 B2 | 11/2004 | Sorrells et al. | |
| 6,823,178 B2 | 11/2004 | Pleasant et al. | |
| 6,836,650 B2 | 12/2004 | Sorrells et al. | |
| 6,850,742 B2 | 2/2005 | Fayyaz | |
| 6,853,690 B1 | 2/2005 | Sorrells et al. | |
| 6,865,399 B2 | 3/2005 | Fujioka et al. | |

| | | | |
|---|---|---|---|
| 6,873,836 B1 | 3/2005 | Sorrells et al. |
| 6,876,846 B2 | 4/2005 | Tamaki et al. |
| 6,879,817 B1 | 4/2005 | Sorrells et al. |
| 6,882,194 B2 | 4/2005 | Belot et al. |
| 6,892,057 B2 | 5/2005 | Nilsson |
| 6,892,062 B2 | 5/2005 | Lee et al. |
| 6,894,988 B1 | 5/2005 | Zehavi |
| 6,909,739 B1 | 6/2005 | Eerola et al. |
| 6,910,015 B2 | 6/2005 | Kawai |
| 6,917,796 B2 | 7/2005 | Setty et al. |
| 6,920,311 B2 | 7/2005 | Rofougaran et al. |
| 6,959,178 B2 | 10/2005 | Macedo et al. |
| 6,963,626 B1 | 11/2005 | Shaeffer et al. |
| 6,963,734 B2 | 11/2005 | Sorrells et al. |
| 6,973,476 B1 | 12/2005 | Naden et al. |
| 6,975,848 B2 | 12/2005 | Rawlins et al. |
| 6,999,747 B2 | 2/2006 | Su |
| 7,006,805 B1 | 2/2006 | Sorrells et al. |
| 7,010,286 B2 | 3/2006 | Sorrells et al. |
| 7,010,559 B2 | 3/2006 | Rawlins et al. |
| 7,016,663 B2 | 3/2006 | Sorrells et al. |
| 7,027,786 B1 | 4/2006 | Smith et al. |
| 7,039,372 B1 | 5/2006 | Sorrells et al. |
| 7,050,508 B2 | 5/2006 | Sorrells et al. |
| 7,054,296 B1 | 5/2006 | Sorrells et al. |
| 7,065,162 B1 | 6/2006 | Sorrells et al. |
| 7,072,390 B1 | 7/2006 | Sorrells et al. |
| 7,072,427 B2 | 7/2006 | Rawlins et al. |
| 7,072,433 B2 | 7/2006 | Bell |
| 7,076,011 B2 | 7/2006 | Cook et al. |
| 7,082,171 B1 | 7/2006 | Johnson et al. |
| 7,085,335 B2 | 8/2006 | Rawlins et al. |
| 7,107,028 B2 | 9/2006 | Sorrells et al. |
| 7,110,435 B1 | 9/2006 | Sorrells et al. |
| 7,110,444 B1 | 9/2006 | Sorrells et al. |
| 7,190,941 B2 | 3/2007 | Sorrells et al. |
| 7,193,965 B1 | 3/2007 | Nevo et al. |
| 7,194,044 B2 | 3/2007 | Birkett et al. |
| 7,194,246 B2 | 3/2007 | Sorrells et al. |
| 7,197,081 B2 | 3/2007 | Saito |
| 7,209,725 B1 | 4/2007 | Sorrells et al. |
| 7,212,581 B2 | 5/2007 | Birkett et al. |
| 7,218,899 B2 | 5/2007 | Sorrells et al. |
| 7,218,907 B2 | 5/2007 | Sorrells et al. |
| 7,224,749 B2 | 5/2007 | Sorrells et al. |
| 7,233,969 B2 | 6/2007 | Rawlins et al. |
| 7,236,754 B2 | 6/2007 | Sorrells et al. |
| 7,245,886 B2 | 7/2007 | Sorrells et al. |
| 7,272,164 B2 | 9/2007 | Sorrells et al. |
| 7,292,835 B2 | 11/2007 | Sorrells et al. |
| 7,295,826 B1 | 11/2007 | Cook et al. |
| 7,308,242 B2 | 12/2007 | Sorrells et al. |
| 7,321,640 B2 | 1/2008 | Milne et al. |
| 7,321,735 B1 | 1/2008 | Smith et al. |
| 7,321,751 B2 | 1/2008 | Sorrells et al. |
| 7,376,410 B2 | 5/2008 | Sorrells et al. |
| 7,379,515 B2 | 5/2008 | Johnson et al. |
| 7,379,883 B2 | 5/2008 | Sorrells |
| 7,386,292 B2 | 6/2008 | Sorrells et al. |
| 7,389,100 B2 | 6/2008 | Sorrells et al. |
| 7,433,910 B2 | 10/2008 | Rawlins et al. |
| 7,454,453 B2 | 11/2008 | Rawlins et al. |
| 7,460,584 B2 | 12/2008 | Parker et al. |
| 7,483,686 B2 | 1/2009 | Sorrells et al. |
| 7,496,342 B2 | 2/2009 | Sorrells et al. |
| 7,515,896 B1 | 4/2009 | Sorrells et al. |
| 7,529,522 B2 | 5/2009 | Sorrells et al. |
| 7,539,474 B2 | 5/2009 | Sorrels et al. |
| 7,546,096 B2 | 6/2009 | Sorrells et al. |
| 7,554,508 B2 | 6/2009 | Johnson et al. |
| 7,599,421 B2 | 10/2009 | Sorrells et al. |
| 2001/0015673 A1 | 8/2001 | Yamashita et al. |
| 2001/0036818 A1 | 11/2001 | Dobrovolny |
| 2002/0021685 A1 | 2/2002 | Sakusabe |
| 2002/0037706 A1 | 3/2002 | Ichihara |
| 2002/0080728 A1 | 6/2002 | Sugar et al. |
| 2002/0098823 A1 | 7/2002 | Lindfors et al. |
| 2002/0132642 A1 | 9/2002 | Hines et al. |
| 2002/0163921 A1 | 11/2002 | Ethridge et al. |
| 2003/0045263 A1 | 3/2003 | Wakayama et al. |
| 2003/0078011 A1 | 4/2003 | Cheng et al. |
| 2003/0081781 A1 | 5/2003 | Jensen et al. |
| 2003/0103581 A1 | 6/2003 | Rawlins et al. |
| 2003/0128776 A1 | 7/2003 | Rawlins et al. |
| 2003/0149579 A1 | 8/2003 | Begemann et al. |
| 2003/0181186 A1 | 9/2003 | Sorrells et al. |
| 2003/0181189 A1 | 9/2003 | Sorrells et al. |
| 2003/0181190 A1 | 9/2003 | Sorrells et al. |
| 2003/0193364 A1 | 10/2003 | Liu et al. |
| 2004/0002321 A1 | 1/2004 | Sorrells et al. |
| 2004/0125879 A1 | 7/2004 | Jaussi et al. |
| 2005/0143042 A1 | 6/2005 | Sorrells et al. |
| 2006/0002491 A1 | 1/2006 | Darabi et al. |
| 2006/0039449 A1 | 2/2006 | Fontana et al. |
| 2006/0209599 A1 | 9/2006 | Kato et al. |

FOREIGN PATENT DOCUMENTS

| | | |
|---|---|---|
| DE | 35 41 031 A1 | 5/1986 |
| DE | 42 37 692 C1 | 3/1994 |
| DE | 196 27 640 A1 | 1/1997 |
| DE | 692 21 098 T2 | 1/1998 |
| DE | 196 48 915 A1 | 6/1998 |
| DE | 197 35 798 C1 | 7/1998 |
| EP | 0 035 166 A1 | 9/1981 |
| EP | 0 087 336 A1 | 8/1983 |
| EP | 0 099 265 A1 | 1/1984 |
| EP | 0 087 336 B1 | 7/1986 |
| EP | 0 254 844 A2 | 2/1988 |
| EP | 0 276 130 A2 | 7/1988 |
| EP | 0 276 130 A3 | 7/1988 |
| EP | 0 193 899 B1 | 6/1990 |
| EP | 0 380 351 A2 | 8/1990 |
| EP | 0 380 351 A3 | 2/1991 |
| EP | 0 411 840 A2 | 2/1991 |
| EP | 0 423 718 A2 | 4/1991 |
| EP | 0 411 840 A3 | 7/1991 |
| EP | 0 486 095 A1 | 5/1992 |
| EP | 0 423 718 A3 | 8/1992 |
| EP | 0 512 748 A2 | 11/1992 |
| EP | 0 529 836 A1 | 3/1993 |
| EP | 0 548 542 A1 | 6/1993 |
| EP | 0 512 748 A3 | 7/1993 |
| EP | 0 560 228 A1 | 9/1993 |
| EP | 0 632 288 A2 | 1/1995 |
| EP | 0 632 577 A1 | 1/1995 |
| EP | 0 643 477 A2 | 3/1995 |
| EP | 0 643 477 A3 | 3/1995 |
| EP | 0 411 840 B1 | 10/1995 |
| EP | 0 696 854 A1 | 2/1996 |
| EP | 0 632 288 A3 | 7/1996 |
| EP | 0 732 803 A1 | 9/1996 |
| EP | 0 486 095 B1 | 2/1997 |
| EP | 0 782 275 A2 | 7/1997 |
| EP | 0 785 635 A1 | 7/1997 |
| EP | 0 789 449 A2 | 8/1997 |
| EP | 0 789 449 A3 | 8/1997 |
| EP | 0 795 955 A3 | 9/1997 |
| EP | 0 795 978 A2 | 9/1997 |
| EP | 0 817 369 A2 | 1/1998 |
| EP | 0 817 369 A3 | 1/1998 |
| EP | 0 837 565 A1 | 4/1998 |
| EP | 0 862 274 A1 | 9/1998 |
| EP | 0 874 499 A2 | 10/1998 |
| EP | 0 512 748 B1 | 11/1998 |
| EP | 0 877 476 A1 | 11/1998 |

| | | |
|---|---|---|
| EP | 0 977 351 A1 | 2/2000 |
| FR | 2 245 130 | 4/1975 |
| FR | 2 669 787 A1 | 5/1992 |
| FR | 2 743 231 A1 | 7/1997 |
| GB | 2 161 344 A | 1/1986 |
| GB | 2 215 945 A | 9/1989 |
| GB | 2 324 919 A | 11/1998 |
| JP | 47-2314 | 2/1972 |
| JP | 55-66057 | 5/1980 |
| JP | 56-114451 | 9/1981 |
| JP | 58-7903 | 1/1983 |
| JP | 58-031622 | 2/1983 |
| JP | 58-133004 | 8/1983 |
| JP | 59-022438 | 2/1984 |
| JP | 59-123318 | 7/1984 |
| JP | 59-144249 | 8/1984 |
| JP | 60-58705 | 4/1985 |
| JP | 60-130203 | 7/1985 |
| JP | 61-30821 | 2/1986 |
| JP | 61-193521 | 8/1986 |
| JP | 61-232706 | 10/1986 |
| JP | 61-245749 | 11/1986 |
| JP | 62-12381 | 1/1987 |
| JP | 62-047214 | 2/1987 |
| JP | 63-54002 | 3/1988 |
| JP | 63-65587 | 3/1988 |
| JP | 63-153691 | 6/1988 |
| JP | 63-274214 | 11/1988 |
| JP | 64-048557 | 2/1989 |
| JP | 2-39632 | 2/1990 |
| JP | 2-131629 | 5/1990 |
| JP | 2-276351 | 11/1990 |
| JP | 4-123614 | 4/1992 |
| JP | 4-127601 | 4/1992 |
| JP | 4-154227 | 5/1992 |
| JP | 5-175730 | 7/1993 |
| JP | 5-175734 | 7/1993 |
| JP | 5-327356 | 12/1993 |
| JP | 6-237276 | 8/1994 |
| JP | 6-284038 | 10/1994 |
| JP | 7-154344 | 6/1995 |
| JP | 7-169292 A | 7/1995 |
| JP | 7-307620 | 11/1995 |
| JP | 8-23359 | 1/1996 |
| JP | 8-32556 | 2/1996 |
| JP | 8-139524 | 5/1996 |
| JP | 8-288882 A | 11/1996 |
| JP | 9-36664 | 2/1997 |
| JP | 9-171399 | 6/1997 |
| JP | 10-22804 A | 1/1998 |
| JP | 10-41860 | 2/1998 |
| JP | 10-96778 | 4/1998 |
| JP | 10-173563 | 6/1998 |
| JP | 11-98205 | 4/1999 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 95/19073 A2 | 7/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A2 | 3/1997 |
| WO | WO 97/08839 A3 | 3/1997 |
| WO | 0 795 955 A2 | 9/1997 |
| WO | WO 97/38490 A1 | 10/1997 |
| WO | WO 98/00953 A1 | 1/1998 |
| WO | WO 98/24201 A1 | 6/1998 |
| WO | WO 98/40968 A2 | 9/1998 |
| WO | WO 98/40968 A3 | 9/1998 |
| WO | WO 98/53556 A2 | 11/1998 |
| WO | WO 99/23755 A1 | 5/1999 |
| WO | WO 00/31659 A1 | 6/2000 |

OTHER PUBLICATIONS

*What is I/Q Data?*, printed Sep. 16, 2006, from http://zone.ni.com, 8 pages (Copyright 2003).

English-language Abstract of Japanese Patent Publication No. JP 62-12381, data supplied by the espacenet, 1 page (Jan. 21, 1987—Date of publication of application).

English-language Abstract of Japanese Patent Publication No. JP 4-154227, data supplied by the espacenet, 1 page (May 27, 1992—Date of publication of application).

English-language Abstract of Japanese Patent Publication No. JP 6-284038, data supplied by the espacenet, 1 page (Oct. 7, 1994—Date of publication of application).

English-language Abstract of Japanese Patent Publication No. JP 10-96778, data supplied by the espacenet, 1 page (Apr. 14, 1998—Date of publication of application).

English-language Abstract of Japanese Patent Publication No. JP 11-98205, data supplied by the espacenet, 1 page (Apr. 9, 1999—Date of publication of application).

English-language Abstract of Japanese Patent Publication No. JP 61-232706, data supplied by the espacenet, 1 page (Oct. 17, 1986—Date of publication of application).

English-language Abstract of Japanese Patent Publication No. JP 9-171399, data supplied by the espacenet, 1 page (Jun. 30, 1997—Date of publication of application).

English-language Abstract of Japanese Patent Publication No. JP 10-41860, data supplied by the espacenet, 1 page (Feb. 13, 1998—Date of publication of application).

Aghvami, H. et al., "Land Mobile Satellites Using the Highly Elliptic Orbits- The UK T-SAT Mobile Payload," *Fourth International Conference on Satellite Systems for Mobile Communications and Navigation*, IEE, pp. 147-153 (Oct. 17-19, 1988).

Akers, N.P. et al., "RF Sampling Gates: a Brief Review," *IEE Proceedings*, IEE, vol. 133, Part A, No. 1, pp. 45-49 (Jan. 1986).

Al-Ahmad, H.A.M. et al., "Doppler Frequency Correction for a Non-Geostationary Communications Satellite. Techniques for CERS and T-SAT," *Electronics Division Colloquium on Low Noise Oscillators and Synthesizers*, IEE, pp. 4/1-4/5 (Jan. 23, 1986).

Ali, I. et al., "Doppler Characterization for LEO Satellites," *IEEE Transactions on Communications*, IEEE, vol. 46, No. 3, pp. 309-313 (Mar. 1998).

Allan, D.W., "Statistics of Atomic Frequency Standards," *Proceedings Of The IEEE Special Issue on Frequency Stability*, IEEE, pp. 221-230 (Feb. 1966).

Allstot, D.J. et al., "MOS Switched Capacitor Ladder Filters," *IEEE Journal of Solid-State Circuits*, IEEE, vol. SC-13, No. 6, pp. 806-814 (Dec. 1978).

Allstot, D.J. And Black Jr. W.C., "Technological Design Considerations for Monolithic MOS Switched-Capacitor Filtering Systems," *Proceedings of the IEEE*, IEEE, vol. 71, No. 8, pp. 967-986 (Aug. 1983).

Alouini, M. et al., "Channel Characterization and Modeling for Ka-Band Very Small Aperture Terminals," *Proceedings Of the IEEE*, IEEE, vol. 85, No. 6, pp. 981-997 (Jun. 1997).

Andreyev, G.A. and Ogarev, S.A., "Phase Distortions of Keyed Millimeter-Wave Signals in the Case of Propagation in a Turbulent Atmosphere," *Telecommunications and Radio Engineering*, Scripta Technica, vol. 43, No. 12, pp. 87-90 (Dec. 1988).

Antonetti, A. et al., "Optoelectronic Sampling in the Picosecond Range," *Optics Communications*, North-Holland Publishing Company, vol. 21, No. 2, pp. 211-214 (May 1977).

Austin, J. et al., "Doppler Correction of the Telecommunication Payload Oscillators in the UK T-SAT," *18th European Microwave Conference*, Microwave Exhibitions and Publishers Ltd., pp. 851-857 (Sep. 12-15, 1988).

Auston, D.H., "Picosecond optoelectronic switching and gating in silicon," *Applied Physics Letters*, American Institute of Physics, vol. 26, No. 3, pp. 101-103 (Feb. 1, 1975).

Baher, H., "Transfer Functions for Switched-Capacitor and Wave Digital Filters," *IEEE Transactions on Circuits and Systems*, IEEE Circuits and Systems Society, vol. CAS-33, No. 11, pp. 1138-1142 (Nov. 1986).

Baines, R., "The DSP Bottleneck," *IEEE Communications Magazine*, IEEE Communications Society, pp. 46-54 (May 1995).

Banjo, O.P. and Vilar, E., "Binary Error Probabilities on Earth-Space Links Subject to Scintillation Fading," *Electronics Letters*, IEE, vol. 21, No. 7, pp. 296-297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277-280 (Mar. 30-Apr. 2, 1987).

Banjo, O.P. and Vilar, E. "Measurement and Modeling of Amplitude Scintillations on Low-Elevation Earth-Space Paths and Impact on Communication Systems," *IEEE Transactions on Communications*, IEEE Communications Society, vol. COM-34, No. 8, pp. 774-780 (Aug. 1986).

Banjo, O.P. et al., "Tropospheric Amplitude Spectra Due to Absorption and Scattering in Earth-Space Paths," *Fourth International Conference on Antennas and Propagation (ICAP 85)*, IEE, pp. 77-82 (Apr. 16-19, 1985).

Basili, P. et al., "Case Study of Intense Scintillation Events on the OTS Path," *IEEE Transactions on Antennas and Propagation*, IEEE, vol. 38, No. 1, pp. 107-113 (Jan. 1990).

Basili, P. et al., "Observation of High $C^2$ and Turbulent Path Length on OTS Space-Earth Link," *Electronics Letters*, IEE, vol. 24, No. 17, pp. 1114-1116 (Aug. 18, 1988).

Blakey, J.R. et al., "Measurement of Atmospheric Millimetre-Wave Phase Scintillations in an Absorption Region," *Electronics Letters*, IEE, vol. 21, No. 11, pp. 486-487 (May 23, 1985).

Burgueño, A. et al., "Influence of rain gauge integration time on the rain rate statistics used in microwave communications," *annales des télécommunications*, International Union of Radio Science, pp. 522-527 (Sep./Oct. 1988).

Burgueño, A. et al., "Long-Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198-201 (Mar. 30-Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation*, IEE, pp. 297-301 (Apr. 4-7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359-1366 (Sep. 1990).

Catalan, C. and Vilar, E., "Approach for satellite slant path remote sensing," *Electronics Letters*, IEE, vol. 34, No. 12, pp. 1238-1240 (Jun. 11, 1998).

Chan, P. et al., "A Highly Linear 1-GHz CMOS Downconversion Mixer," *European Solid State Circuits Conference*, IEEE Communication Society, pp. 210-213 (Sep. 22-24, 1993).

Declaration of Michael J. Bultman filed in U.S. Appl. No. 09/176,022, which is directed to related subject matter, 2 pages.

Declaration of Robert W. Cook filed in U.S. Appl. No. 09/176,022, which is directed to related subject matter, 2 pages.

Declaration of Alex Holtz filed in U.S. Appl. No. 09/176,022, which is directed to related subject matter, 3 pages.

Declaration of Richard C. Looke filed in U.S. Appl. No. 09/176,022, which is directed to related subject matter, 2 pages.

Declaration of Charley D. Moses, Jr. filed in U.S. Appl. No. 09/176,022, which is directed to related subject matter, 2 pages.

Declaration of Jeffrey L. Parker and David F. Sorrells, with attachment Exhibit 1, filed in U.S. Appl. No. 09/176,022, which is directed to related subject matter, 130 pages.

Dewey, R.J. and Collier, C.J., "Multi-Mode Radio Receiver," *Electronics Division Colloquium on Digitally Implemented Radios*, IEE, pp. 3/1-3/5 (Oct. 18, 1985).

Dialog File 347 (JAPIO) English Language Patent Abstract for JP 2-276351, 1 page (Nov. 13, 1990—Date of publication of application).

Dialog File 347 (JAPIO) English Language Patent Abstract for JP 2-131629, 1 page (May 21, 1990—Date of publication of application).

Dialog File 347 (JAPIO) English Language Patent Abstract for JP 2-39632, 1 page (Feb. 8, 1990—Date of publication of application).

Dialog File 348 (European Patents) English Language Patent Abstract for EP 0 785 635 A1, 3 pages (Dec. 26, 1996—Date of publication of application).

Dialog File 348 (European Patents) English Language Patent Abstract for EP 35166 A2, 2 pages (Feb. 18, 1981—Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET-Less Sample-and-Hold with High Charge-to-Droop Current Ratio," *IEEE Journal of Solid-State Circuits*, IEEE, vol. SC-13, No. 6, pp. 864-873 (Dec. 1978).

Faulkner, N.D. and Vilar, E., "Subharmonic Sampling for the Measurement of Short Term Stability of Microwave Oscillators," *IEEE Transactions on Instrumentation and Measurement*, IEEE, vol. IM-32, No. 1, pp. 208-213 (Mar. 1983).

Faulkner, N.D. et al., "Sub-Harmonic Sampling for the Accurate Measurement of Frequency Stability of Microwave Oscillators," *CPEM 82 Digest: Conference on Precision Electromagnetic Measurements*, IEEE, pp. M-10 and M-11 (1982).

Faulkner, N.D. and Vilar, E., "Time Domain Analysis of Frequency Stability Using Non-Zero Dead-Time Counter Techniques," *CPEM 84 Digest Conference on Precision Electromagnetic Measurements*, IEEE, pp. 81-82 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958-1965 (Nov. 1990).

Fukahori, K., "A CMOS Narrow-Band Signaling Filter with Q Reduction," *IEEE Journal of Solid-State Circuits*, IEEE, vol. SC-19, No. 6, pp. 926-932 (Dec. 1984).

Fukuchi, H. and Otsu, Y., "Available time statistics of rain attenuation on earth-space path," *IEE Proceedings—H: Microwaves, Antennas and Propagation*, IEE, vol. 135, Pt. H, No. 6, pp. 387-390 (Dec. 1988).

Gibbins, C.J. and Chadha, R., "Millimetre-wave propagation through hydrocarbon flame," *IEE Proceedings*, IEE, vol. 134, Pt. H, No. 2, pp. 169-173 (Apr. 1987).

Gilchrist, B. et al., "Sampling hikes performance of frequency synthesizers," *Microwaves & RF*, Hayden Publishing, vol. 23, No. 1, pp. 93-94 and 110 (Jan. 1984).

Gossard, E.E., "Clear weather meteorological effects on propagation at frequencies above 1 Ghz," *Radio Science*, American Geophysical Union, vol. 16, No. 5, pp. 589-608 (Sep.-Oct. 1981).

Gregorian, R. et al., "Switched-Capacitor Circuit Design," *Proceedings of the IEEE*, IEEE, vol. 71, No. 8, pp. 941-966 (Aug. 1983).

Groshong et al., "Undersampling Techniques Simplify Digital Radio," *Electronic Design*, Penton Publishing, pp. 67-68, 70, 73-75 and 78 (May 23, 1991).

Grove, W.M., "Sampling for Oscilloscopes and Other RF Systems: DC through X-Band," *IEEE Transactions on Microwave Theory and Techniques*, IEEE, pp. 629-635 (Dec. 1966).

Haddon, J. et al., "Measurement of Microwave Scintillations on a Satellite Down-Link at X-Band," *Antennas and Propagation*, IEE, pp. 113-117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP-34, No. 5, pp. 646-657 (May 1986).

Hafdallah, H. et al., "2-4 Ghz MESFET Sampler," *Electronics Letters*, IEE, vol. 24, No. 3, pp. 151-153 (Feb. 4, 1988).

Herben, M.H.A.J., "Amplitude and Phase Scintillation Measurements on 8-2 km Line-Of-Sight Path at 30 Ghz," *Electronics Letters*, IEE, vol. 18, No. 7, pp. 287-289 (Apr. 1, 1982).

Hewitt, A. et al., "An 18 Ghz Wideband LOS Multipath Experiment," *International Conference on Measurements for Telecommunication Transmission Systems—MTTS 85*, IEE, pp. 112-116 (Nov. 27-28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136-1143 (Nov. 1989).

Hewitt, A. and Viler, E., "Selective fading on LOS Microwave Links: Classical and Spread-Spectrum Measurement Techniques," *IEEE Transactions on Communications*, IEEE Communications Society, vol. 36, No. 7, pp. 789-796 (Jul. 1988).

Hospitalier, E., "Instruments for Recording and Observing Rapidly Varying Phenomena," *Science Abstracts*, IEE, vol. VII, pp. 22-23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115-121 (Sep. 18-20, 1990).

Hu, X., *A Switched-Current Sample-and-Hold Amplifier for FM Demodulation*, Thesis for Master of Applied Science, Dept. of Electrical and Computer Engineering, University of Toronto, UMI Dissertation Services, pp. 1-64 (1995).

Hung, H-L. A. et al., "Characterization of Microwave Integrated Circuits Using An Optical Phase-Locking and Sampling System," *IEEE MTT-S Digest*, IEEE, pp. 507-510 (1991).

Hurst, P.J., "Shifting the Frequency Response of Switched-Capacitor Filters by Nonuniform Sampling," *IEEE Transactions on Circuits and Systems*, IEEE Circuits and Systems Society, vol. 38, No. 1, pp. 12-19 (Jan. 1991).

Itakura, T., "Effects of the sampling pulse width on the frequency characteristics of a sample-and-hold circuit," *IEE Proceedings Circuits, Devices and Systems*, IEE, vol. 141, No. 4, pp. 328-336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52-59 (Aug. 1950).

Janssen, J.M.L. and Michels, A.J., "An Experimental 'Stroboscopic' Oscilloscope for Frequencies up to about 50 Mc/s: II. Electrical Build-Up," *Philips Technical Review*, Philips Research Laboratories, vol. 12, No. 3, pp. 73-82 (Sep. 1950).

Jondral, V.F. et al., "Doppler Profiles for Communication Satellites," *Frequenz*, Herausberger, pp. 111-116 (May-Jun. 1996).

Kaleh, G.K., "A Frequency Diversity Spread Spectrum System for Communication in the Presence of In-band Interference," *1995 IEEE Globecom*, IEEE Communications Society, pp. 66-70 (1995).

Karasawa, Y. et al., "A New Prediction Method for Tropospheric Scintillation on Earth-Space Paths," *IEEE Transactions on Antennas and Propagation*, IEEE Antennas and Propagation Society, vol. 36, No. 11, pp. 1608-1614 (Nov. 1988).

Kirsten, J. and Fleming, J., "Undersampling reduces data-acquisition costs for select applications," *EDN*, Cahners Publishing, vol. 35, No. 13, pp. 217-222, 224, 226-228 (Jun. 21, 1990).

Lam, W.K. et al., "Measurement of the Phase Noise Characteristics of an Unlocked Communications Channel Identifier," *Proceedings Of the 1993 IEEE International Frequency Control Symposium*, IEEE, pp. 283-288 (Jun. 2-4, 1993).

Lam, W.K. et al., "Wideband sounding of 11.6 Ghz transhorizon channel," *Electronics Letters*, IEE, vol. 30, No. 9, pp. 738-739 (Apr. 28, 1994).

Larkin, K.G., "Efficient demodulator for bandpass sampled AM signals," *Electronics Letters*, IEE, vol. 32, No. 2, pp. 101-102 (Jan. 18, 1996).

Lau, W.H. et al., "Analysis of the Time Variant Structure of Microwave Line-of-sight Multipath Phenomena," *IEEE Global Telecommunications Conference & Exhibition*, IEEE, pp. 1707-1711 (Nov. 28-Dec. 1, 1988).

Lau, W.H. et al., "Improved Prony Algorithm to Identify Multipath Components," *Electronics Letters*, IEE, vol. 23, No. 20, pp. 1059-1060 (Sep. 24, 1987).

Lesage, P. and Audoin, C., "Effect of Dead-Time on the Estimation of the Two-Sample Variance," *IEEE Transactions on Instrumentation and Measurement*, IEEE Instrumentation and Measurement Society, vol. IM-28, No. 1, pp. 6-10 (Mar. 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, vol. MTT-23, No. 6, pp. 461-469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS-26, No. 4, pp. 4443-4449 (Aug. 1979).

Liou, M.L., "A Tutorial on Computer-Aided Analysis of Switched-Capacitor Circuits," *Proceedings of the IEEE*, IEEE, vol. 71, No. 8, pp. 987-1005 (Aug. 1983).

Lo, P. et al., "Coherent Autoniatic Gain Control," *IEE Colloquium on Phase Locked Techniques*, IEE, pp. 2/1-2/6 (Mar. 26, 1980).

Lo, P. et al., "Computation of Rain Induced Scintillations on Satellite Down-Links at Microwave Frequencies," *Third International Conference on Antennas and Propagation (ICAP 83)*, pp. 127-131 (Apr. 12-15, 1983).

Lo, P.S.L.O. et al., "Observations of Amplitude Scintillations on a Low-Elevation Earth-Space Path," *Electronics Letters*, IEE, vol. 20, No. 7, pp. 307-308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960-1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592-594 (Aug. 7, 1989).

Martin, K. and Sedra, A.S., "Switched-Capacitor Building Blocks for Adaptive Systems," *IEEE Transactions on Circuits and Systems*, IEEE Circuits and Systems Society, vol. CAS-28, No. 6, pp. 576-584 (Jun. 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, vol. 46, No. 10, pp. 1506-1518 (Oct. 1998).

Matricciani, E., "Prediction of fade durations due to rain in satellite communication systems," *Radio Science*, American Geophysical Union, vol. 32, No. 3, pp. 935-941 (May-Jun. 1997).

McQueen, J.G., "The Monitoring of High-Speed Waveforms," *Electronic Engineering*, Morgan Brothers Limited, vol. XXIV, No. 296, pp. 436-441 (Oct. 1952).

Merkelo, J. and Hall, R.D., "Broad-Band Thin-Film Signal Sampler," *IEEE Journal of Solid-State Circuits*, IEEE, vol. SC-7, No. 1, pp. 50-54 (Feb. 1972).

Merle, U. et al., "Amplitude Scintillation Cycles in a Sirio Satellite-Earth Link," *Electronics Letters*, IEE, vol. 21, No. 23, pp. 1094-1096 (Nov. 7, 1985).

Morris, D., "Radio-holographic reflector measurement of the 30-m millimeter radio telescope at 22 Ghz with a cosmic signal source," *Astronomy and Astrophysics*, Springer-Verlag, vol. 203, No. 2, pp. 399-406 (Sep. (II) 1988).

Moulsley, T.J. et al., "The efficient acquisition and processing of propagation statistics," *Journal of the Institution of Electronic and Radio Engineers*, IERE, vol. 55, No. 3, pp. 97-103 (Mar. 1985).

Ndzi, D. et al., "Wide-Band Statistical Characterization of an Over-the-Sea Experimental Transhorizon Link," *IEE Colloquium on Radio Communications at Microwave and Millimetre Wave Frequencies*, IEE, pp. 1/1-1/6 (Dec. 16, 1996).

Ndzi, D. et al., "Wideband Statistics of Signal Levels and Doppler Spread on an Over-The-Sea Transhorizon Link," *IEE Colloquium on Propagation Characteristics and Related System Techniques for Beyond Line-of-Sight Radio*, IEE, pp. 9/1-9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130-135 (Apr. 12, 1979).

Oppenheim, A.V. et al., *Signals and Systems*, Prentice-Hall, pp. 527-531 and 561-562 (1983).

Ortgies, G., "Experimental Parameters Affecting Amplitude Scintillation Measurements on Satellite Links," *Electronics Letters*, IEE, vol. 21, No. 17, pp. 771-772 (Aug. 15, 1985).

Parssinen et al., "A 2-GHz Subharmonic Sampler for Signal Downconversion," *IEEE Transactions on Microwave Microwave Theory and Techniques*, IEEE, vol. 45, No. 12, 7 pages (Dec. 1997).

Peeters, G. et al., "Evaluation of Statistical Models for Clear-Air Scintillation Prediction Using Olympus Satellite Measurements," *International Journal of Satellite Communications*, John Wiley and Sons, vol. 15, No. 2, pp. 73-88 (Mar.-Apr. 1997).

Perrey, A.G. and Schoenwetter, H.K., *NBS Technical Note 1121: A Schottky Diode Bridge Sampling Gate*, U.S. Dept. of Commerce, pp. 1-14 (May 1980).

Poulton, K. et al., "A 1-Ghz 6-bit ADC System," *IEEE Journal of Solid-State Circuits*, IEEE, vol. SC-22, No. 6, pp. 962-969 (Dec. 1987).

Press Release, "Parkervision, Inc. Announces Fiscal 1993 Results," Lippert/Heilshorn and Associates, 2 Pages (Apr. 6, 1994).

Press Release, "Parkervision, Inc. Announces the Appointment of Michael Baker to the New Position of National Sales Manager," Lippert/Heilshorn and Associates, 1 Page (Apr. 7, 1994).

Press Release, "Parkervision's Cameraman Well-Received By Distance Learning Market," Lippert/Heilshorn and Associates, 2 Pages (Apr. 8, 1994).

Press Release, "Parkervision, Inc. Announces First Quarter Financial Results," Lippert/Heilshorn and Associates, 2 Pages (Apr. 26, 1994).

Press Release, "Parkervision, Inc. Announces The Retirement of William H. Fletcher, Chief Financial Officer," Lippert/Heilshorn and Associates, 1 Page (May 11, 1994).

Press Release, "Parkervision, Inc. Announces New Cameraman System II™ At Infocomm Trade Show," Lippert/Heilshorn and Associates, 3 Pages (Jun. 9, 1994).

Press Release, "Parkervision, Inc. Announces Appointments to its National Sales Force," Lippert/Heilshorn and Associates, 2 Pages (Jun. 17, 1994).

Press Release, "Parkervision, Inc. Announces Second Quarter and Six Months Financial Results," Lippert/Heilshorn and Associates, 3 Pages (Aug. 9, 1994).

Press Release, "Parkervision, Inc. Announces Third Quarter and Nine Months Financial Results," Lippert/Heilshorn and Associates, 3 Pages (Oct. 28, 1994).

Press Release, "Parkervision, Inc. Announces First Significant Dealer Sale of Its *Cameraman®* System II," Lippert/Heilshorn and Associates, 2 Pages (Nov. 7, 1994).

Press Release, "Parkervision, Inc. Announces Fourth Quarter and Year End Results," Lippert/Heilshorn and Associates, 2 Pages (Mar. 1, 1995).

Press Release, "Parkervision, Inc. Announces Joint Product Developments With VTEL," Lippert/Heilshorn and Associates, 2 Pages (Mar. 21, 1995).

Press Release, "Parkervision, Inc. Announces First Quarter Financial Results," Lippert/Heilshorn and Associates, 3 Pages (Apr. 28, 1995).

Press Release, "Parkervision Wins Top 100 Product Districts' Choice Award," Parkervision Marketing and Manufacturing Headquarters, 1 Page (Jun. 29, 1995).

Press Release, "Parkervision National Sales Manager Next President of USDLA," Parkervision Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Financial Results," Parkervision Marketing and Manufacturing Headquarters, 2 Pages (Jul. 31, 1995).

Press Release, "Parkervision, Inc. Expands Its Cameraman System II Product Line," Parkervision Marketing and Manufacturing Headquarters, 2 Pages (Sep. 22, 1995).

Press Release, "Parkervision Announces New Camera Control Technology," Parkervision Marketing and Manufacturing Headquarters, 2 Pages (Oct. 25, 1995).

Press Release, "Parkervision, Inc. Announces Completion of VTEL/Parkervision Joint Product Line," Parkervision Marketing and Manufacturing Headquarters, 2 Pages (Oct. 30, 1995).

Press Release, "Parkervision, Inc. Announces Third Quarter and Nine Months Financial Results," Parkervision Marketing and Manufacturing Headquarters, 2 Pages (Oct. 30, 1995).

Press Release, "Parkervision's Cameraman Personal Locator Camera System Wins Telecon XV Award," Parkervision Marketing and Manufacturing Headquarters, 2 Pages (Nov. 1, 1995).

Press Release, "Parkervision, Inc. Announces Purchase Commitment From VTEL Corporation," Parkervision Marketing and Manufacturing Headquarters, 1 Page (Feb. 26, 1996).

Press Release, "ParkerVision, Inc. Announces Fourth Quarter and Year End Results," Parkervision Marketing and Manufacturing Headquarters, 2 Pages (Feb. 27, 1996).

Press Release, "ParkerVision, Inc. Expands its Product Line," Parkervision Marketing and Manufacturing Headquarters, 2 Pages (Mar. 7, 1996).

Press Release, "ParkerVision Files Patents for its Research of Wireless Technology," Parkervision Marketing and Manufacturing Headquarters, 1 Page (Mar. 28, 1996).

Press Release, "Parkervision, Inc. Announces First Significant Sale of Its Cameraman® Three-Chip System," Parkervision Marketing and Manufacturing Headquarters, 2 Pages (Apr. 12, 1996).

Press Release, "Parkervision, Inc. Introduces New Product Line For Studio Production Market," Parkervision Marketing and Manufacturing Headquarters, 2 Pages (Apr. 15, 1996).

Press Release, "Parkervision, Inc. Announces Private Placement of 800,000 Shares," Parkervision Marketing and Manufacturing Headquarters, 1 Page (Apr. 15, 1996).

Press Release, "Parkervision, Inc. Announces First Quarter Financial Results," Parkervision Marketing and Manufacturing Headquarters, 3 Pages (Apr. 30, 1996).

Press Release, "ParkerVision's New Studio Product Wins Award," Parkervision Marketing and Manufacturing Headquarters, 2 Pages (Jun. 5, 1996).

Press Release, "Parkervision, Inc. Announces Second Quarter and Six Months Financial Results," Parkervision Marketing and Manufacturing Headquarters, 3 Pages (Aug. 1, 1996).

Press Release, "Parkervision, Inc. Announces Third Quarter and Nine Months Financial Results," Parkervision Marketing and Manufacturing Headquarters, 2 Pages (Oct. 29, 1996).

Press Release, "PictureTel and ParkerVision Sign Reseller Agreement," Parkervision Marketing and Manufacturing Headquarters, 2 Pages (Oct. 30, 1996).

Press Release, "CLI and ParkerVision Bring Enhanced Ease-of-Use to Videoconferencing," CLI/Parkervision, 2 Pages (Jan. 20, 1997).

Press Release, "Parkervision, Inc. Announces Fourth Quarter and Year End Results," Parkervision Marketing and Manufacturing Headquarters, 3 Pages (Feb. 27, 1997).

Press Release, "Parkervision, Inc. Announces First Quarter Financial Results," Parkervision Marketing and Manufacturing Headquarters, 3 Pages (Apr. 29, 1997).

Press Release, "NEC and Parkervision Make Distance Learning Closer," NEC America, 2 Pages (Jun. 18, 1997).

Press Release, "Parkervision Supplies JPL with Robotic Cameras, Cameraman Shot Director for Mars Mission," Parkervision Marketing and Manufacturing Headquarters, 2 Pages (Jul. 8, 1997).

Press Release, "ParkerVision and IBM Join Forces to Create Wireless Computer Peripherals," Parkervision Marketing and Manufacturing Headquarters, 2 Pages (Jul. 23, 1997).

Press Release, "ParkerVision, Inc. Announces Second Quarter and Six Months Financial Results," Parkervision Marketing and Manufacturing Headquarters, 3 Pages (Jul. 31, 1997).

Press Release, "Parkervision, Inc. Announces Private Placement of 990,000 Shares," Parkervision Marketing and Manufacturing Headquarters, 2 Pages (Sep. 8, 1997).

Press Release, "Wal-Mart Chooses Parkervision for Broadcast Production," Parkervision Marketing and Manufacturing Headquarters, 2 Pages (Oct. 24, 1997).

Press Release, "Parkervision, Inc. Announces Third Quarter Financial Results," Parkervision Marketing and Manufacturing Headquarters, 3 Pages (Oct. 30, 1997).

Press Release, "ParkerVision Announces Breakthrough in Wireless Radio Frequency Technology," Parkervision Marketing and Manufacturing Headquarters, 3 Pages (Dec. 10, 1997).

Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).

Press Release, "Parkervision Announces Existing Agreement with IBM Terminates—Company Continues with Strategic Focus Announced in December," Parkervision Marketing and Manufacturing Headquarters, 2 Pages (Jan. 27, 1998).

Press Release, "Laboratory Tests Verify Parkervision Wireless Technology," Parkervision Marketing and Manufacturing Headquarters, 2 Pages (Mar. 3, 1998).

Press Release, "Parkervision, Inc. Announces Fourth Quarter and Year End Financial Results," Parkervision Marketing and Manufacturing Headquarters, 3 Pages (Mar. 5, 1998).

Press Release, "Parkervision Awarded Editors' Pick of Show for NAB 98," Parkervision Marketing and Manufacturing Headquarters, 2 Pages (Apr. 15, 1998).

Press Release, "Parkervision Announces First Quarter Financial Results," Parkervision Marketing and Manufacturing Headquarters, 3 Pages (May 4, 1998).

Press Release, "Parkervision 'DIRECT2DATA' Introduced in Response to Market Demand," Parkervision Marketing and Manufacturing Headquarters, 3 Pages (Jul. 9, 1998).

Press Release, "Parkervision Expands Senior Management Team," Parkervision Marketing and Manufacturing Headquarters, 2 Pages (Jul. 29, 1998).

Press Release, "Parkervision Announces Second Quarter and Six Month Financial Results," Parkervision Marketing and Manufacturing Headquarters, 4 Pages (Jul. 30, 1998).

Press Release, "Parkervision Announces Third Quarter and Nine Month Financial Results," Parkervision Marketing and Manufacturing Headquarters, 3 Pages (Oct. 30, 1998).

Press Release, "Questar Infocomm, Inc. Invests $5 Million in Parkervision Common Stock," Parkervision Marketing and Manufacturing Headquarters, 3 Pages (Dec. 2, 1998).

Press Release, "Parkervision Adds Two New Directors," Parkervision Marketing and Manufacturing Headquarters, 2 Pages (Mar. 5, 1999).

Pree Release, "Parkervision Announces Fourth Quarter and Year End Financial Results," Parkervision Marketing and Manufacturing Headquarters, 3 Pages (Mar. 5, 1999).

Press Release, "Joint Marketing Agreement Offers New Automated Production Solution," Parkervision Marketing and Manufacturing Headquarters, 2 Pages (Apr. 13, 1999).

"Project Cost 205: Scintillations in Earth-satellite links," *Alta Frequenza: Scientific Review in Electronics*, AEI, vol. LIV, No. 3, pp. 209-211 (May-Jun. 1985).

Razavi, B., *RF Microelectronics*, Prentice-Hall, pp. 147-149 (1998).

Reeves, R.J.D., "The Recording and Collocation of Waveforms (Part 1)," *Electronic Engineering*, Morgan Brothers Limited, vol. 31, No. 373, pp. 130-137 (Mar. 1959).

Reeves, R.J.D., "The Recording and Collocation of Waveforms (Part 2)," *Electronic Engineering*, Morgan Brothers Limited, vol. 31, No. 374, pp. 204-212 (Apr. 1959).

Rein, H.M. and Zahn, M., "Subnanosecond-Pulse Generator with Variable Pulsewidth Using Avalanche Transistors," *Electronics Letters*, IEE, vol. 11, No. 1, pp. 21-23 (Jan. 9, 1975).

Riad, S.M. and Nahman, N.S., "Modeling of the Feed-through Wideband (DC to 12.4 Ghz) Sampling-Head," *IEEE MTT-S International Microwave Symposium Digest*, IEEE, pp. 267-269 (Jun. 27-29, 1978).

Rizzoli, V. et al., "Computer-Aided Noise Analysis of MESFET and HEMT Mixers," *IEEE Transactions on Microwave Theory and Techniques*, IEEE, vol. 37, No. 9, pp. 1401-1410 (Sep. 1989).

Rowe, H.E., *Signals and Noise in Communication Systems*, D. Van Nostrand Company, Inc., Princeton, New Jersey, including, for example, Chapter V, Pulse Modulation Systems (1965).

Rücker, F. and Dintelmann, F., "Effect of Antenna Size on OTS Signal Scintillations and Their Seasonal Dependence," *Electronics Letters*, IEE, vol. 19, No. 24, pp. 1032-1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238-242 (Oct. 25-27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218-223 (Oct. 16-18, 1990).

Salous, S., "IF digital generation of FMCW waveforms for wideband channel characterization," *IEE Proceedings-I*, IEE, vol. 139, No. 3, pp. 281-288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched-Capacitor Biquad," *Proceedings of the IEEE*, IEEE, vol. 71, No. 8, pp. 1008-1009 (Aug. 1983).

Saul, P.H., "A GaAs MESFET Sample and Hold Switch," *Fifth European Solid State Circuits Conference-ESSCIRC 79*, IEE, pp. 5-7 (1979).

Shen, D.H. et al., "A 900-Mhz RF Front-End with Integrated Discrete-Time Filtering," *IEEE Journal of Solid-State Circuits*, IEEE Solid-State Circuits Council, vol. 31, No. 12, pp. 1945-1954 (Dec. 1996).

Shen, X.D. and Vilar, E., "Anomalous transhorizon propagation and meteorological processes of a multilink path," *Radio Science*, American Geophysical Union, vol. 30, No. 5, pp. 1467-1479 (Sep.-Oct. 1995).

Shen, X. and Tawfik, A.N., "Dynamic Behaviour of Radio Channels Due to Trans-Horizon Propagation Mechanisms," *Electronics Letters*, IEE, vol. 29, No. 17, pp. 1582-1583 (Aug. 19, 1993).

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1-4/7 (Mar. 8, 1996).

Shen, X. and Vilar, E., "Path loss statistics and mechanisms of transhorizon propagation over a sea path," *Electronics Letters*, IEE, vol. 32, No. 3, pp. 259-261 (Feb. 1, 1996).

Shen, D. et al., "A 900 MHZ Integrated Discrete-Time Filtering RF Front-End," *IEEE International Solid State Circuits Conference*, IEEE, vol. 39, pp. 54-55 and 417 (Feb. 1996).

Spillard, C. et al., "X-Band Tropospheric Transhorizon Propagation Under Differing Meteorological Conditions," *Sixth International Conference on Antennas and Propagation (ICAP 89) Part 2: Propagation*, IEE, pp. 451-455 (Apr. 4-7, 1989).

Stafford, K.R. et al., "A Complete Monolithic Sample/Hold Amplifier," *IEEE Journal of Solid-State Circuits*, IEEE, vol. SC-9, No. 6, pp. 381-387 (Dec. 1974).

Staruk, W. Jr. et al., "Pushing HF Data Rates," *Defense Electronics*, EW Communications, vol. 17, No. 5, pp. 211, 213, 215, 217, 220 and 222 (May 1985).

Stephenson, A.G., "Digitizing multiple RF signals requires an optimum sampling rate," *Electronics*, McGraw-Hill, pp. 106-110 (Mar. 27, 1972).

Sugarman, R. "Sampling Oscilloscope for Statistically Varying Pulses," *The Review of Scientific Instruments*, American Institute of Physics, vol. 28, No. 11, pp. 933-938 (Nov. 1957).

Sylvain, M., "Experimental probing of multipath microwave channels," *Radio Science*, American Geophysical Union, vol. 24, No. 2, pp. 160-178 (Mar.-Apr. 1989).

Takano, T., "Novel GaAs Pet Phase Detector Operable To Ka Band," *IEEE MT-S Digest*, IEEE, pp. 381-383 (1984).

Tan, M.A., "Biquadratic Transconductance Switched-Capacitor Filters," *IEEE Transactions on Circuits and Systems-I: Fundamental Theory and Applications*, IEEE Circuits and Systems Society, vol. 40, No. 4, pp. 272-275 (Apr. 1993).

Tanaka, K. et al., "Single Chip Multisystem AM Stereo Decoder IC," *IEEE Transactions on Consumer Electronics*, IEEE Consumer Electronics Society, vol. CE-32, No. 3, pp. 482-496 (Aug. 1986).

Tawfik, A.N., "Amplitude, Duration and Predictability of Long Hop Trans-Horizon X-band Signals Over the Sea," *Electronics Letters*, IEE, vol. 28, No. 6, pp. 571-572 (Mar. 12, 1992).

Tawfik, A.N. and Vilar, E., "Correlation of Transhorizon Signal Level Strength with Localized Surface Meteorological Parameters," *Eighth International Conference on Antennas and Propagation*, Electronics Division of the IEE, pp. 335-339 (Mar. 30-Apr. 2, 1993).

Tawfik, A.N. and Vilar, E., "Dynamic Structure of a Transhorizon Signal at X-band Over a Sea Path," *Sixth International Conference on Antennas and Propagation (ICAP 89) Part 2: Propagation*, IEE, pp. 446-450 (Apr. 4-7, 1989).

Tawfik, A.N. and Vilar, E., "Statistics of Duration and Intensity of Path Loss in a Microwave Transhorizon Sea-Path," *Electronics Letters*, IEE, vol. 26, No. 7, pp. 474-476 (Mar. 29, 1990).

Tawfik, A.N. and Vilar, E., "X-Band Transhorizon Measurements of CW Transmissions Over the Sea- Part 1: Path Loss, Duration of Events, and Their Modeling," *IEEE Transactions on Antennas and Propagation*, IEEE Antennas and Propagation Society, vol. 41, No. 11, pp. 1491-1500 (Nov. 1993).

Temes, G.C. and Tsividis, T., "The Special Section on Switched-Capacitor Circuits," *Proceedings of the IEEE*, IEEE, vol. 71, No. 8, pp. 915-916 (Aug. 1983).

Thomas, G.B., *Calculus and Analytic Geometry*, Third Edition, Addison-Wesley Publishing, pp. 119-133 (1960).

Tomassetti, Q., "An Unusual Microwave Mixer," *16th European Microwave Conference*, Microwave Exhibitions and Publishers, pp. 754-759 (Sep. 8-12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1-3 (Jan. 1984).

Tsividis, Y. and Antognetti, P. (Ed.), *Design of MOS VLSI Circuits for Telecommunications*, Prentice-Hall, p. 304 (1985).

Tsividis, Y., "Principles of Operation and Analysis of Switched-Capacitor Circuits," *Proceedings of the IEEE*, IEEE, vol. 71, No. 8, pp. 926-940 (Aug. 1983).

Tsurumi, H. and Maeda, T., "Design Study on a Direct Conversion Receiver Front-End for 280 MHZ, 900 MHZ, and 2.6 Ghz Band Radio Communication Systems," *41st IEEE Vehicular Technology Conference*, IEEE Vehicular Technology Society, pp. 457-462 (May 19-22, 1991).

Valdmanis, J.A. et al., "Picosecond and Subpicosend Optoelectronics for Measurements of Future High Speed Electronic Devices," *IEDM Technical Digest*, IEEE, pp. 597-600 (Dec. 5-7, 1983).

van de Kamp, M.M.J.L., "Asymmetric signal level distribution due to tropospheric scintillation," *Electronics Letters*, IEE, vol. 34, No. 11, pp. 1145-1146 (May 28, 1998).

Vasseur, H. and Vanhoenacker, D., "Characterization of tropospheric turbulent layers from radiosonde data," *Electronics Letters*, IEE, vol. 34, No. 4, pp. 318-319 (Feb. 19, 1998).

Verdone, R., "Outage Probability Analysis for Short-Range Communication Systems at 60 Ghz in ATT Urban Environments," *IEEE Transactions on Vehicular Technology*, IEEE Vehicular Technology Society, vol. 46, No. 4, pp. 1027-1039 (Nov. 1997).

Vierira-Ribeiro, S.A., *Single-IF DECT Receiver Architecture using a Quadrature Sub-Sampling Band-Pass Sigma-Delta Modulator*, Thesis for Degree of Master's of Engineering, Carleton University, UMI Dissertation Services, pp. 1-180 (Apr. 1995).

Vilar, E. et al., "A Comprehensive/Selective MM-Wave Satellite Downlink Experiment on Fade Dynamics," *Tenth International Conference on Antennas and Propagation*, Electronics Division of the IEE, pp. 2.98-2.101 (Apr. 14-17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8-1-8-16 (Oct. 4-7, 1983).

Vilar, E. and Smith, H., "A Theoretical and Experimental Study of Angular Scintillations in Earth Space Paths," *IEEE Transactions on Antennas and Propagation*, IEEE, vol. AP-34, No. 1, pp. 2-10 (Jan. 1986).

Vilar, E. et al., "A Wide Band Transhorizon Experiment at 11.6 Ghz," *Eighth International Conference on Antennas and Propagation*, Electronics Division of the IEE, pp. 441-445 (Mar. 30-Apr. 2, 1993).

Vilar, E. and Matthews, P.A. "Amplitude Dependence of Frequency in Oscillators," *Electronics Letters*, IEE, vol. 8, No. 20, pp. 509-511 (Oct. 5, 1972).

Vilar, E. et al., "An experimental mm-wave receiver system for measuring phase noise due to atmospheric turbulence," *Proceedings of the 25th European Microwave Conference*, Nexus House, pp. 114-119 (1995).

Viler, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306-1312 (Sep. 1991).

Vilar, E. et al., "Angle of Arrival Fluctuations in High and Low Elevation Earth Space Paths," *Fourth International Conference on Antennas and Propagation (ICAP 85)*, Electronics Division of the IEE, pp. 83-88 (Apr. 16-19, 1985).

Vilar, E., "Antennas and Propagation: A Telecommunications Systems Subject," *Electronics Division Colloquium on Teaching Antennas and Propagation to Undergraduates*, IEE, pp. 7/1-7/6 (Mar. 8, 1988).

Vilar, E. et al., "CERS*. Millimetre-Wave Beacon Package and Related Payload Doppler Correction Strategies," *Electronics Division Colloquium on CERS- Communications Engineering Research Satellite*, IEE, pp. 10/1-10/10 (Apr. 10, 1984).

Vilar, E. and Moulsley, T.J., "Comment and Reply: Probability Density Function of Amplitude Scintillations," *Electronics Letters*, IEE, vol. 21, No. 14, pp. 620-622 (Jul. 4, 1985).

Vilar, E. et al., "Comparison of Rainfall Rate Duration Distributions for ILE-IFE and Barcelona," *Electronics Letters*, IEE, vol. 28, No. 20, pp. 1922-1924 (Sep. 24, 1992).

Vilar, E., "Depolarization and Field Transmittances in Indoor Communications," *Electronics Letters*, IEE, vol. 27, No. 9, pp. 732-733 (Apr. 25, 1991).

Viler, E. and Larsen, J.R. "Elevation Dependence of Amplitude Scintillations on Low Elevation Earth Space Paths," *Sixth International Conference on Antennas and Propagation (ICAP 89) Part 2: Propagation*, IEE, pp. 150-154 (Apr. 4-7, 1989).

Vilar, E. et al., "Experimental System and Measurements of Transhorizon Signal Levels at 11 Ghz," *18th European Microwave Conference*, Microwave Exhibitions and Publishers Ltd., pp. 429-435 (Sep. 12-15, 1988).

Vilar, E. and Matthews, P.A., "Importance of Amplitude Scintillations in Millimetric Radio Links," *Proceedings of the 4th European Microwave Conference*, Microwave Exhibitions and Publishers, pp. 202-206 (Sep. 10-13, 1974).

Vilar, E. and Haddon, J., "Measurement and Modeling of Scintillation Intensity to Estimate Turbulence Parameters in an Earth-Space Path," *IEEE Transactions on Antennas and Propagation*, IEEE Antennas and Propagation Society, vol. AP-32, No. 4, pp. 340-346 (Apr. 1984).

Vilar, E. and Matthews, P.A., "Measurement of Phase Fluctuations on Millimetric Radiowave Propagation," *Electronics Letters*, IEE, vol. 7, No. 18, pp. 566-568 (Sep. 9, 1971).

Vilar, E. and Wan, K.W., "Narrow and Wide Band Estimates of Field Strength for Indoor Communications in the Millimetre Band," *Electronics Division Colloquium on Radiocommunications in the Range 30-60 Ghz*, IEE, pp. 5/1-5/8 (Jan. 17, 1991).

Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink," *Electronics Letters*, IEE, vol. 33, No. 22, pp. 1901-1902 (Oct. 23, 1997).

Vilar, E. et al.,"Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230-2.233 (Apr. 14-17, 1997).

Vilar, E. and Haddon, J., "Scintillation Modeling and Measurement—A Tool for Remote-Sensing Slant Paths," *AGARD Conference Proceedings No. 332: Propagation Aspects of Frequency Sharing, Interference And System Diversity*, AGARD, pp. 27-1-27-13 (Oct. 18-22, 1982).

Vilar, E., "Some Limitations on Digital Transmission Through Turbulent Atmosphere," *International Conference on Satellite Communication Systems Technology*, Electronics Division of the IEE, pp. 169-187 (Apr. 7-10, 1975).

Vilar, E. and Matthews, P.A., "Summary of Scintillation Observations in a 36 Ghz Link Across London," *International Conference on Antennas and Propagation Part 2: Propagation*, IEE, pp. 36-40 (Nov. 28-30, 1978).

Vilar, E. et al., "Wideband Characterization of Scattering Channels," *Tenth International Conference on Antennas and Propagation*, Electronics Division of the IEE, pp. 2.353-2.358 (Apr. 14-17, 1997).

Vollmer, A. "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1-11 (Nov. 1986).

Wan, K.W. et al., "A Novel Approach to the Simultaneous Measurement of Phase and Amplitude Noises in Oscillator," *Proceedings of the 19th European Microwave Conference*, Microwave Exhibitions and Publishers Ltd., pp. 809-813 (Sep. 4-7, 1989).

Wan, K.W. et al., "Extended Variances and Autoregressive/Moving Average Algorithm for the Measurement and Synthesis of Oscillator Phase Noise," *Proceedings Of the 43rd Annual Symposium on Frequency Control*, IEEE, pp. 331-335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1-3/5 (Dec. 3, 1993).

Wang, H., "A 1-V Multigigahertz RF Mixer Core in 0.5—µm CMOS," *IEEE Journal of Solid-State Circuits*, IEEE Solid-State Circuits Society, vol. 33, No. 12, pp. 2265-2267 (Dec. 1998).

Watson, A.W.D. et al., "Digital Conversion and Signal Processing for High Performance Communications Receivers," *Digital Processing of Signals in Communications*, Institution of Electronic and Radio Engineers, pp. 367-373 (Apr. 22-26, 1985).

Weast, R.C. et al. (Ed.), *Handbook of Mathematical Tables*, Second Edition, The Chemical Rubber Co., pp. 480-485 (1964).

Wiley, R.G., "Approximate FM Demodulation Using Zero Crossings," *IEEE Transactions on Communications*, IEEE, vol. COM-29, No. 7, pp. 1061-1065 (Jul. 1981).

Worthman, W., "Convergence . . . Again," *RF Design*, Primedia, p. 102 (Mar. 1999).

Young, I.A. And Hodges, D.A., "MOS Switched-Capacitor Analog Sampled-Data Direct-Form Recursive Filters," *IEEE Journal of Solid-State Circuits*, IEEE, vol. SC-14, No. 6, pp. 1020-1033 (Dec. 1979).

Translation of Specification and Claims of FR Patent No. 2245130, 3 pages (Apr. 18, 1975- Date of publication of application).

Fest, Jean-Pierre, "Le Convertisseur A/N Revolutionne Le Recepteur Radio," *Electronique*, JMJ (Publisher), No. 54, pp. 40-42 (Dec. 1995).

Translation of DE Patent No. 35 41 031 A1, 22 pages (May 22, 1986- Date of publication of application).

Translation of EP Patent No. 0 732 803 A1, 9 pages (Sep. 18, 1996- Date of publication of application).

Fest, Jean-Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages (Jul. 16, 1998- Date of publication of application).

Miki, S. and Nagahama, R., *Modulation System II*, Common Edition 7, Kyoritsu Publishing Co., Ltd., pp. 146-154 (Apr. 30, 1956).

Miki, S. and Nagahama, R., *Modulation System II*, Common Edition 7, Kyoritsu Publishing Co., Ltd., pp. 146-149 (Apr. 30, 1956). (Partial Translation of Doc. AQ51).

Rabiner, L.R. and Gold, B., *Theory And Application Of Digital Signal Processing*, Prentice-Hall, Inc., pp. v-xii and 40-46 (1975).

English-language Abstract of Japanese Patent Publication No. 08-032556, from http://www1.ipdl.jpo.go.jp, 2 Pages (Feb. 2, 1996—Date of publication of application).

English-language Abstract of Japanese Patent Publication No. 08-139524, from http://www1.ipdl.jpo.go.jp, 2 Pages (May 31, 1996—Date of publication of application).

English-language Abstract of Japanese Patent Publication No. 59-144249, from http://www1.ipdl.jpo.go.jp, 2 Pages (Aug. 18, 1984—Date of publication of application).

English-language Abstract of Japanese Patent Publication No. 63-054002, from http://www1.ipdl.jpo.go.jp, 2 Pages (Mar. 8, 1988—Date of publication of application).

English-language Abstract of Japanese Patent Publication No. 06-237276, from http://www1.ipdl.jpo.go.jp, 2 Pages (Aug. 23, 1994—Date of publication of application).

English-language Abstract of Japanese Patent Publication No. 08-023359, from http://www1.ipdl.jpo.go.jp, 2 Pages (Jan. 23, 1996—Date of publication of application).

Translation of Japanese Patent Publication No. 47/2314, 7 Pages (Feb. 4, 1972- Date of publication of application).

Partial Translation of Japanese Patent Publication No. 58-7903, 3 Pages (Jan. 17, 1983- Date of publication of application).

English-language Abstract of Japanese Patent Publication No. 58-133003, from http://www1.ipdl.jpo.go.jp, 2 Pages (Aug. 8, 1993—Date of publication of application.

English-language Abstract of Japanese Patent Publication No. 60-058705, from http://www1.ipdl.jpo.go.jp, 2 Pages (Apr. 4, 1985—Date of publication of application).

English-language Abstract of Japanese Patent Publication No. 04-123614, from http://www1.ipdl.jpo.go.jp, 2 Pages (Apr. 23, 1992—Date of publication of application).

English-language Abstract of Japanese Patent Publication No. 04-127601, from http://www1.ipdl.jpo.go.jp, 2 Pages (Apr. 28, 1992—Date of publication of application).

English-language Abstract of Japanese Patent Publication No. 05-175730, from http://www1.ipdl.jpo.go.jp, 2 Pages (Jul. 13, 1993—Date of publication of application).

English-language Abstract of Japanese Patent Publication No. 05-175734, from http://www1.ipdl.jpo.go.jp, 2 Pages (Jul. 13, 1993—Date of publication of application).

English-language Abstract of Japanese Patent Publication No. 07-154344, from http://www1.ipdl.jpo.go.jp, 2 Pages (Jun. 16, 1995—Date of publication of application).

English-language Abstract of Japanese Patent Publication No. 07-307620, from http://www1.ipdl.jpo.go.jp, 2 Pages (Nov. 21, 1995—Date of publication of application).

Oppenheim, A.V. and Schafer, R.W., *Digital Signal Processing*, Prentice-Hall, pp. vii-x, 6-35, 45-78, 87-121 and 136-165 (1975).

English-language Abstract of Japanese Patent Publication No. 55-066057, from http://www1.ipdl.jpo.go.jp, 2 Pages (May 19, 1980—Date of publication of application).

English-language Abstract of Japanese Patent Publication No. 63-065587, from http://www1.ipdl.jpo.go.jp, 2 Pages (Mar. 24, 1988—Date of publication of application).

English-language Abstract of Japanese Patent Publication No. 63-153691, from http://www1.ipdl.jpo.go.jp, 2 Pages (Jun. 27, 1988—Date of publication of application).

Translation of Japanese Patent Publication No. 60-130203, 3 Pages (Jul. 11, 1985- Date of publication of application).

Razavi, B., "A 900-MHz/1.8-Ghz CMOS Transmitter for Dual-Band Applications," *Symposium on VLSI Circuits Digest of Technical Papers*, IEEE, pp. 128-131 (1998).

Ritter, G.M., "SDA, A New Solution for Transceivers," *16th European Microwave Conference*, Microwave Exhibitions and Publishers, pp. 729-733 (Sep. 8, 1986).

Dialog File 351 (Derwent WPI) English Language Patent Abstract for FR 2 669 787, 1 page (May 29, 1992- Date of publication of application).

Akos, D.M. et al., "Direct Bandpass Sampling of Multiple Distinct RF Signals," *IEEE Transactions on Communications*, IEEE, vol. 47, No. 7, pp. 983-988 (Jul. 1999).

Patel, M. et al., "Bandpass Sampling for Software Radio Receivers, and the Effect of Oversampling on Aperture Jitter," *VTC 2002*, IEEE, pp. 1901-1905 (2002).

English-language Abstract of Japanese Patent Publication No. 61-030821, from http://www1.ipdl.jpo.go.jp, 2 Pages (Feb. 13, 1986- Date of publication of application).

English-language Abstract of Japanese Patent Publication No. 05-327356, from http://www1.ipdl.jpo.go.jp, 2 Pages (Dec. 10, 1993—Date of publication of application).

Tayloe, D., "A Low-noise, High-performance Zero IF Quadrature Detector/Preamplifier," *RF Design*, Primedia Business Magazines & Media, Inc., pp. 58, 60, 62 and 69 (Mar. 2003).

Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117-120 (Apr. 1996).

Simoni, A. et al., "A Digital Camera for Machine Vision," *20th International Conference on Industrial Electronics, Control and Instrumentation*, IEEE, pp. 879-883 (Sep. 1994).

Stewart, R.W. and Pfann, E., "Oversampling and sigma-delta strategies for data conversion," *Electronics & Communication Engineering Journal*, IEEE, pp. 37-47 (Feb. 1998).

Rudell, J.C. et al., "A 1.9-Ghz Wide-Band IF Double Conversion CMOS Receiver for Cordless Telephone Applications," *IEEE Journal of Solid-State Circuits*, IEEE, vol. 32, No. 12, pp. 2071-2088 (Dec. 1997).

English-language Abstract of Japanese Patent Publication No. 09-036664, from http://www1.ipdl.jpo.go.jp, 2 Pages (Feb. 7, 1997—Date of publication of application).

Simoni, A. et al., "A Single-Chip Optical Sensor with Analog Memory for Motion Detection," *IEEE Journal of Solid-State Circtuits*, IEEE, vol. 30, No. 7, pp. 800-806 (Jul. 1995).

English Translation of German Patent Publication No. DE 196 48 915 A1, 10 pages.

Deboo, Gordon J., *Integrated Circuits and Semiconductor Devices*, 2nd Edition, McGraw-Hill, Inc., pp. 41-45 (1977).

Hellwarth, G.A. and Jones, G.D, "Automatic Conditioning of Speech Signals," *IEEE Transactions on Audio and Electroacoustics*, vol. AU-16, No. 2, pp. 169-179 (Jun. 1968).

English Abstract for German Patent No. DE 692 21 098 T2, 1 page, data supplied from the espacenet.

Gaudiosi, J., "Retailers will bundle Microsoft's Xbox with games and peripherals," *Video Store Magazine*, vol. 23, Issue 36, p. 8, 2 pages (Sep. 2-8, 2001).

English translation of German Patent DE 1936252, 12 pages.

English-language Abstract of Japanese Patent Publication No. JP 58-031622, data supplied by ep.espacenet.com, 1 page (Feb. 24, 1983—Date of publication of application).

English-language Abstract of Japanese Patent Publication No. JP 61-245749, data supplied by ep.espacenet.com, 1 page (Nov. 1, 1986—Date of publication of application).

English-language Abstract of Japanese Patent Publication No. JP 64-048557, data supplied by ep.espacenet.com, 1 page (Feb. 23, 1989—Date of publication of application).

English-language Abstract of Japanese Patent Publication No. JP 59-022438, data supplied by ep.espacenet.com, 1 page (Feb. 4, 1984—Date of publication of application).

English-language Abstract of Japanese Patent Publication No. JP 59-123318, data supplied by ep.espacenet.com, 1 page (Jul. 17, 1984—Date of publication of application).

English-language Abstract of Japanese Patent Publication No. JP 61-193521, data supplied by ep.espacenet.com, 1 page (Aug. 28, 1986—Date of publication of application).

English-language Abstract of Japanese Patent Publication No. JP 62-047214, data supplied by ep.espacenet.com, 1 page (Feb. 28, 1987—Date of publication of application).

English-language Abstract of Japanese Patent Publication No. JP 63-274214, data supplied by ep.espacenet.com, 1 page (Nov. 11, 1988—Date of publication of application).

English-language Abstract of Japanese Patent Publication No. JP 7-169292, data supplied by ep.espacenet.com, 1 page (Jul. 4, 1995 - Date of publication of application).

English-language Abstract of Japanese Patent Publication No. JP 10-22804, data supplied by ep.espacenet.com, 1 page (Jan. 23, 1998 - Date of publication of application).

English-language Abstract of Japanese Patent Publication No. JP 8-288882, data supplied by ep.espacenet.com, 1 page (Nov. 1, 1996- Date of publication of application).

\* cited by examiner

IMPEDANCE MATCHED ALIASING MODULE

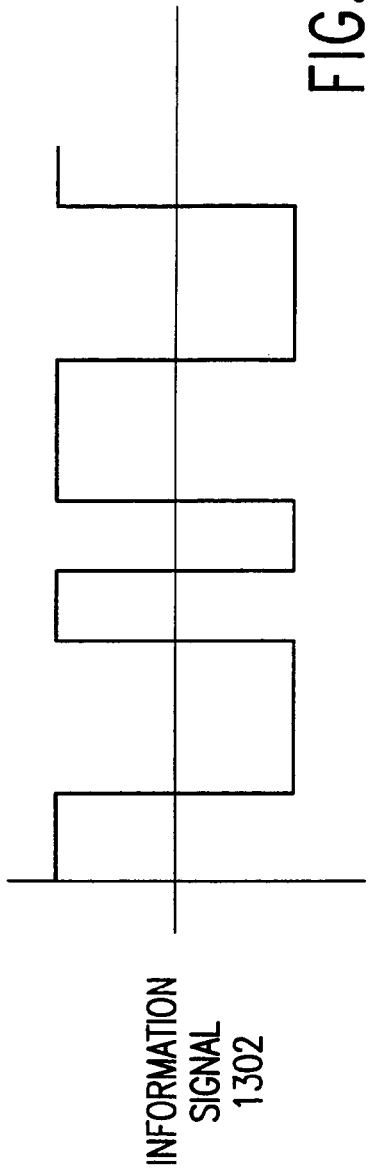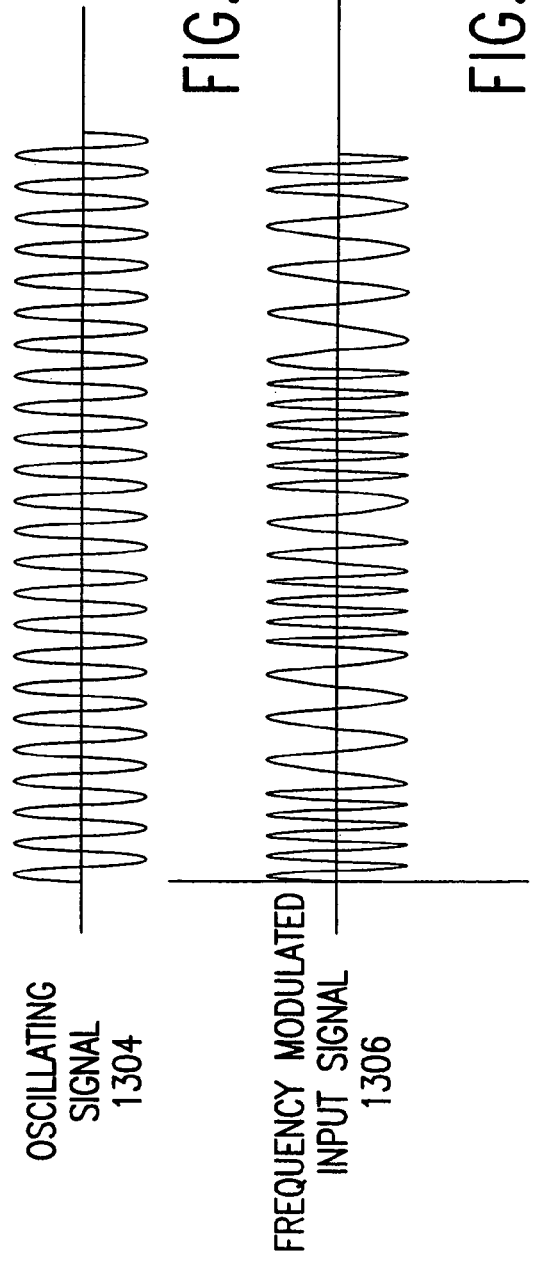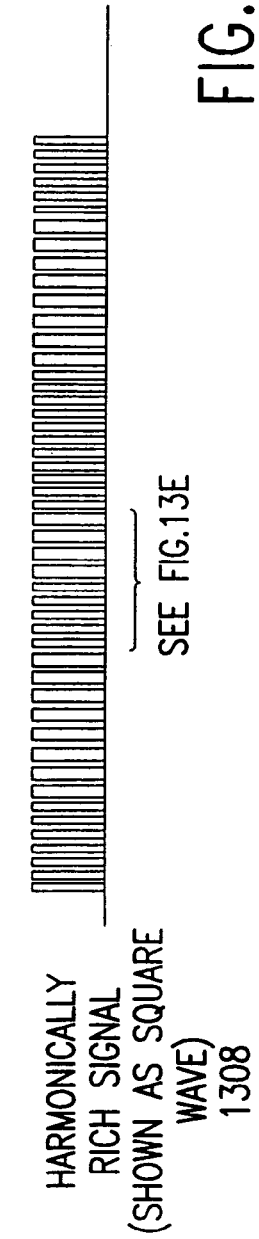
FIG. 13A
FIG. 13B
FIG. 13C
FIG. 13D
INFORMATION SIGNAL 1302
OSCILLATING SIGNAL 1304
FREQUENCY MODULATED INPUT SIGNAL 1306
HARMONICALLY RICH SIGNAL (SHOWN AS SQUARE WAVE) 1308
SEE FIG.13E

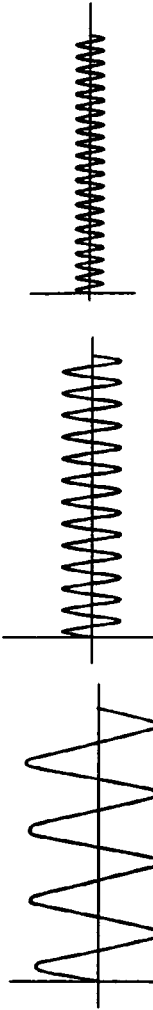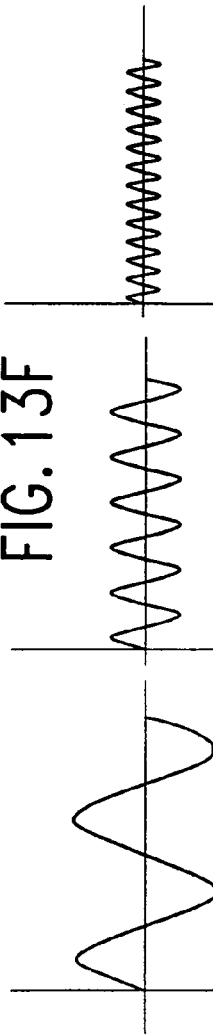

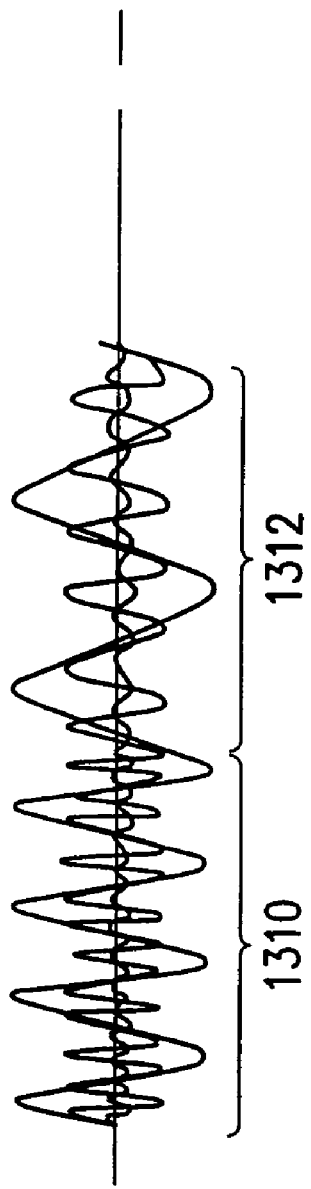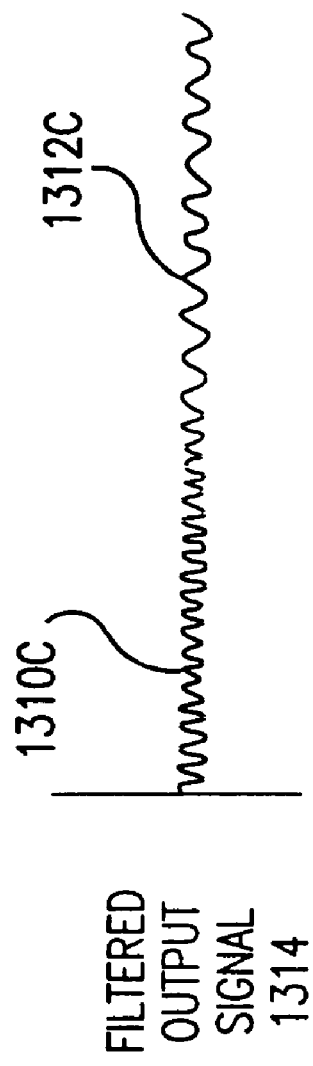

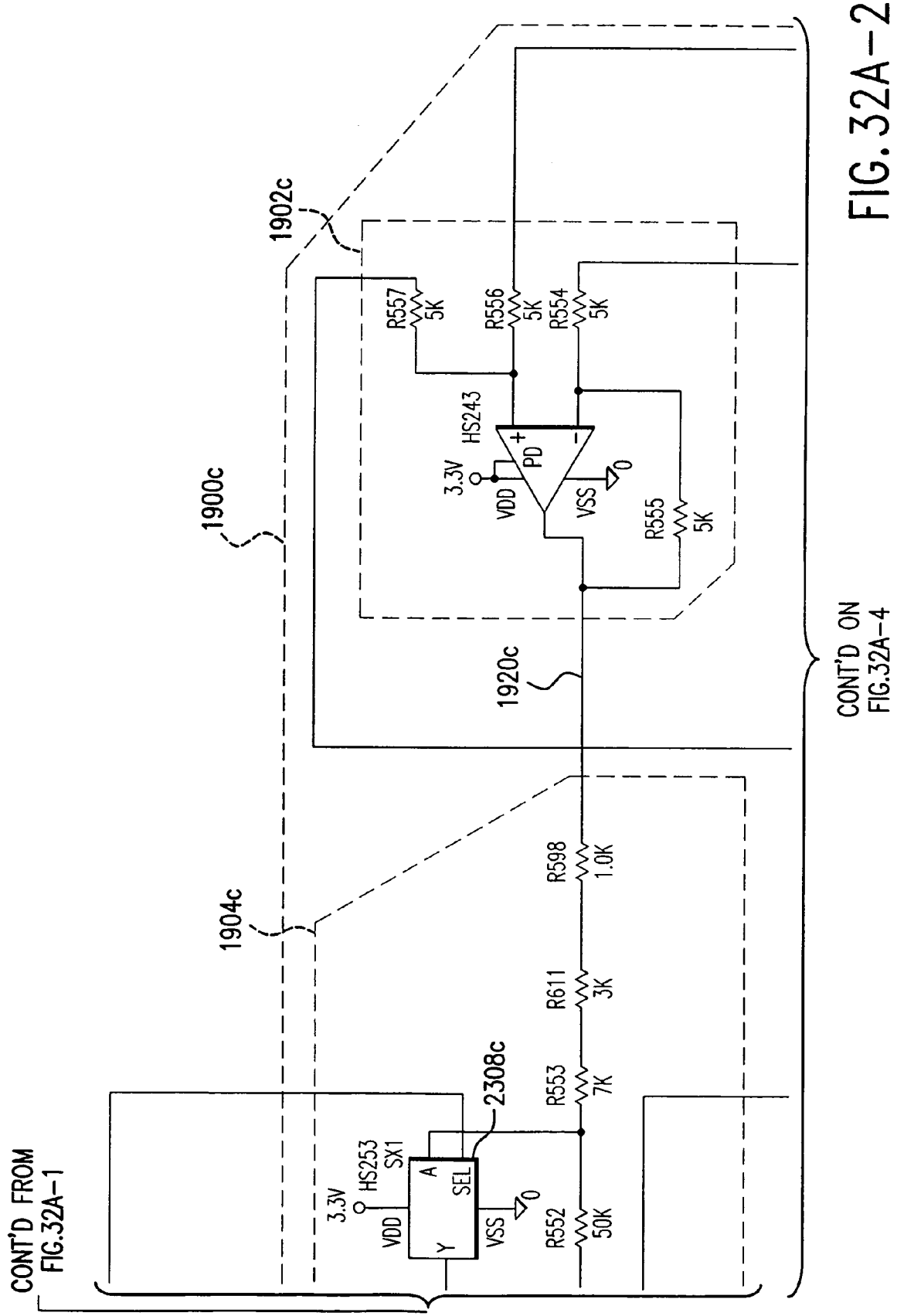

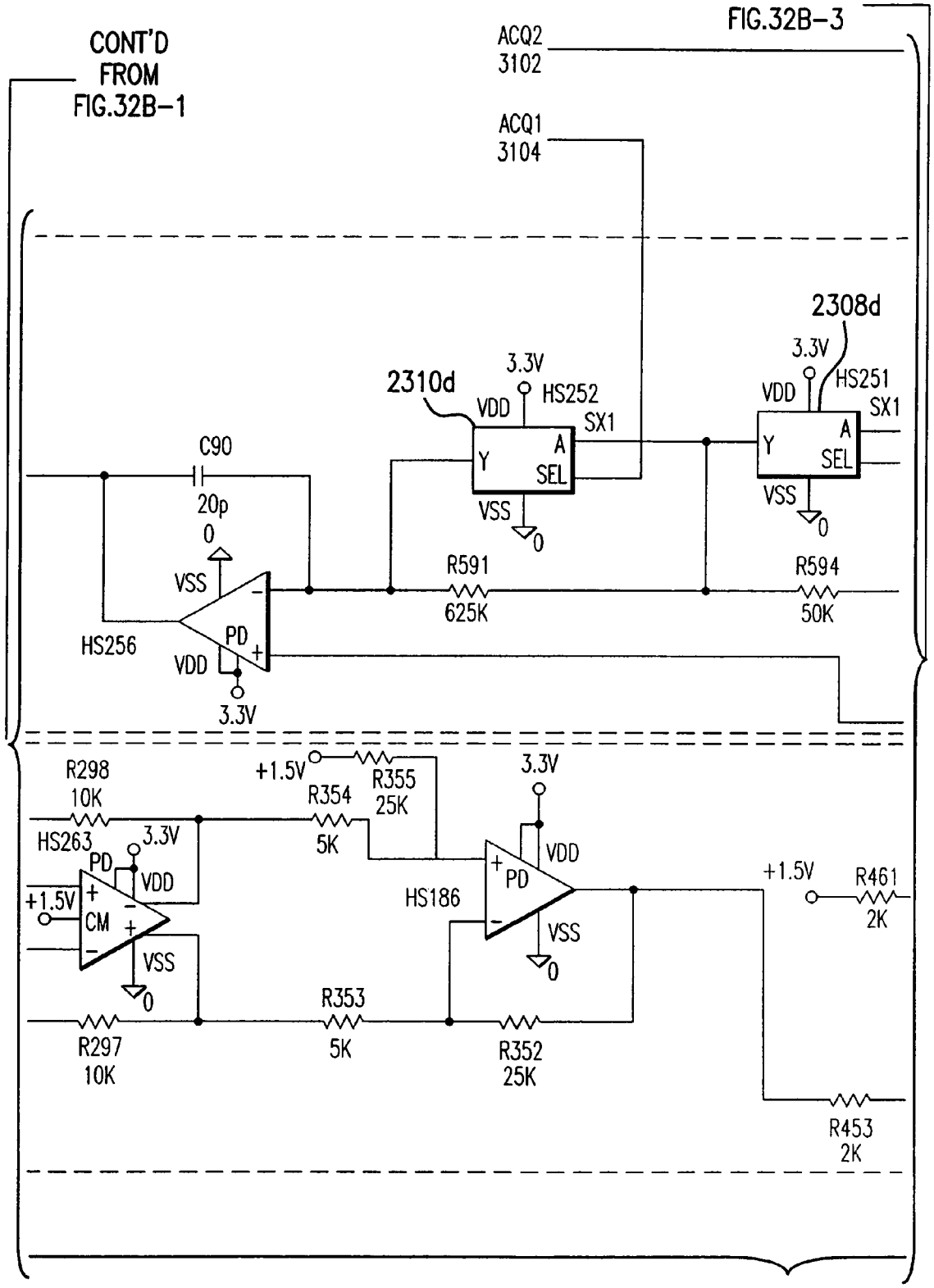
FIG. 32B-2   1900d, 1612

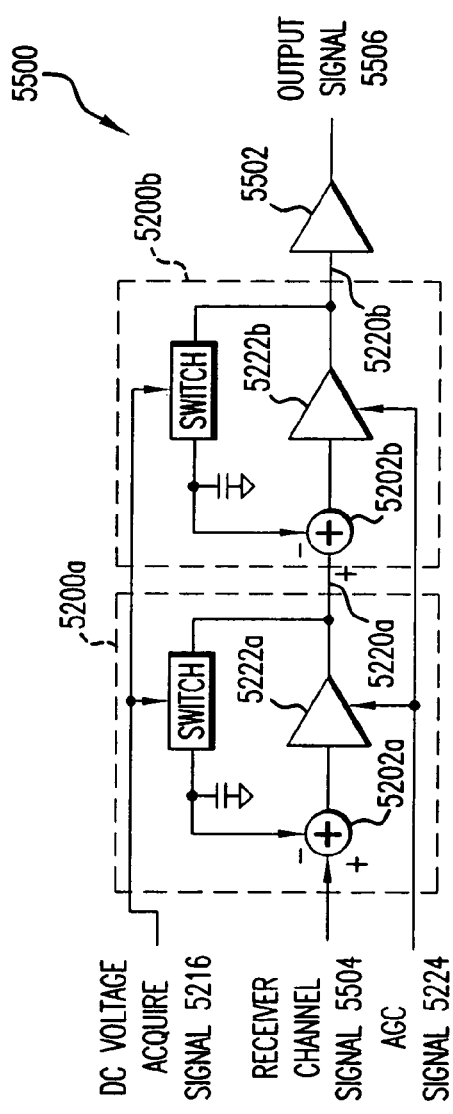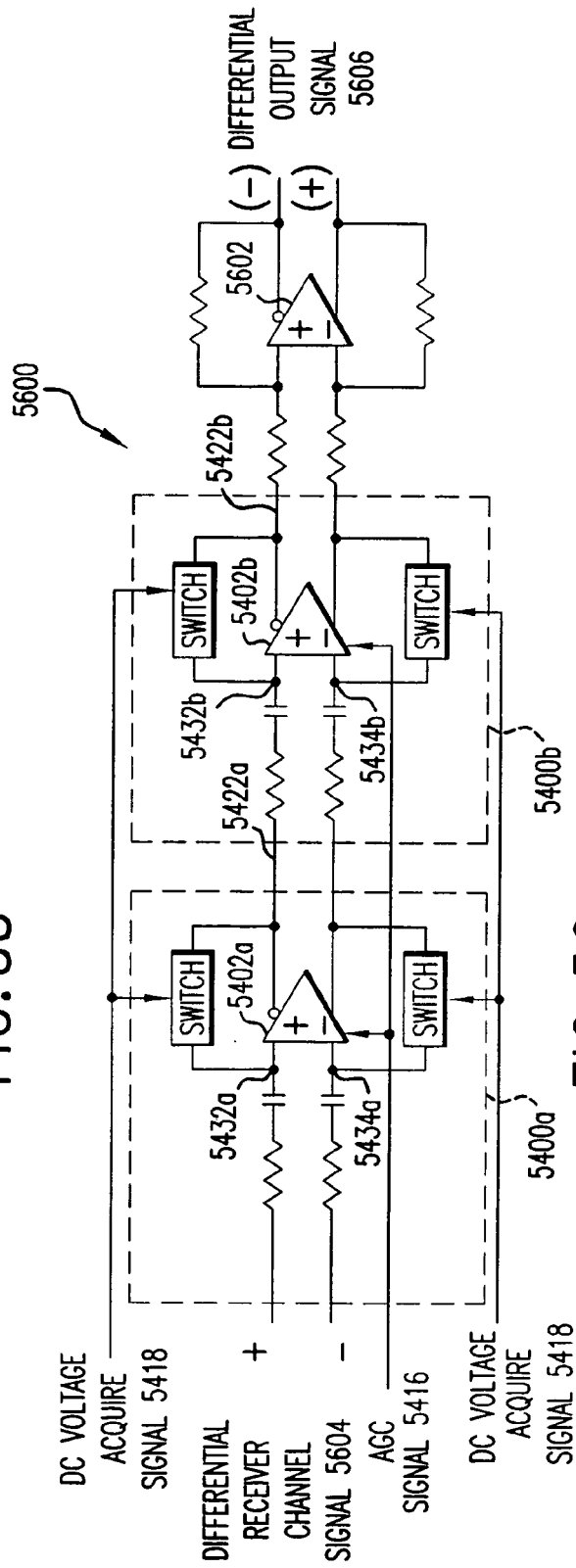

$$\text{GAIN}(T) \propto [V_{gain} - V_{th}(T)]^2 * K(T)$$

GAIN CONTROL IN A COMMUNICATION CHANNEL

CROSS-REFERENCE TO RELATED APPLICATIONS

This is a divisional application of U.S. application Ser. No. 09/986,764, filed Nov. 9, 2001, now U.S. Pat. No. 7,085,335, and is a continuation of U.S. application Ser. No. 10/289,377, filed Nov. 7, 2002, now U.S. Pat. No. 7,072,427, which is a continuation-in-part of application Ser. No. 09/986,764, filed Nov. 9, 2001, now U.S. Pat. No. 7,085,335, and claims the benefit of U.S. Provisional Application No. 60/384,840, filed Jun. 4, 2002, all of which are herein incorporated by reference in their entireties.

STATEMENT REGARDING FEDERALLY-SPONSORED RESEARCH AND DEVELOPMENT

Not applicable.

REFERENCE TO MICROFICHE APPENDIX/SEQUENCE LISTING/TABLE/COMPUTER PROGRAM LISTING APPENDIX (Submitted on a Compact Disc and an Incorporation-by-reference of the Material on the Compact Disc)
Not applicable.

BACKGROUND OF THE INVENTION

1. Field of the Invention

The present invention relates to frequency conversion of electromagnetic (EM) signals. More particularly, the present invention relates to reducing or eliminating DC offset voltages when down-converting a signal in a communication system.

2. Background Art

Electromagnetic (EM) information signals (baseband signals) include, but are not limited to, video baseband signals, voice baseband signals, computer baseband signals, etc. Baseband signals include analog baseband signals and digital baseband signals. It is often beneficial to propagate baseband signals at higher frequencies. Conventional up-conversion processes use modulation techniques to modulate higher frequency carrier signals with the baseband signals, to form modulated carrier signals.

Numerous problems exist in attempting to accurately receive or down-convert modulated carrier signals in communication systems. One such problem is when unwanted DC offset voltages exist in receiver channels. A DC offset voltage may enter a receiver channel by way of receiver channel down-conversion circuitry components, for example. This unwanted DC offset can enter a receiver channel, and cause the receiver channel to become saturated. For example, DC offset may saturate a receiver channel when it is amplified by gain amplifiers in the receiver channel, such that a voltage rail is reached or exceeded. Furthermore, any DC offset in the receiver channel has the effect of competing with the signal of interest, producing a statistical bias much like an interference. Hence, it is desirable to reduce or entirely eliminate unwanted DC offset voltages from receiver channels. Furthermore, the DC offset voltages must be removed without distorting the signal of interest.

BRIEF SUMMARY OF THE INVENTION

Methods and apparatuses for reducing DC offsets in a communication system are described. In a first embodiment, a first receiver channel signal is received from a first receiver channel node. The first receiver channel signal is integrated to generate an integrated signal. The integrated signal is summed with a second receiver channel signal at a second receiver channel node. The first receiver channel node is downstream from the second receiver channel node in the receiver channel.

In an embodiment, a feedback loop circuit is used to reduce DC offsets in the WLAN receiver channel, according to the above stated method. A receiver channel signal is coupled as a first input to a summing node in the receiver channel. An integrator has an input coupled to a second node of the receiver channel. An output of the integrator is coupled as a second input to the summing node.

The frequency response of the feedback loop circuit may be variable. In such an embodiment, the integrator has a frequency response that may be controlled to vary the frequency response of the feedback loop circuit. By varying the frequency response of the feedback loop circuit, the frequency response of the receiver channel may be varied. For example, the integrator frequency response may be varied to vary the frequency response of the receiver channel to a first frequency response, a second frequency response, and a third frequency response. Each of the three frequency responses have a corresponding lower 3 dB frequency. The first frequency response may have a relatively low lower 3 dB frequency. The second frequency response may have a relatively medium lower 3 dB frequency. The third frequency response may have a relatively greater lower 3 dB frequency.

In a second embodiment, a circuit provides gain control in a communication system, such as a WLAN receiver channel. A first automatic gain control (AGC) amplifier is coupled in a first portion of the receiver channel. A second AGC amplifier is coupled in a second portion of the receiver channel. The second AGC amplifier receives a first AGC signal. The first AGC amplifier receives a second AGC signal. The first and second AGC signals are related to each other. In an example embodiment, a multiplier receives the first AGC signal and outputs the second AGC signal.

In a third embodiment, DC offsets in a communication system are reduced. A DC offset voltage is received from a first node of the receiver channel. The voltage is stored. The stored voltage is de-coupled from the first node. At a second node in the receiver channel the stored voltage is subtracted from a receiver channel signal. The first node is downstream from the second node in the receiver channel.

In an embodiment, a circuit is used to reduce DC offsets in a WLAN receiver channel according to the above stated method. A summing node in the receiver channel receives as a first input a receiver channel signal. A storage element has a terminal coupled as a second input to the summing node. A switch is coupled between a second node of the receiver channel and the terminal of the storage element.

Methods and apparatuses for monitoring DC offset, and for providing control signals for varying the frequency response of the DC offset reducing circuits are provided. In an embodiment, a window comparator module determines whether a DC offset in each of an I channel input signal and a Q channel input signal is within an acceptable range. In an embodiment, a state machine generates the control signals that vary circuit frequency responses.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 7A:
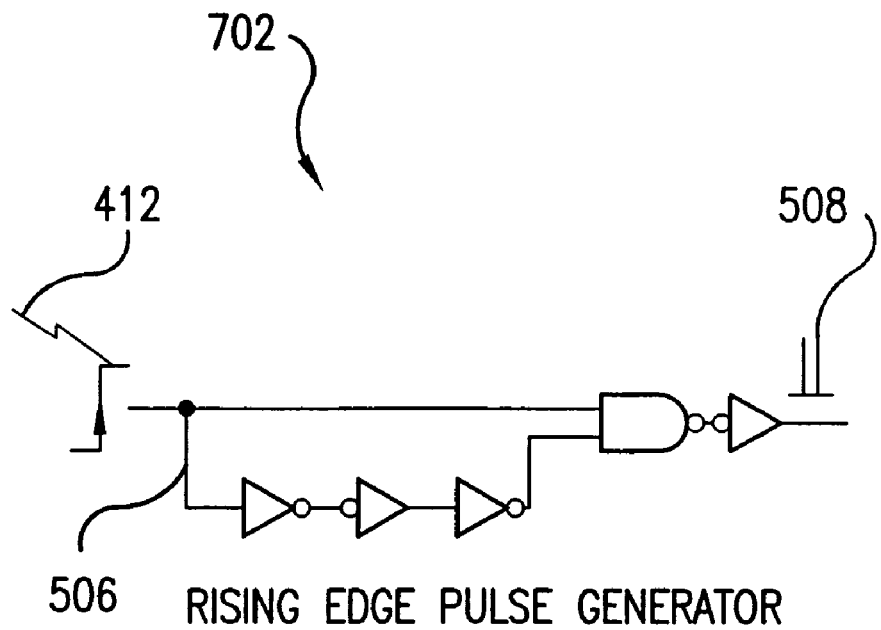
Figure 7B:
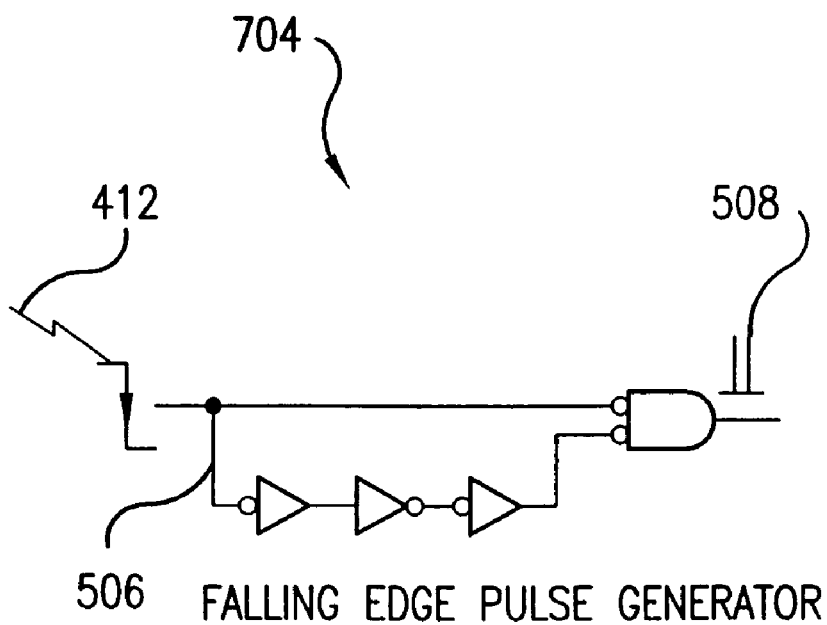

FIGS. 7A-B illustrate example aperture generators.

Figure 8:
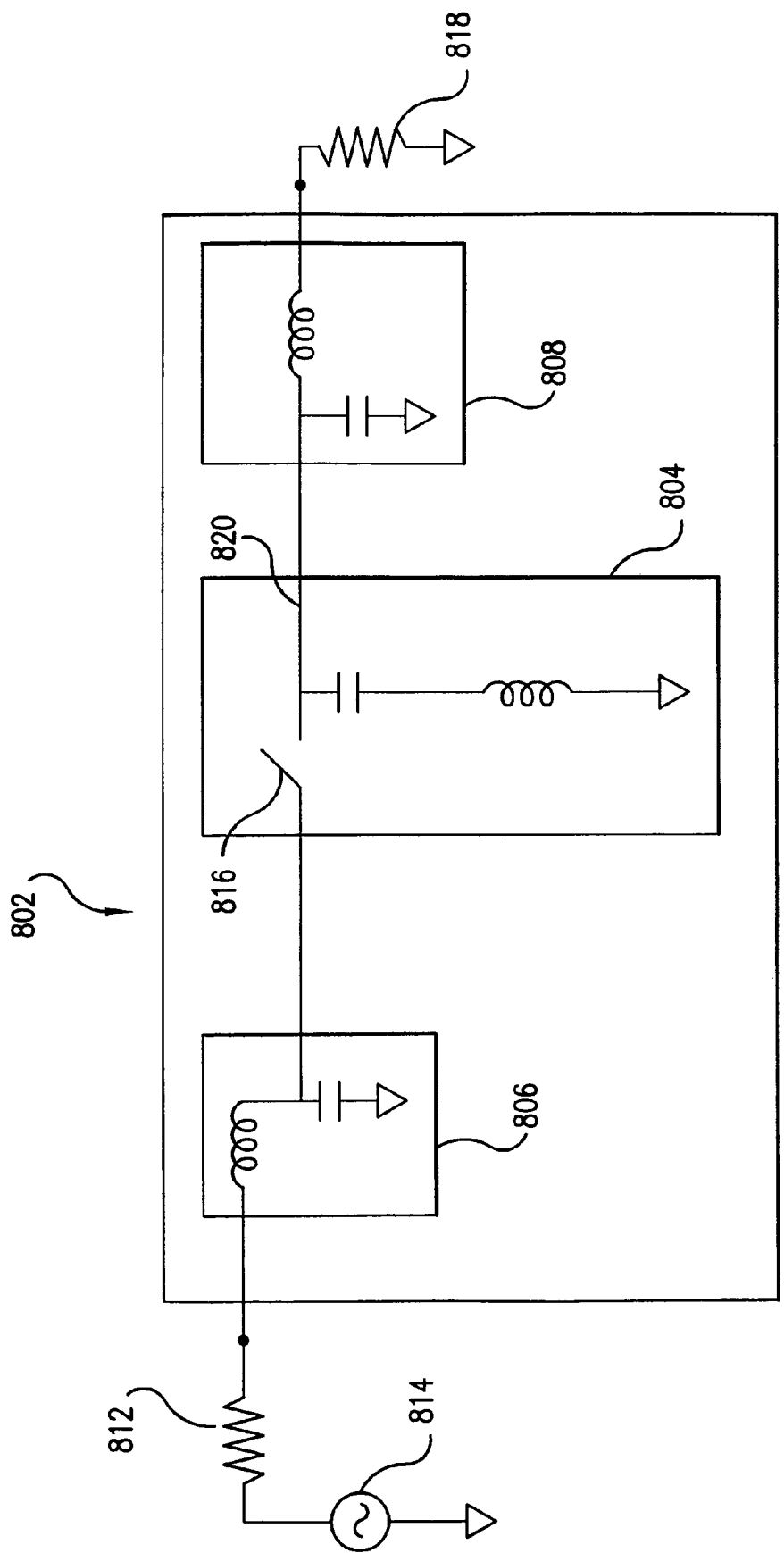

FIG. 8 illustrates an aliasing module with input and output impedance match according to an embodiment of the invention.

Figure 9:
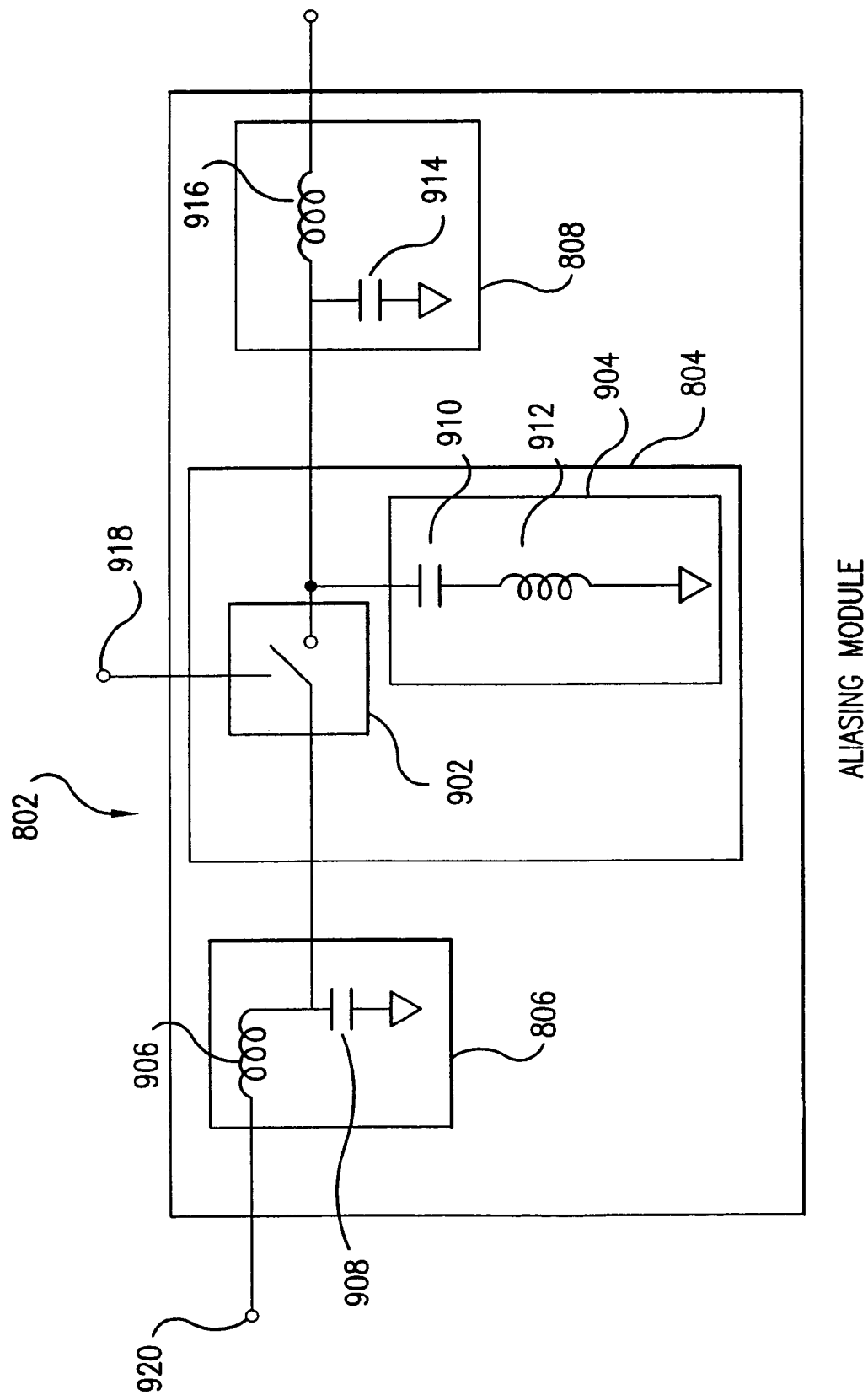

FIG. 9 illustrates an example energy transfer module with a switch module and a reactive storage module according to an embodiment of the invention.

Figure 10:
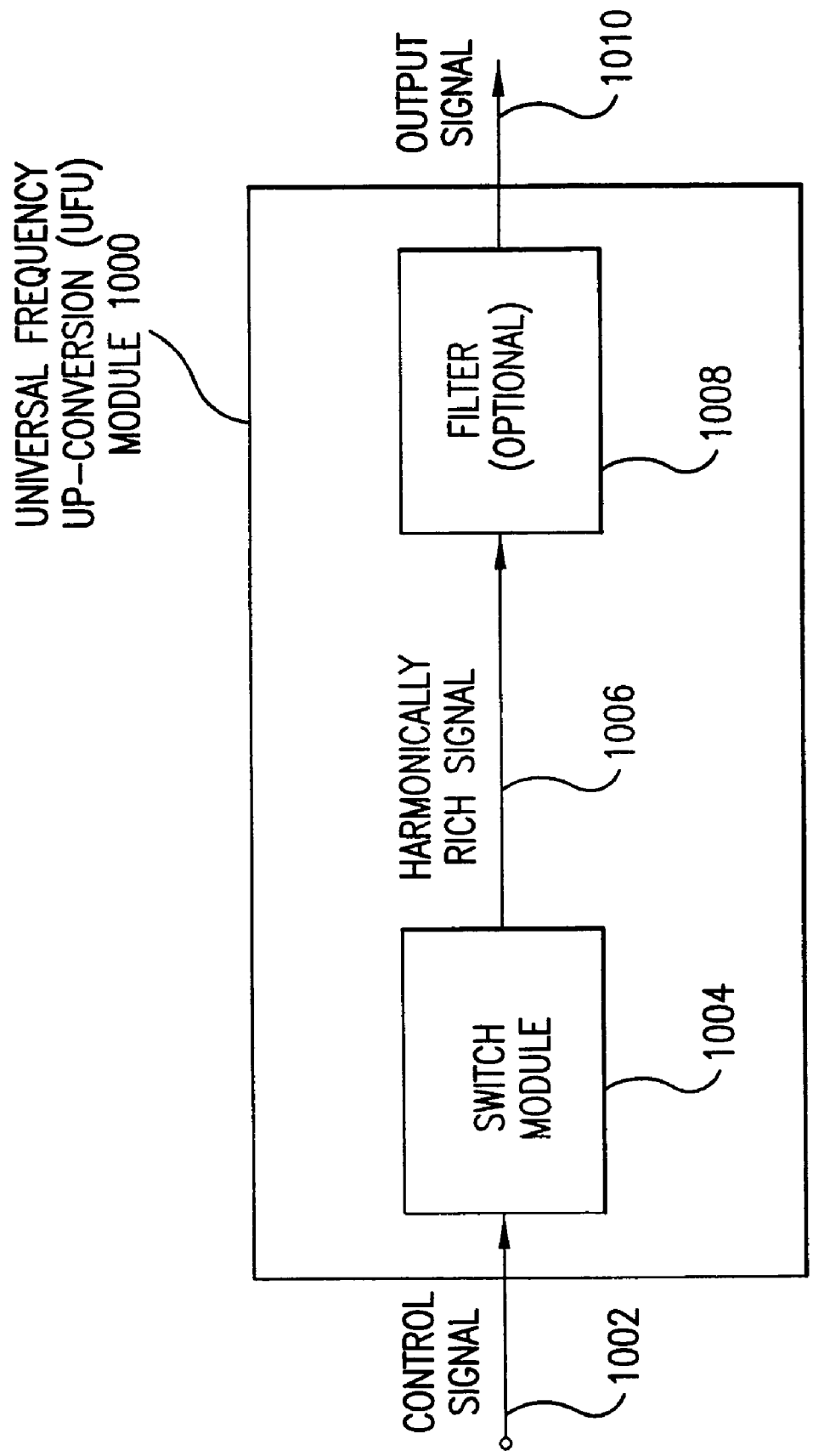

FIG. 10 is a block diagram of a universal frequency up-conversion (UFU) module according to an embodiment of the invention.

Figure 11:
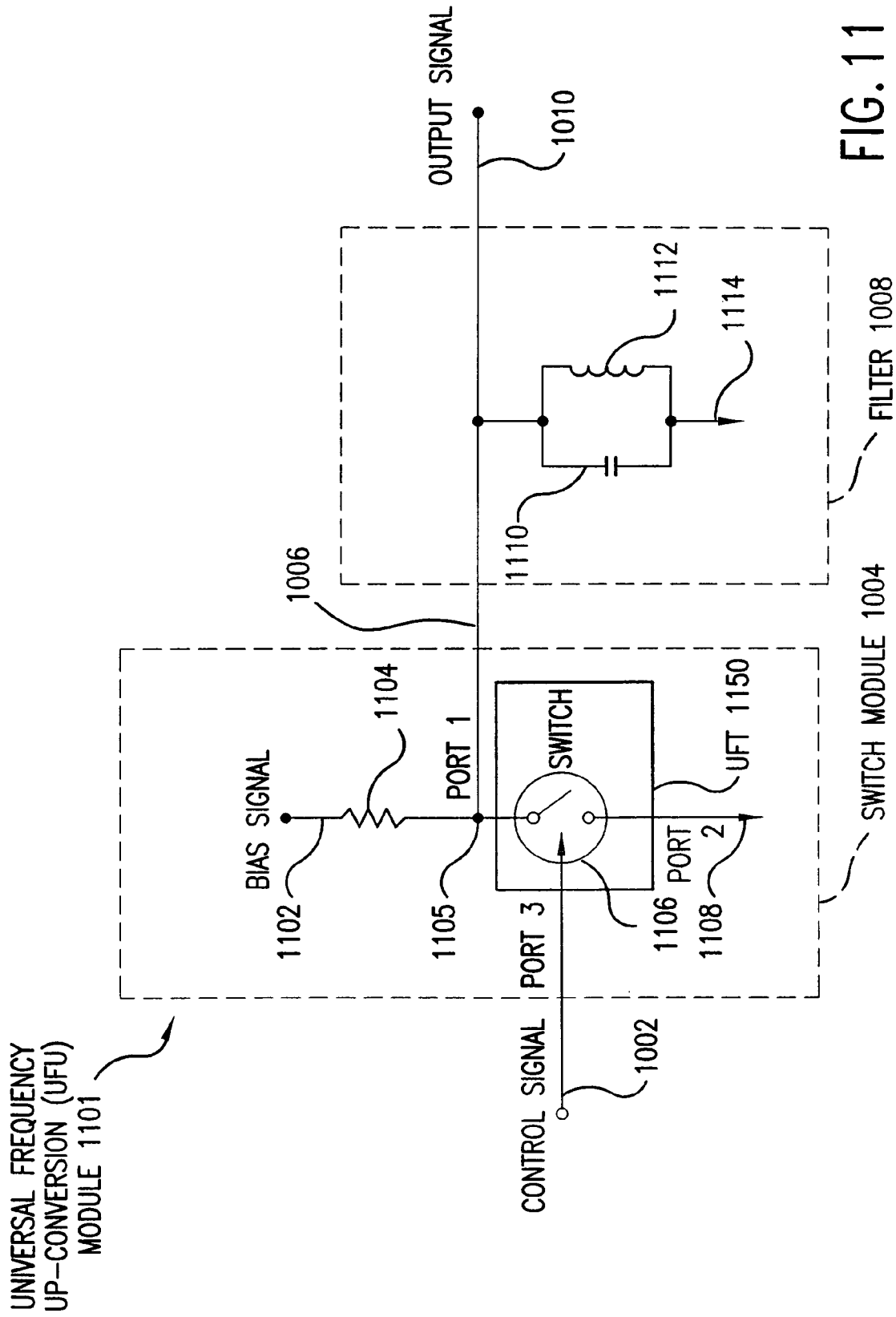

FIG. 11 is a more detailed diagram of a universal frequency up-conversion (UFU) module according to an embodiment of the invention.

Figure 12:
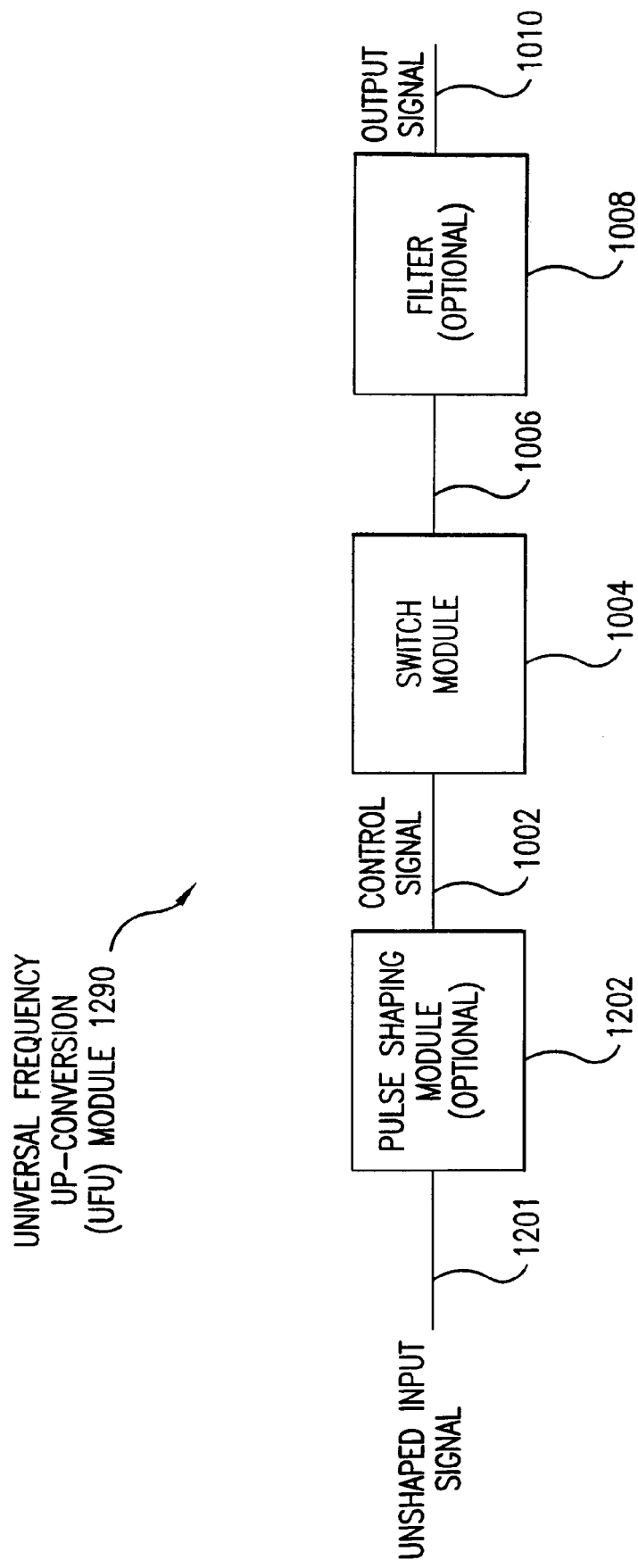

FIG. 12 is a block diagram of a universal frequency up-conversion (UFU) module according to an alternative embodiment of the invention.

FIGS. 13A-13I illustrate example waveforms used to describe the operation of the UFU module.

Figure 14:
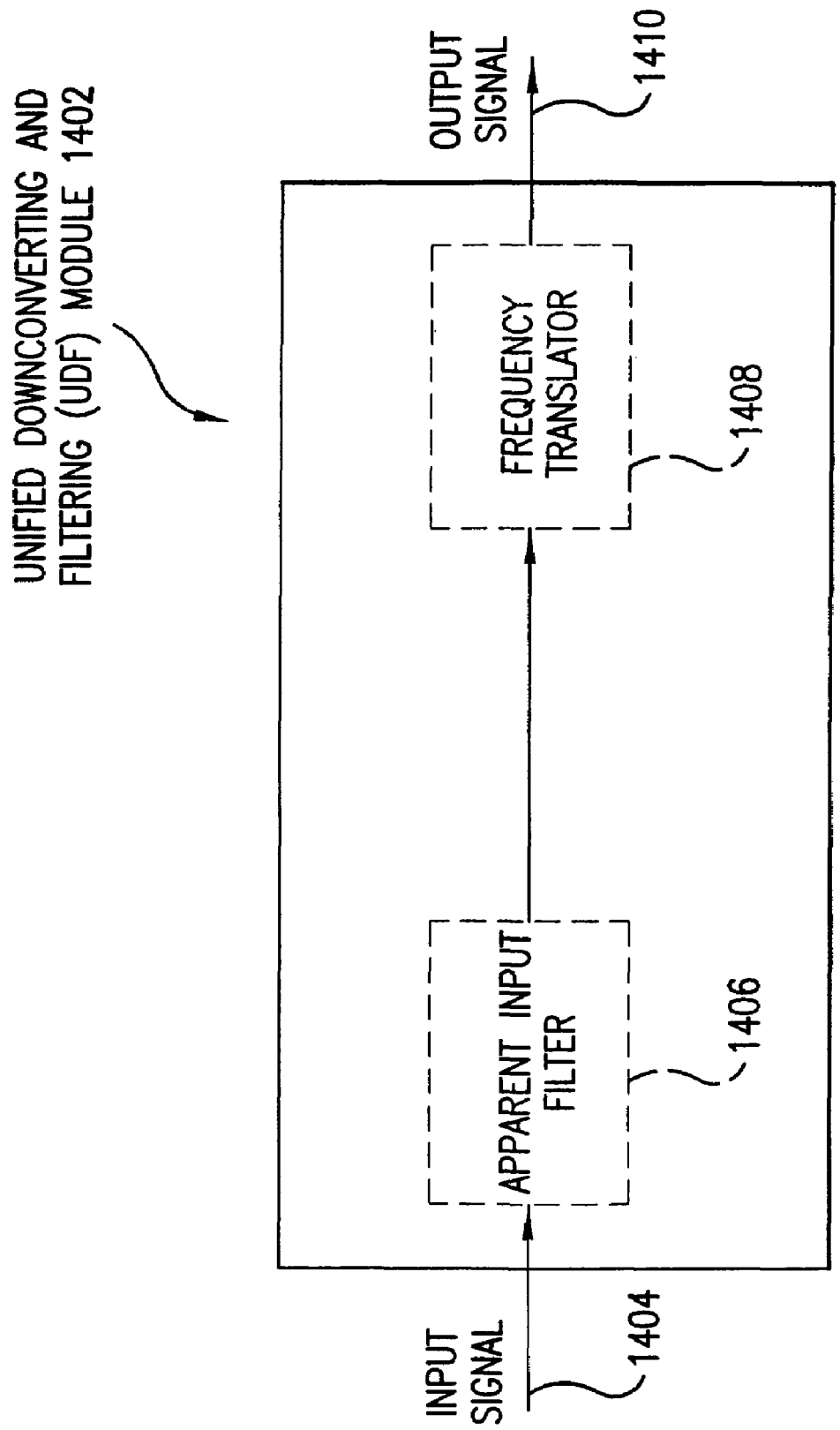

FIG. 14 illustrates a unified down-converting and filtering (UDF) module according to an embodiment of the invention.

Figure 15:
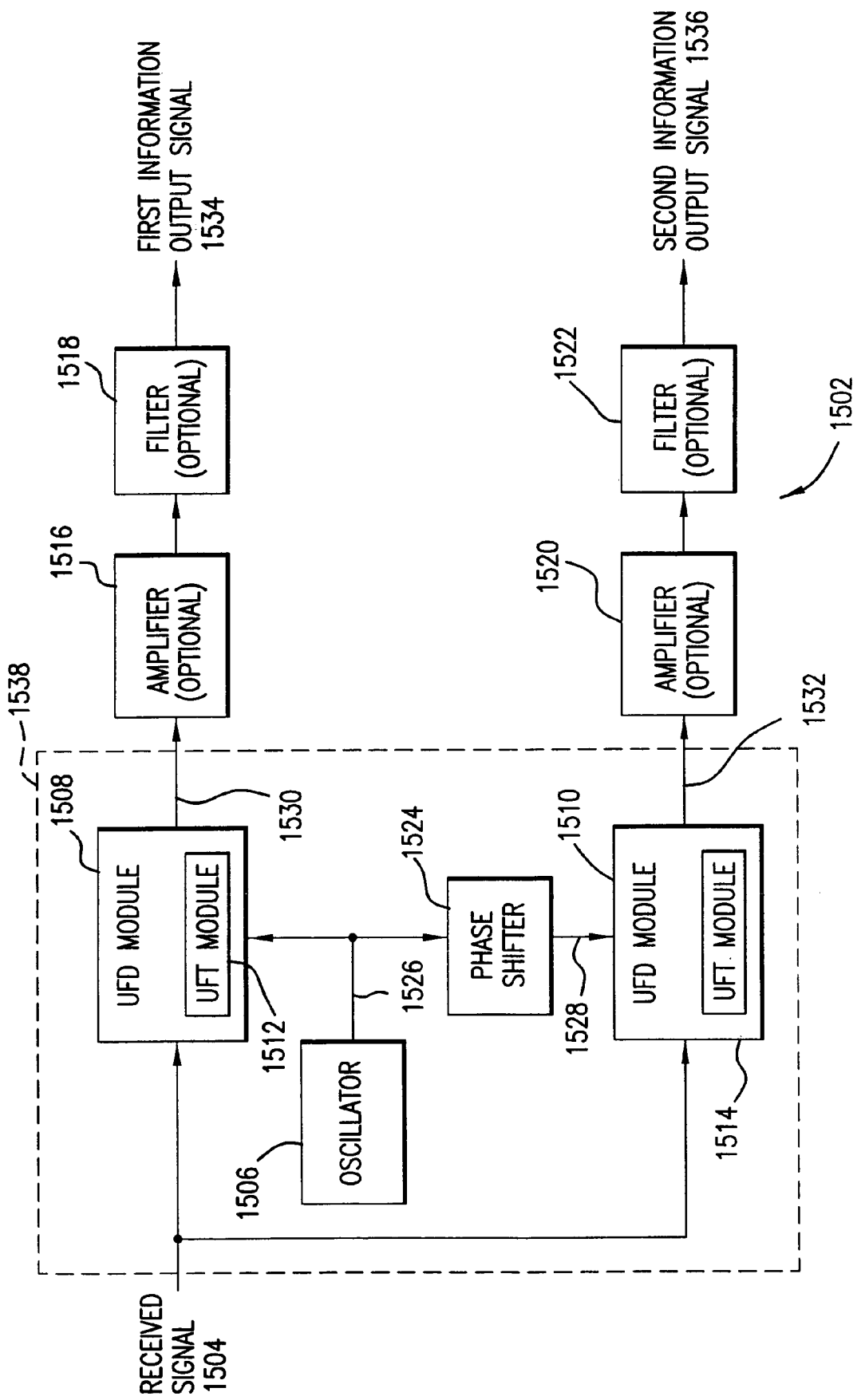

FIG. 15 illustrates an exemplary I/Q modulation embodiment of a receiver according to the invention.

Figure 16:
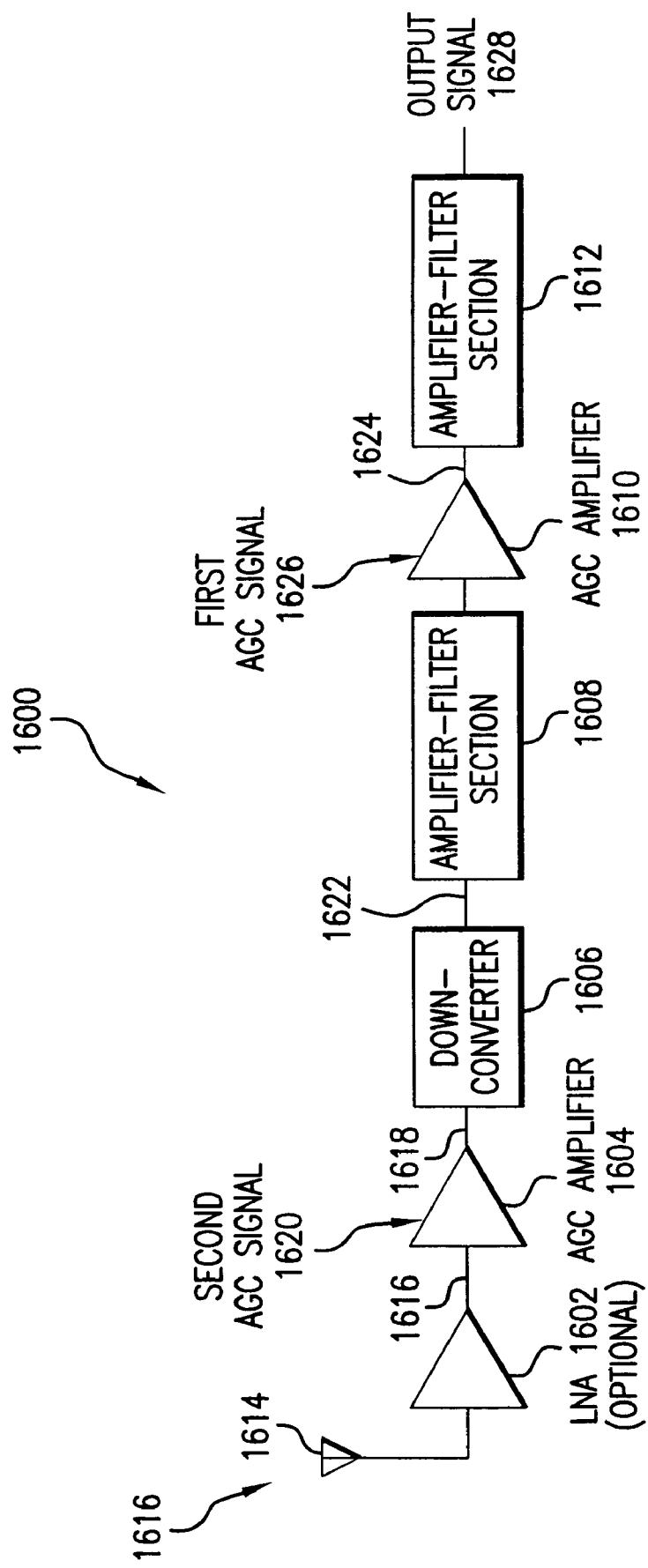

FIG. 16 shows an exemplary receiver channel in which embodiments of the present invention may be implemented.

Figure 17:
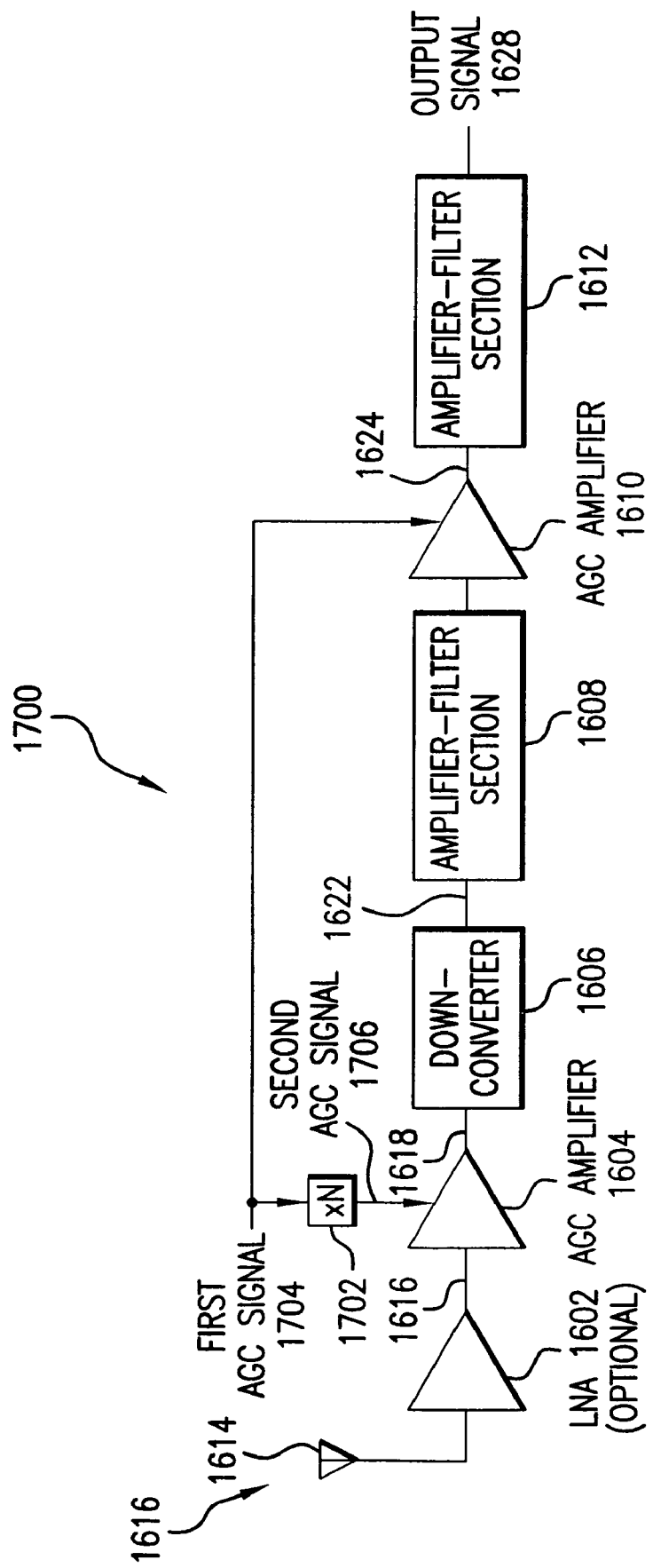

FIG. 17 shows an receiver channel with automatic gain control, according to an embodiment of the present invention.

Figure 18:
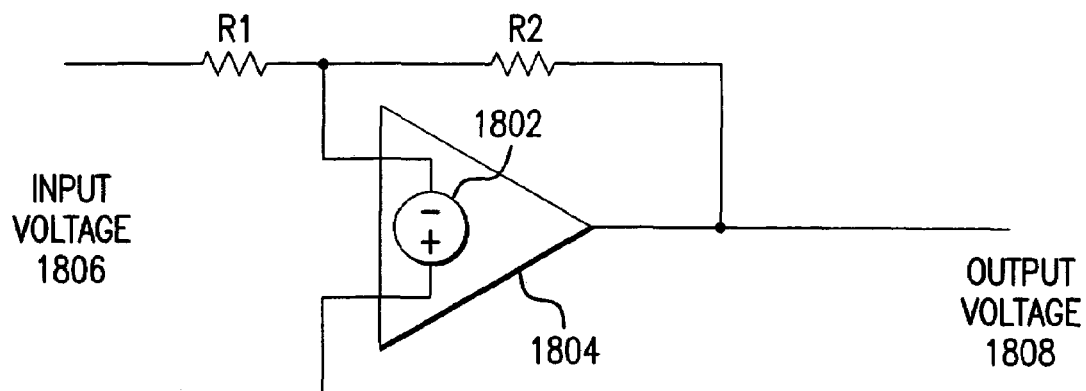

FIG. 18 shows a DC offset voltage present in an example model of an operational amplifier gain stage.

Figure 19:
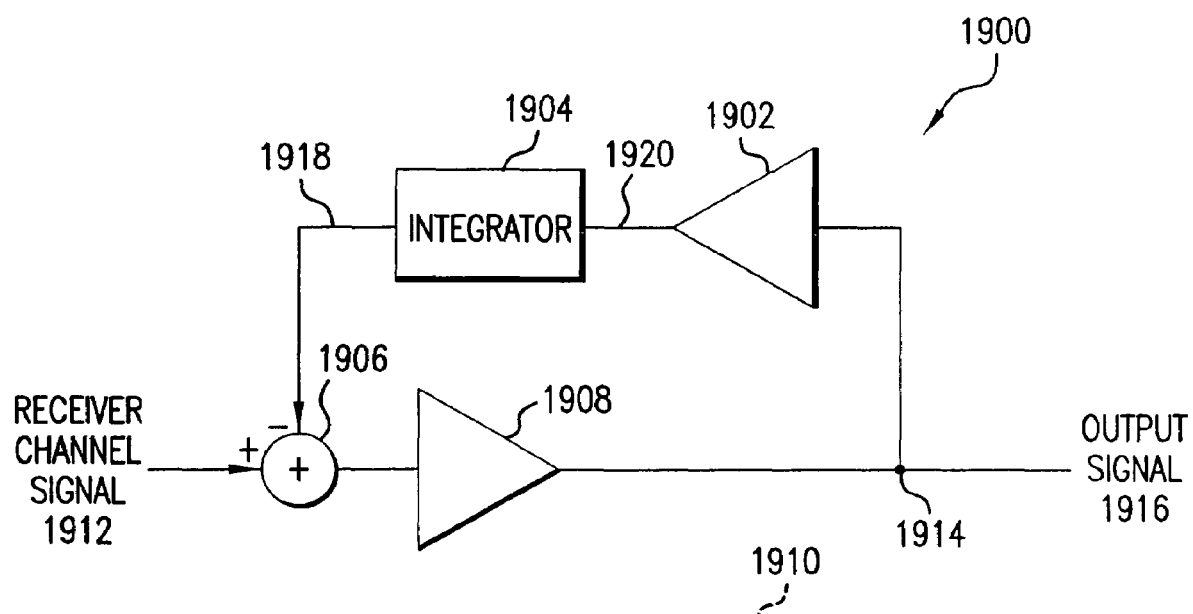

FIG. 19 shows an example feedback loop for reducing DC offset in a receiver channel, according to an embodiment of the present invention.

Figure 20:
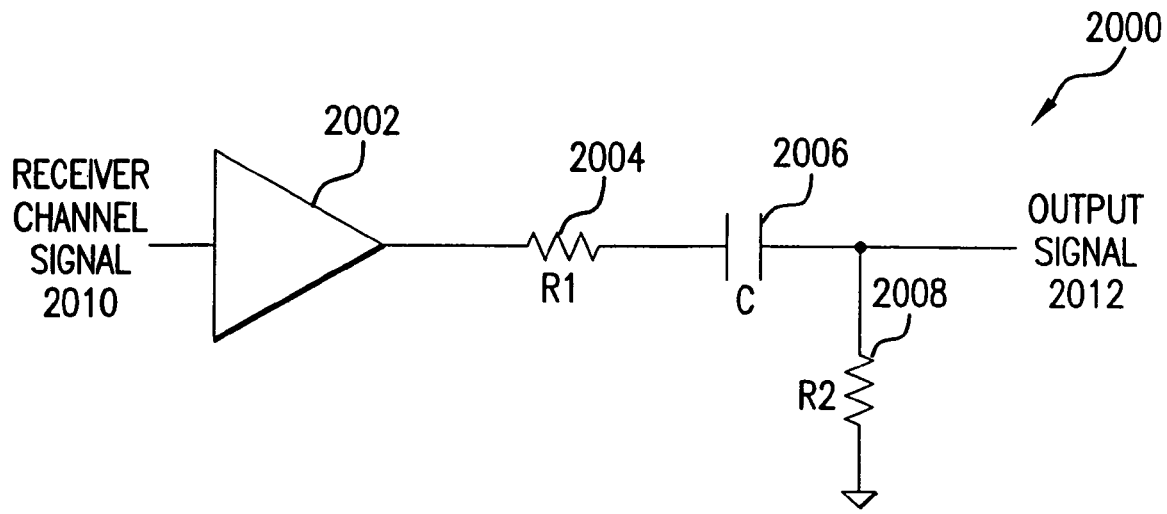

FIG. 20 shows an exemplary differentiator circuit that may be used to reduce or eliminate DC offset voltages in the receiver channel.

Figure 21:
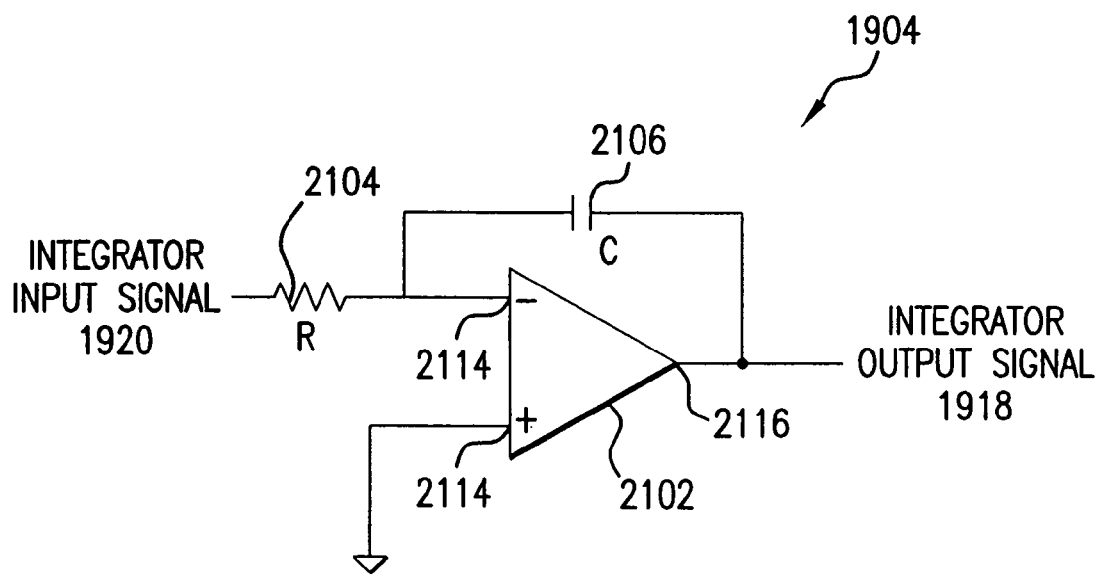

FIG. 21 shows an example embodiment for the integrator of FIG. 19, including an operational amplifier, a resistor, and a capacitor that are configured in an integrating amplifier configuration.

Figure 22:
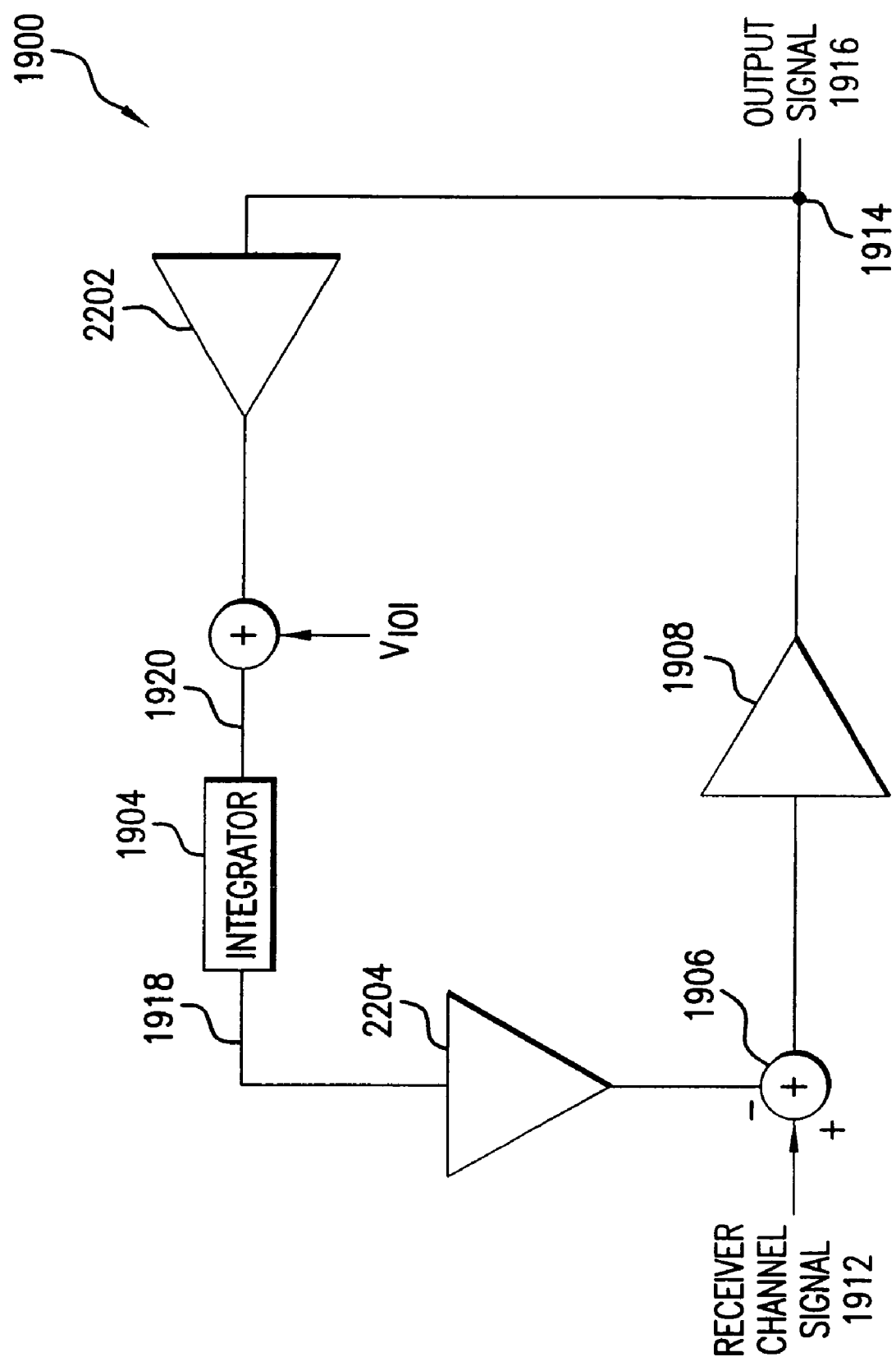

FIG. 22 shows an embodiment of the feedback loop of FIG. 19, where the first amplifier is divided into a first feedback amplifier and a second feedback amplifier, according to the present invention.

Figure 23:
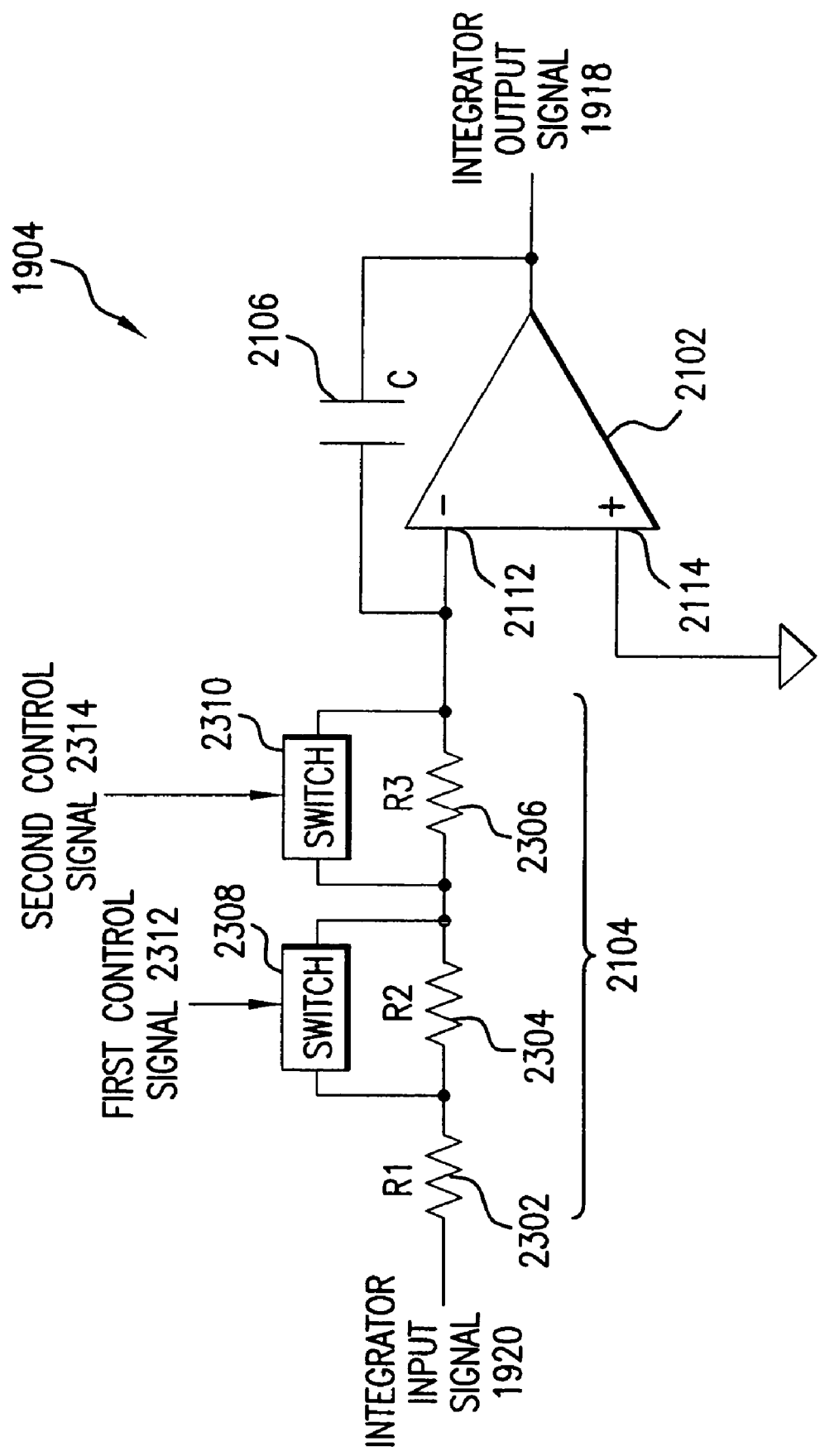

FIG. 23 shows an integrator, where the resistor is a variable resistor, according to an embodiment of the present invention.

Figure 24A:
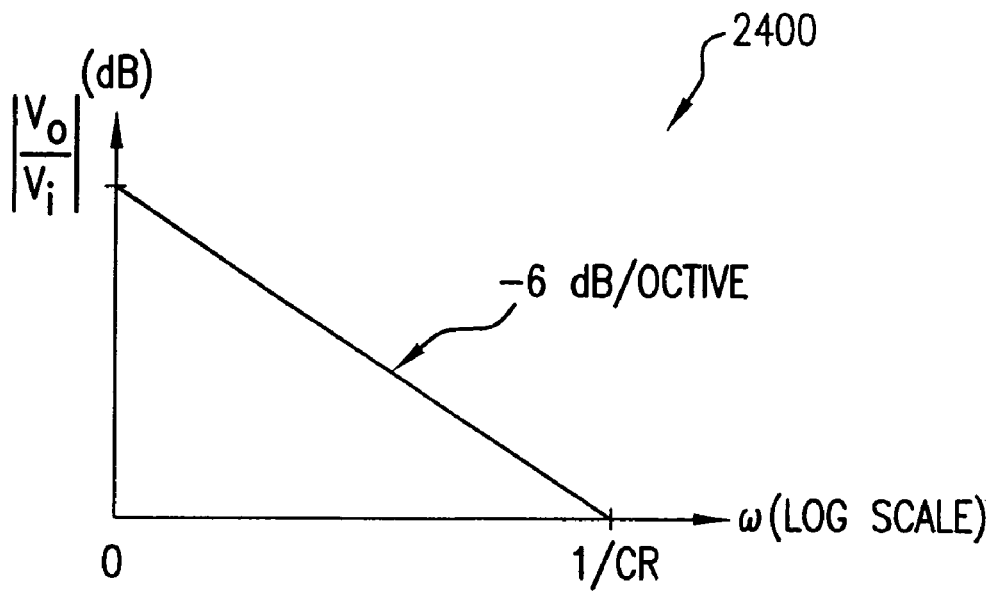

FIG. 24A shows a frequency response of an ideal integrator similar to the integrator of FIG. 19.

Figure 24B:
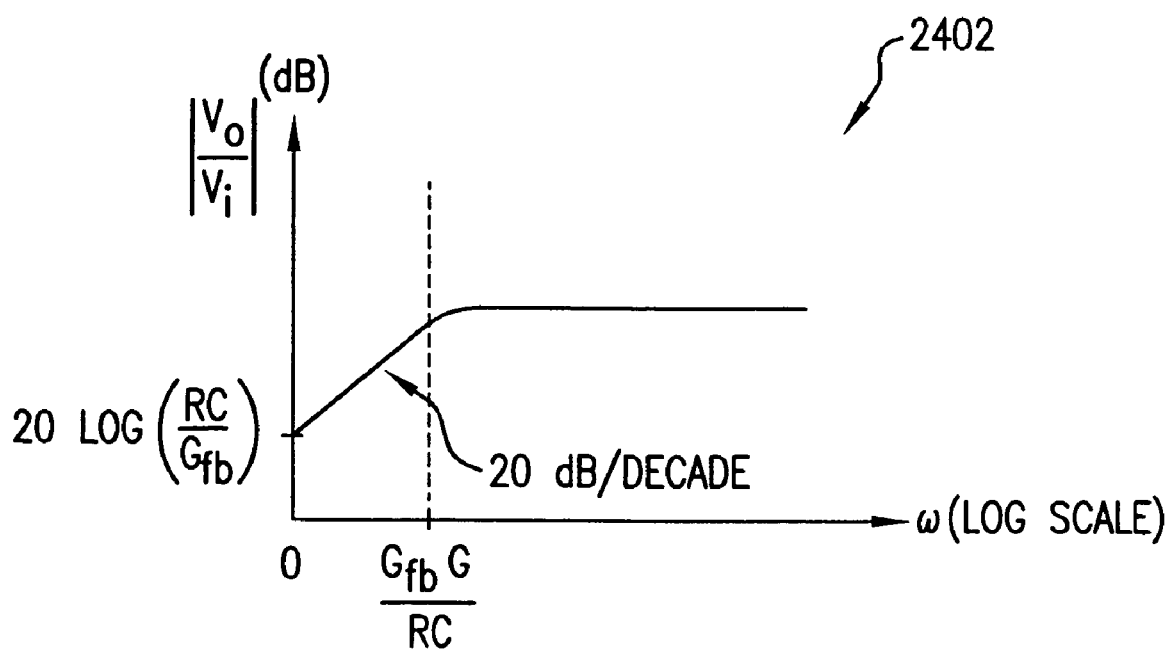

FIG. 24B shows a plot of the frequency response of the feedback loop of FIG. 19.

Figure 25A:
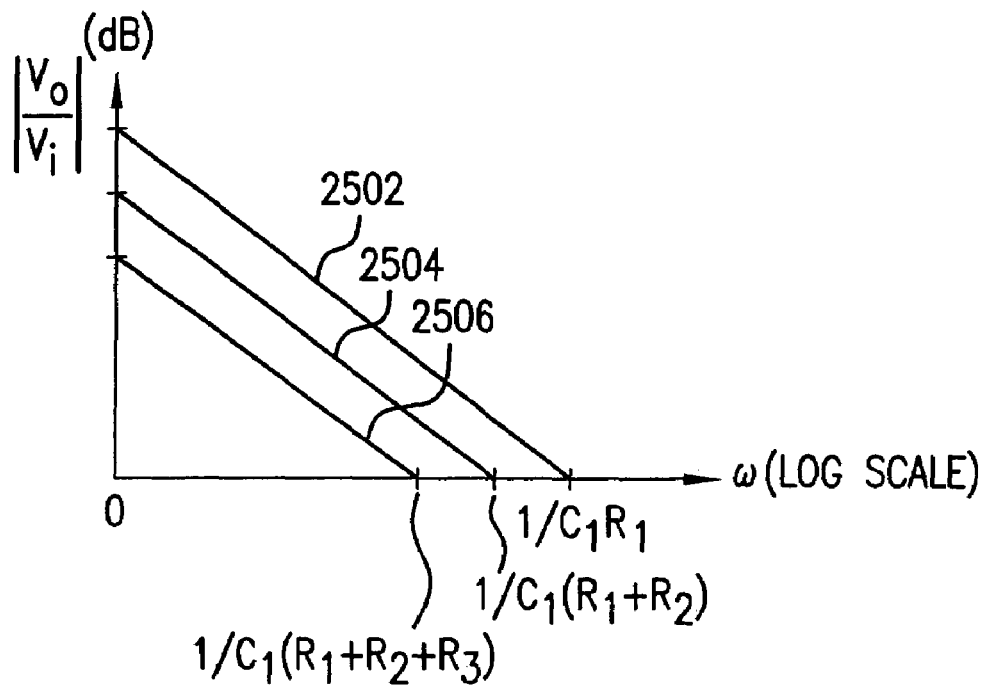

FIG. 25A shows frequency responses for the integrator of FIG. 19 during three time periods, according to an embodiment of the present invention.

Figure 25B:
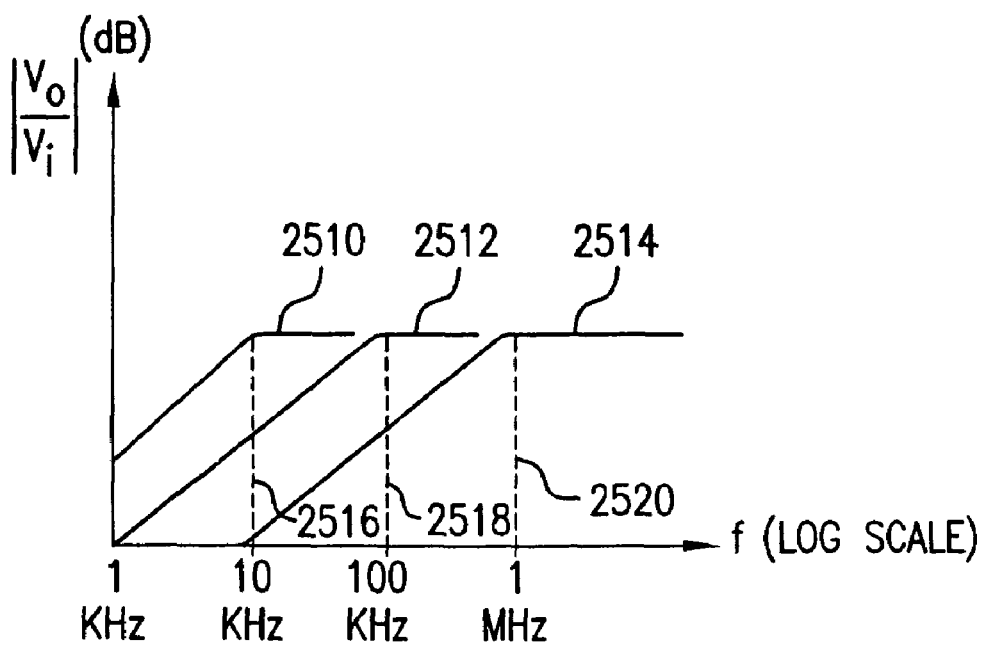

FIG. 25B shows frequency responses for the feedback loop of FIG. 19 that correspond to first, second, and third frequency responses shown in FIG. 25A.

Figure 26:
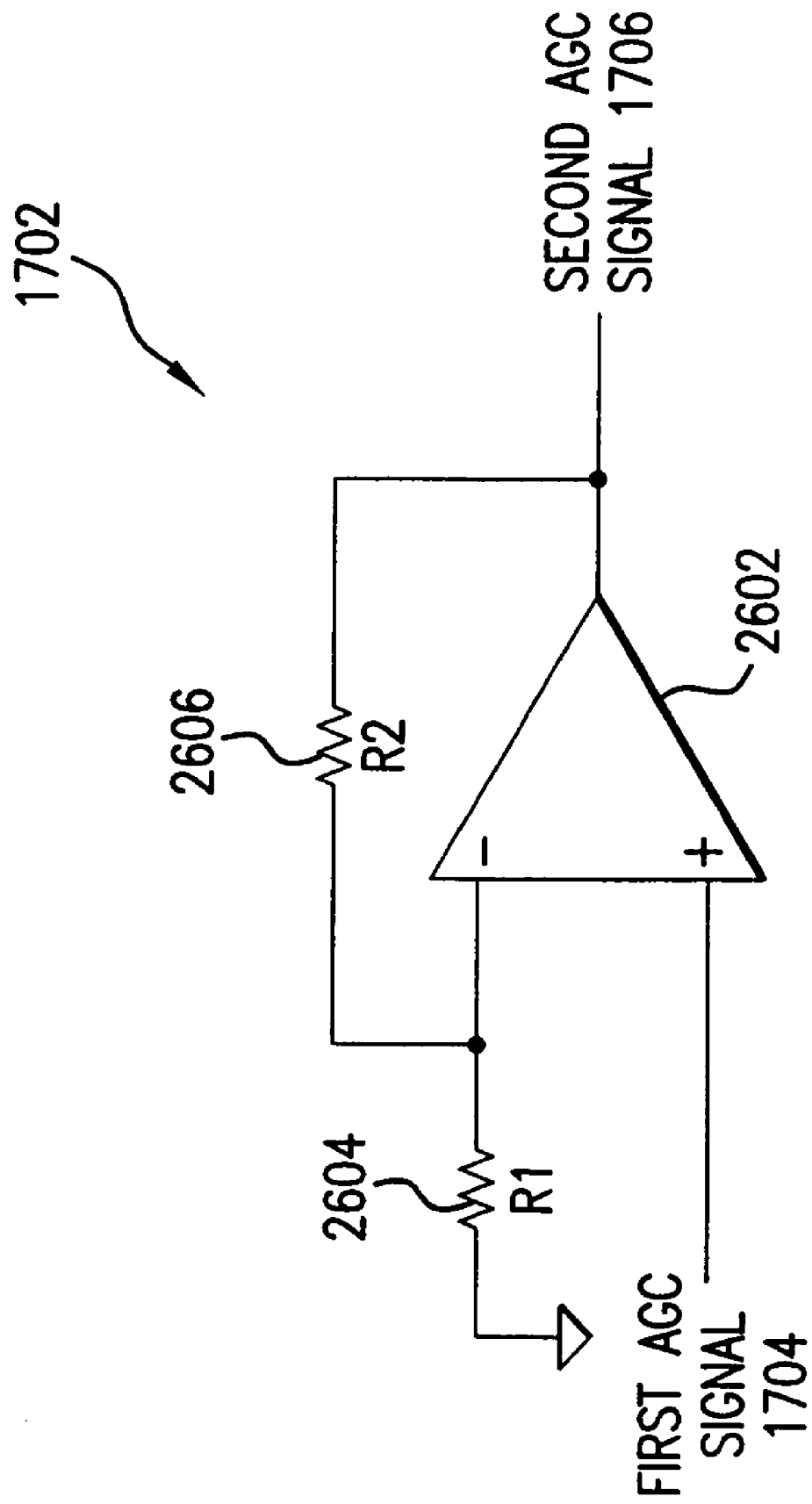

FIG. 26 shows an example embodiment for the multiplier shown in FIG. 17.

FIGS. 27-29 and 33-34 show example flowcharts providing operational steps for performing embodiments of the present invention.

Figure 30:
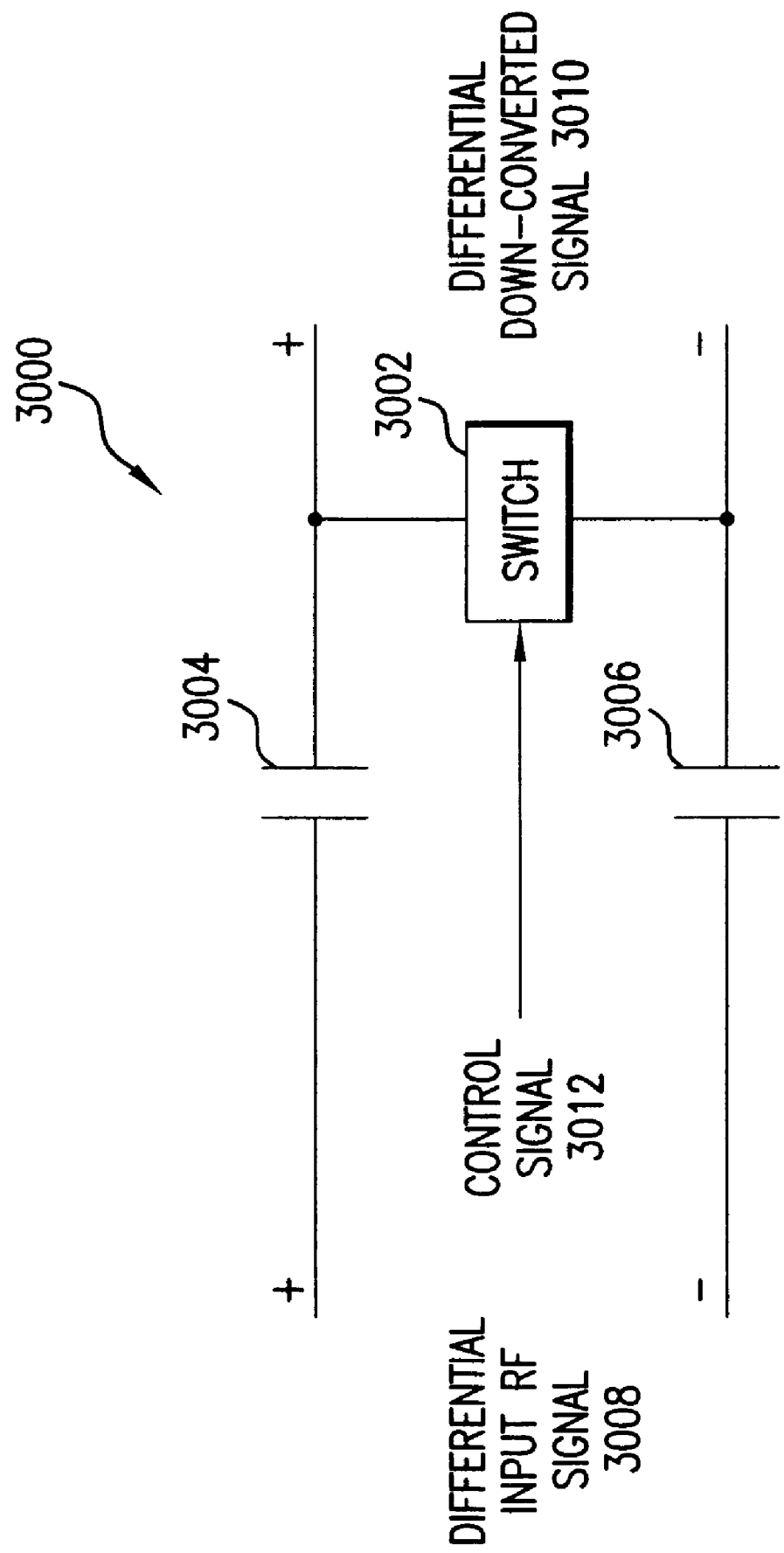

FIG. 30 shows a differential UFD module that may be used as a down-converter, according to an embodiment of the present invention.

Figure 31A:
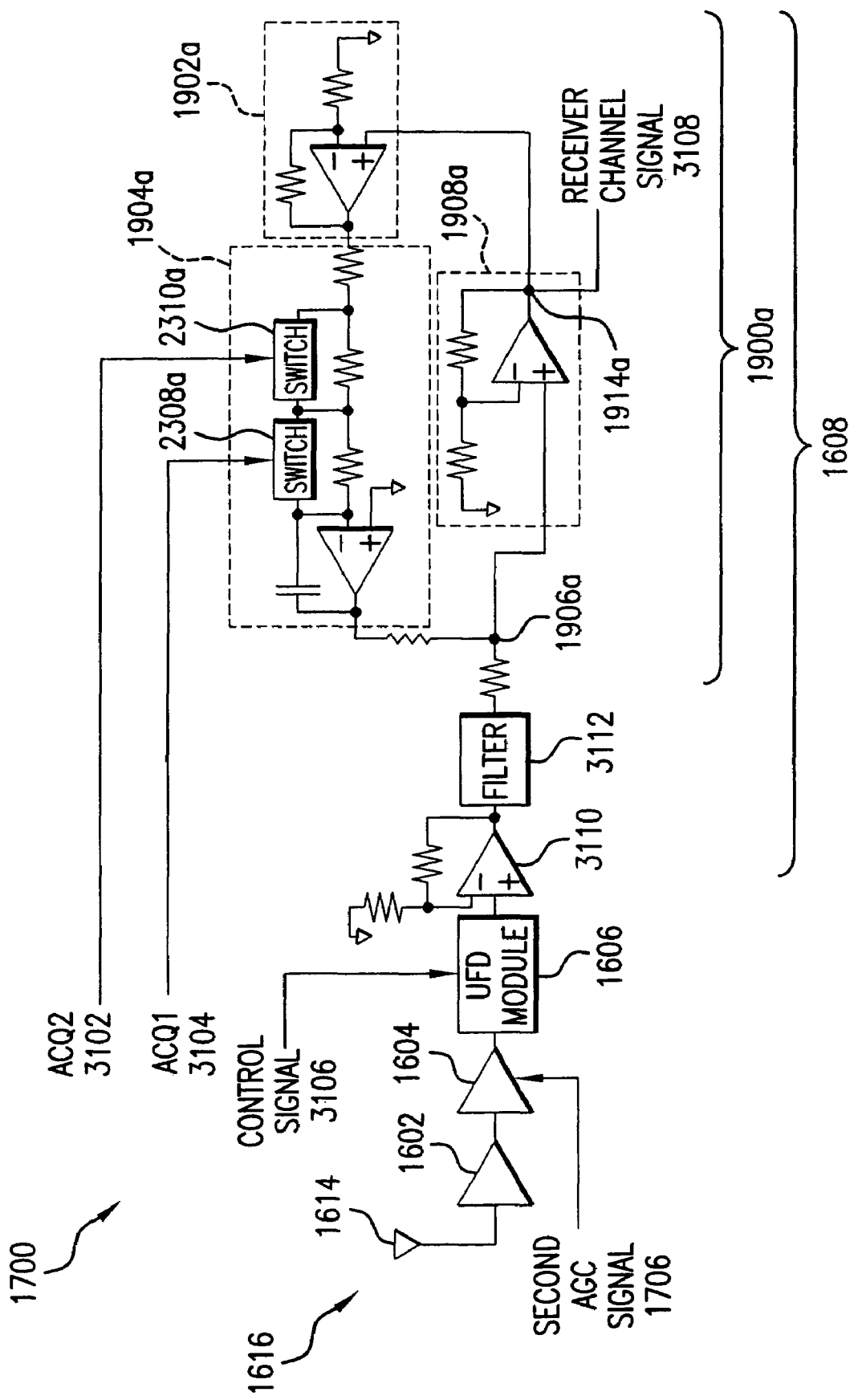
Figure 31B:
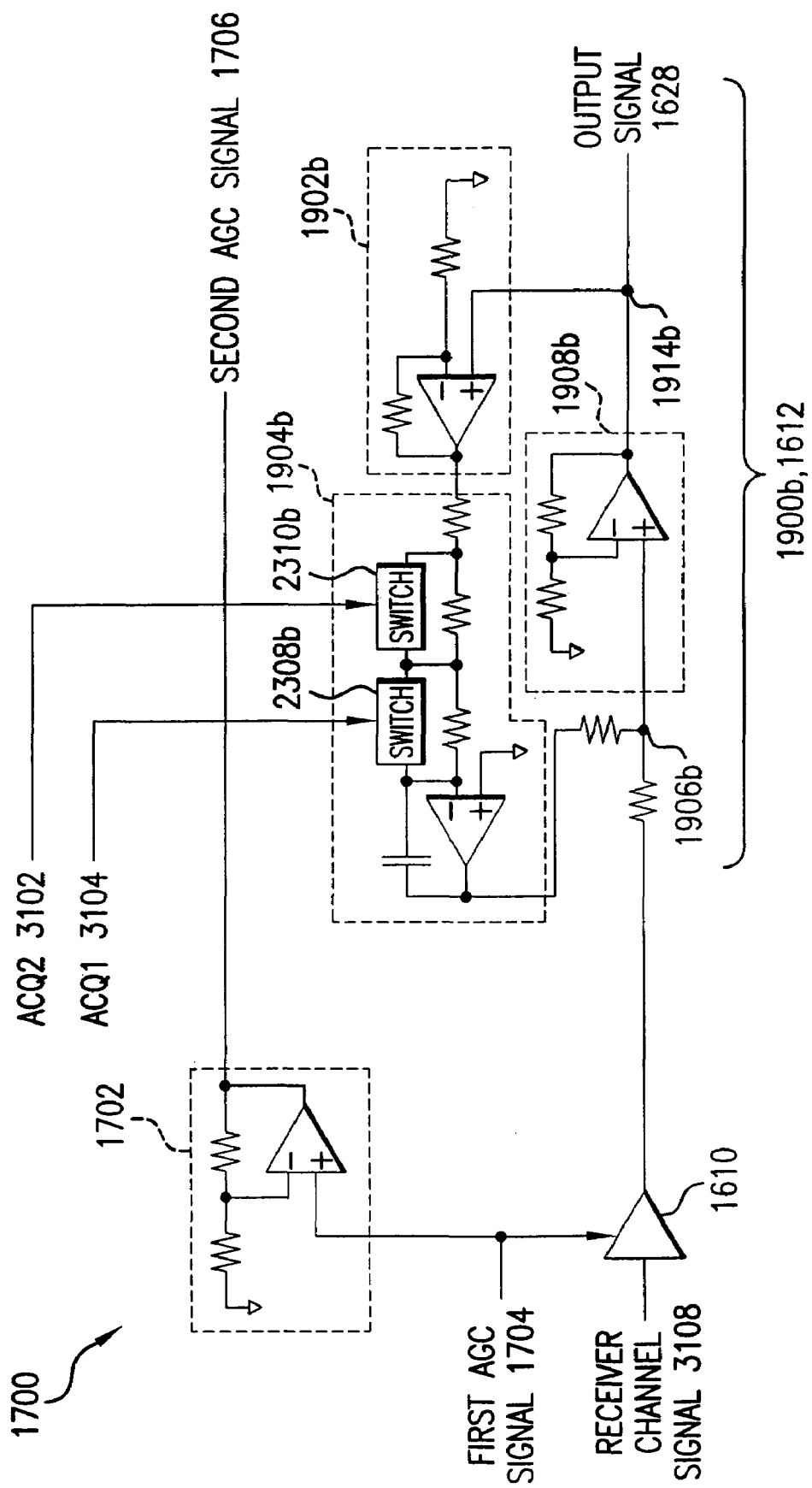

FIGS. 31A and 31B show further detail of a receiver channel, according to an exemplary embodiment of the present invention.

Figure 32A:
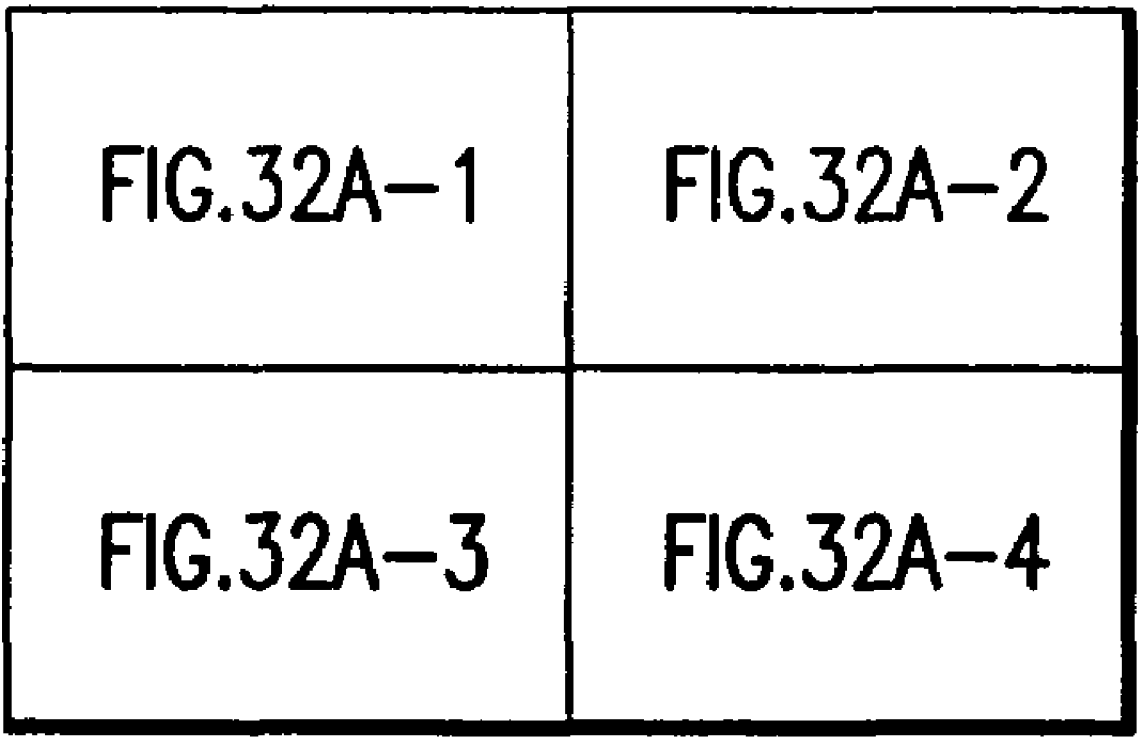
Figures 1, 32A:
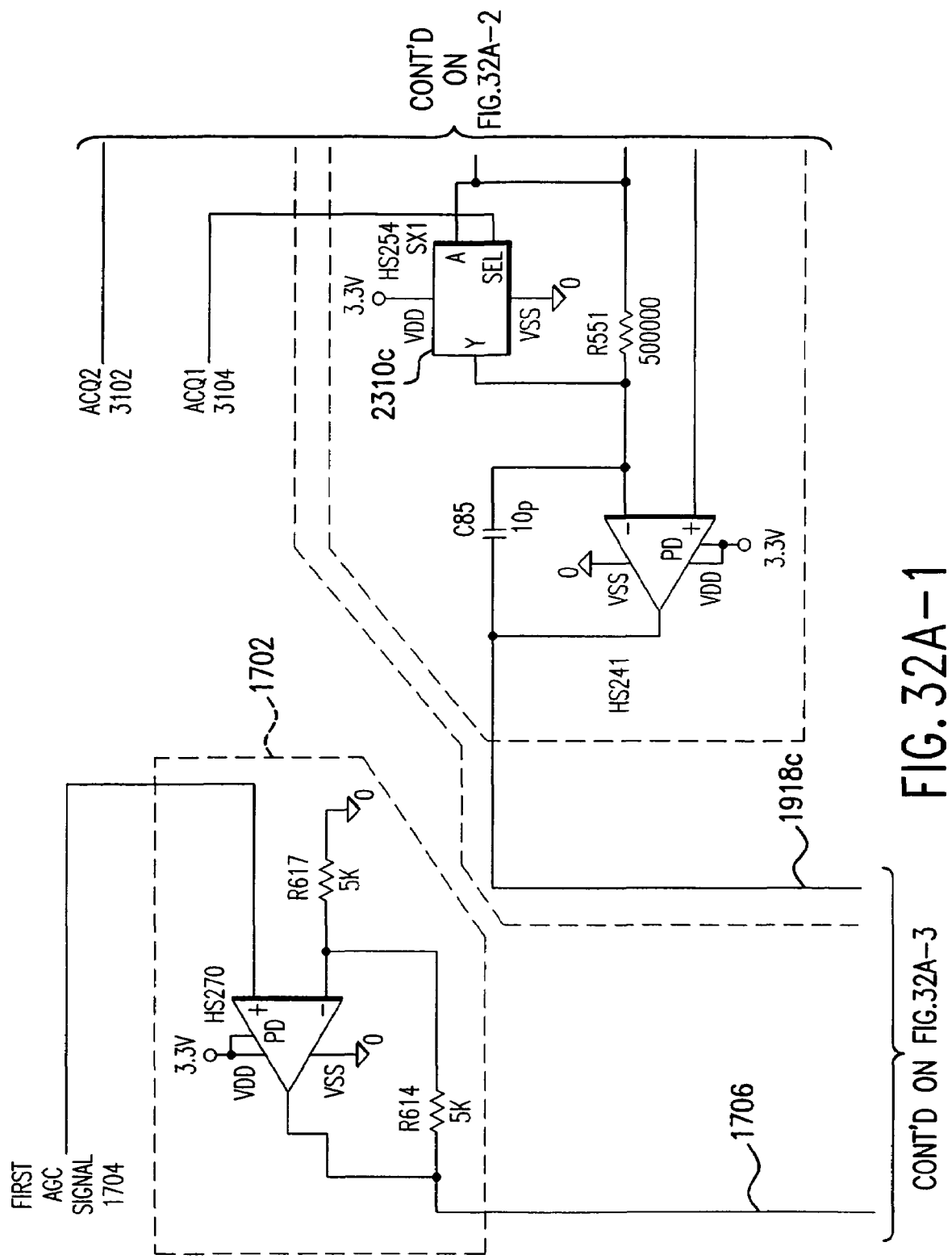
Figures 3, 32A:
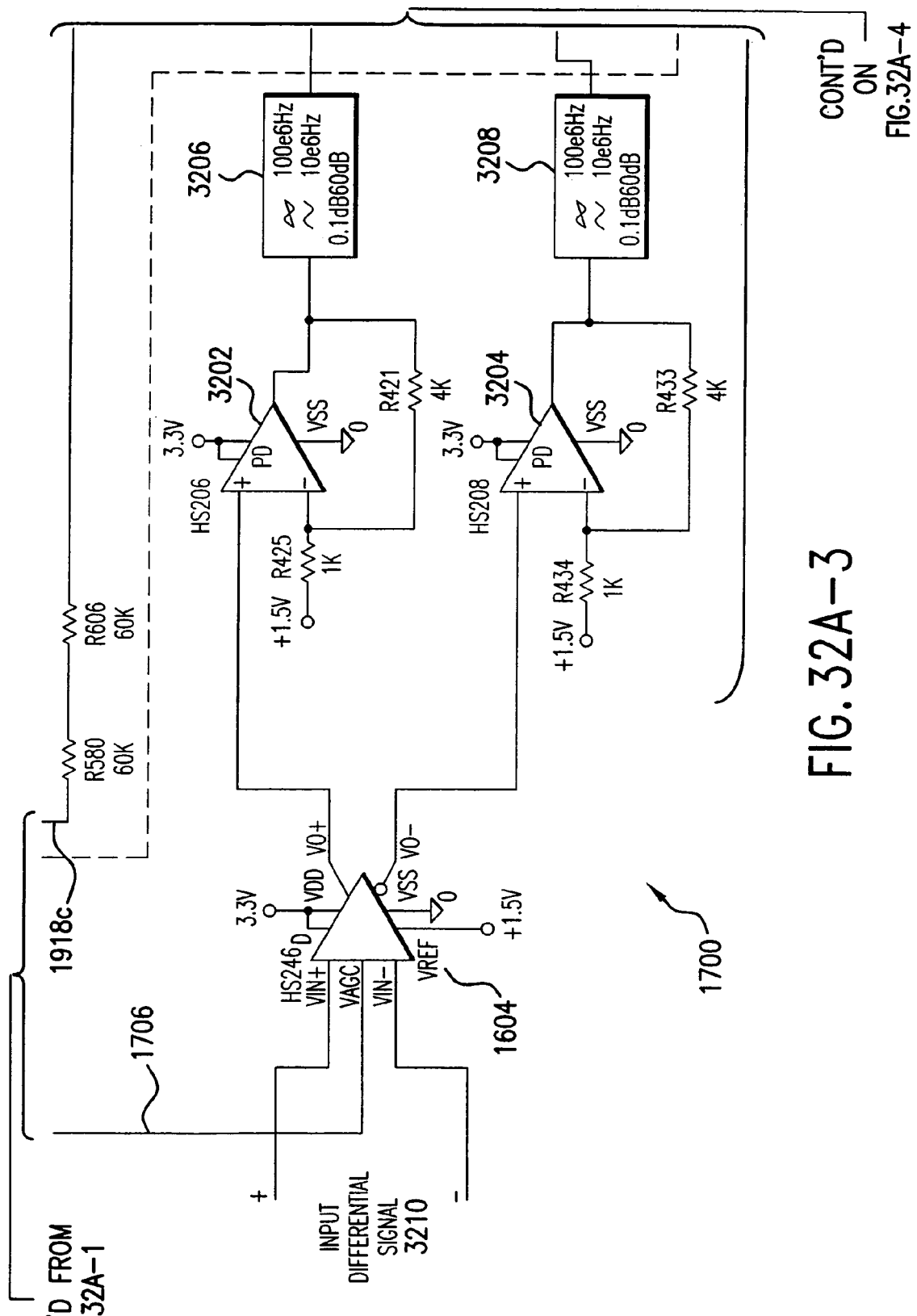
Figures 4, 32A:
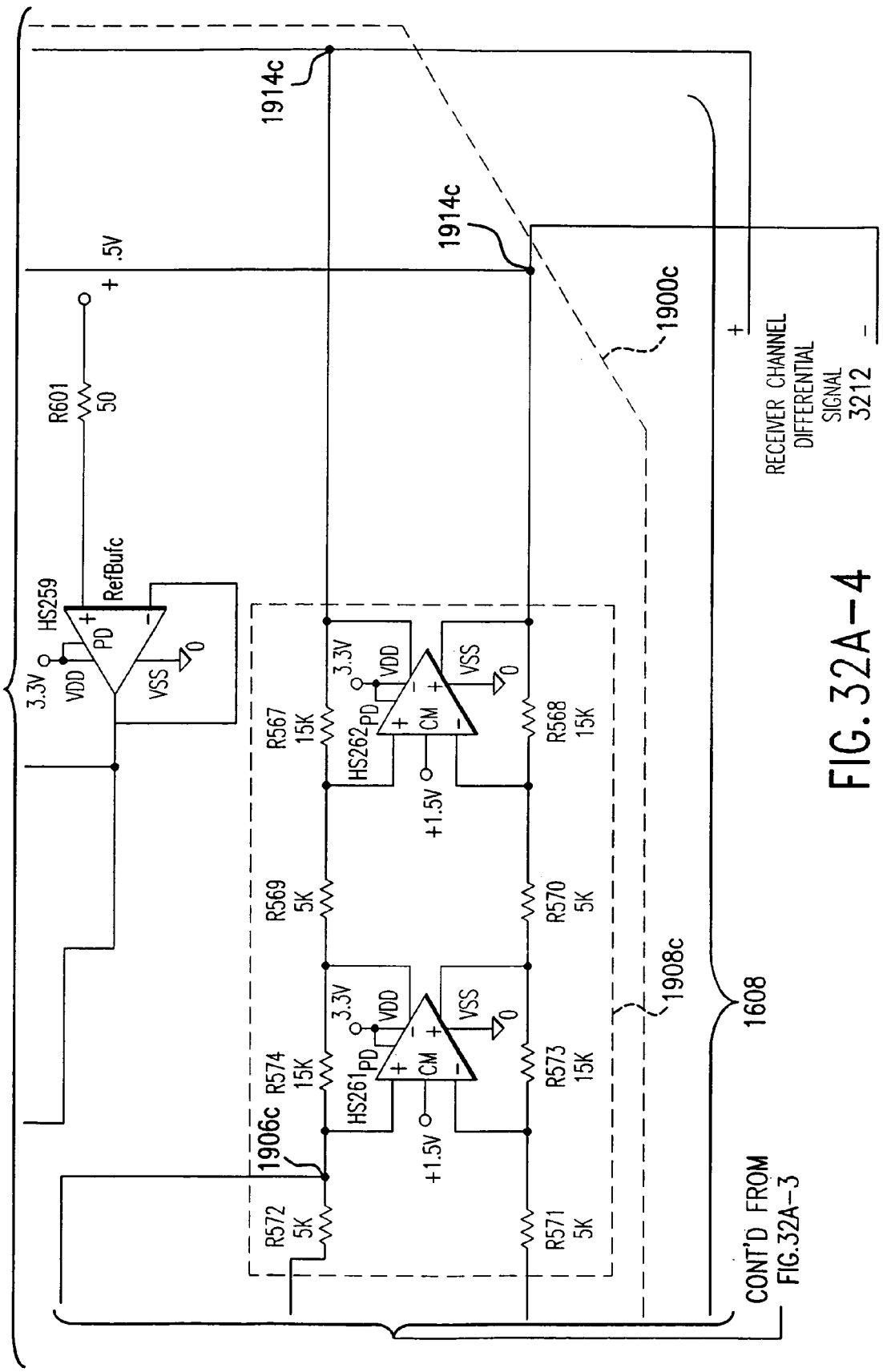
Figure 32B:
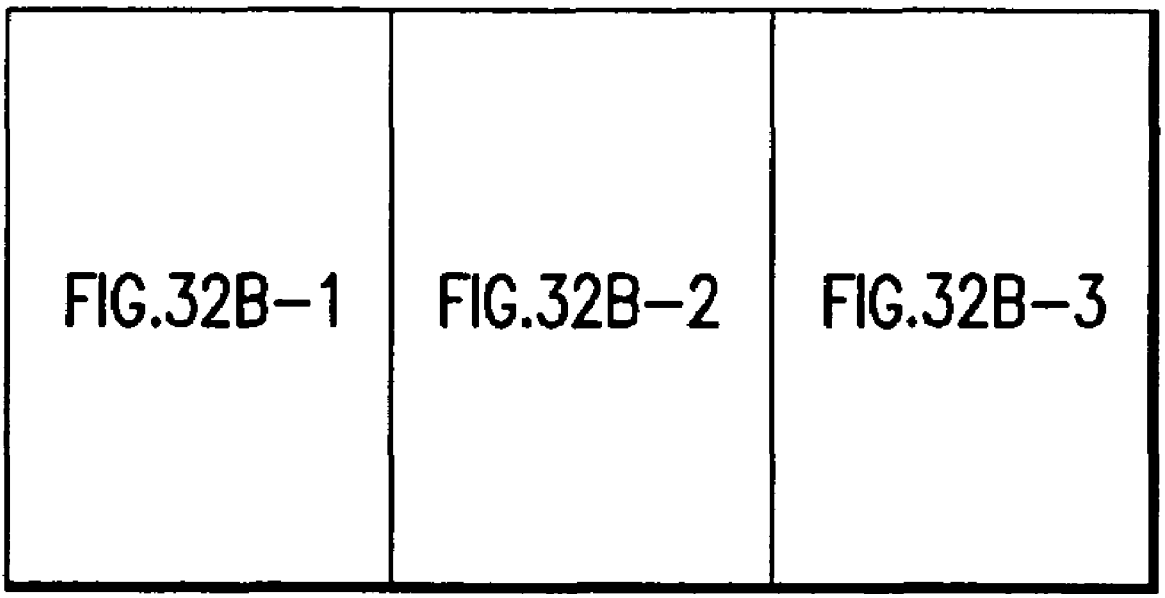
Figures 1, 32B:
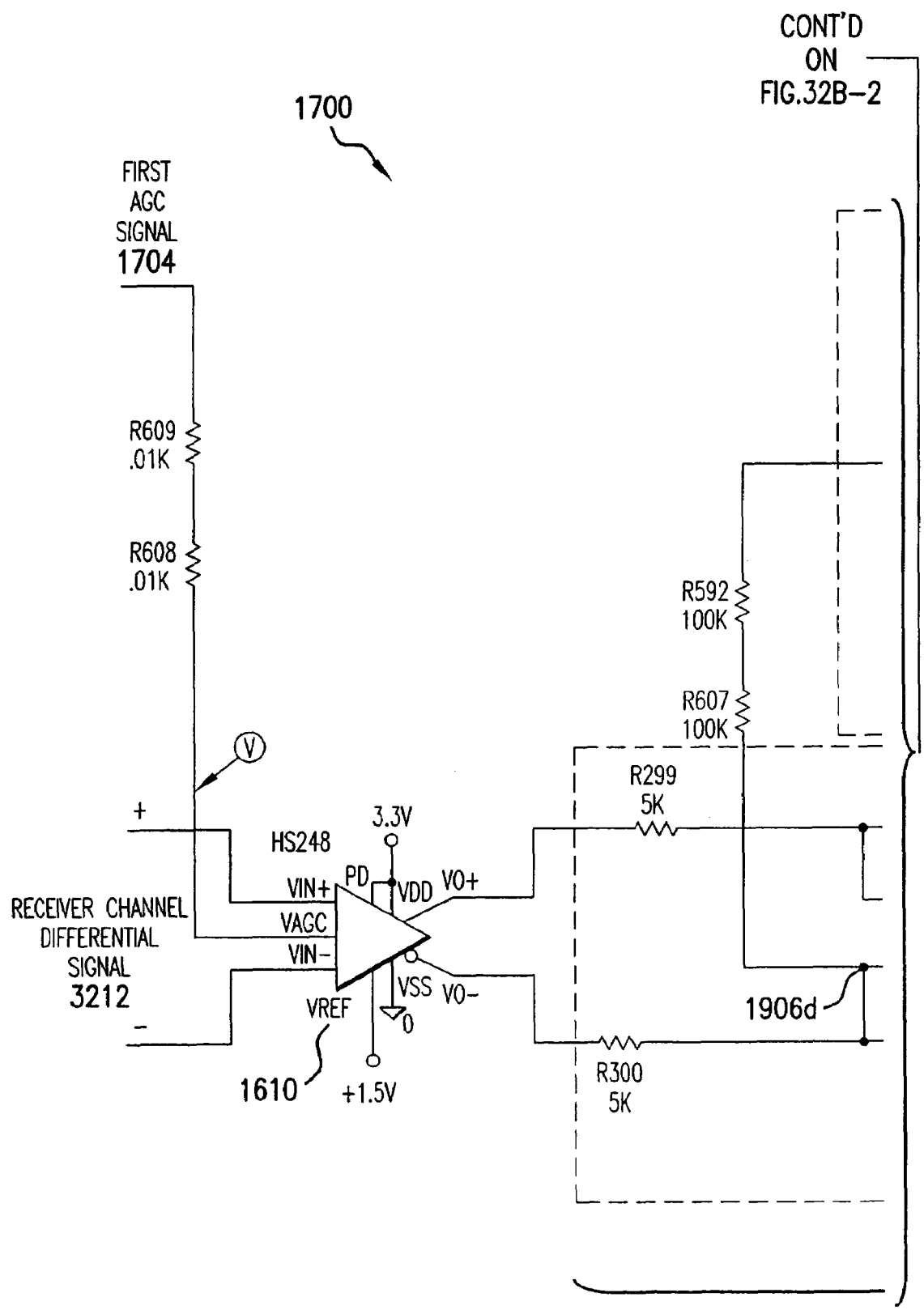
Figures 3, 32B:
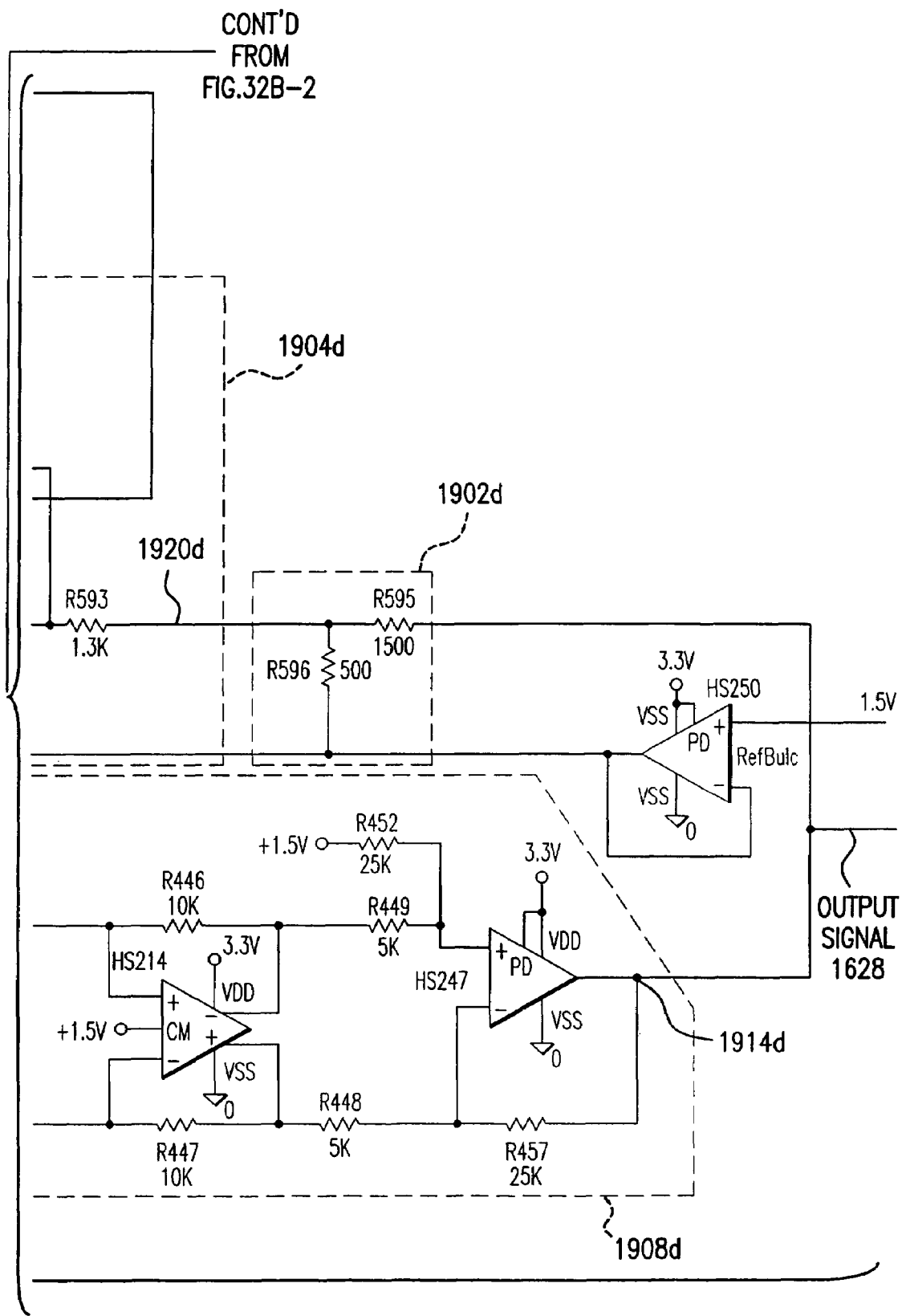

FIGS. 32A (comprising FIGS. 32A-1, 32A-2, 32A-3, and 32A-4) and 32B (comprising FIGS. 32B-1, 32B-2, and 32B-3) show further detail of a receiver channel, according to an example differential receiver channel embodiment of the present invention.

Figure 35:
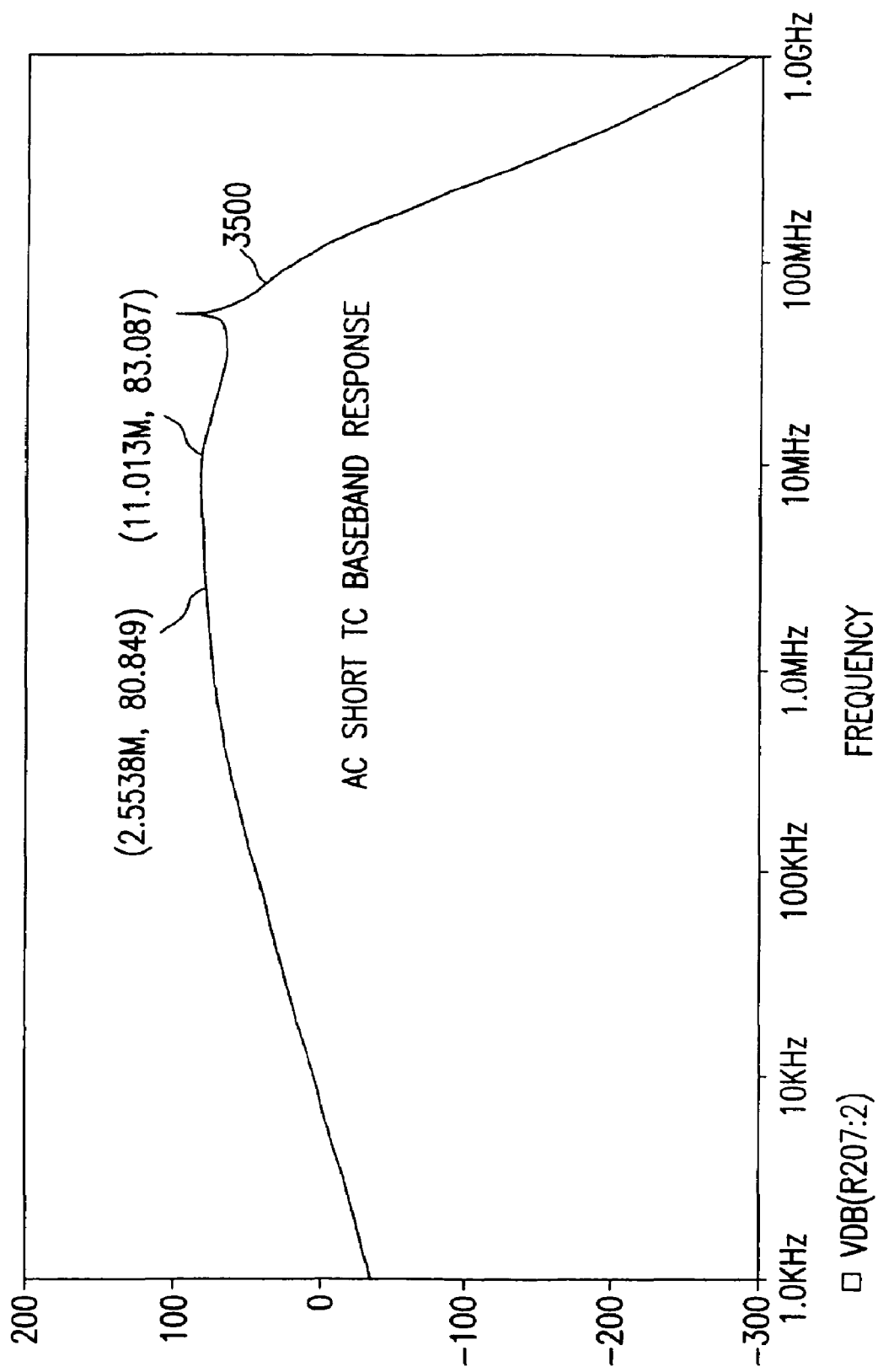
Figure 36:
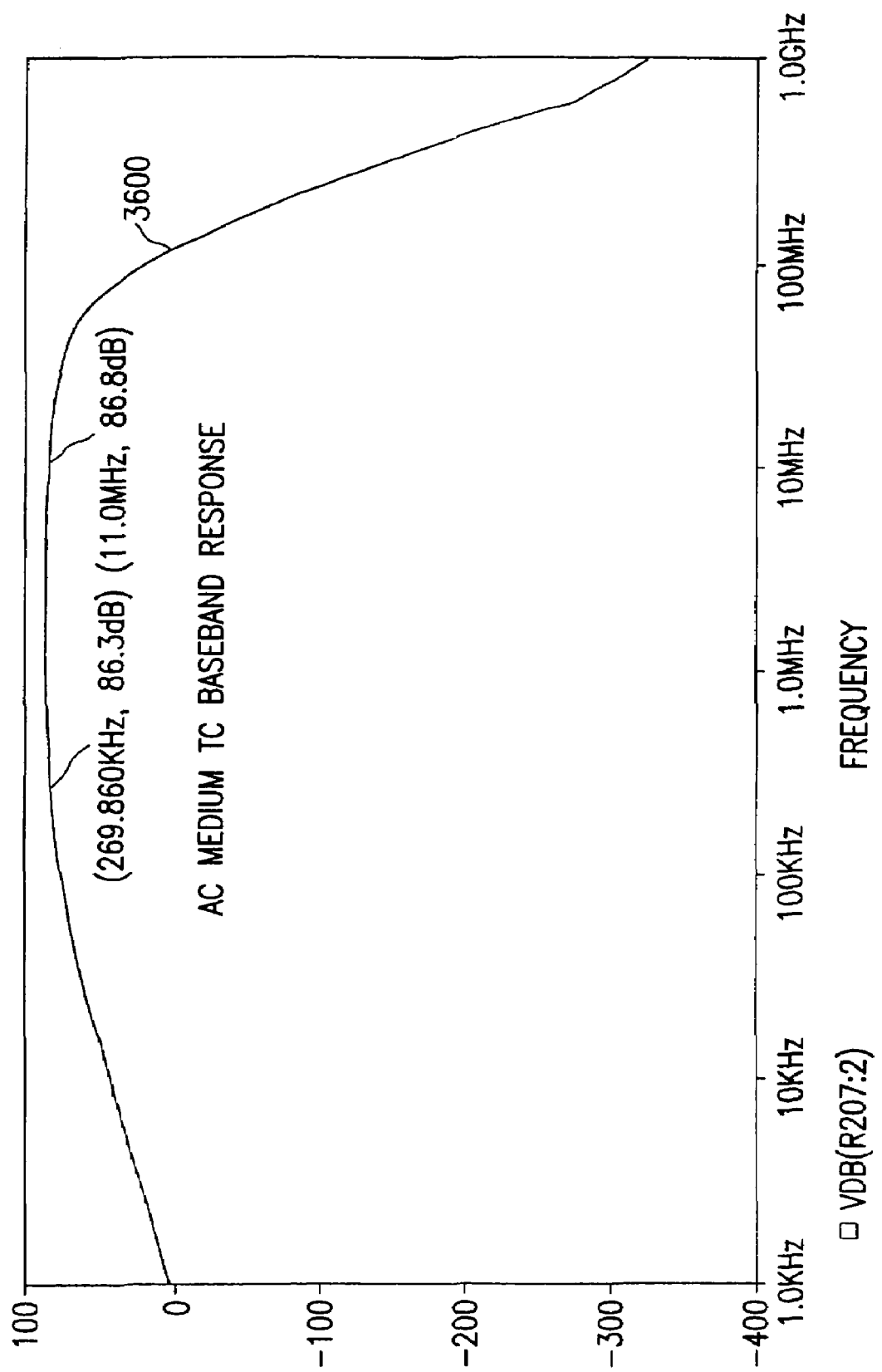
Figure 37:
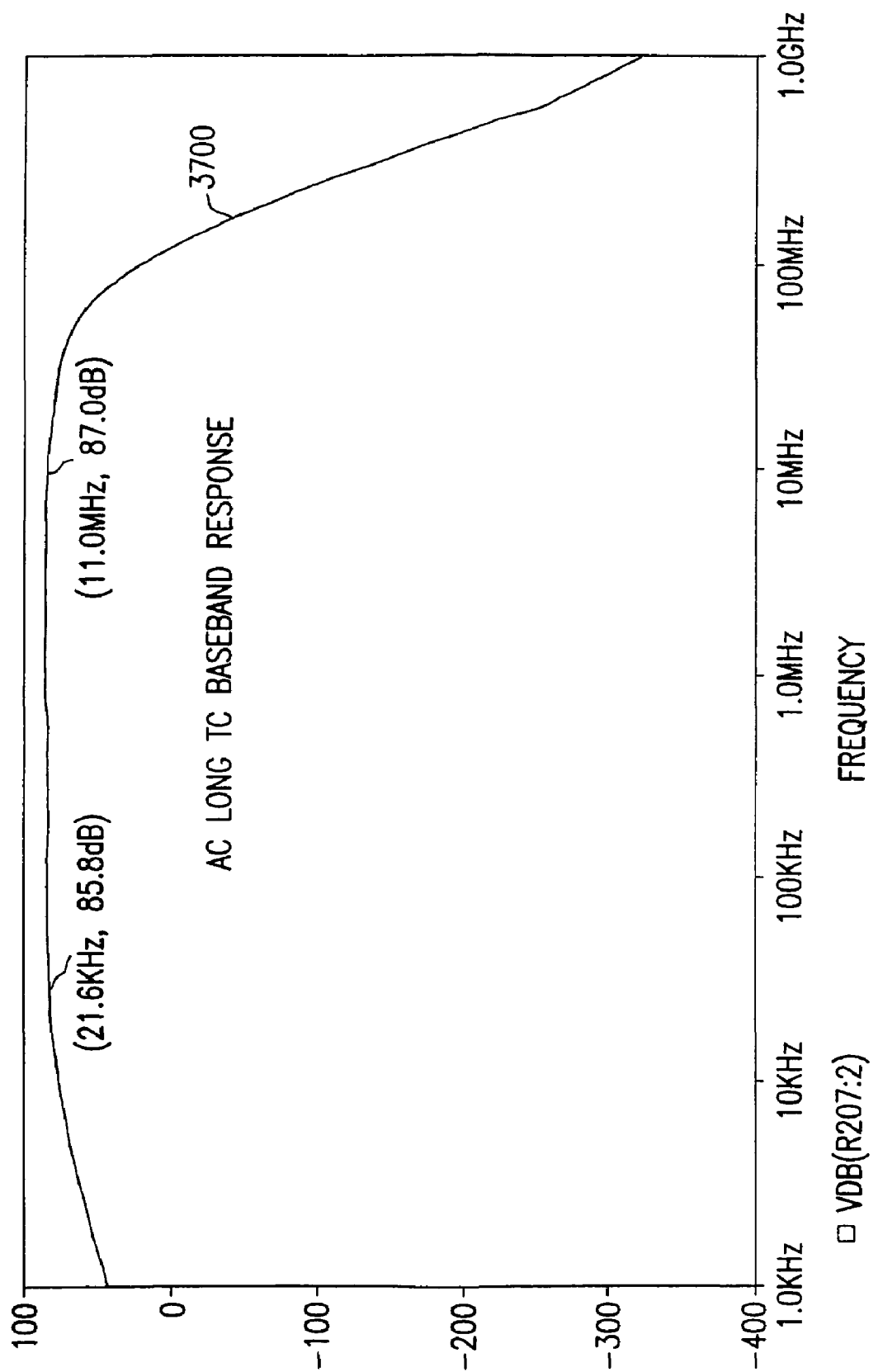

FIGS. 35-37 show exemplary frequency responses for a receiver channel configured as shown in FIGS. 31A-B or 32A-B, when the frequency response is varied, according to embodiments of the present invention.

Figure 38:
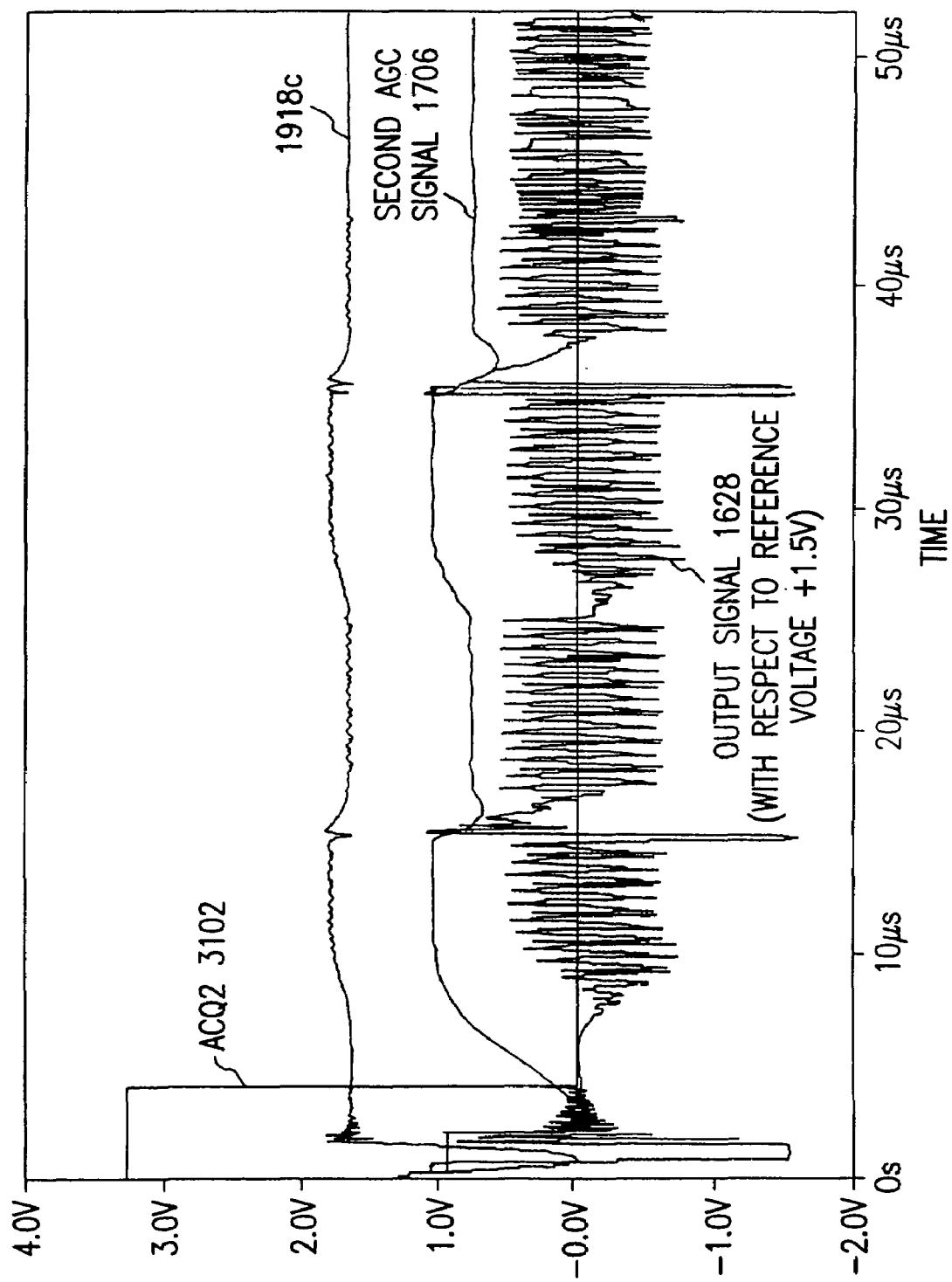

FIG. 38 shows example waveforms related to the operation of receiver channel as shown in FIGS. 32A-B in a WLAN environment, according to an embodiment of the present invention.

Figure 39:
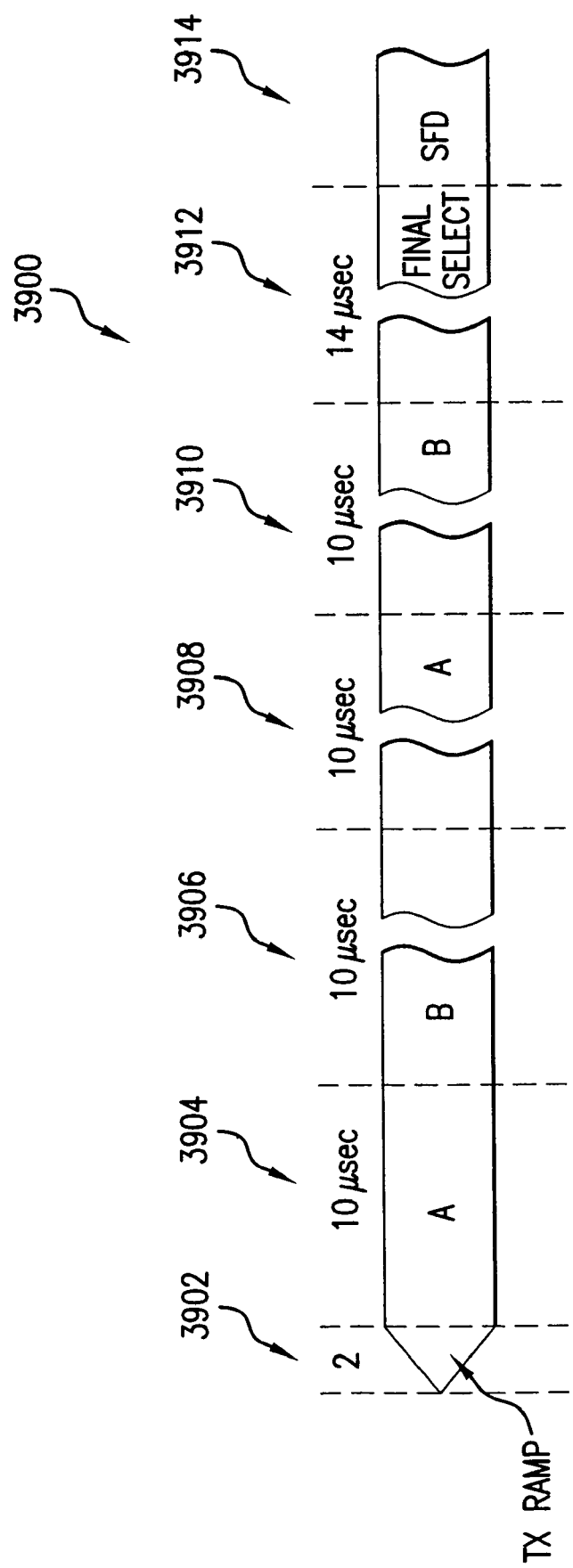

FIG. 39 shows an example timeline for receiving a WLAN DSSS frame, according to an embodiment of the present invention.

Figure 40:
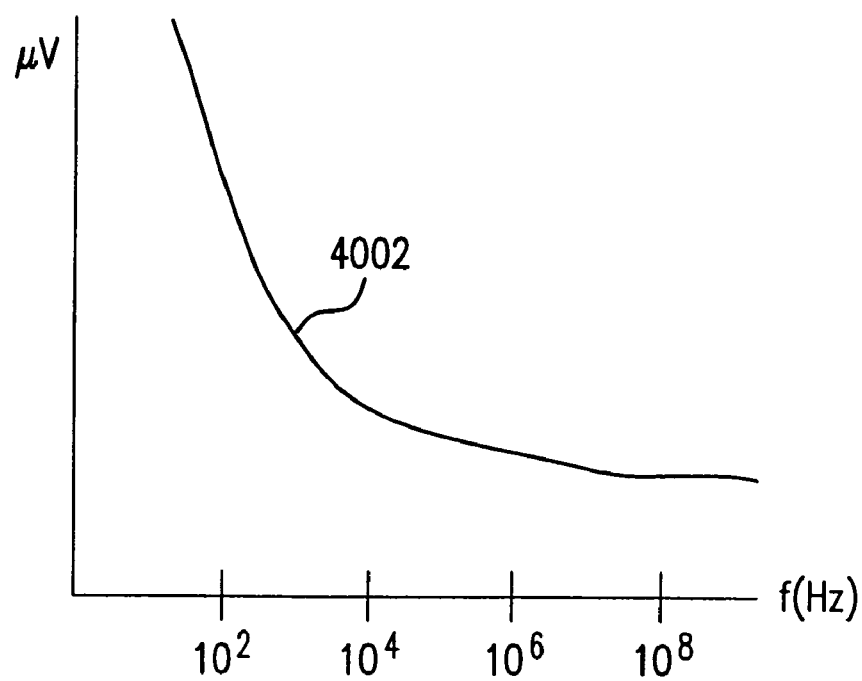

FIG. 40 shows an example 1/f noise characteristic curve.

Figure 41:
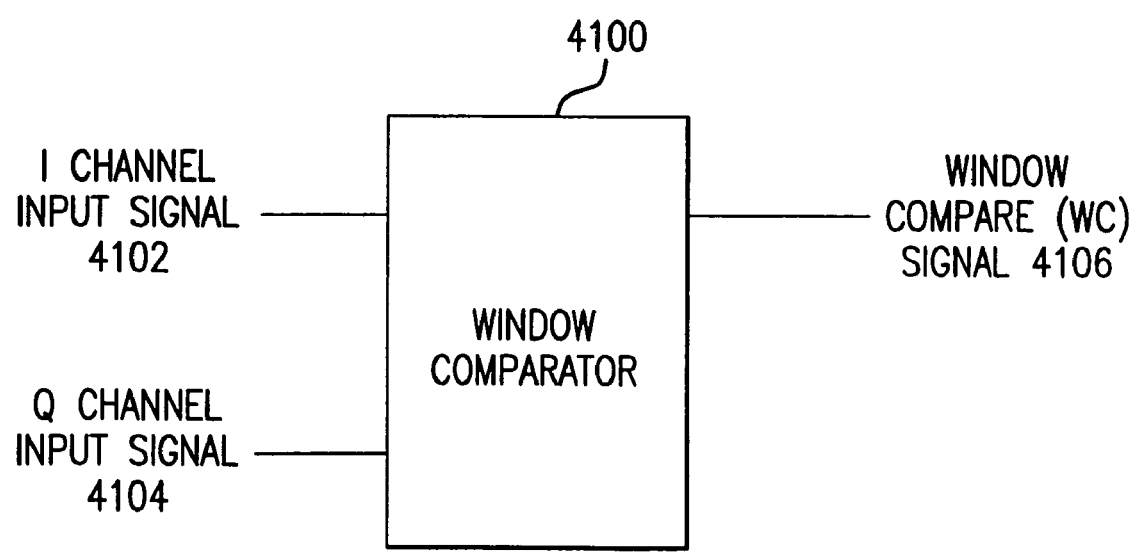

FIG. 41 shows a high level view of a window comparator module, according to an embodiment of the present invention.

Figure 42:
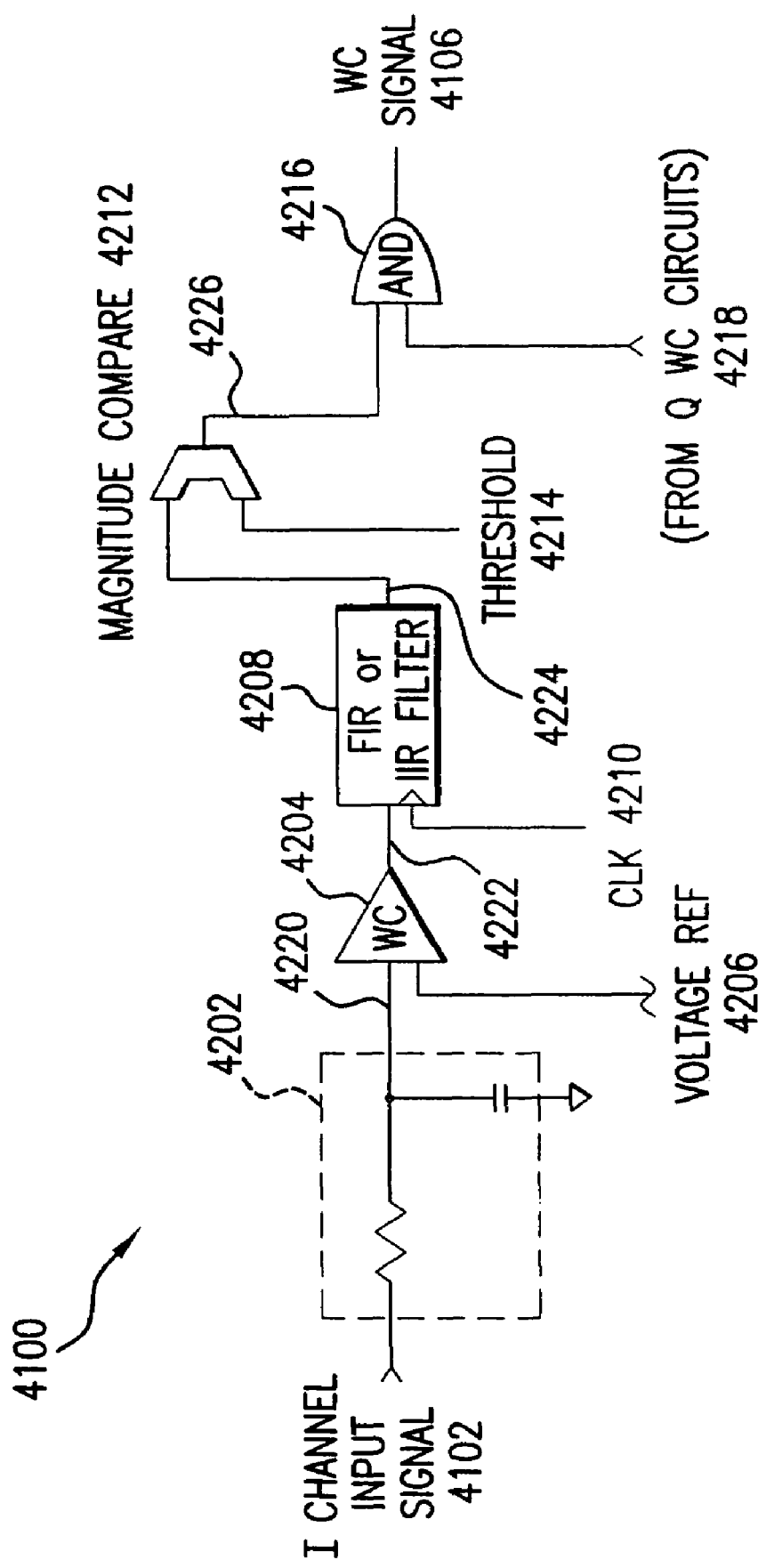
Figure 43:
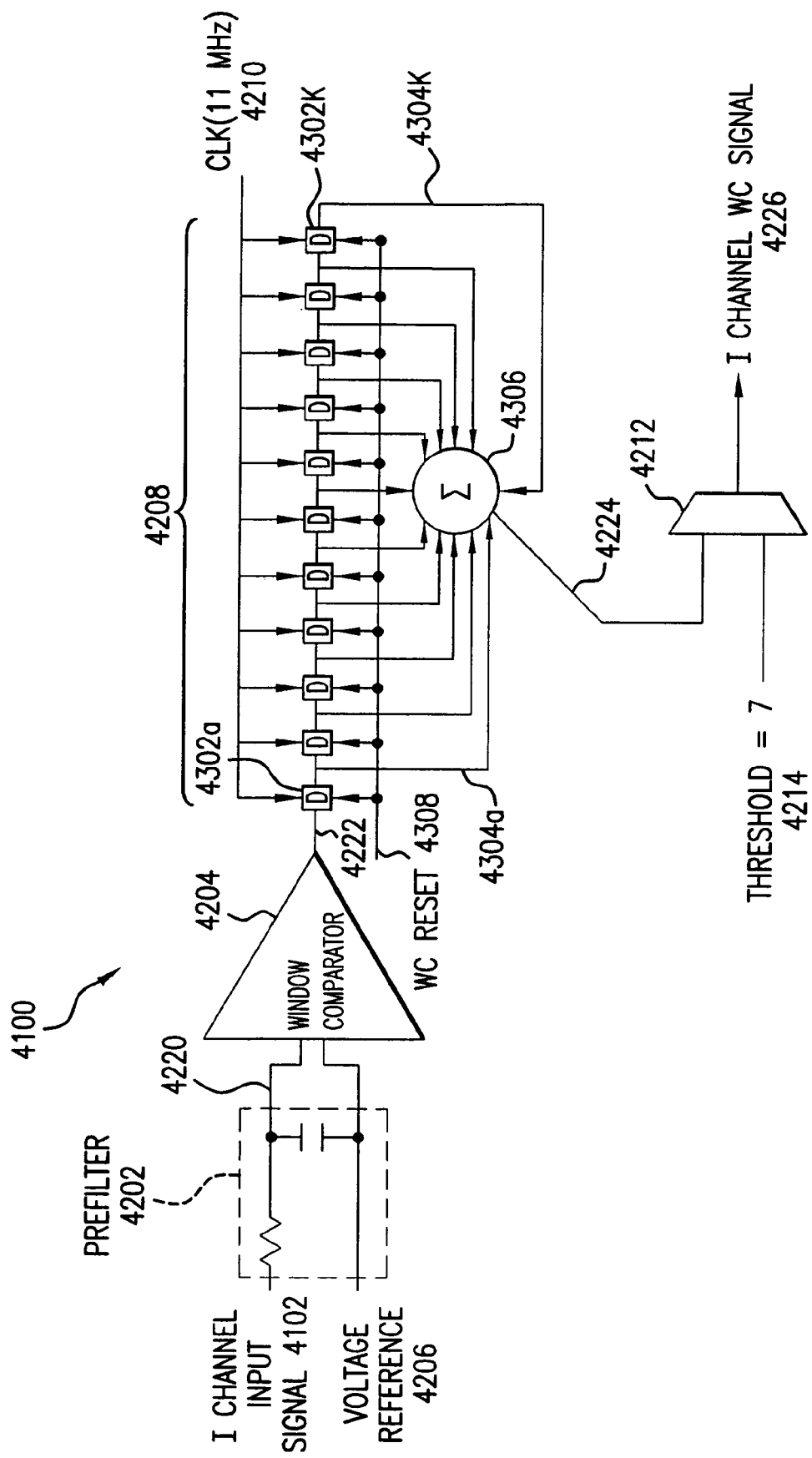

FIGS. 42 and 43 show more detailed examples of the window comparator module of FIG. 41, according to embodiments of the present invention.

Figure 44:
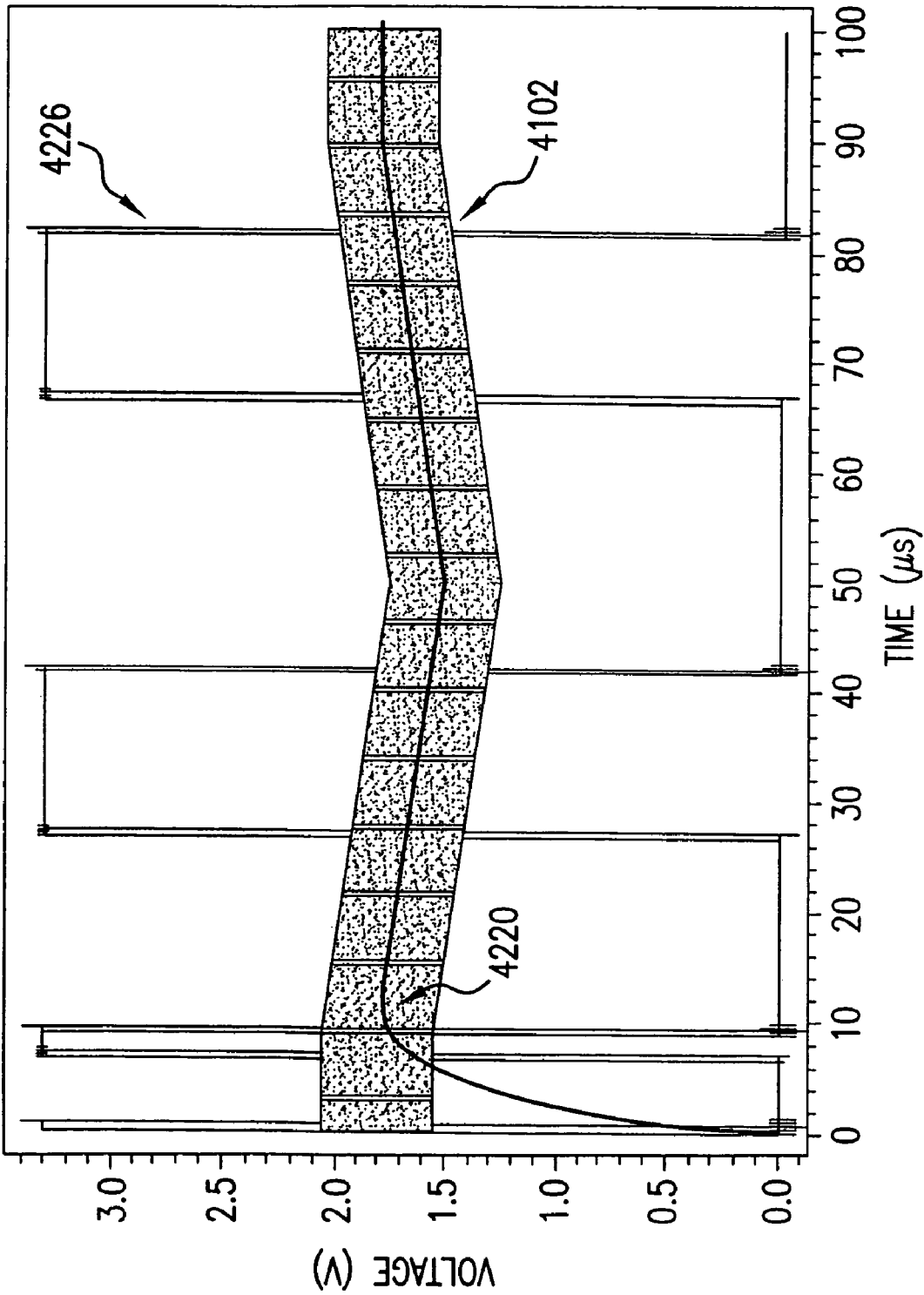

FIG. 44 shows example waveforms related to the operation of a waveform comparator, according to an embodiment of the present invention.

Figure 45:
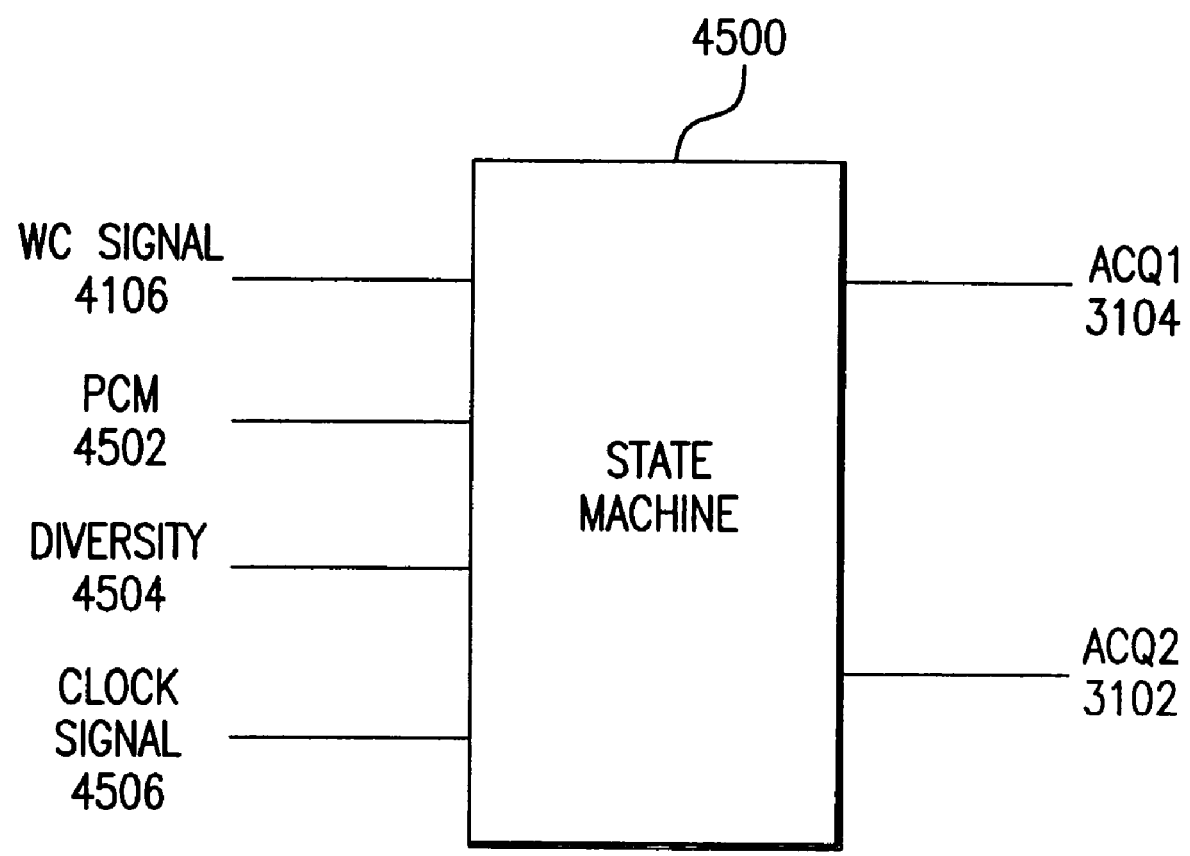

FIG. 45 shows an example state machine module for generating and sequencing control signals of the present invention.

Figure 46:
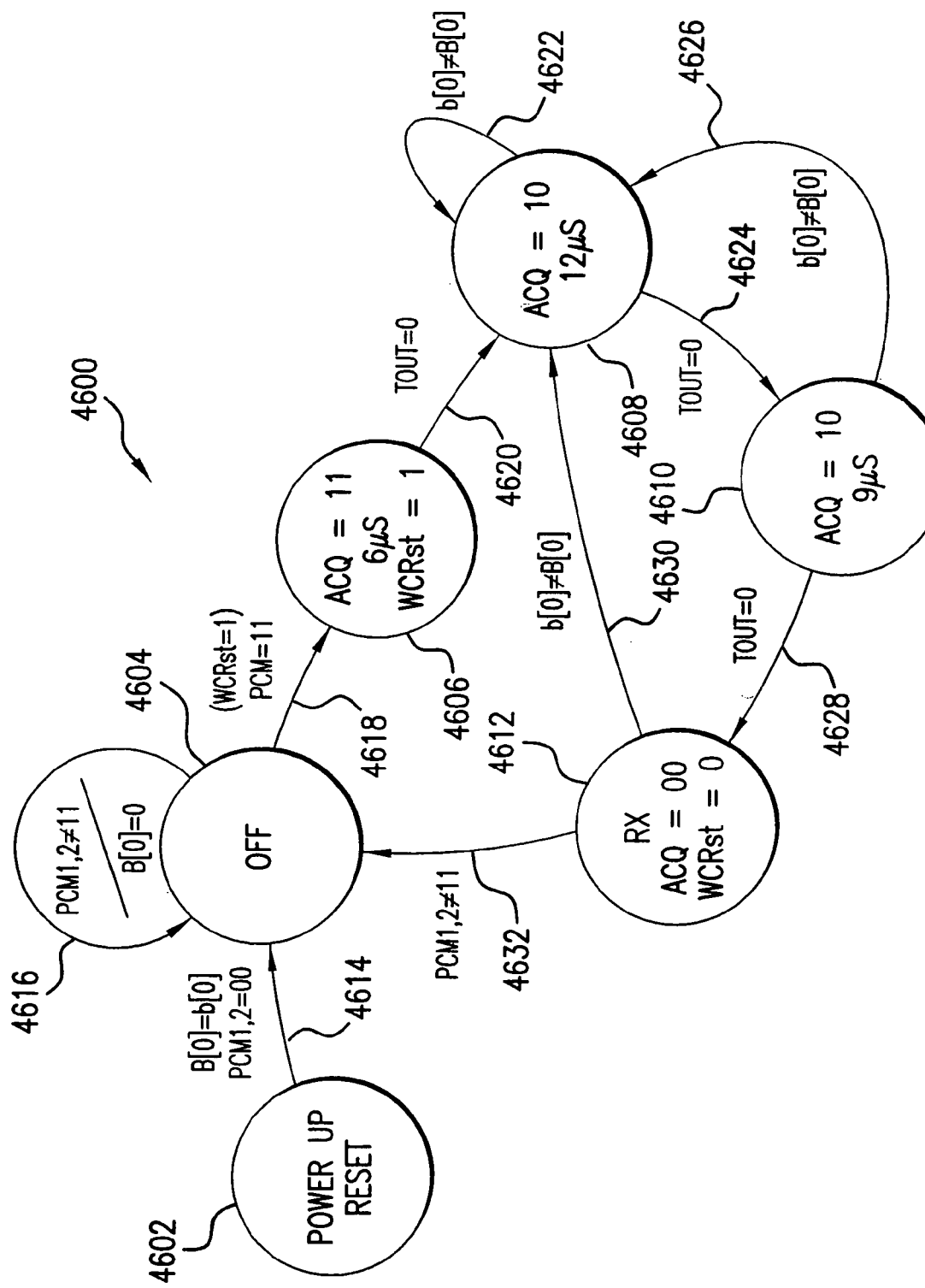
Figure 47:
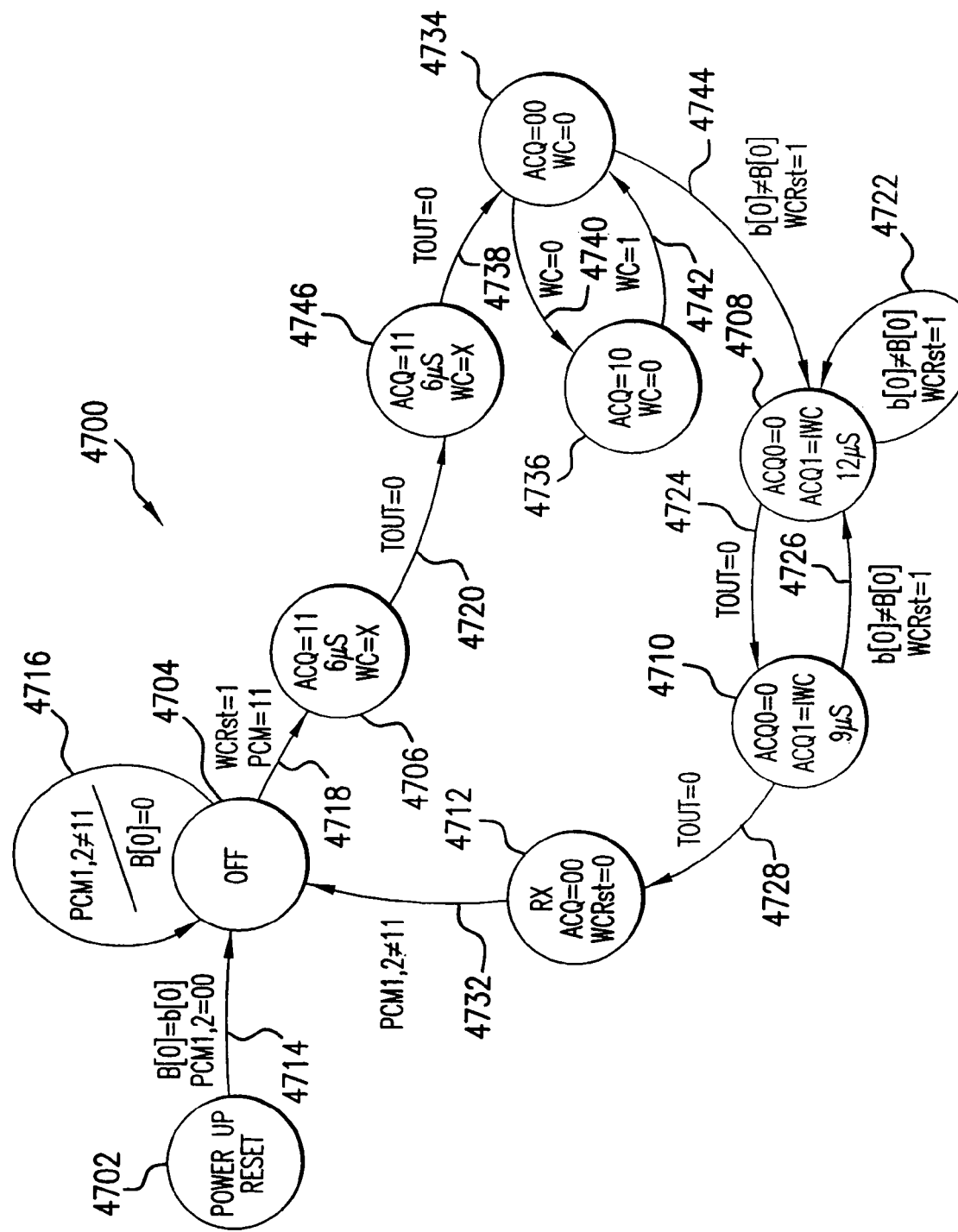

FIGS. 46 and 47 show example state diagrams that may be implemented by the state machine module of FIG. 45, according to embodiments of the present invention.

FIGS. 48, 49, 50A, and 50B show example flowcharts providing operational steps for performing embodiments of the present invention.

Figure 51:
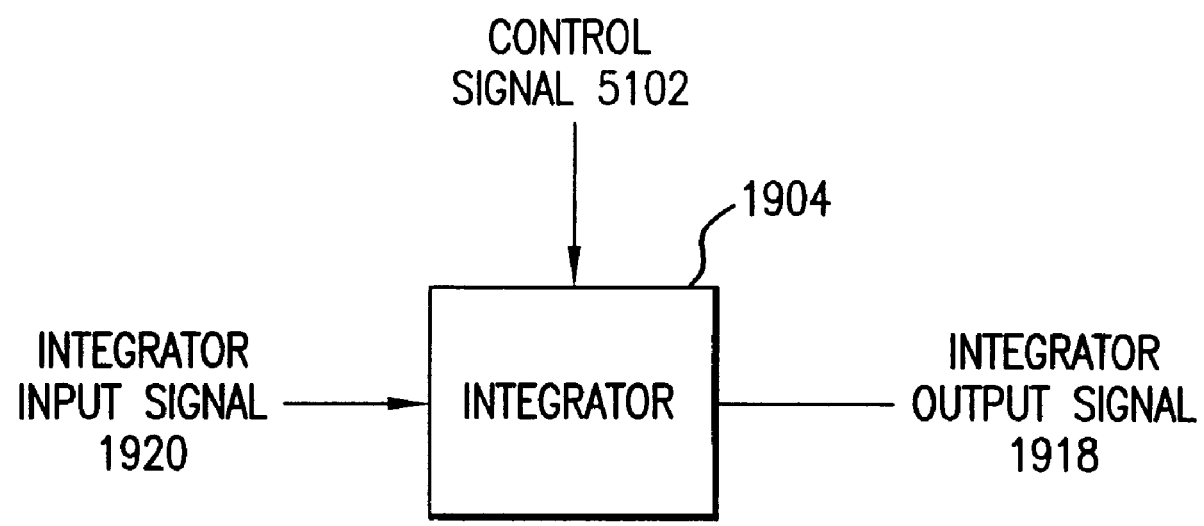

FIG. 51 shows an block diagram of an integrator that receives a control signal, according to an embodiment of the present invention.

Figure 52:
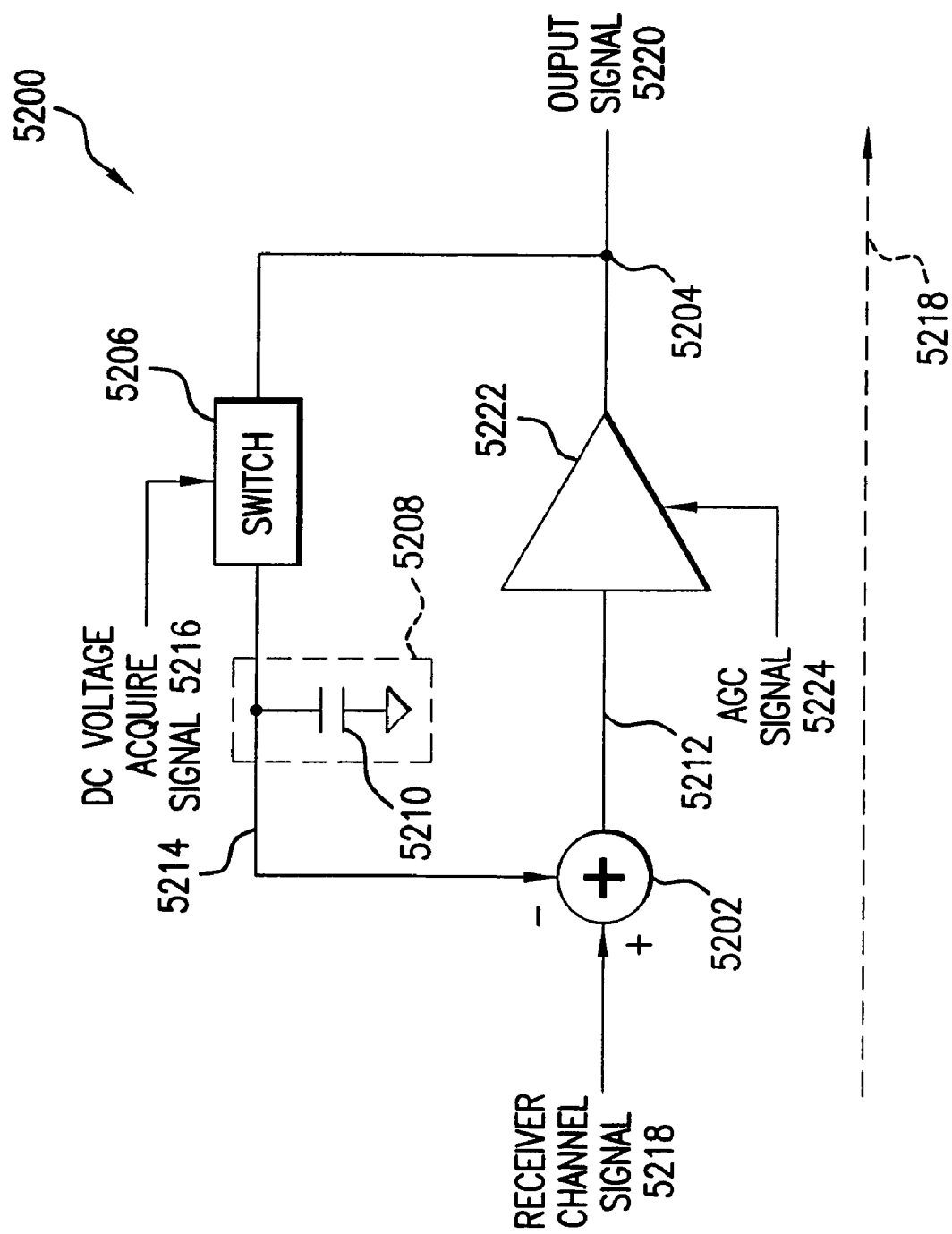

FIG. 52 shows an open loop circuit for reducing DC offsets in a receiver channel, according to an example embodiment of the present invention.

Figure 53:
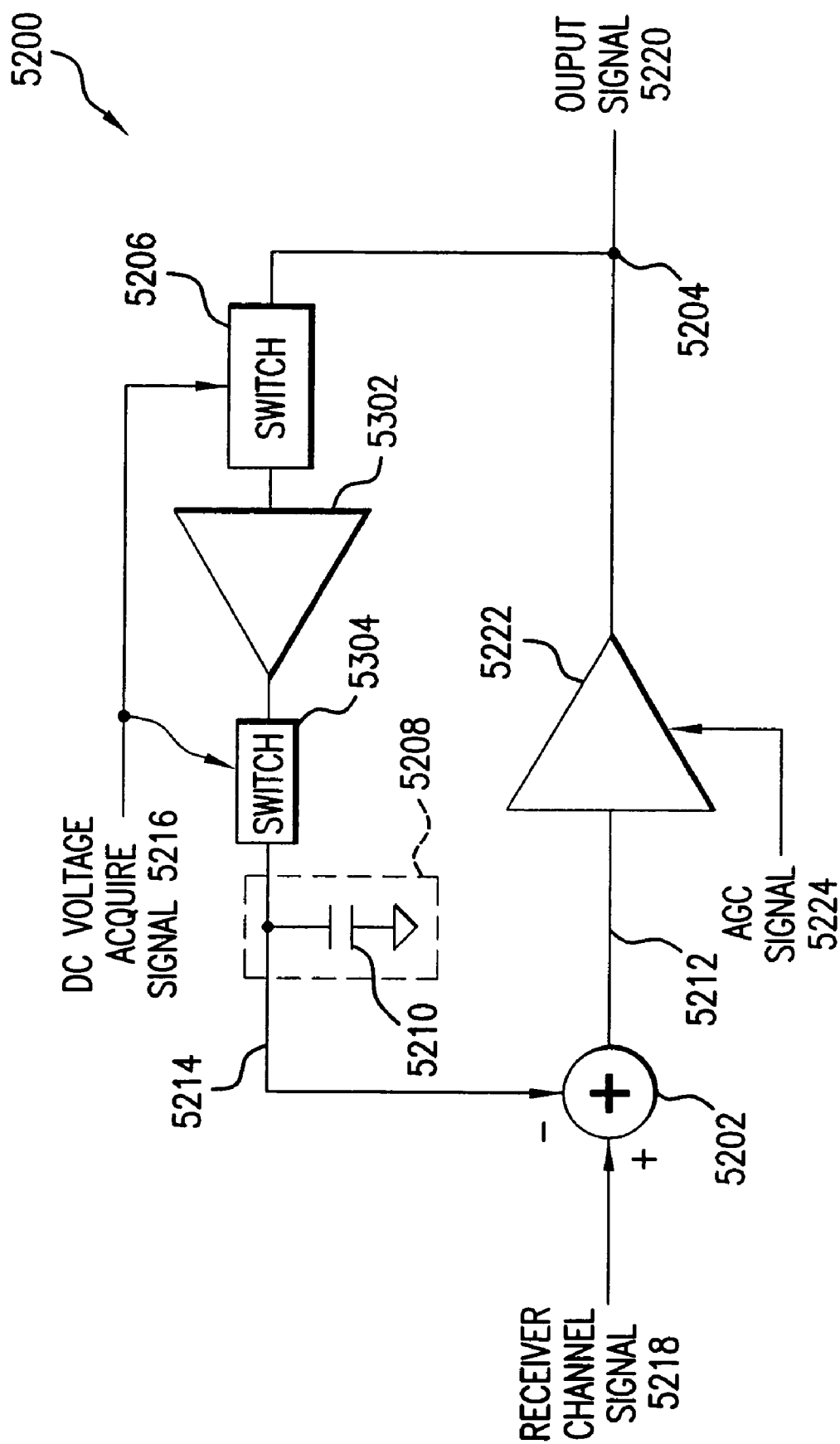

FIG. 53 shows an alternative embodiment for the open loop circuit of FIG. 52, according to the present invention.

Figure 54:
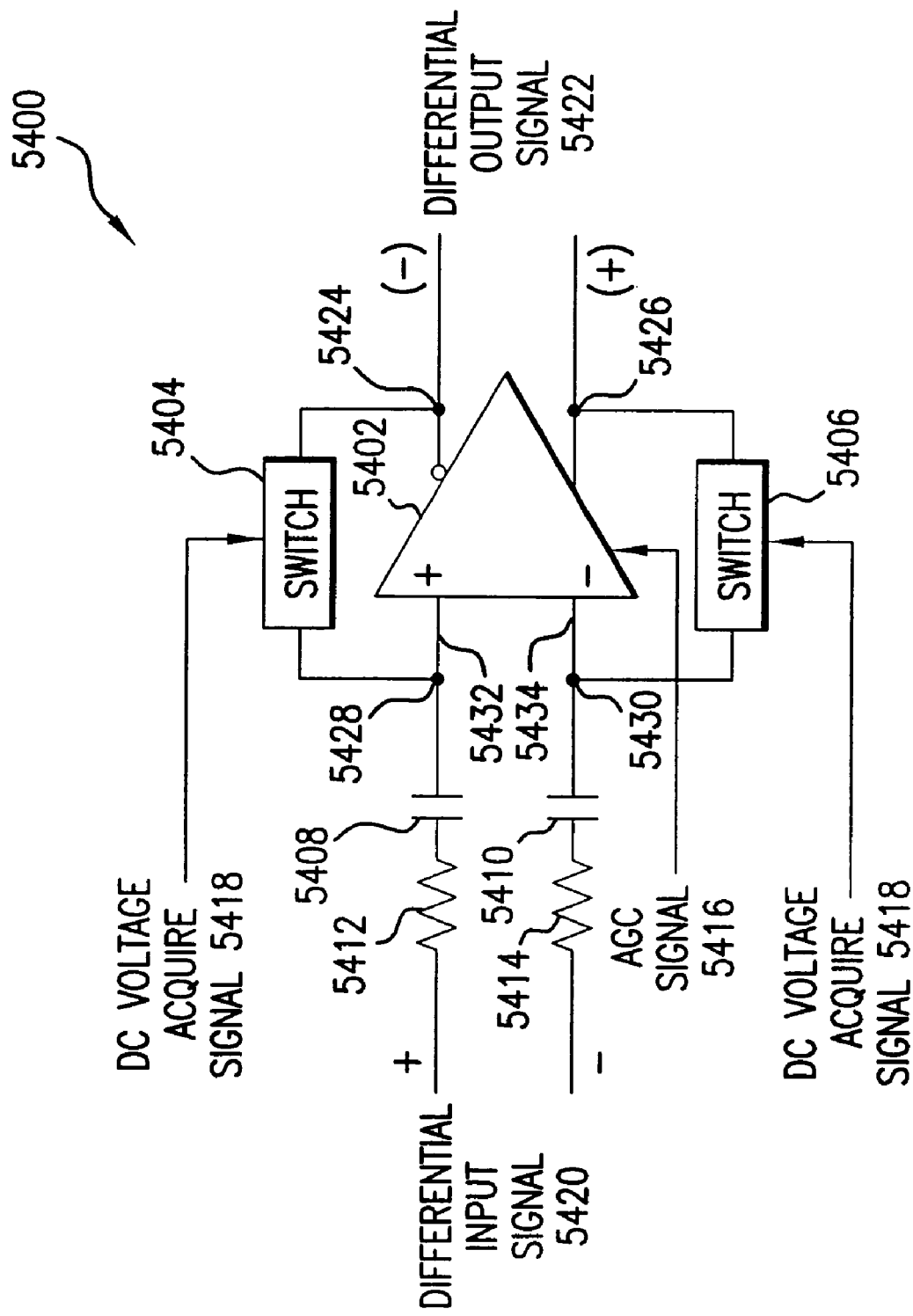

FIG. 54 shows a differential open loop circuit for reducing DC offsets, according to an embodiment of the present invention.

FIG. 55 shows an open loop circuit pair for reducing DC offset voltages that may be implemented in a receiver channel, according to an example embodiment of the present invention.

FIG. 56 shows a differential open loop circuit pair for reducing DC offset voltages that may be implemented in a receiver channel, according to an example embodiment of the present invention.

Figure 57:
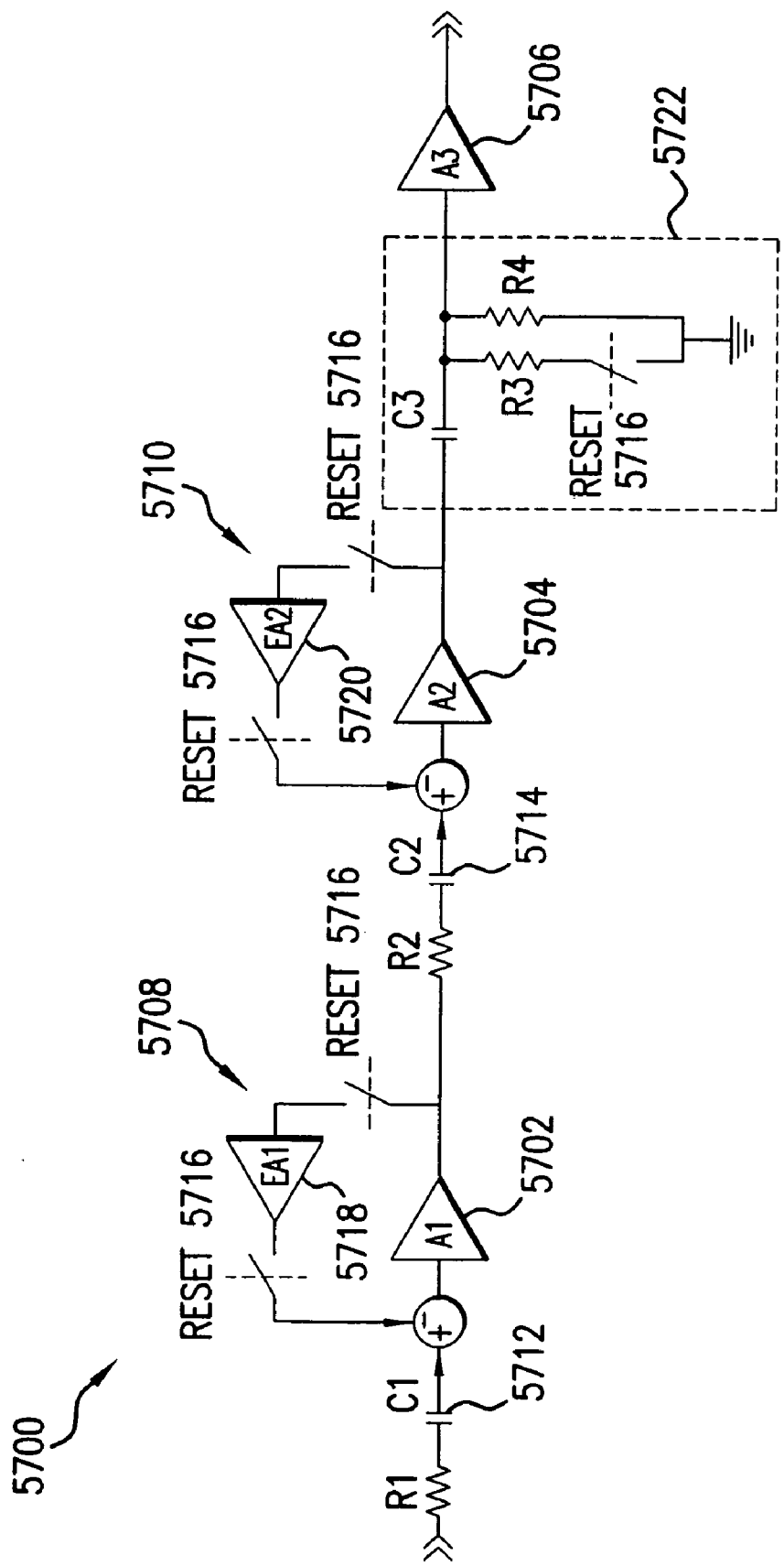

FIG. 57 illustrates a baseband portion of a receiver channel, according to an embodiment of the present invention.

Figure 58:
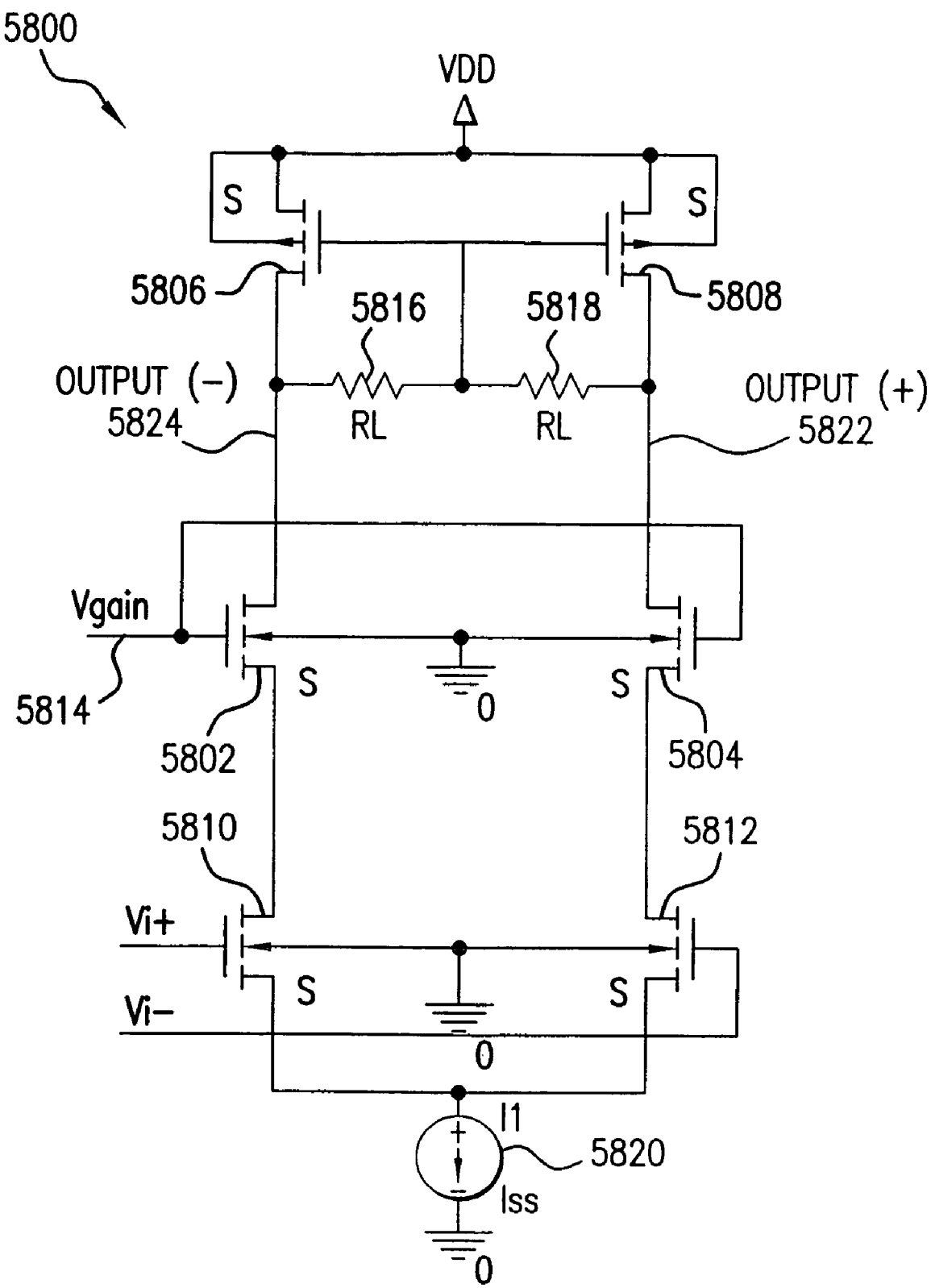

FIG. 58 illustrates an example variable gain amplifier that may be used in the receiver channel portion shown in FIG. 58, according to an embodiment of the present invention.

Figure 59:
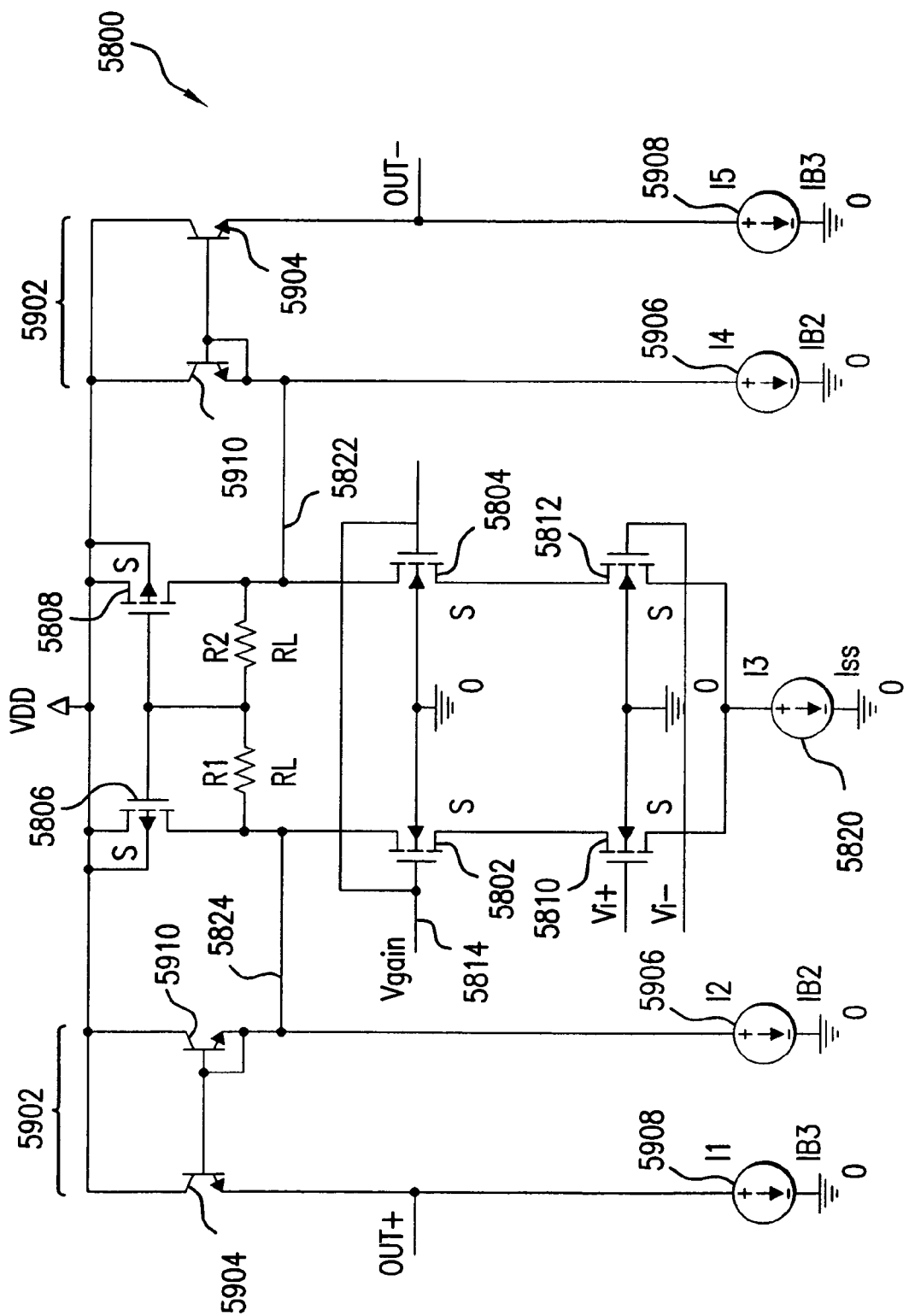

FIG. 59 shows an example buffered configuration for the variable gain amplifier shown in FIG. 58, according to an embodiment of the present invention.

Figure 60:
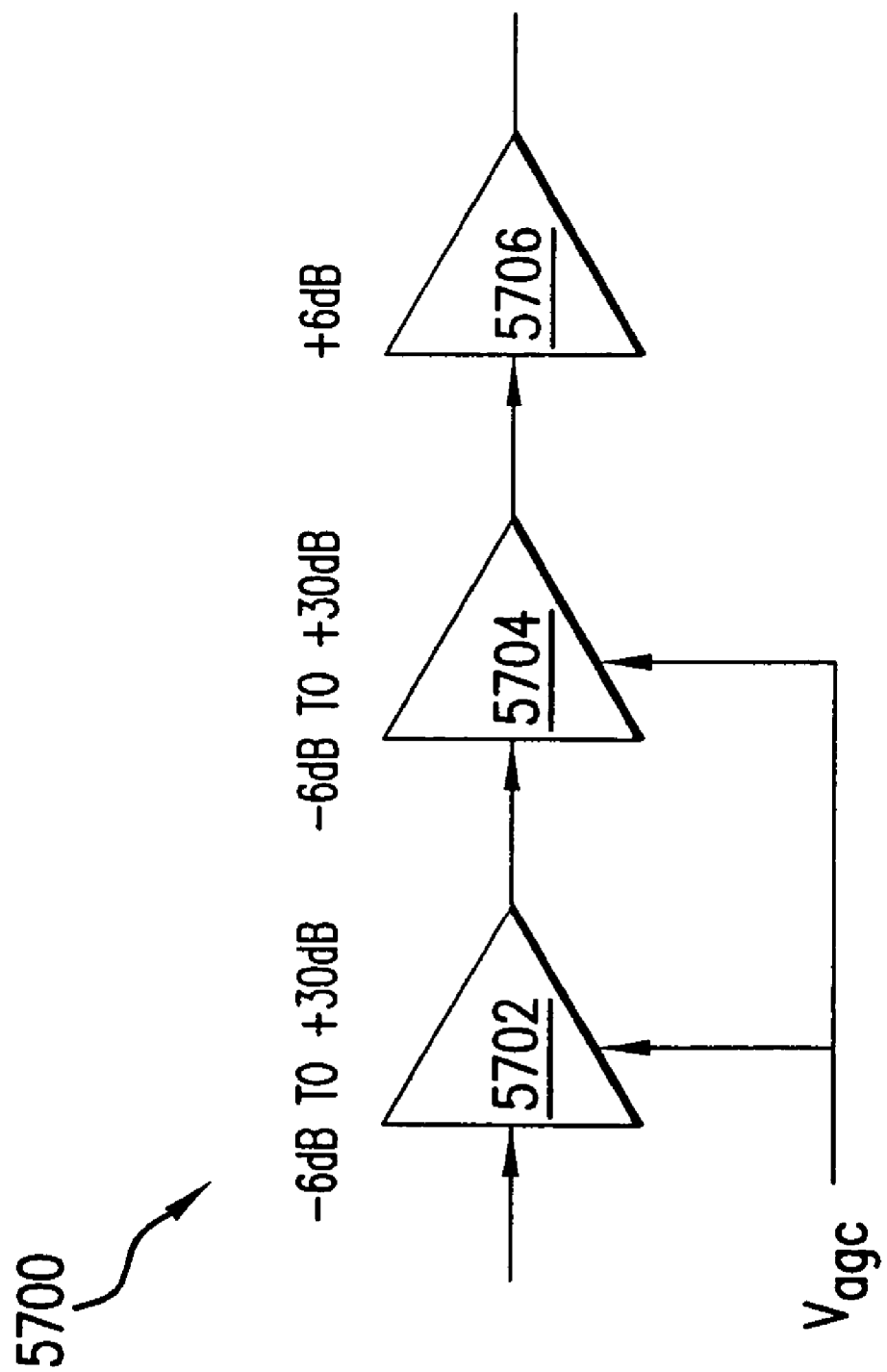

FIG. 60 illustrates the receiver channel portion shown in FIG. 57 with example gain values, according to an embodiment of the present invention.

Figure 61:
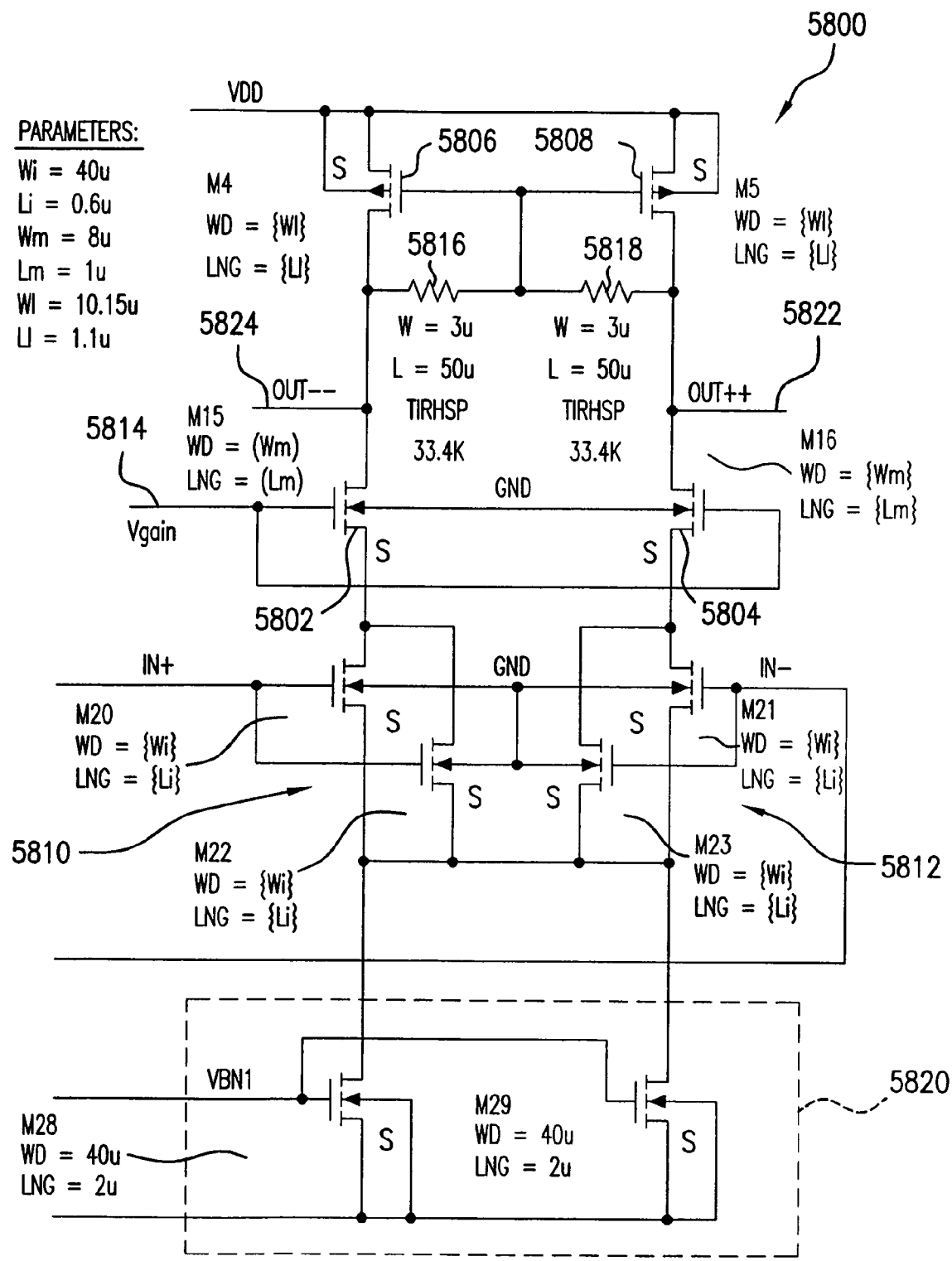

FIG. 61 shows a detailed schematic view of the variable gain amplifier shown in FIG. 58, according to an embodiment of the present invention.

Figure 62:
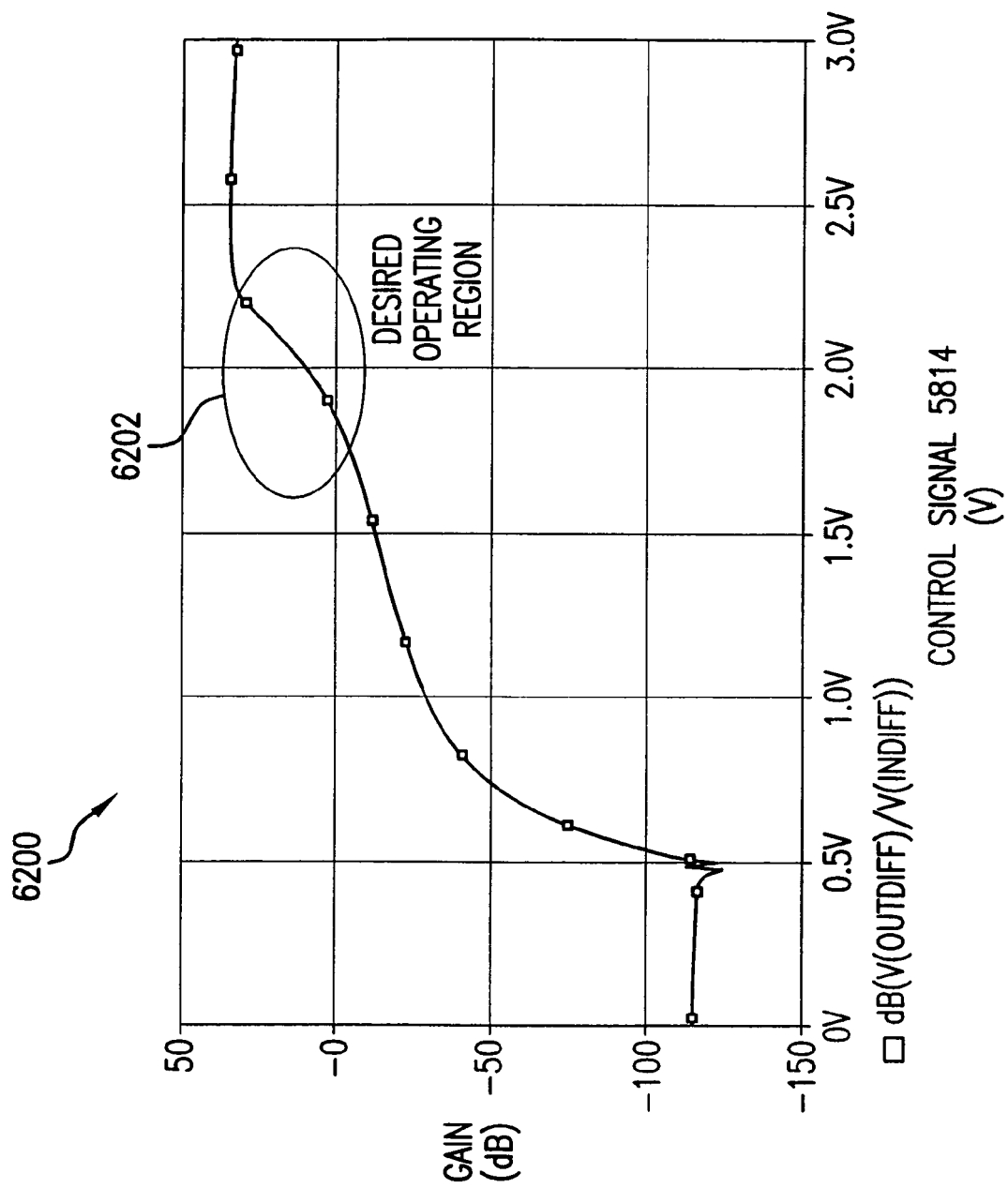

FIG. 62 shows the gain (in dB) of the variable gain amplifier of FIG. 61.

Figures 63, 64:
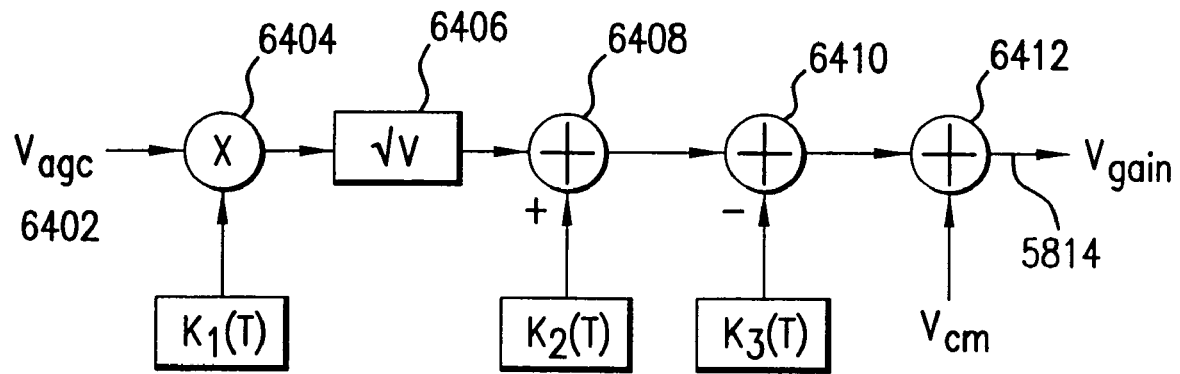

FIG. 63 shows an equation relating the gain of the variable gain amplifier of FIG. 62 to the square of the difference of a control voltage and a threshold voltage.

FIG. 64 illustrates a process for conditioning an applied gain control voltage to generate the control voltage input to the variable gain amplifier of FIG. 58, according to an embodiment of the present invention.

Figure 65:
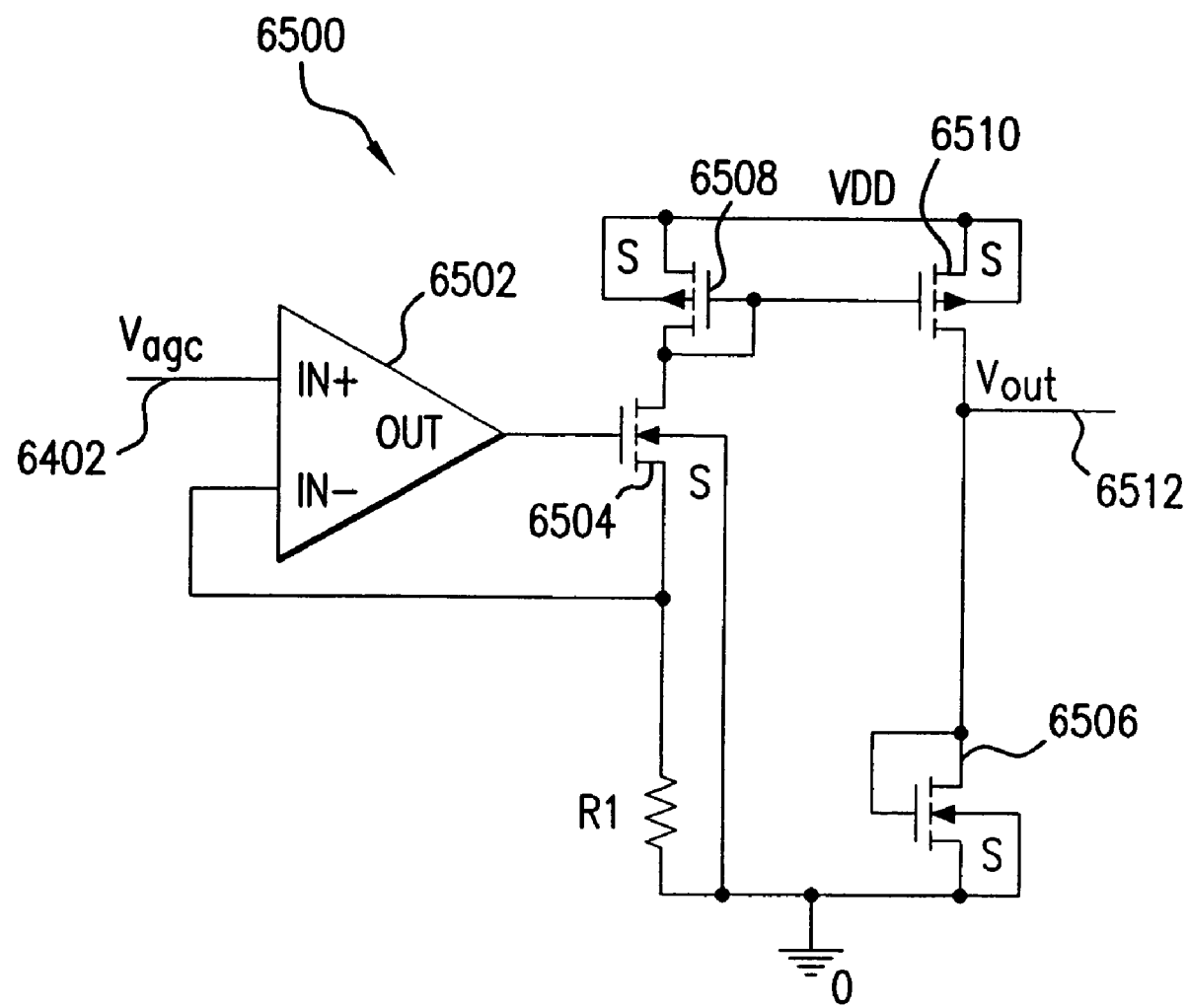

FIG. 65 illustrates an example square root function generator, according to an embodiment of the present invention.

Figure 66:
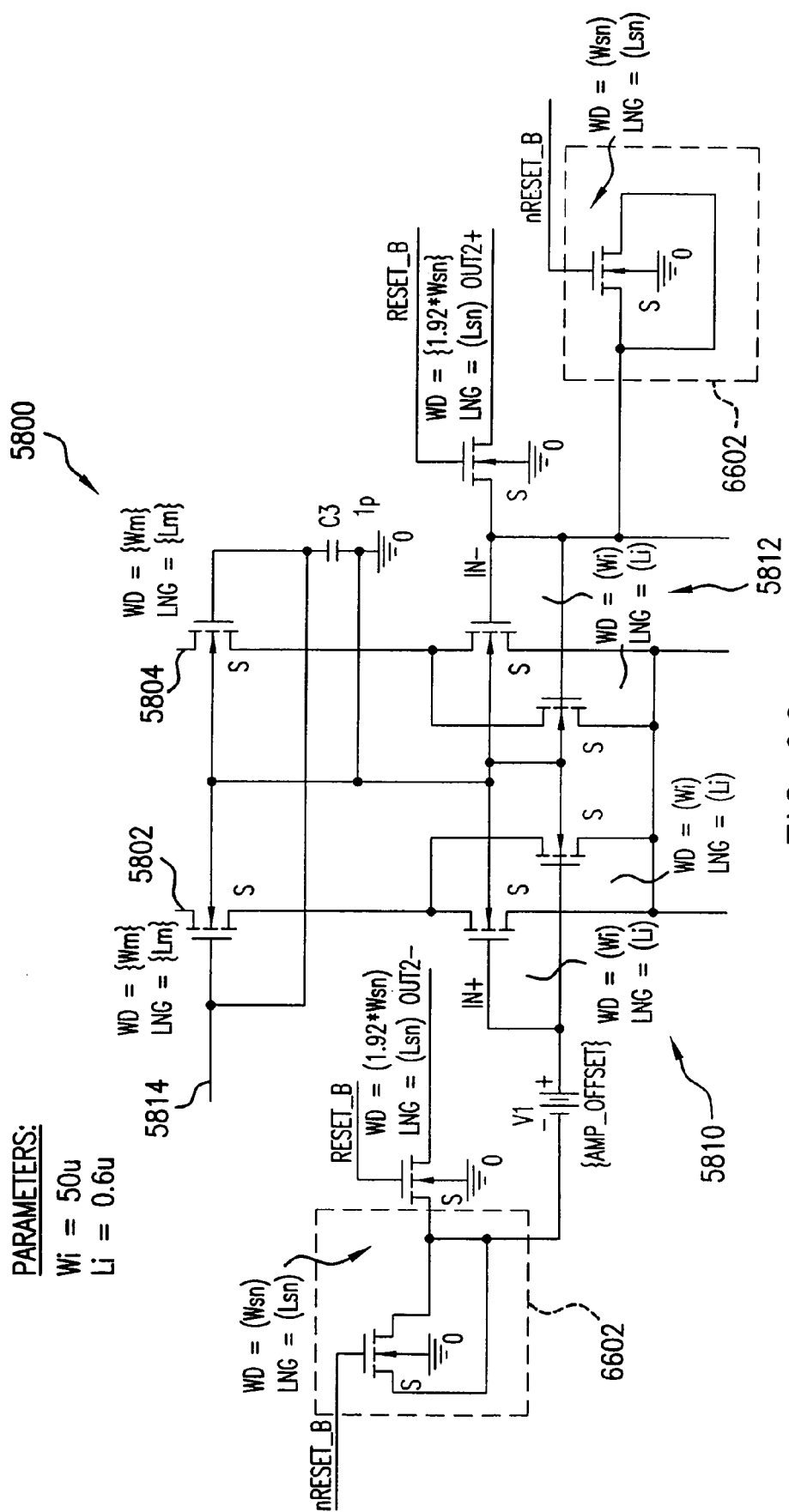

FIG. 66 shows an example portion of the variable gain amplifier of FIG. 58, with one or more dummy switches for cancellation of charge injection, according to an embodiment of the present invention.

Figure 67A:
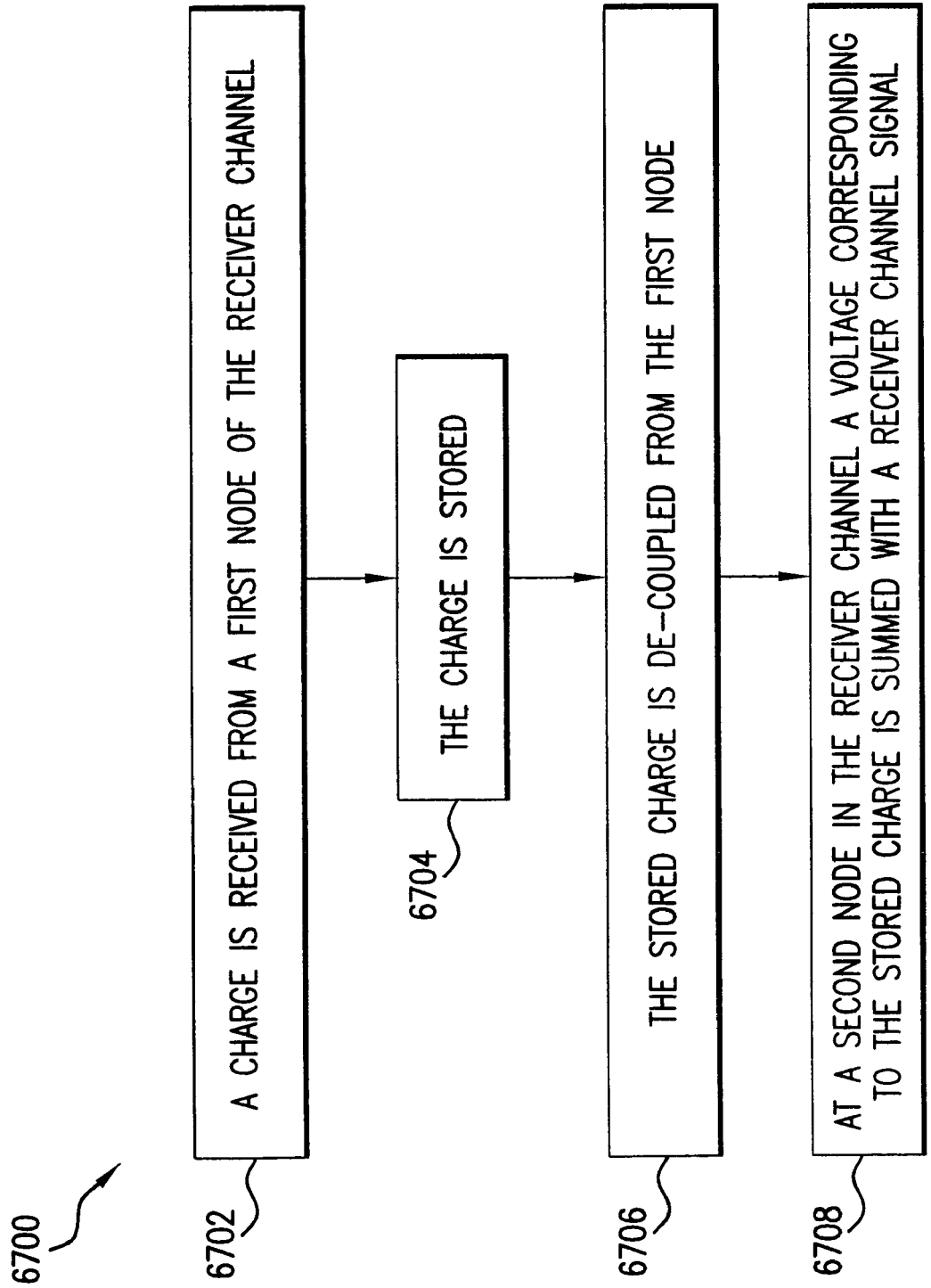
Figure 67B:
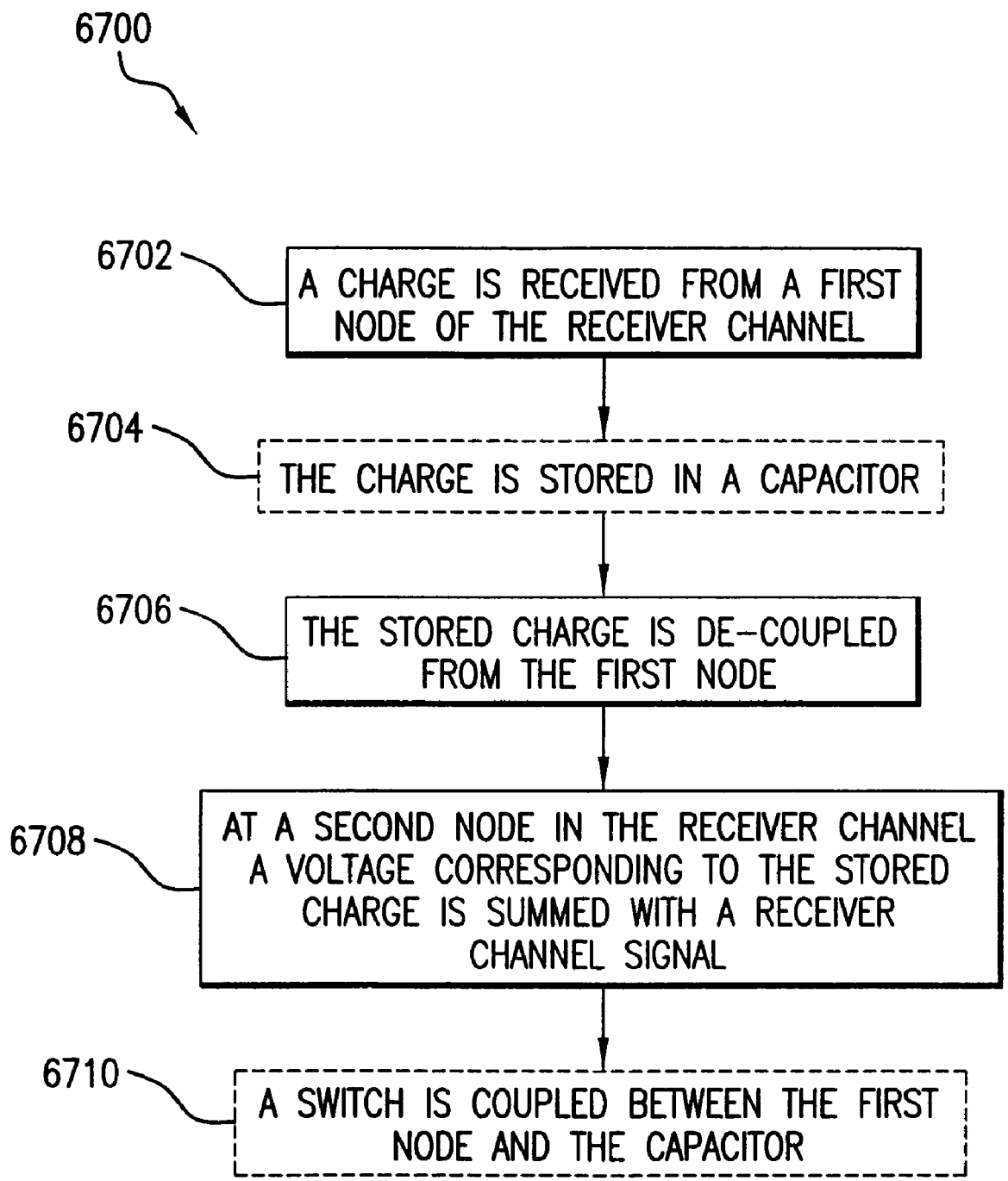
Figure 67C:
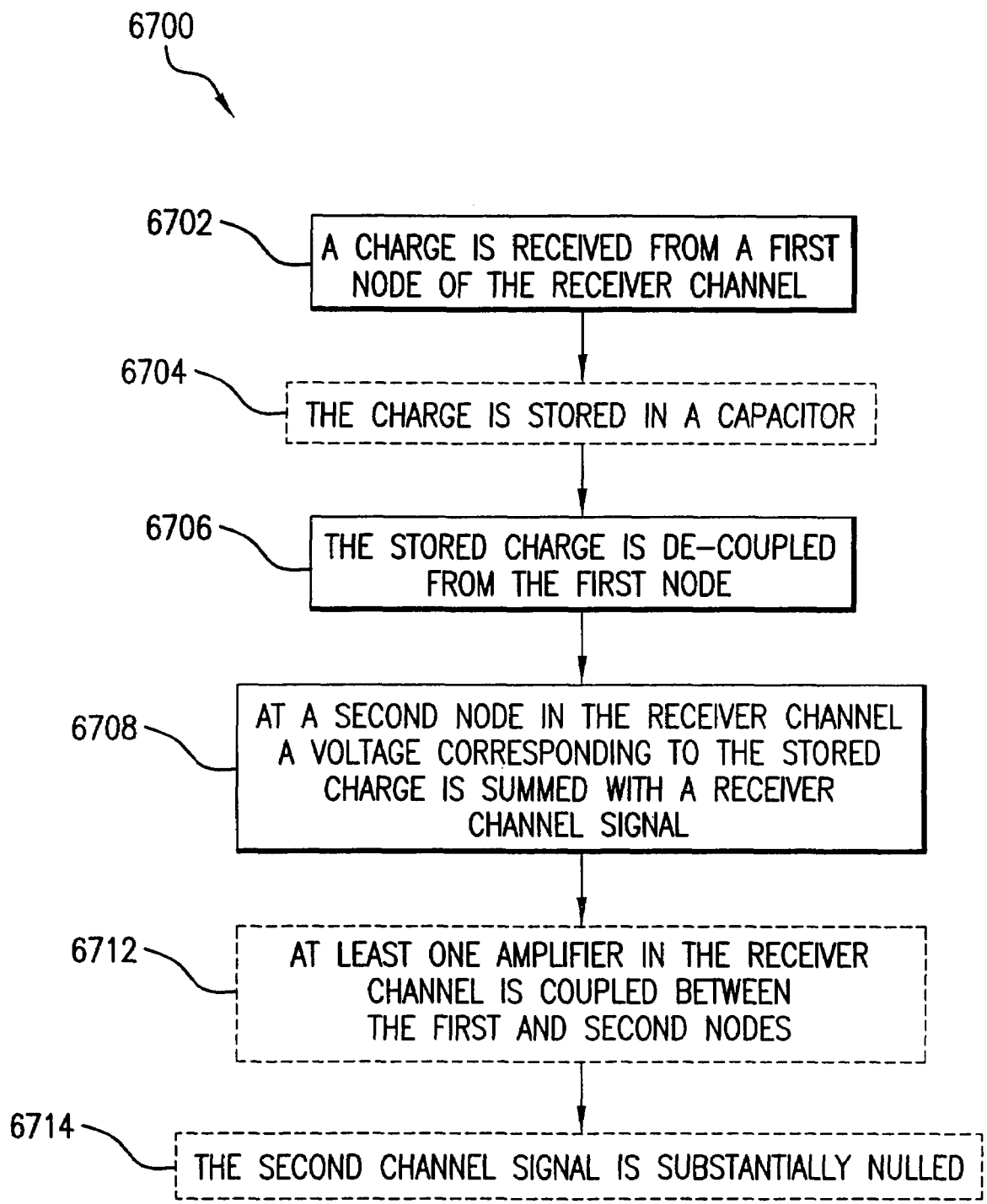

FIGS. 67A-67C show example flowcharts providing operational steps for performing embodiments of the present invention.

Figure 68:
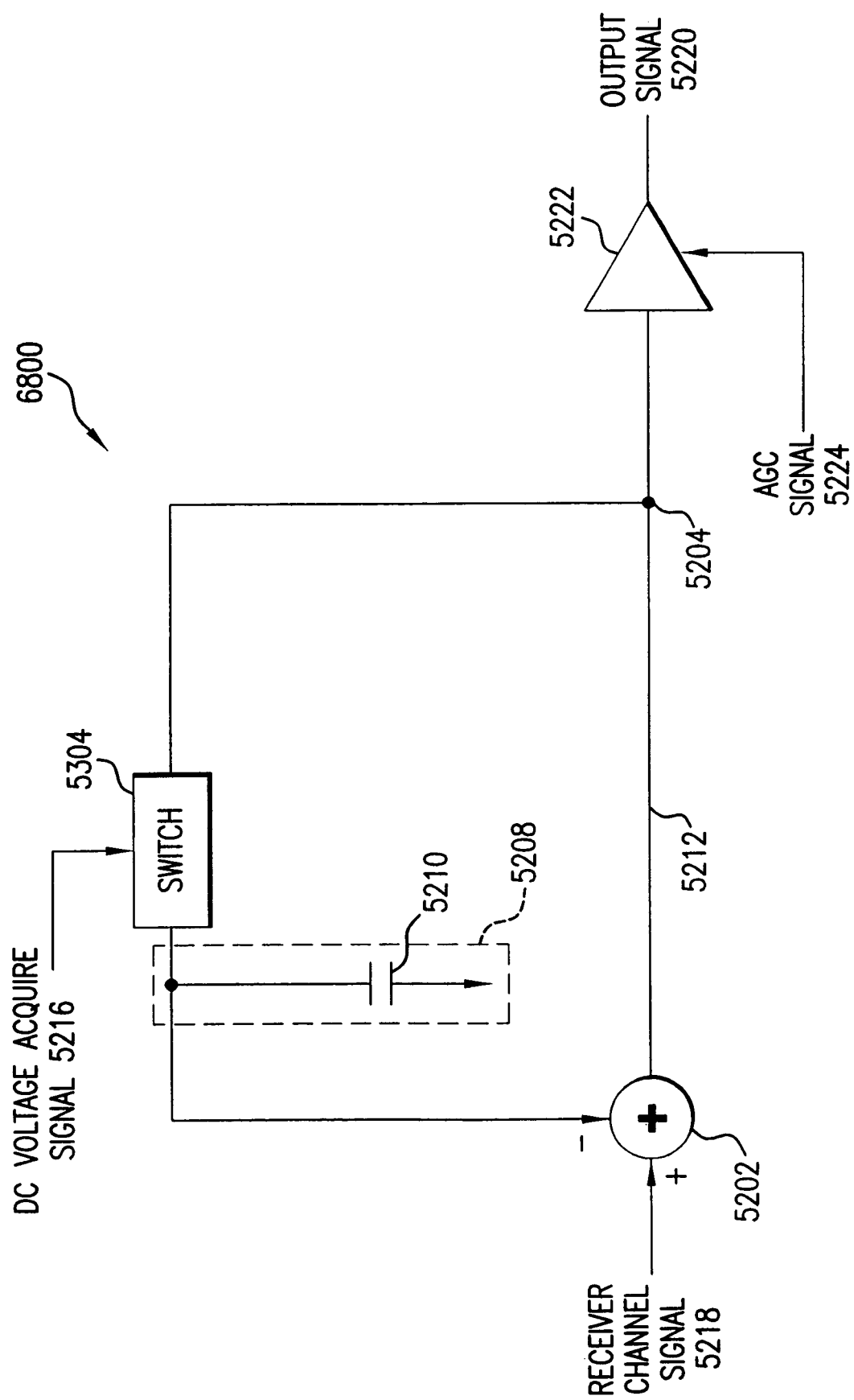

FIG. 68 shows an alternative embodiment for the open loop circuit of FIG. 52, according to the present invention.

The present invention will now be described with reference to the accompanying drawings. In the drawings, like reference numbers generally indicate identical or functionally similar elements. Additionally, the left-most digit(s) of a reference number generally identifies the drawing in which the reference number first appears.

DETAILED DESCRIPTION OF THE INVENTION

Table of Contents

1. Introduction
2. Universal Frequency Translation
   2.1 Frequency Down-Conversion
   2.2 Optional Energy Transfer Signal Module
   2.3 Impedance Matching
   2.4 Frequency Up-Conversion
   2.5 Enhanced Signal Reception
   2.6 Unified Down-Conversion and Filtering
3. Example Down-Converter Embodiments of the Invention
   3.1 Receiver Embodiments
      3.1.1 In-Phase/Quadrature-Phase (I/Q) Modulation Mode Receiver Embodiments
4. DC Offset and Circuit Gain Considerations and Corrections
   4.1 Overview of DC Offset
   4.2 Exemplary Communications Systems Receiver Channel
   4.3 Embodiments for Cancellation of DC Offset by Closed Feedback Loop
      4.3.1 Variable Frequency Response Embodiments of the Present Invention
      4.3.2 Operation of the Closed Feedback Loop of the Present Invention
   4.4 Embodiments for Cancellation of DC Offset by Open Feedback Loop
      4.4.1. Nulling the Receiver Channel Input Signal
      4.4.2 Operation of the Open Feedback Loop of the Present Invention
   4.5 Embodiments for Automatic Gain Control
      4.5.1 Operation of Automatic Gain Control Embodiments of the Present Invention
   4.6 Exemplary Receiver Channel Embodiments of the Present Invention
      4.6.1 Using the Receiver Channel of the Present Invention to Receive a WLAN Signal Packet
      4.6.2 Embodiments for Generating Control Signals for a Receiver Channel According to the Present Invention
         4.6.2.1 Window Comparator for Monitoring DC Offset
         4.6.2.2 State Machine for Generating Control Signals
5. Conclusion 1. Introduction The present invention is directed to the down-conversion and up-conversion of an electromagnetic signal using a universal frequency translation (UFT) module, transforms for same, and applications thereof. The systems described herein each may include one or more receivers, transmitters, and/or transceivers. According to embodiments of the invention, at least some of these receivers, transmitters, and/or transceivers are implemented using universal frequency translation (UFT) modules. The UFT modules perform frequency translation operations. Embodiments of the present invention are described below.

Systems that transmit and receive EM signals using UFT modules exhibit multiple advantages. These advantages include, but are not limited to, lower power consumption, longer power source life, fewer parts, lower cost, less tuning, and more effective signal transmission and reception. These systems can receive and transmit signals across a broad frequency range. The structure and operation of embodiments of the UFT module, and various applications of the same are described in detail in the following sections, and in the referenced documents.

2. Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
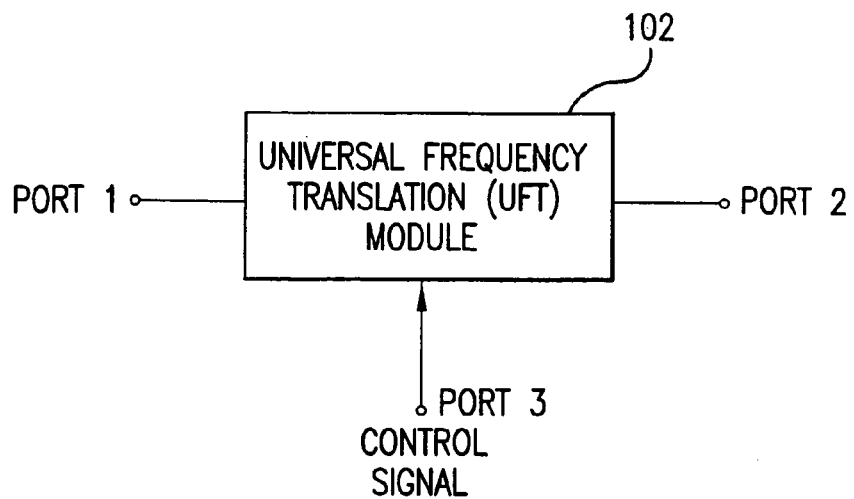
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
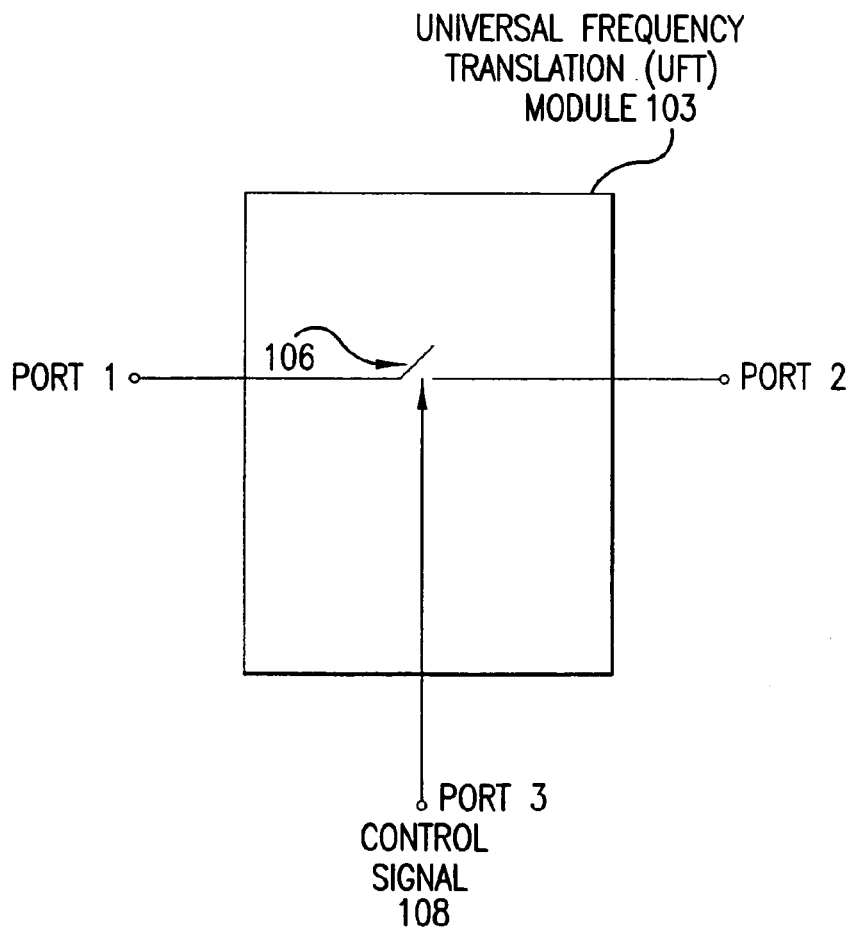
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2:
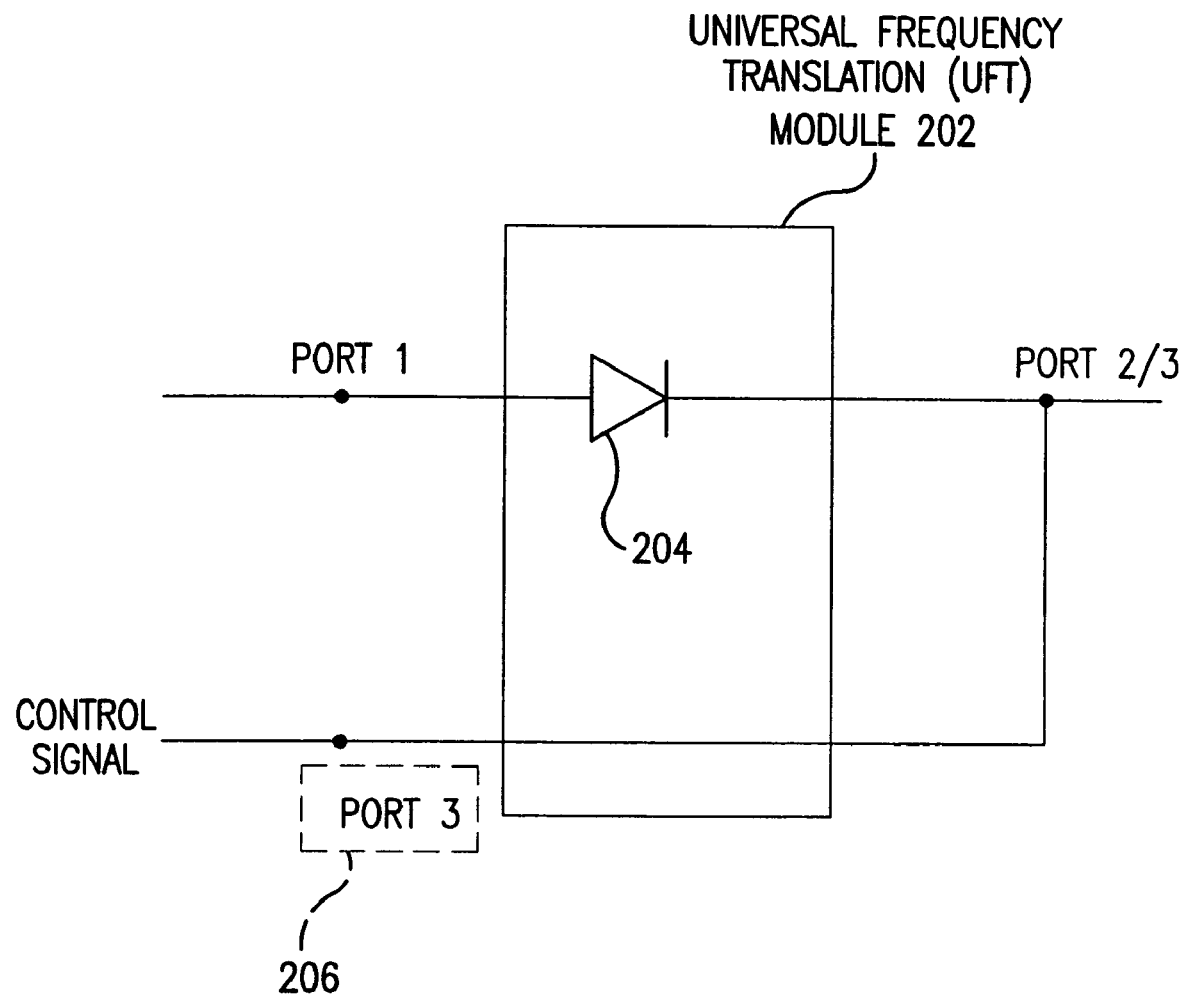
FIG. 2 is a block diagram of a universal frequency translation (UFT) module according to an alternative embodiment of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label. Other embodiments, as described herein, have more than three ports.

The UFT module is a very powerful and flexible device. Its flexibility is illustrated, in part, by the wide range of applications in which it can be used. Its power is illustrated, in part, by the usefulness and performance of such applications.

Figure 1C:
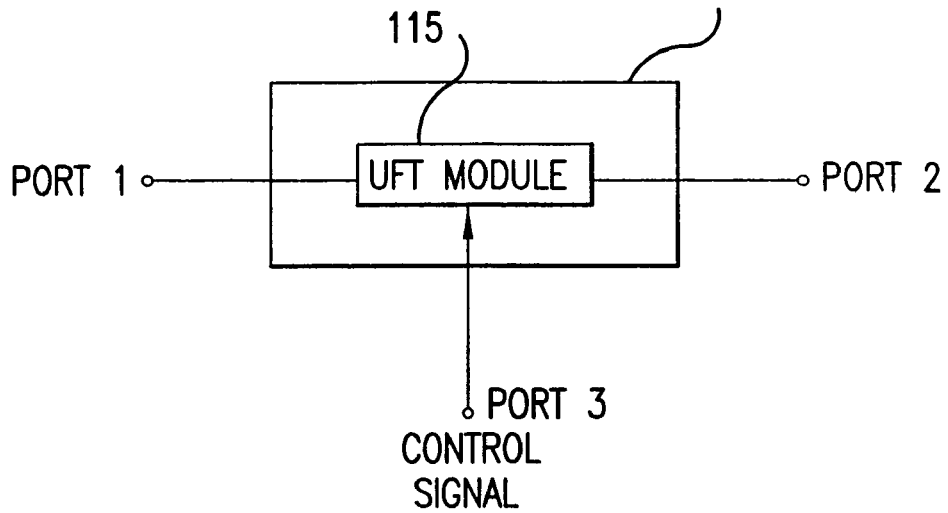
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
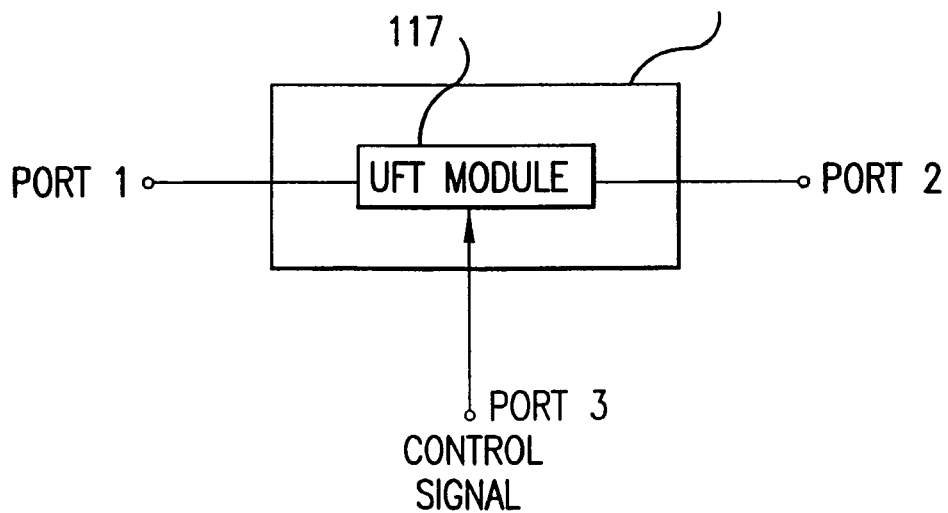
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2.1 Frequency Down-Conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in U.S. Pat. No. 6,061,551 entitled "Method and System for Down-Converting Electromagnetic Signals," the full disclosure of which is incorporated herein by reference. A relevant portion of the above-mentioned patent is summarized below to describe down-converting an input signal to produce a down-converted signal that exists at a lower frequency or a baseband signal. The frequency translation aspects of the invention are further described in other documents referenced above, such as application Ser. No. 09/550,644, entitled "Method and System for Down-converting an Electromagnetic Signal, and Transforms for Same, and Aperture Relationships."

Figure 3A:
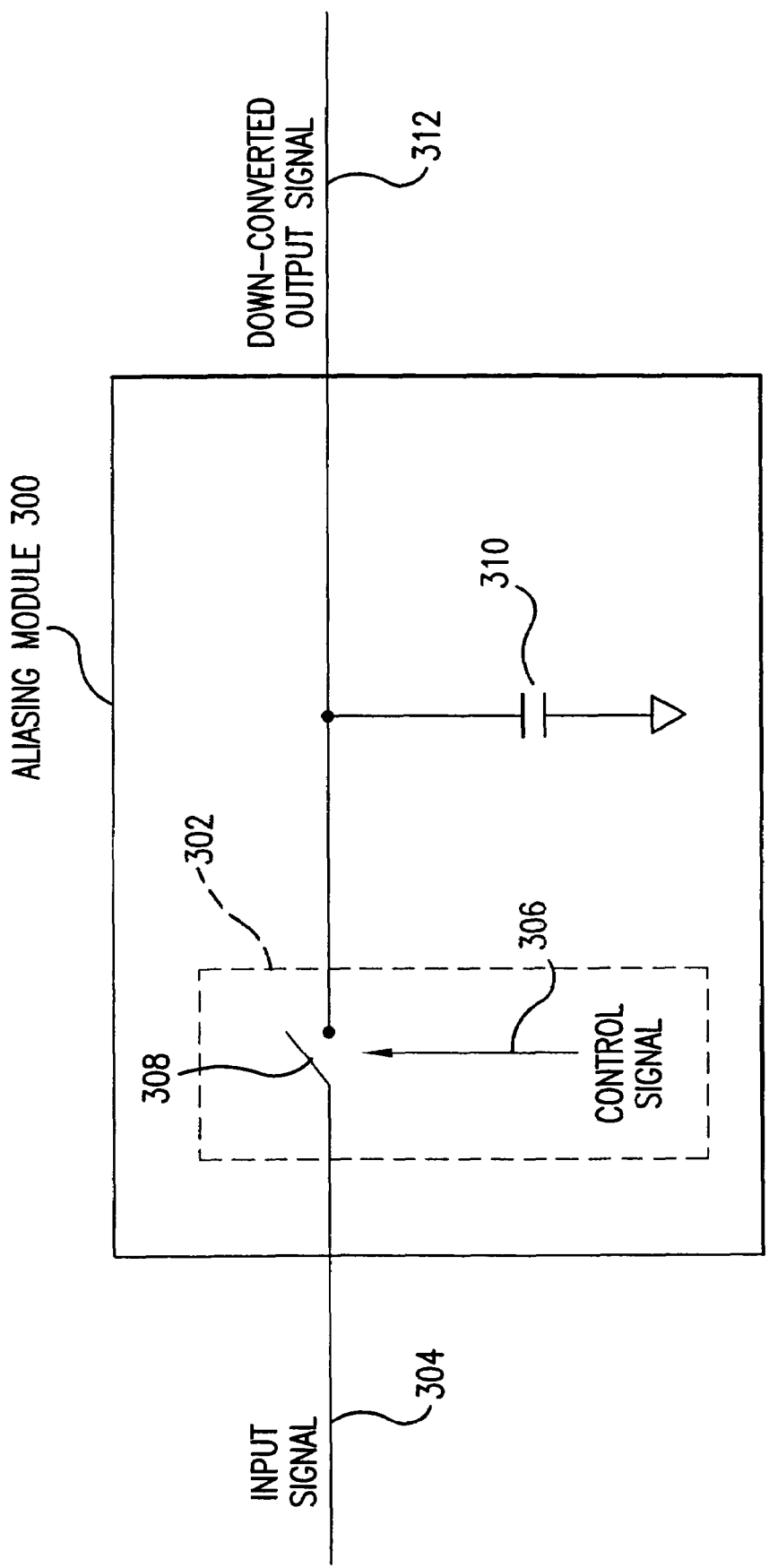
FIGS. 3A and 3G are example aliasing modules according to embodiments of the invention.
Figure 3B:
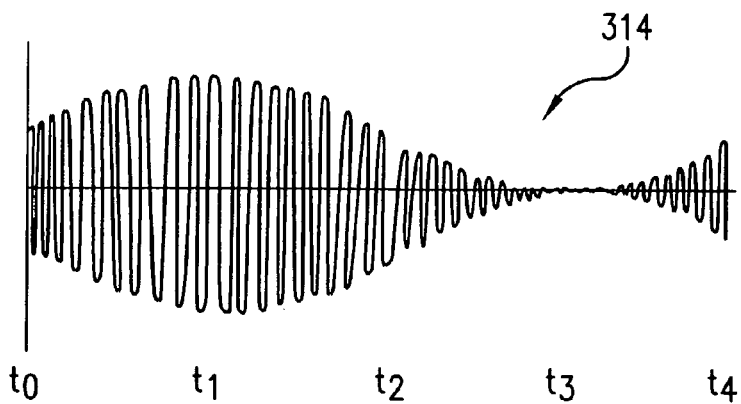
FIGS. 3B-3F are example waveforms used to describe the operation of the aliasing modules of FIGS. 3A and 3G.
Figure 3C:
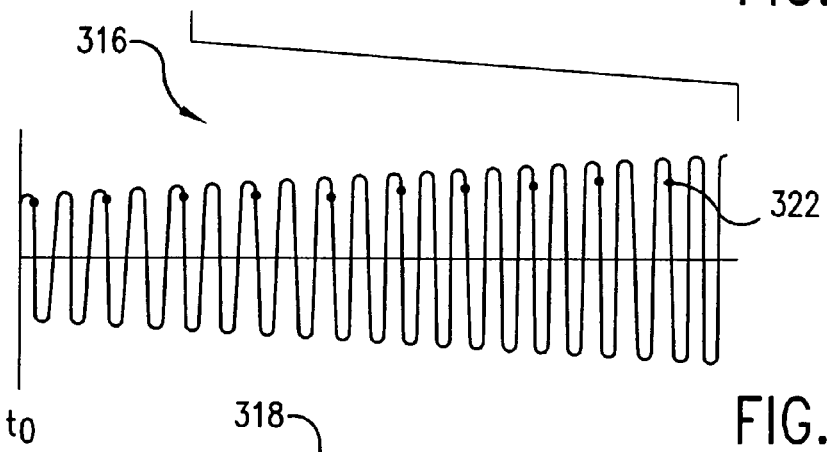

FIG. 3A illustrates an aliasing module 300 for down-conversion using a universal frequency translation (UFT) module 302 which down-converts an EM input signal 304. In particular embodiments, aliasing module 300 includes a switch 308 and a capacitor 310 (or integrator). (In embodiments, the UFT module is considered to include the switch and integrator.) The electronic alignment of the circuit components is flexible. That is, in one implementation, the switch 308 is in series with input signal 304 and capacitor 310 is shunted to ground (although it may be other than ground in configurations such as differential mode). In a second implementation (see FIG. 3G), the capacitor 310 is in series with the input signal 304 and the switch 308 is shunted to ground (although it may be other than ground in configurations such as differential mode). Aliasing module 300 with UFT module 302 can be tailored to down-convert a wide variety of electromagnetic signals using aliasing frequencies that are well below the frequencies of the EM input signal 304.

In one implementation, aliasing module 300 down-converts the input signal 304 to an intermediate frequency (IF) signal. In another implementation, the aliasing module 300 down-converts the input signal 304 to a demodulated baseband signal. In yet another implementation, the input signal 304 is a frequency modulated (FM) signal, and the aliasing module 300 down-converts it to a non-FM signal, such as a phase modulated (PM) signal or an amplitude modulated (AM) signal. Each of the above implementations is described below.

In an embodiment, the control signal 306 includes a train of pulses that repeat at an aliasing rate that is equal to, or less than, twice the frequency of the input signal 304. In this embodiment, the control signal 306 is referred to herein as an aliasing signal because it is below the Nyquist rate for the frequency of the input signal 304. Preferably, the frequency of control signal 306 is much less than the input signal 304.

Figure 3D:
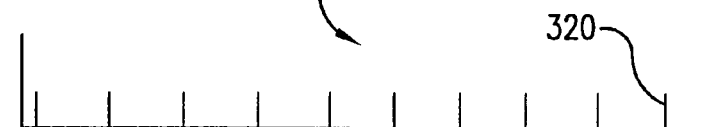
Figure 3E:
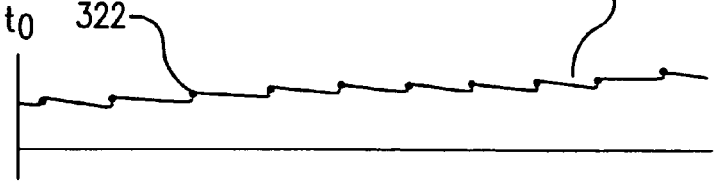

A train of pulses 318 as shown in FIG. 3D controls the switch 308 to alias the input signal 304 with the control signal 306 to generate a down-converted output signal 312. More specifically, in an embodiment, switch 308 closes on a first edge of each pulse 320 of FIG. 3D and opens on a second edge of each pulse. When the switch 308 is closed, the input signal 304 is coupled to the capacitor 310, and charge is transferred from the input signal to the capacitor 310. The charge stored during successive pulses forms down-converted output signal 312.

Exemplary waveforms are shown in FIGS. 3B-3F.

FIG. 3B illustrates an analog amplitude modulated (AM) carrier signal 314 that is an example of input signal 304. For illustrative purposes, in FIG. 3C, an analog AM carrier signal portion 316 illustrates a portion of the analog AM carrier signal 314 on an expanded time scale. The analog AM carrier signal portion 316 illustrates the analog AM carrier signal 314 from time $t_0$ to time $t_1$.

FIG. 3D illustrates an exemplary aliasing signal 318 that is an example of control signal 306. Aliasing signal 318 is on approximately the same time scale as the analog AM carrier signal portion 316. In the example shown in FIG. 3D, the aliasing signal 318 includes a train of pulses 320 having negligible apertures that tend towards zero (the invention is not limited to this embodiment, as discussed below). The pulse aperture may also be referred to as the pulse width as will be understood by those skilled in the art(s). The pulses 320 repeat at an aliasing rate, or pulse repetition rate of aliasing signal 318. The aliasing rate is determined as described below.

Figure 3F:
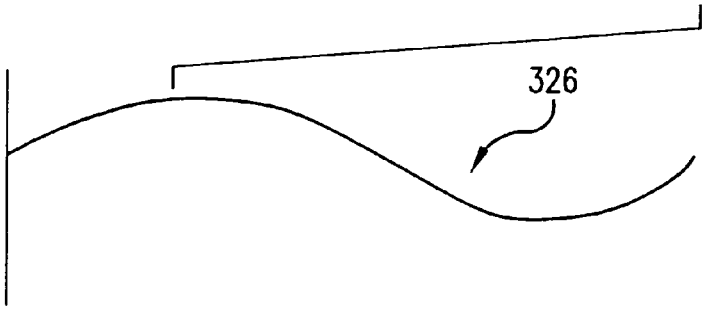
Figure 3G:
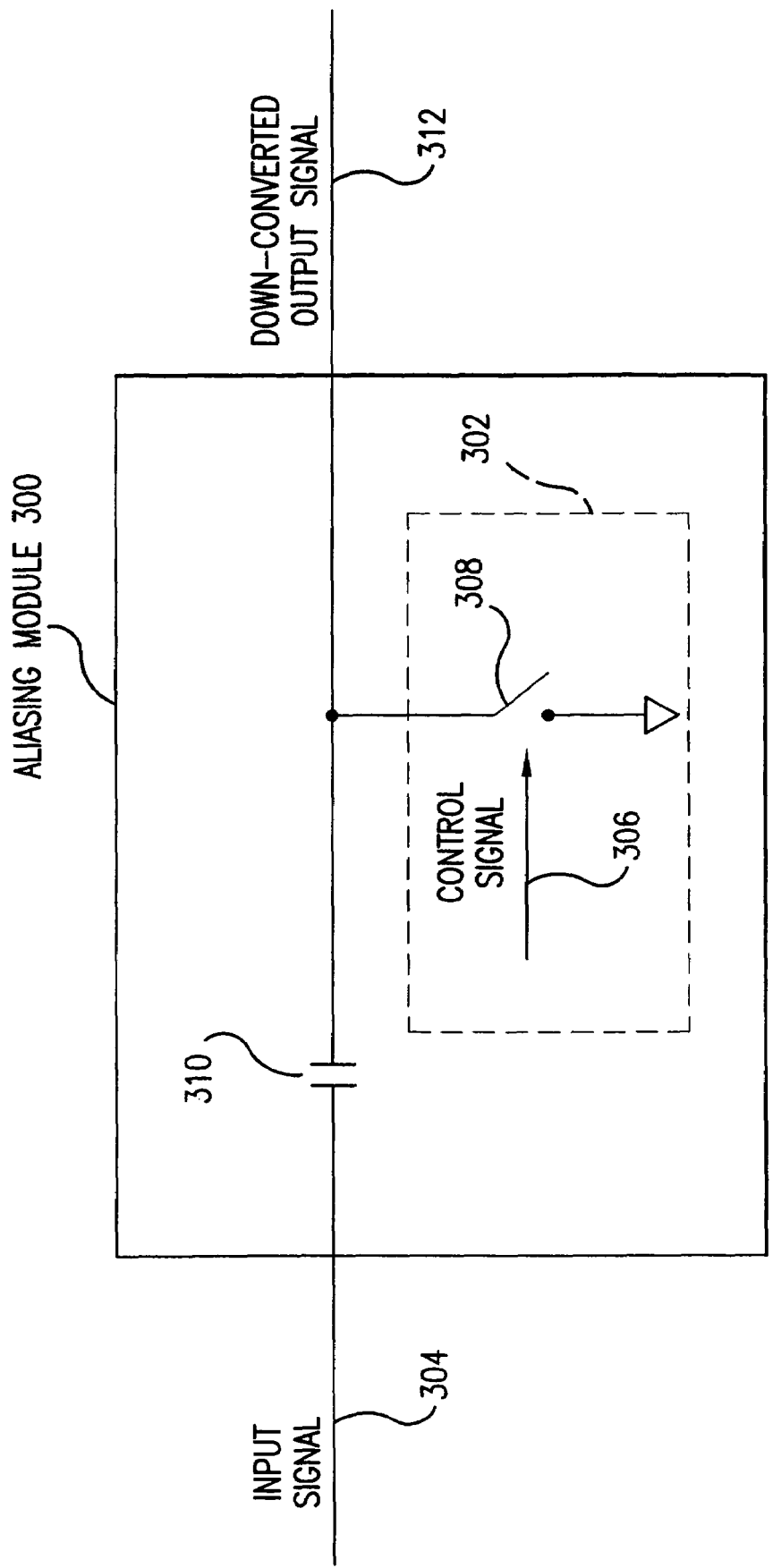

As noted above, the train of pulses 320 (i.e., control signal 306) control the switch 308 to alias the analog AM carrier signal 316 (i.e., input signal 304) at the aliasing rate of the aliasing signal 318. Specifically, in this embodiment, the switch 308 closes on a first edge of each pulse and opens on a second edge of each pulse. When the switch 308 is closed, input signal 304 is coupled to the capacitor 310, and charge is transferred from the input signal 304 to the capacitor 310. The charge transferred during a pulse is referred to herein as an under-sample. Exemplary under-samples 322 form down-converted signal portion 324 (FIG. 3E) that corresponds to the analog AM carrier signal portion 316 (FIG. 3C) and the train of pulses 320 (FIG. 3D). The charge stored during successive under-samples of AM carrier signal 314 form the down-converted signal 324 (FIG. 3E) that is an example of down-converted output signal 312 (FIG. 3A). In FIG. 3F, a demodulated baseband signal 326 represents the demodulated baseband signal 324 after filtering on a compressed time scale. As illustrated, down-converted signal 326 has substantially the same "amplitude envelope" as AM carrier signal 314. Therefore, FIGS. 3B-3F illustrate down-conversion of AM carrier signal 314.

The waveforms shown in FIGS. 3B-3F are discussed herein for illustrative purposes only, and are not limiting.

The aliasing rate of control signal 306 determines whether the input signal 304 is down-converted to an IF signal, down-converted to a demodulated baseband signal, or down-converted from an FM signal to a PM or an AM signal. Generally, relationships between the input signal 304, the aliasing rate of the control signal 306, and the down-converted output signal 312 are illustrated below:

(Freq. of input signal 304)=$n$·(Freq. of control signal 306)±(Freq. of down-converted output signal 312)

For the examples contained herein, only the "+" condition will be discussed. Example values of n include, but are not limited to, n={0.5, 1, 2, 3, 4, . . . }.

When the aliasing rate of control signal 306 is off-set from the frequency of input signal 304, or off-set from a harmonic or sub-harmonic thereof, input signal 304 is down-converted to an IF signal. This is because the under-sampling pulses occur at different phases of subsequent cycles of input signal 304. As a result, the under-samples form a lower frequency oscillating pattern. If the input signal 304 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 306 would be calculated as follows:

(Freq$_{input}$-Freq$_{IF}$)/$n$=Freq$_{control}$ (901 MHZ-1 MHZ)/$n$=900/$n$

For n={0.5, 1, 2, 3, 4, . . . }, the frequency of the control signal 306 would be substantially equal to 1.8 GHz, 900 MHZ, 450 MHZ, 300 MHZ, 225 MHZ, etc.

Alternatively, when the aliasing rate of the control signal 306 is substantially equal to the frequency of the input signal 304, or substantially equal to a harmonic or sub-harmonic thereof, input signal 304 is directly down-converted to a demodulated baseband signal. This is because, without modulation, the under-sampling pulses occur at the same point of subsequent cycles of the input signal 304. As a result, the under-samples form a constant output baseband signal. If the input signal 304 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 306 would be calculated as follows:

(Freq$_{input}$-Freq$_{IF}$)/$n$=Freq$_{control}$ (900 MHZ-0 MHZ)/$n$=900 MHZ/$n$ For n={0.5, 1, 2, 3, 4, . . . }, the frequency of the control signal 306 should be substantially equal to 1.8 GHz, 900 MHZ, 450 MHZ, 300 MHZ, 225 MHZ, etc.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, [($F_1$+$F_2$)÷2]) of the FSK signal is down-converted to zero IF. For example, to down-convert an FSK signal having $F_1$ equal to 899 MHZ and $F_2$ equal to 901 MHZ, to a PSK signal, the aliasing rate of the control signal 306 would be calculated as follows:

$$\text{Frequency of the input} = (F_1 + F_2) \div 2$$
$$= (899\ MHZ + 901\ MHZ) \div 2$$
$$= 900\ MHZ$$

Frequency of the down-converted signal=0 (i.e., baseband)

(Freq$_{input}$-Freq$_{IF}$)/$n$=Freq$_{control}$ (900 MHZ-0 MHZ)/$n$=900 MHZ/$n$ For n={0.5, 1, 2, 3, 4 . . . }, the frequency of the control signal 306 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 306 should be substantially equal to:

(900 MHZ-0 MHZ)/$n$=900 MHZ/$n$, or (901 MHZ-0 MHZ)/$n$=901 MHZ/$n$.

For the former case of 900 MHZ/n, and for n={0.5, 1, 2, 3, 4, ... }, the frequency of the control signal 306 should be substantially equal to 1.8 GHz, 900 MHZ, 450 MHZ, 300 MHZ, 225 MHZ, etc. For the latter case of 901 MHZ/n, and for n={0.5, 1, 2, 3, 4, ... }, the frequency of the control signal 306 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

In an embodiment, the pulses of the control signal 306 have negligible apertures that tend towards zero. This makes the UFT module 302 a high input impedance device. This configuration is useful for situations where minimal disturbance of the input signal may be desired.

In another embodiment, the pulses of the control signal 306 have non-negligible apertures that tend away from zero. This makes the UFT module 302 a lower input impedance device. This allows the lower input impedance of the UFT module 302 to be substantially matched with a source impedance of the input signal 304. This also improves the energy transfer from the input signal 304 to the down-converted output signal 312, and hence the efficiency and signal to noise (s/n) ratio of UFT module 302.

Exemplary systems and methods for generating and optimizing the control signal 306, and for otherwise improving energy transfer and s/n ratio, are disclosed in U.S. Pat. No. 6,061,551 entitled "Method and System for Down-Converting Electromagnetic Signals."

When the pulses of the control signal 306 have non-negligible apertures, the aliasing module 300 is referred to interchangeably herein as an energy transfer module or a gated transfer module, and the control signal 306 is referred to as an energy transfer signal. Exemplary systems and methods for generating and optimizing the control signal 306 and for otherwise improving energy transfer and/or signal to noise ratio in an energy transfer module are described below.

2.2 Optional Energy Transfer Signal Module

Figure 4:
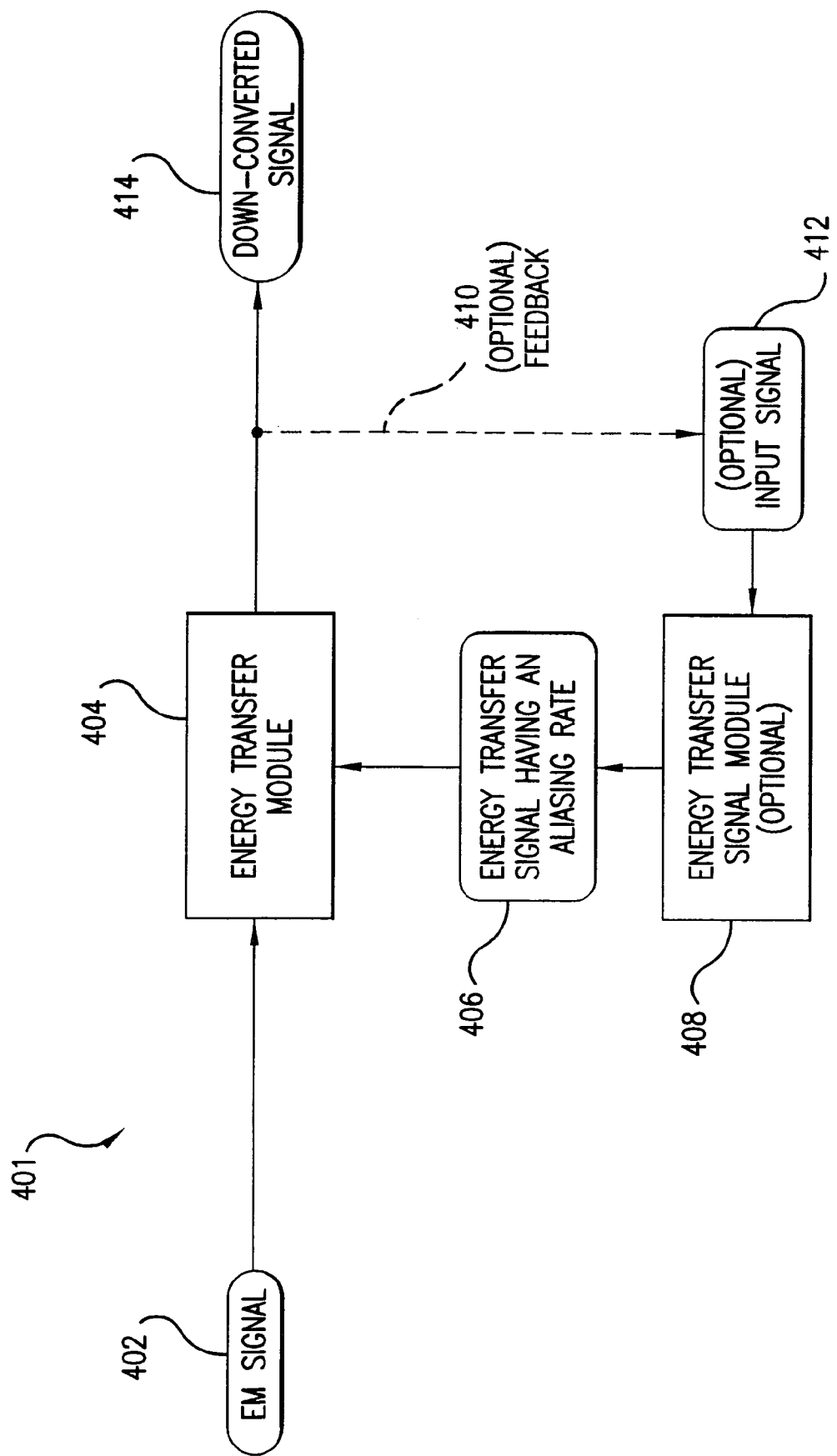
FIG. 4 illustrates an energy transfer system with an optional energy transfer signal module according to an embodiment of the invention.

FIG. 4 illustrates an energy transfer system 401 that includes an optional energy transfer signal module 408, which can perform any of a variety of functions or combinations of functions including, but not limited to, generating the energy transfer signal 406.

Figure 5:
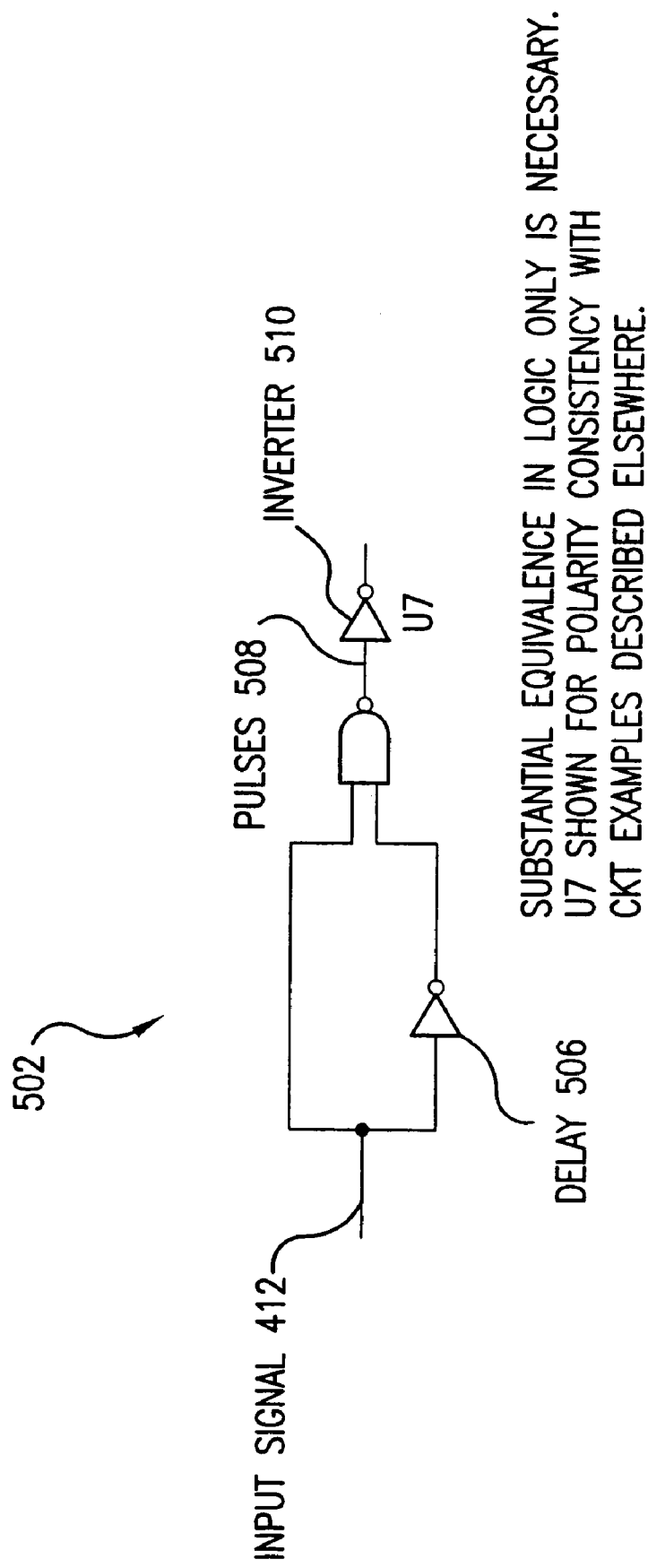
FIG. 5 illustrates an example aperture generator.

In an embodiment, the optional energy transfer signal module 408 includes an aperture generator, an example of which is illustrated in FIG. 5 as an aperture generator 502. The aperture generator 502 generates non-negligible aperture pulses 508 from an input signal 412. The input signal 412 can be any type of periodic signal, including, but not limited to, a sinusoid, a square wave, a saw-tooth wave, etc. Systems for generating the input signal 412 are described below.

The width or aperture of the pulses 508 is determined by delay through the branch 506 of the aperture generator 502. Generally, as the desired pulse width increases, the difficulty in meeting the requirements of the aperture generator 502 decrease (i.e., the aperture generator is easier to implement). In other words, to generate non-negligible aperture pulses for a given EM input frequency, the components utilized in the example aperture generator 502 do not require reaction times as fast as those that are required in an under-sampling system operating with the same EM input frequency.

The example logic and implementation shown in the aperture generator 502 are provided for illustrative purposes only, and are not limiting. The actual logic employed can take many forms. The example aperture generator 502 includes an optional inverter 510, which is shown for polarity consistency with other examples provided herein.

Figure 6A:
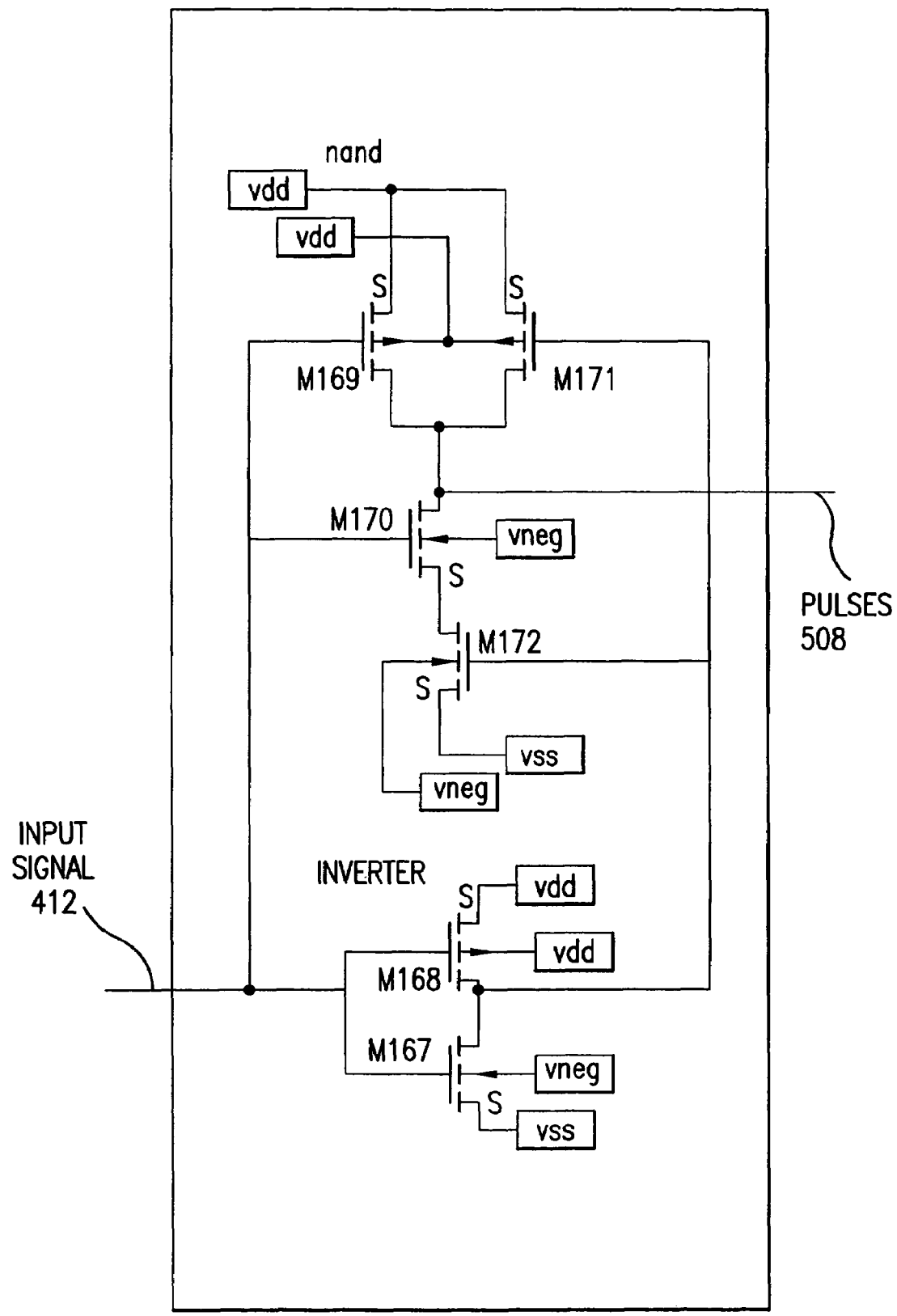
FIG. 6A illustrates an example aperture generator.

An example implementation of the aperture generator 502 is illustrated in FIG. 6A. Additional examples of aperture generation logic are provided in FIGS. 7A and 7B. FIG. 7A illustrates a rising edge pulse generator 702, which generates pulses 508 on rising edges of the input signal 412. FIG. 7B illustrates a falling edge pulse generator 704, which generates pulses 508 on falling edges of the input signal 412. These circuits are provided for example only, and do not limit the invention.

Figure 6B:
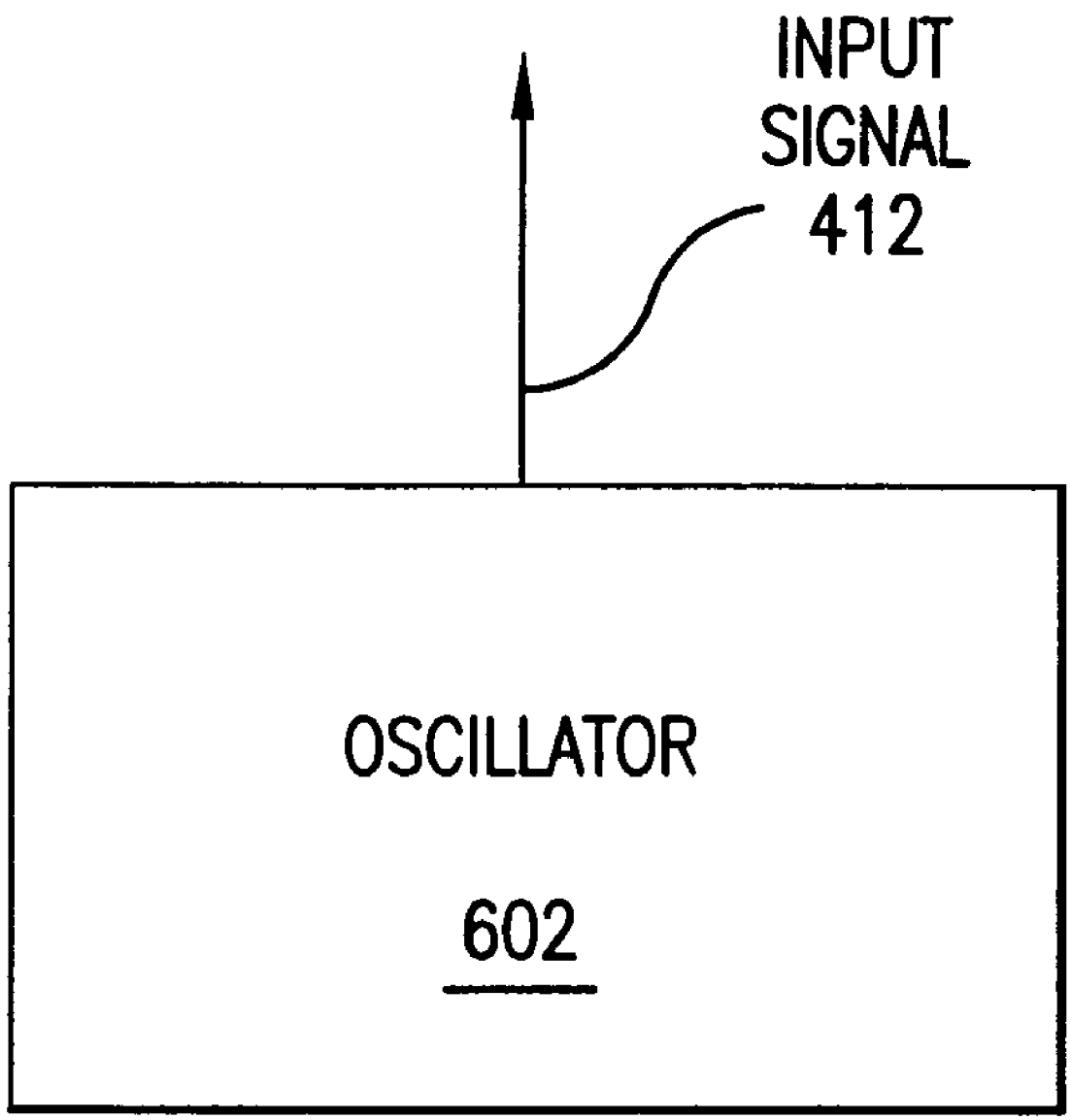
FIG. 6B illustrates an oscillator according to an embodiment of the present invention.

In an embodiment, the input signal 412 is generated externally of the energy transfer signal module 408, as illustrated in FIG. 4. Alternatively, the input signal 412 is generated internally by the energy transfer signal module 408. The input signal 412 can be generated by an oscillator, as illustrated in FIG. 6B by an oscillator 602. The oscillator 602 can be internal to the energy transfer signal module 408 or external to the energy transfer signal module 408. The oscillator 602 can be external to the energy transfer system 401. The output of the oscillator 602 may be any periodic waveform.

The type of down-conversion performed by the energy transfer system 401 depends upon the aliasing rate of the energy transfer signal 406, which is determined by the frequency of the pulses 508. The frequency of the pulses 508 is determined by the frequency of the input signal 412.

The optional energy transfer signal module 408 can be implemented in hardware, software, firmware, or any combination thereof.

2.3 Impedance Matching

The example energy transfer module 300 described in reference to FIG. 3A, above, has input and output impedances generally defined by (1) the duty cycle of the switch module (i.e., UFT 302), and (2) the impedance of the storage module (e.g., capacitor 310), at the frequencies of interest (e.g. at the EM input, and intermediate/baseband frequencies).

Starting with an aperture width of approximately 12 the period of the EM signal being down-converted as an example embodiment, this aperture width (e.g. the "closed time") can be decreased (or increased). As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Referring to FIG. 8, a specific example embodiment using an RF signal as an input, assuming that the impedance 812 is a relatively low impedance of approximately 50 Ohms, for example, and the input impedance 816 is approximately 300 Ohms, an initial configuration for the input impedance match module 806 can include an inductor 906 and a capacitor 908, configured as shown in FIG. 9. The configuration of the inductor 906 and the capacitor 908 is a possible configuration when going from a low impedance to a high impedance. Inductor 906 and the capacitor 908 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 914 and an inductor 916 can be configured as shown in FIG. 9. The capacitor 914 and the inductor 916 constitute an L match, the calculation of the component values being well known to those skilled in the relevant arts.

The configuration of the input impedance match module 806 and the output impedance match module 808 are considered in embodiments to be initial starting points for impedance matching, in accordance with embodiments of the present invention. In some situations, the initial designs may be suitable without further optimization. In other situations, the initial designs can be enhanced in accordance with other various design criteria and considerations.

As other optional optimizing structures and/or components are utilized, their affect on the characteristic impedance of the energy transfer module should be taken into account in the match along with their own original criteria.

2.4 Frequency Up-Conversion

The present invention is directed to systems and methods of frequency up-conversion, and applications of same.

An example frequency up-conversion system 1000 is illustrated in FIG. 10. The frequency up-conversion system 1000 is now described.

An input signal 1002 (designated as "Control Signal" in FIG. 10) is accepted by a switch module 1004. For purposes of example only, assume that the input signal 1002 is a FM input signal 1306, an example of which is shown in FIG. 13C. FM input signal 1306 may have been generated by modulating information signal 1302 onto oscillating signal 1304 (FIGS. 13A and 13B). It should be understood that the invention is not limited to this embodiment. The information signal 1302 can be analog, digital, or any combination thereof, and any modulation scheme can be used.

The output of switch module 1004 is a harmonically rich signal 1006, shown for example in FIG. 13D as a harmonically rich signal 1308. The harmonically rich signal 1308 has a continuous and periodic waveform.

FIG. 13E is an expanded view of two sections of harmonically rich signal 1308, section 1310 and section 1312. The harmonically rich signal 1308 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Harmonically rich signal 1308 is comprised of a plurality of sinusoidal waves whose frequencies are integer multiples of the fundamental frequency of the waveform of the harmonically rich signal 1308. These sinusoidal waves are referred to as the harmonics of the underlying waveform, and the fundamental frequency is referred to as the first harmonic. FIG. 13F and FIG. 13G show separately the sinusoidal components making up the first, third, and fifth harmonics of section 1310 and section 1312. (Note that in theory there may be an infinite number of harmonics; in this example, because harmonically rich signal 1308 is shown as a square wave, there are only odd harmonics). Three harmonics are shown simultaneously (but not summed) in FIG. 13H.

The relative amplitudes of the harmonics are generally a function of the relative widths of the pulses of harmonically rich signal 1006 and the period of the fundamental frequency, and can be determined by doing a Fourier analysis of harmonically rich signal 1006. According to an embodiment of the invention, the input signal 1306 may be shaped to ensure that the amplitude of the desired harmonic is sufficient for its intended use (e.g., transmission).

An optional filter 1008 filters out any undesired frequencies (harmonics), and outputs an electromagnetic (EM) signal at the desired harmonic frequency or frequencies as an output signal 1010, shown for example as a filtered output signal 1314 in FIG. 13I.

FIG. 11 illustrates an example universal frequency up-conversion (UFU) module 1101. The UFU module 1101 includes an example switch module 1004, which comprises a bias signal 1102, a resistor or impedance 1104, a universal frequency translator (UFT) 1150, and a ground 1108. The UFT 1150 includes a switch 1106. The input signal 1002 (designated as "Control Signal" in FIG. 11) controls the switch 1106 in the UFT 1150, and causes it to close and open. Harmonically rich signal 1006 is generated at a node 1105 located between the resistor or impedance 1104 and the switch 1106.

Also in FIG. 11, it can be seen that an example optional filter 1008 is comprised of a capacitor 1110 and an inductor 1112 shunted to a ground 1114. The filter is designed to filter out the undesired harmonics of harmonically rich signal 1006.

The invention is not limited to the UFU embodiment shown in FIG. 11. For example, in an alternate embodiment shown in FIG. 12, an unshaped input signal 1201 is routed to a pulse shaping module 1202. The pulse shaping module 1202 modifies the unshaped input signal 1201 to generate a (modified) input signal 1002 (designated as the "Control Signal" in FIG. 12). The input signal 1002 is routed to the switch module 1004, which operates in the manner described above. Also, the filter 1008 of FIG. 12 operates in the manner described above.

The purpose of the pulse shaping module 1202 is to define the pulse width of the input signal 1002. Recall that the input signal 1002 controls the opening and closing of the switch 1106 in switch module 1004. During such operation, the pulse width of the input signal 1002 establishes the pulse width of the harmonically rich signal 1006. As stated above, the relative amplitudes of the harmonics of the harmonically rich signal 1006 are a function of at least the pulse width of the harmonically rich signal 1006. As such, the pulse width of the input signal 1002 contributes to setting the relative amplitudes of the harmonics of harmonically rich signal 1006.

Further details of up-conversion as described in this section are presented in U.S. Pat. No. 6,091,940, entitled "Method and System for Frequency Up-Conversion," incorporated herein by reference in its entirety.

2.5 Enhanced Signal Reception

The present invention is directed to systems and methods of enhanced signal reception (ESR), and applications of same, which are described in the above-referenced U.S. Pat. No. 6,061,555, entitled "Method and System for Ensuring Reception of a Communications Signal," incorporated herein by reference in its entirety.

2.6 Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

FIG. 14 is a conceptual block diagram of a UDF module 1402 according to an embodiment of the present invention. The UDF module 1402 performs at least frequency translation and frequency selectivity.

The effect achieved by the UDF module 1402 is to perform the frequency selectivity operation prior to the performance of the frequency translation operation. Thus, the UDF module 1402 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1404 received by the UDF module 1402 are at radio frequencies. The UDF module 1402 effectively operates to input filter these RF input signals 1404. Specifically, in these embodiments, the UDF module 1402 effectively performs input, channel select filtering of the RF input signal 1404. Accordingly, the invention achieves high selectivity at high frequencies.

The UDF module 1402 effectively performs various types of filtering, including but not limited to bandpass filtering, low pass filtering, high pass filtering, notch filtering, all pass filtering, band stop filtering, etc., and combinations thereof.

Conceptually, the UDF module 1402 includes a frequency translator 1408. The frequency translator 1408 conceptually represents that portion of the UDF module 1402 that performs frequency translation (down conversion).

The UDF module 1402 also conceptually includes an apparent input filter 1406 (also sometimes called an input filtering emulator). Conceptually, the apparent input filter 1406 represents that portion of the UDF module 1402 that performs input filtering.

In practice, the input filtering operation performed by the UDF module 1402 is integrated with the frequency translation operation. The input filtering operation can be viewed as being performed concurrently with the frequency translation operation. This is a reason why the input filter 1406 is herein referred to as an "apparent" input filter 1406.

The UDF module 1402 of the present invention includes a number of advantages. For example, high selectivity at high frequencies is realizable using the UDF module 1402. This feature of the invention is evident by the high Q factors that are attainable. For example, and without limitation, the UDF module 1402 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1402 can be electrically adjusted, either statically or dynamically.

Also, the UDF module 1402 can be designed to amplify input signals.

Further, the UDF module 1402 can be implemented without large resistors, capacitors, or inductors. Also, the UDF module 1402 does not require that tight tolerances be maintained on the values of its individual components, i.e., its resistors, capacitors, inductors, etc. As a result, the architecture of the UDF module 1402 is friendly to integrated circuit design techniques and processes.

The features and advantages exhibited by the UDF module 1402 are achieved at least in part by adopting a new technological paradigm with respect to frequency selectivity and translation. Specifically, according to the present invention, the UDF module 1402 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and/or samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module 1402 preferably performs input filtering and frequency down-conversion in a unified manner.

Further details of unified down-conversion and filtering as described in this section are presented in U.S. Pat. No. 6,049, 706, entitled "Integrated Frequency Translation And Selectivity," filed Oct. 21, 1998, and incorporated herein by reference in its entirety.

3. Example Down-Converter Embodiments of the Invention

As noted above, the UFT module of the present invention is a very powerful and flexible device. Its flexibility is illustrated, in part, by the wide range of applications and combinations in which it can be used. Its power is illustrated, in part, by the usefulness and performance of such applications and combinations.

Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals. Example receiver, transmitter, and transceiver embodiments implemented using the UFT module of the present invention are set forth below.

3.1 Receiver Embodiments

In embodiments, a receiver according to the invention includes an aliasing module for down-conversion that uses a universal frequency translation (UFT) module to down-convert an EM input signal. For example, in embodiments, the receiver includes the aliasing module 300 described above, in reference to FIG. 3A or FIG. 3G. As described in more detail above, the aliasing module 300 may be used to down-convert an EM input signal to an intermediate frequency (IF) signal or a demodulated baseband signal.

In alternate embodiments, the receiver may include the energy transfer system 401, including energy transfer module 404, described above, in reference to FIG. 4. As described in more detail above, the energy transfer system 401 may be used to down-convert an EM signal to an intermediate frequency (IF) signal or a demodulated baseband signal. As also described above, the aliasing module 300 or the energy transfer system 401 may include an optional energy transfer signal module 408, which can perform any of a variety of functions or combinations of functions including, but not limited to, generating the energy transfer signal 406 of various aperture widths.

In further embodiments of the present invention, the receiver may include the impedance matching circuits and/or techniques described herein for enhancing the energy transfer system of the receiver.

3.1.1 In-Phase/Quadrature-Phase (I/Q) Modulation Mode Receiver Embodiments

FIG. 15 illustrates an exemplary I/Q modulation mode embodiment of a receiver 1502, according to an embodiment of the present invention. This I/Q modulation mode embodiment is described herein for purposes of illustration, and not limitation. Alternate I/Q modulation mode embodiments (including equivalents, extensions, variations, deviations, etc., of the embodiments described herein), as well as embodiments of other modulation modes, will be apparent to persons skilled in the relevant art(s) based on the teachings contained herein. The invention is intended and adapted to include such alternate embodiments.

Receiver 1502 comprises an I/Q modulation mode receiver 1538, a first optional amplifier 1516, a first optional filter 1518, a second optional amplifier 1520, and a second optional filter 1522.

I/Q modulation mode receiver 1538 comprises an oscillator 1506, a first UFD module 1508, a second UFD module 1510, a first UFT module 1512, a second UFT module 1514, and a phase shifter 1524.

Oscillator 1506 provides an oscillating signal used by both first UFD module 1508 and second UFD module 1510 via the phase shifter 1524. Oscillator 1506 generates an "I" oscillating signal 1526.

"I" oscillating signal 1526 is input to first UFD module 1508. First UFD module 1508 comprises at least one UFT module 1512. First UFD module 1508 frequency down-converts and demodulates received signal 1504 to down-converted "I" signal 1530 according to "I" oscillating signal 1526.

Phase shifter 1524 receives "I" oscillating signal 1526, and outputs "Q" oscillating signal 1528, which is a replica of "I" oscillating signal 1526 shifted preferably by 90 degrees.

Second UFD module 1510 inputs "Q" oscillating signal 1528. Second UFD module 1510 comprises at least one UFT module 1514. Second UFD module 1510 frequency down-converts and demodulates received signal 1504 to down-converted "Q" signal 1532 according to "Q" oscillating signal 1528.

Down-converted "I" signal 1530 is optionally amplified by first optional amplifier 1516 and optionally filtered by first optional filter 1518, and a first information output signal 1534 is output.

Down-converted "Q" signal 1532 is optionally amplified by second optional amplifier 1520 and optionally filtered by second optional filter 1522, and a second information output signal 1536 is output.

In the embodiment depicted in FIG. 15, first information output signal 1534 and second information output signal 1536 comprise a down-converted baseband signal. In embodiments, first information output signal 1534 and second information output signal 1536 are individually received and processed by related system components. Alternatively, first information output signal 1534 and second information output signal 1536 are recombined into a single signal before being received and processed by related system components.

Alternate configurations for I/Q modulation mode receiver 1538 will be apparent to persons skilled in the relevant art(s) from the teachings herein. For instance, an alternate embodiment exists wherein phase shifter 1524 is coupled between received signal 1504 and UFD module 1510, instead of the configuration described above. This and other such I/Q modulation mode receiver embodiments will be apparent to persons skilled in the relevant art(s) based upon the teachings herein, and are within the scope of the present invention.

4. DC Offset and Circuit Gain Considerations and Corrections

Various embodiments related to the method(s) and structure(s) described herein are presented in this section (and its subsections). Exemplary WLAN receiver channel circuits are provided below, and circuits used to reduce or eliminate problems of DC offset in the WLAN receiver channel circuits are described. The embodiments of the present invention are applicable to any WLAN receiver circuit, such as IEEE 802.11 WLAN standard compliant receivers, including the IEEE 802.11a and 802.11b extensions, and to other communication standards.

These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments. Furthermore, the invention is applicable to additional communication system environments. For instance, the invention as disclosed herein is applicable to any type of communication system receiver, such as wireless personal area network (WPAN) receivers (including the Bluetooth standard), wireless metropolitan area network (WMAN receivers, code division multiple access (CDMA) receivers (including wideband CDMA receivers), Global System for Mobile Communications (GSM) standard compatible receivers, and 3$^{rd}$ Generation (3G) network receivers.

4.1 Overview of DC Offset

Receivers, and other electronic circuits, may suffer from problems of DC offset and re-radiation. Generally, "DC offset" refers to a DC voltage level that is added to a signal of interest by related circuitry. The related circuitry creates the DC offset voltage through a variety of mechanisms that are well known. Some of these mechanisms are discussed in further detail below. "Re-radiation" is an undesired phenomenon where an unwanted signal is generated by circuitry, such as by an oscillator, and is transmitted by an antenna. The unwanted signal may then be received by circuitry, to interfere with the signal of interest. Such re-radiation may also lead to unwanted DC offset voltages.

If a DC offset voltage value is significant, it can degrade the quality of the signal of interest. In a receiver, for example, the signal of interest may be a down-converted signal. Unless reduced or eliminated, the added DC offset voltage level may undesirably change the voltage value of the down-converted signal. As a result, the desired voltage value of the down-converted signal may be difficult to ascertain by downstream processing.

For example, unwanted DC offset voltages created by receiver channel amplifiers may be inserted into the receiver channel signal path. FIG. 18 shows a DC offset voltage 1802 present in an example model of an operational amplifier gain stage. DC offset voltage 1802 is internally generated in operational amplifier 1804 and/or inherited from previous stages, and may be considered to be a voltage inserted between the amplifier inputs. Typically, DC offset voltage 1802 is a differential input voltage resulting from the mismatch of devices within operational amplifier 1804. Due to DC offset voltage 1802 ($V_{IO}$), an unwanted output voltage offset ($V_{OO}$) will appear in output voltage 1808. $V_{IO}$ is amplified by the circuit closed loop gain to create $V_{OO}$. For example, in the configuration shown in FIG. 18, $V_{OO}$ may be calculated according to the following equation:

$$V_{\infty} = \left(\frac{R2}{R1} + 1\right)V_{IO}$$

This unwanted output DC offset voltage is input to subsequent amplifiers in the receiver channel and is accordingly amplified. If it becomes significant, it may cause outputs of the subsequent amplifiers to reach their voltage rails. In any event, DC offset voltages present in the receiver channel amplifiers may lead to an erroneous output signal.

Frequency down-converters may input DC offset voltages into the receiver channel. Embodiments of the UFT module may be used in many communications applications, including embodiments of the UFD module, to frequency down-convert signals in receivers. For some of these applications, the signal space may include waveforms with near DC content. Hence, it may be advantageous to limit the amount of artificial DC insertion or DC offsets contributed by the UFD module or its complimentary demodulation architecture.

There are at least three significant categories of offsets related to operation of the UFD module, which are listed as follows:
1. Clock Excitation or Charge Injected
2. Re-radiation Offsets
3. Intermodulation Distortion Each category possesses its own mechanisms. Further description of these categories of offsets in relation to the UFD module are provided in U.S. Ser. No. 09/526,041, titled "DC Offset, Re-radiation, and I/Q Solutions Using Universal Frequency Translation Technology," filed Mar. 14, 2000, the disclosure of which is incorporated by reference herein in its entirety. These sources of DC offset may lead to erroneous receiver channel output signals.

Example methods and systems are provided in the subsections below for reducing or eliminating unwanted DC offsets. Such methods and systems may be used separately, or in any combination, to address offset issues.

4.2 Exemplary Communications System Receiver Channel

FIG. 16 shows an exemplary receiver channel 1600 in which embodiments of the present invention may be implemented. Receiver channel 1600 may be used to receive WLAN signals, or other signal types.

Receiver channel 1600 includes an optional low noise amplifier 1602, a second automatic gain control (AGC) amplifier 1604, a down-converter 1606, a first optional amplifier/filter section 1608, a first AGC amplifier 1610, a second optional amplifier/filter section 1612, and an antenna 1614. The present invention is also applicable to further receiver channel embodiments than receiver channel 1600, with fewer or more elements than shown in FIG. 16. Furthermore, the elements of receiver channel 1600 are not necessarily required to be arranged in the order shown in FIG. 16. For example, when first amplifier/filter section 1612 is present, some or all of it may be implemented upstream from down-converter 1606. Further embodiments for receiver channel 1600 will be apparent to persons skilled in the relevant art(s) from the teachings herein.

In an embodiment, more than one receiver channel 1600 may be required to receive a particular input signal. In the case of an I/Q modulated input signal, for example, a first receiver channel 1600 may be used to down-convert the I-channel, and a second receiver channel 1600 may be used to down-convert the Q-channel. Alternatively, for example, receiver channel 1600 may be divided into two channels (an I and Q channel) following LNA 1602 or second AGC amplifier 1604.

Antenna 1614 receives an input RF signal 1616. LNA 1602 (when present) receives and amplifies input RF signal 1616.

Second AGC amplifier 1604 receives input RF signal 1616 and receives a second AGC signal 1620. Second AGC amplifier 1604 amplifies input RF signal 1616 by an amount controlled by second AGC signal 1620, and outputs amplified RF signal 1618. Typically, second AGC signal 1620 is generated by downstream circuitry that detects the level of the receiver channel signal at a given location (not shown), and then determines by what amount the signal level of the receiver channel needs to be amplified, i.e., increased or decreased, to produce an acceptable receiver channel signal level.

Down-converter 1606 receives amplified RF signal 1618. Down-converter 1606 frequency down-converts, and optionally demodulates amplified input RF signal 1618 to a down-converted signal 1622. For example, in an embodiment, down-converter 1606 includes a conventional down-converter, such as a superheterodyne configuration. In another embodiment, down-converter 1606 may include a UFD module (e.g., UFD module 114 shown in FIG. 1C, aliasing module 300 shown in FIG. 3A) for frequency down-conversion/demodulation. Down-converted signal 1622 may be an intermediate frequency signal or baseband signal.

When present, first amplifier-filter section 1608 amplifies and/or filters down-converted signal 1622. First amplifier-filter section 1608 includes one or more amplifiers, such as operational amplifiers, and filter circuits for conditioning down-converted signal 1622. Any filter circuits that are present may have low-pass, high-pass, band-pass, and/or band-stop filter characteristics, for example. The filters may be active or passive filter types.

First AGC amplifier 1610 receives the optionally amplified/filtered down-converted signal 1622 and receives a first AGC signal 1626. First AGC amplifier 1610 amplifies down-converted signal 1622 by an amount controlled by first AGC signal 1626, and outputs amplified down-converted signal 1624. Similarly to second AGC signal 1620, first AGC signal 1626 is generated by circuitry that detects the level of the receiver channel signal at a given location (not shown), and then determines by what amount the signal level of the receiver channel needs to be amplified, i.e., increased or decreased, to produce an acceptable receiver channel signal level.

When present, second amplifier-filter section 1612 amplifies and/or filters amplified down-converted signal 1624. Second amplifier-filter section 1612 includes one or more amplifiers, such as operational amplifiers, and filter circuits for conditioning amplified down-converted signal 1624. Any filter circuits that are present may have low-pass, high-pass, band-pass, and/or band-stop filter characteristics, for example. The filters may be active or passive filter types. Second amplifier-filter section 1612 outputs an output signal 1628. Output signal 1628 may be an intermediate frequency signal that is passed on to further down-converters if needed, or a baseband signal that is passed to subsequent baseband signal processor circuitry.

Each element of receiver channel 1600 may introduce DC offsets, as described above, into the signal passing through receiver channel 1600. The following subsections further describe some of these sources of DC offset, and describe embodiments of the present invention for reducing or eliminating unwanted DC offset in a receiver channel.

4.3 Embodiments for Cancellation of DC Offset by Closed Feedback Loop

As described above, DC offset voltages may be introduced by elements of a receiver channel. DC offset voltages due to a down-converter, such as a UFD module, are briefly described in section 4.1 above, as are DC offset voltages due to an operational amplifier. These DC offset voltages can lead to erroneous receiver channel output signals. Hence, it would be desirable to reduce or eliminate DC offset voltages due to these and other elements of the receiver channel.

FIG. 20 shows an exemplary high-pass filter, or differentiator circuit 2000 that may be used to reduce or eliminate DC offset voltages in a receiver channel. Circuit 2000 is located in series in the receiver channel path. Circuit 2000 includes an amplifier 2002, a first resistor 2004, a capacitor 2006, and a second resistor 2008. Amplifier 2002 receives receiver channel signal 2010. First resistor 2004 and capacitor 2006 are coupled in series between the output of amplifier 2002 and the circuit output, output signal 2012. Second resistor 2008 is coupled between output signal 2012 and a ground or other potential.

A transfer function for circuit 2000 is provided below, wherein amplifier 2002 has a gain of G:

$$\frac{Vo}{Vi} = \frac{G \cdot \frac{R2}{R1 + R2}}{1 + \frac{1}{(R1 + R2)C \cdot s}}$$

Circuit 2000 is suitable for correcting an instantaneous DC offset, but may not be efficient in correcting for DC offset voltages over an infinite amount of time. For example, when there are perturbations in the DC offset voltage due to the temperature drift of circuit components, potentials may form across capacitor 2006 that do not easily dissipate. In addition, there is a single fixed time constant which does not simultaneously permit adequate frequency response and rapid DC offset acquisition time. Hence, circuit 2000 is not necessarily a desirable solution in all situations.

According to the present invention, DC offset voltages may be reduced or eliminated from a receiver channel using a closed feedback loop to subtract out the DC offset voltage. Embodiments for the closed feedback loop are provided as follows. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein.

In embodiments, a DC offset voltage at a particular receiver channel node is measured. Using a feedback loop, the measured DC offset voltage is subtracted from the receiver channel. FIG. 19 shows an example feedback loop 1900 for reducing DC offset in a receiver channel, according to an embodiment of the present invention. Feedback loop 1900 includes an optional first amplifier 1902, an integrator 1904, a summing node 1906, and a second amplifier 1908. Feedback loop 1900 may be located at any point in a receiver channel, including at RF, IF, and baseband portions of the receiver channel. The direction of signal flow in the receiver channel is shown by arrow 1910.

Feedback loop 1900 provides a more robust approach to removing DC offset than circuit 2000, described above and shown in FIG. 20. Feedback loop 1900 continually measures the DC level of the receiver channel node, and continually corrects for it. Furthermore, feedback loop 1900 allows for rapid acquisition and removal of DC offset voltages, particularly when accompanied by time varying integration time constants as described herein.

The receiver channel DC offset is monitored at an output node 1914. Output node 1914 is located in the receiver channel signal path. Output node 1914 also provides an output signal 1916 of feedback loop 1900. Output signal 1916 is further coupled to subsequent components of the receiver channel.

Integrator 1904 has an input coupled to output node 1914 through first amplifier 1902. First amplifier 1902 is optional, and when first amplifier 1902 is not present, integrator 1904 may be directly coupled to output node 1914. Integrator 1904 integrates the signal received from output node 1914, which includes a DC offset voltage. Integrator 1904 outputs an integrator output signal 1918. Integrator 1904 may include passive and/or active circuit elements to provide the integration function.

Summing node 1906 is located in the receiver channel upstream from output node 1914. A receiver channel signal 1912 is coupled as a first input to summing node 1906. The output of integrator 1904, integrator output signal 1918, is coupled as a second input to summing node 1906.

Summing node 1906 may be merely a signal node in the receiver channel, or may include circuit components (active and/or passive) for combining integrator output signal 1918 and receiver channel signal 1912. Integrator output signal 1918 includes the DC offset to be removed from the receiver channel that is determined by feedback loop 1900. Integrator output signal 1918 may be inverted, such that summing node 1906 adds integrator output signal 1918 and receiver channel signal 1912, or may be non-inverted, so that summing node 1906 subtracts integrator output signal 1918 from receiver channel signal 1912. For example, integrator 1904 may be configured as an inverting integrator, or first amplifier 1902, when present, may be configured as an inverting amplifier, so that integrator output signal 1918 is inverted.

One or more amplifiers and other circuit components may be coupled between summing node 1906 and output node 1914. Feedback loop 1900 operates to eliminate or reduce DC offsets produced by these circuit components from the receiver channel, so that they do not substantially appear in output signal 1916. In the example embodiment shown in FIG.19, second amplifier 1908 is coupled between summing node 1906 and output node 1914, and may provide a DC offset voltage at output node 1914.

FIG. 21 shows an example embodiment for integrator 1904, including an operational amplifier 2102, a resistor 2104, and a capacitor 2106 that are configured in an integrating amplifier configuration. Integrator input signal 1920 is coupled to a first terminal of resistor 2104. A second terminal of resistor 2104 is coupled to a first input 2112 of amplifier 2102. A second input 2114 of amplifier 2102 is coupled to ground or other reference potential. Capacitor 2106 is coupled between first input 2112 and output 2116 of amplifier 2102. Output 2116 is coupled to integrator output signal 1918.

Integrator 1904 shown in FIG. 21 performs the integration operation of:

$$v_o(t) = -\frac{1}{CR}\int_0^t v_i(t)dt$$

$$\frac{V_o}{V_i} = -\frac{1}{sCR}$$

Hence, as indicated by the minus sign in the integrator transfer function, integrator 1904 is an inverting integrator. Note that a non-inverting integrator may alternatively be used for integrator 1904 provided that integrator output signal 1918 is subtracted at summing node 1906. Hence, an inverting integrator 1904 with positive summing node 1906 weighting or a non-inverting integrator 1904 with negative summing node 1906 weighting of integrator output signal 1918 may be used. The feedback loop averages the output signal and effectively subtracts that result at the loop input. FIG. 24A shows a frequency response 2400 of an ideal integrator similar in an embodiment to integrator 1904. The integrator frequency response 2400 of FIG. 24A has a time constant, CR, determined by the values of capacitor 2106 and resistor 2104.

The transfer function for feedback loop 1900 shown in FIG. 19 may be calculated as follows:

$$V_o(s) = (-K_i G_{fb} V_o(s) + V_i(s))G$$

$$V_o(1 + K_i G_{fb} G) = V_i G$$

$$\frac{V_o}{V_i} = \frac{V_i G}{1 + K_i G_{fb} G} = \frac{G}{1 + \frac{G_{fb} G}{RCs}} = \frac{Gs}{s + \frac{G_{fb} G}{RC}}$$

where: $K_i = 1/RCs$
 $G$ = the gain of amplifier 1908,
 $G_{fb}$ = the gain of amplifier 1902,
 $V_o$ = output signal 1916, and
 $V_i$ = receiver channel signal 1912.

In the above calculation, a negative sign at the summing node accounts for a non-inverting integrator for integrator 1904 in feedback loop 1900. An inverting integrator for integrator 1904 may also be accommodated by these calculations by adjusting the polarity of the summing node. FIG. 24B shows a plot of the transfer function of feedback loop 1900. Feedback loop 1900 is useful for reducing or eliminating DC offset voltages originating between summing node 1906 and output node 1914 in the receiver channel, in addition to DC offset voltages existing in receiver channel signal 1912. For example, a DC offset voltage of second amplifier 1908, $V_{IOA}$, appearing at the input of second amplifier 1908, is reduced as follows:

$$V_o(s) = (-K_i G_{fb} V_o(s) + V_i(s) + V_{IOA})G$$

$$V_o(1 + K_i G_{fb} G) = V_{IOA} G$$

where $V_i = 0$ $$V_o = \frac{V_{IOA} G}{1 + K_i G_{fb} G}$$

For large loop gain $G_{fb}$, $$|V_o| \approx \frac{V_{IOA}}{K_i G_{fb}}$$

In some situations, DC offset voltages appearing in the feedback path of feedback loop 1900 may not be reduced as effectively. For example, FIG. 22 shows an embodiment of feedback loop 1900, where first amplifier 1902 is divided into a first feedback amplifier 2202 and a second feedback amplifier 2204, according to an embodiment of the present invention. FIG. 22 shows a DC offset voltage of integrator 1904, $V_{IOI}$, being added to the feedback signal path at the input of integrator 1904. $V_{IOI}$ affects output signal 1916 as follows:

$$V_o = -(K_i G_{fb1} V_o + K_i V_{IOI}) G_{fb2} \cdot G + V_i G$$

Where $G_{fb} = G_{fb1} G_{fb2}$ $$V_o = \frac{G K_i G_{fb2} V_{IOI}}{1 + G K_i G_{fb}} + V_i \frac{G}{1 + G K_i G_{fb}}$$

For $V_i=0$ and large loop gain $G_{fb}$, $$|V_o| \approx \frac{V_{IOI}}{G_{fb1}}$$

Hence, in the embodiment of FIG. 22, the DC offset contribution of integrator 1904, $V_{IOI}$, can be reduced by increasing the gain of first feedback amplifier 2202 (with a corresponding decrease in the gain of second feedback amplifier 2204 to keep from affecting the overall loop gain).

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

As described above, the frequency response of the feedback loop may be varied. The varying of the frequency response of the feedback loop is described more fully in the next sub-section. Examples of the operation of closed feedback loop embodiments of the present invention are then described in the following sub-section.

4.3.1 Variable Frequency Response Embodiments of the Present Invention

In some communication system receivers, it may be advantageous to incorporate a feedback loop 1900 with a variable frequency response. This may allow for DC offset voltages to be acquired according to different degrees of accuracy, while allowing the receiver channel to better pass signals of different signal formats. By varying the frequency response of feedback loop 1900, a frequency response of the receiver channel may be correspondingly varied. Furthermore, the ability to vary the frequency response of feedback loop 1900 allows for more rapid acquisition of DC offset voltages.

For example, a frequency response with a high-pass filter characteristic may be desirable to avoid problems of 1/f noise, also known as "flicker" noise. 1/f noise is produced by amplifiers, and gets its name from the fact that its characteristic curve has a slope close to 1/f. 1/f noise can cause subsequent amplifiers in the receiver channel to saturate, and can otherwise interfere with the receiver channel signal. Hence, it may be advantageous to have a high-pass filter characteristic in the receiver frequency response to reject 1/f noise. FIG. 40 shows an example 1/f noise characteristic curve 4002. The 1/f corner frequency for an amplifier can be around 10 KHz, or even greater, as shown in 1/f noise characteristic curve 4002. The noise level to the left of the 1/f corner frequency can be in the microvolts. Hence, a high-pass corner frequency of 100 KHz or 1 MHz may be desirable, for example.

However, a signal packet being received may have characteristics making a lower high-pass filter corner frequency more desirable. For example, in a 802.11 standard WLAN environment, a CCK modulated data portion of a WLAN signal frame may have this characteristic, as opposed to the WLAN signal frame preamble which may not. Furthermore, it may be advantageous to have a lower high-pass filter corner frequency in order to better capture and follow DC offset voltage changes due to thermal drift, etc. These considerations must be balanced with the problem of 1/f noise, as well as DC acquisition loop settling time.

In a WLAN (or other) communication system receiver, two or more separately located antennas may be used. During signal acquisition, the antennas may be sequentially switched on, so that each antenna is individually coupled to the same receiver channel. This antenna "diversity" switch allows for the antennas to be sequenced through, until it is determined which antenna allows for the strongest received signal. During this period of diversity antenna switching, a first frequency response for feedback loop 1900 may be desired, due to potentially a higher or lower tolerance in the acceptability of DC offset. Once an antenna has been selected, further frequency responses for feedback loop 1900 may be desired, due to changes in the tolerance for DC offset. Different frequency responses for feedback loop 1900 may be desirable when down-converting each of the preamble and data portions of a data frame, for example.

Hence, in an embodiment of the present invention, the frequency response of feedback loop 1900 is variable. The frequency response of feedback loop 1900 may be varied by changing component values in the feedback loop circuit, for example.

In an embodiment, integrator 1904 in feedback loop 1900 may be variable. The frequency response of integrator 1904 may be made variable by varying its respective components. Furthermore, integrator 1904 may receive one or more control signals to control the timing of frequency response changes for integrator 1904. FIG. 51 shows an block diagram of integrator 1904, according to an embodiment of the present invention. As shown in FIG. 51, integrator 1904 may receive a control signal 5102. One or more components of integrator 1904 may be varied in response to control signal 5102. In the embodiment of integrator 1904 shown in FIG. 21, the values of resistor 2104 and/or capacitor 2106 may be made variable in response to a control signal in order to vary the frequency response of integrator 1904. Other components may be made variable in other embodiments for integrator 1904.

FIG. 23 shows an integrator 1904, where resistor 2104 is a variable resistor, according to an embodiment of the present invention. Integrator 1904 as shown in FIG. 23 is configured substantially similarly to integrator 1904 shown in FIG. 21, with resistor 2104 divided into a first resistor 2302, a second resistor 2304, and a third resistor 2306, which are coupled in series. Furthermore, as shown in FIG. 23, integrator 1904 receives two control signals, first and second control signals 2312 and 2314.

A first switch 2308 is coupled across second resistor 2304, and receives a first control signal 2312. A second switch 2310 is coupled across third resistor 2306, and receives a second control signal 2314. By using first control signal 2312 and second control signal 2314 to switch second resistor 2304 and third resistor 2306 in and out of the circuit of integrator 1904, the frequency response of integrator 1904 may be varied. Any number of one or more resistors with corresponding switches in parallel may be used, according to the present invention, each providing for a corresponding change in the frequency response for integrator 1904. Furthermore, one or more continuously variable resistors may be used for resistor 2104 instead fixed resistors.

In an example embodiment, first and second control signals 2312 and 2314 are sequenced between three consecutive time periods according to the following table:

TABLE 1

|  | first control signal 2312 | second control signal 2314 |
|---|---|---|
| first time period | 1 | 1 |
| second time period | 0 | 1 |
| third time period | 0 | 0 |

Due to the sequencing shown in Table 1, during the first time period, second and third resistors 2304 and 2306 are both shorted out of resistor 2104. First and second controls signals 2312 and 2314 (which are both high) open both of first and second switches 2308 and 2310, respectively. Only first resistor 2302 has an affect on the frequency response of integrator 1904. During the second time period, only third resistor 2306 is shorted out of resistor 2104 by second control signal 2314, which opens second switch 2310. The sum of the resistances of first resistor 2302 and second resistor 2304 affect the frequency response of integrator 1904. During the third time period, none of the three resistors are shorted out of resistor 2104 by the control signals/switches. The sum of the resistances of first resistor 2302, second resistor 2304, and third resistor 2306 affect the frequency response of integrator 1904.

Note that, although not shown in Table 1, in a fourth time period, first control signal 2312 could be equal to a logical high level, and second control signal 2314 could be equal to a logical low level.

Also, note that in an actual implementation, the switching action of first and second switches 2308 and 2310 may cause voltage spikes that appear in integrator output signal 1918. Any such voltage spikes could harm the operation of integrator 1904. Circuit components must be carefully selected and configured to keep the amplitude and duration of any voltage spikes below certain amounts to keep from disturbing the integrator too much.

In an embodiment, the values for first, second, and third resistors 2302, 2304, and 2306 may be selected such that the value of first resistor 2302 has a lower resistance value than second resistor 2304, and second resistor 2304 has a lower resistance value than third resistor 2306. Other resistor value combinations are also applicable to the present invention.

FIG. 25A shows frequency responses of integrator 1904 during the three time periods of Table 1, according to an embodiment of the present invention. For the frequency response shown in FIG. 25A, R1 (first resistor 2302)<<R2 (second resistor 2304)<<R3 (third resistor 2306). FIG. 25A shows a first integrator frequency response 2502 corresponding to the first time period, a second integrator frequency response 2504 corresponding to the second time period, and a third integrator frequency response 2506 corresponding to the third time period.

FIG. 25B shows a plot of transfer functions for feedback loop 1900 that correspond to first, second, and third integrator frequency responses 2502, 2504, and 2506. FIG. 25B shows a first loop frequency response 2510 that corresponds to third integrator frequency response 2506, a second loop frequency response 2512 that corresponds to second integrator frequency response 2504, and a third loop frequency response 2514 that corresponds to first integrator frequency response 2502. First loop frequency response 2510 has a relatively low high-pass corner frequency of approximately 10 KHz, for example. Second loop frequency response 2512 has a relatively medium high-pass corner frequency of approximately 100 KHz, for example. Third loop frequency response 2514 has a relatively higher high-pass corner frequency of approximately 1 MHz, for example.

First loop frequency response 2510, second loop frequency response 2512, and third loop frequency response 2514 may be respectively referred to as having a long or slow time constant, a medium time constant, and a short or fast time constant, elsewhere herein. These labels correspond to the RC time constants for their respective configurations of integrator 1904: (R1+R2+R3)C for loop frequency response 2510, (R1+R2)C for loop frequency response 2512, and (R1)C for loop frequency response 2514.

In an embodiment, one or more feedback loops similar to feedback loop 1900 are present in a receiver channel used to receive WLAN signals. In such an embodiment, different frequency responses for feedback loop 1900 may be used during different portions of the signal receiving process. For example, during the first time period, an initial pass at acquiring DC offset may be made. Accurately acquiring and following DC offset may not be as important during this time period (i.e., a short time constant may be acceptable). During the second time period, an optimal antenna diversity may be searched for and selected. DC offset concerns may become greater during this time period. Also during the first and second time periods, a signal preamble may be received. For example, the preamble may be coded with a Barker word. Hence, DC offset considerations may become more important during this time period (i.e., a medium time constant may be acceptable). During the third time period, a data portion of the data frame corresponding to the received preamble may be received. For example, the data portion may be modulated according to complementary code keying (CCK). The CCK modulated data signal may require the receiver to have a high-pass corner frequency closer to DC than does the Barker coded preamble (i.e., long time constant). Hence, the actions performed during these three time periods may each require a respective receiver frequency response tailored to their special conditions.

In an embodiment, these three time periods are sequenced through each time a new WLAN signal packet is received. In such an embodiment, for example, the first time period used to initially acquire DC offset may be within the range of 5 to 6 microseconds. The second time period used to complete the reception of the preamble may be within the range of 55 to 128 microseconds. The third time period may last as long as it is required to receive the entire data portion of the signal packet. In alternative embodiments, one or more of such time periods may be of any duration necessary to support portions of the signal receiving process.

4.3.2 Operation of the Closed Feedback Loop of the Present Invention

Figure 27:
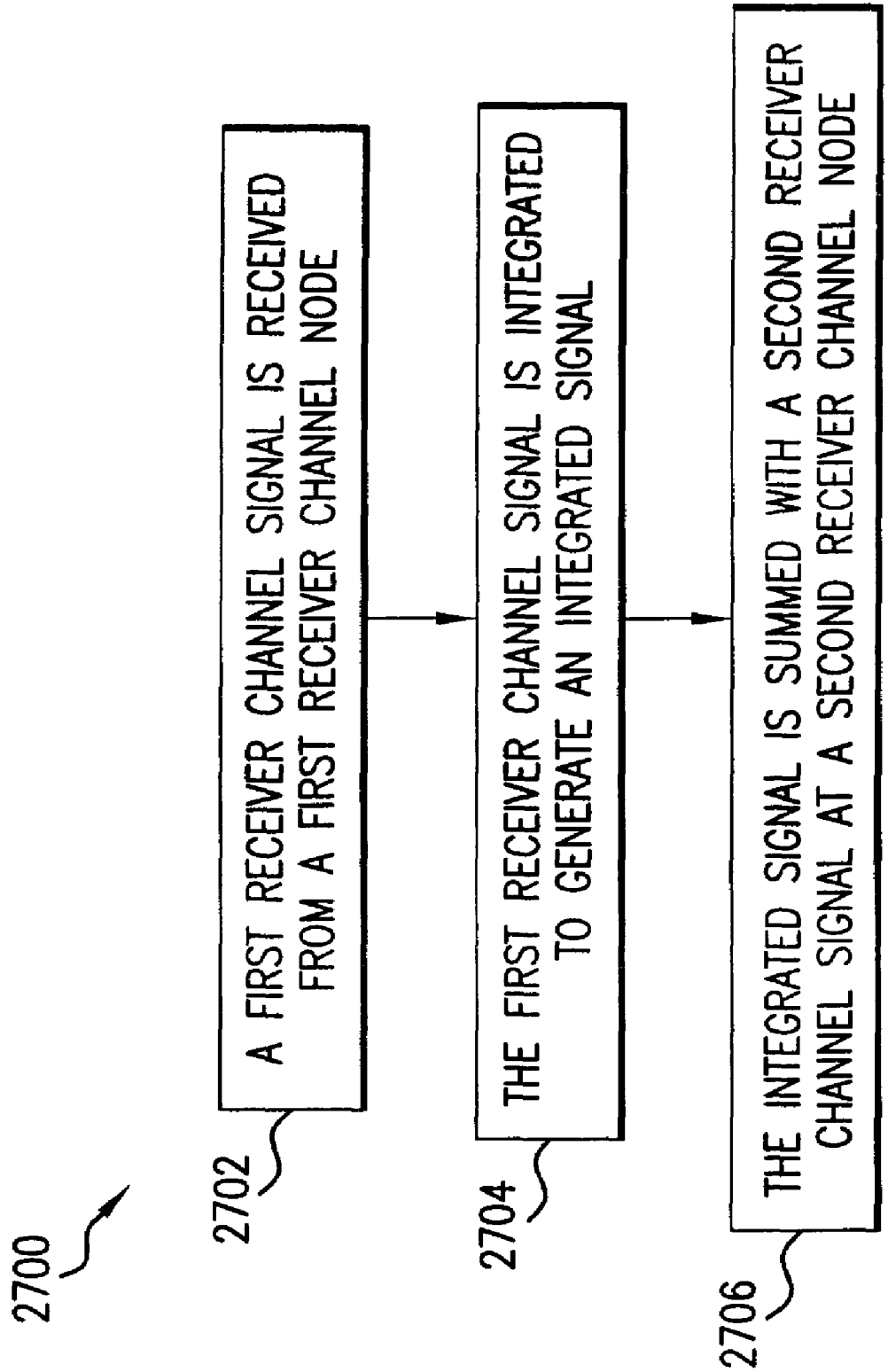

FIG. 27 shows a flowchart 2700 providing operational steps for performing embodiments of the present invention. FIGS. 28, 29, 33, and 34 provide additional operational steps for flowchart 2700, according to embodiments of the present invention. The steps shown in FIGS. 27-29, 33, and 34 do not necessarily have to occur in the order shown, as will be apparent to persons skilled in the relevant art(s) based on the teachings herein. Other embodiments will be apparent to persons skilled in the relevant art(s) based on the following discussion. These steps are described in detail below.

As shown in FIG. 27, flowchart 2700 begins with step 2702. In step 2702, a first receiver channel signal is received from a first receiver channel node. For example, the first receiver channel signal is output signal 1916, received from output node 1914, as shown in FIG. 19. In an embodiment, the first receiver channel signal is amplified before being received. For example, output signal 1916 may be amplified by first amplifier 1902, which outputs integrator input signal 1920.

In step 2704, the first receiver channel signal is integrated to generate an integrated signal. For example, integrator input signal 1920 is integrated. For example, integrator input signal 1920 may be integrated by integrator 1904 to generate integrator output signal 1918.

In step 2706, the integrated signal is summed with a second receiver channel signal at a second receiver channel node. For example, integrator output signal 1918 is summed with receiver channel signal 1912 at summing node 1906. The first receiver channel node is downstream from the second receiver channel node in the receiver channel. As shown in FIG. 19, output node 1914 is further downstream in the receiver channel than is summing node 1906.

In an embodiment, step 2704 includes the step where the integrated signal is generated as an integrated and inverted version of the first receiver channel signal. For example, integrator 1904 may be configured as an inverting integrator to produce an inverted integrator output signal 1918. In another example, when present, first amplifier 1902 may be configured in an inverting amplifying configuration to produce an inverted integrator input signal 1904, which is input to integrator 1904.

In an embodiment, step 2704 is performed by an integrator circuit. For example, the integrator circuit is integrator 1904. In an embodiment, the integrator circuit includes an amplifier, a capacitor, and a resistor. For example, integrator 1904 may include amplifier 2102, capacitor 2106, and resistor 2104, as shown in FIG. 21. The present invention is applicable to alternative embodiments for integrator 1904. In an embodiment, flowchart 2700 further includes the step where the amplifier, capacitor, and resistor are arranged in an integrating amplifier configuration. For example, amplifier 2102, capacitor 2106, and resistor 2104, may be arranged in an integrating amplifier configuration as shown in FIG. 21.

Figure 28:
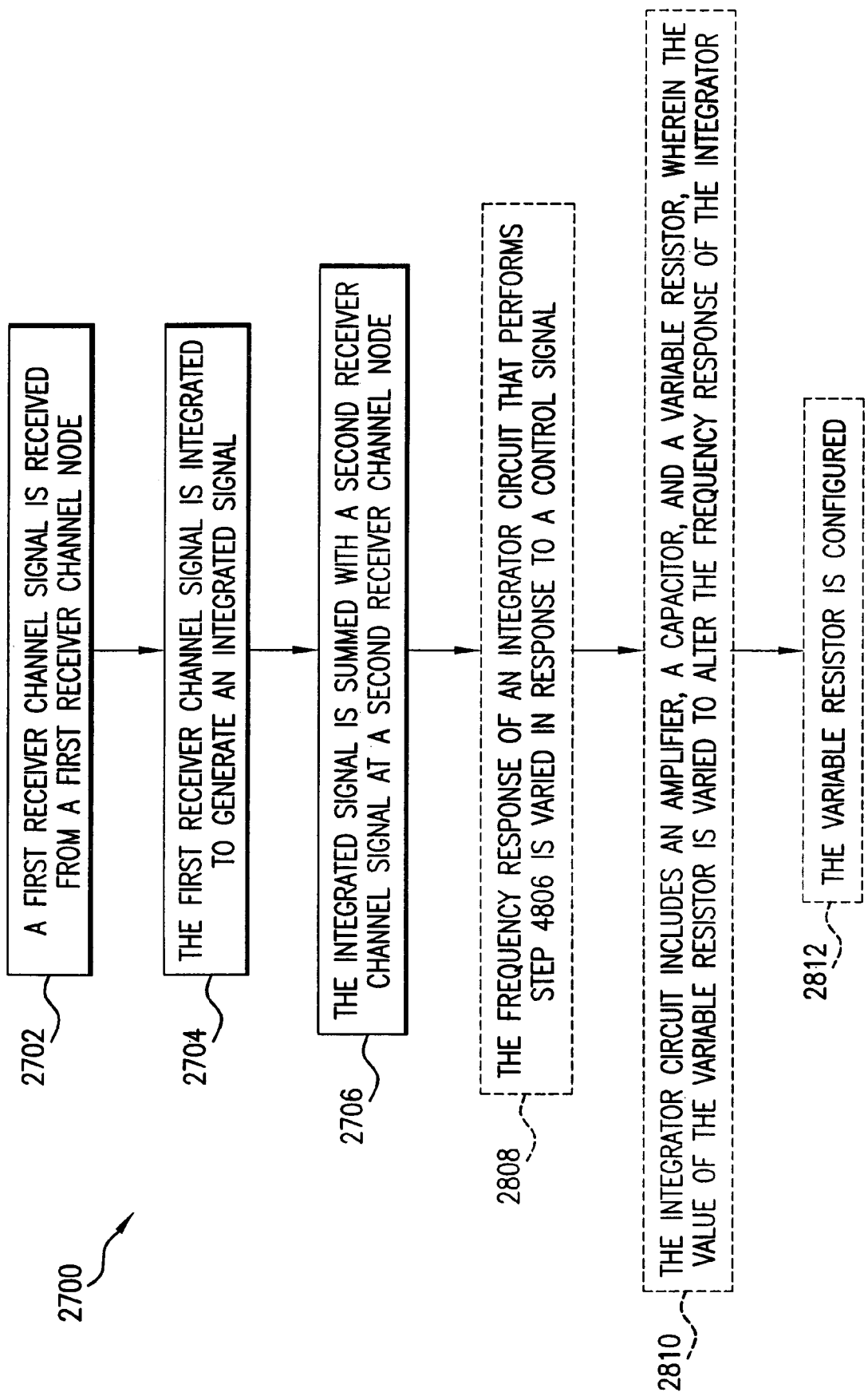

FIG. 28 shows flowchart 2700 with additional optional steps, according to an embodiment of the present invention. In FIG. 28, optional steps are indicated by dotted lines. In an embodiment, flowchart 2700 further includes step 2808. In step 2808, the frequency response of the integrator circuit is varied in response to a control signal. For example, as shown in FIG. 23, integrator 1904 is variable according to first control signal 2312 and second control signal 2314.

In an embodiment, flowchart 2700 further includes step 2810 shown in FIG. 28. In this embodiment, the integrator includes an amplifier, a capacitor, and a variable resistor. For example, resistor 2104 may be a variable resistor. In step 2810, the value of the variable resistor is varied to alter the frequency response of the integrator. For example, the value of resistor 2104 may be varied to alter the frequency response of integrator 1904.

In an embodiment, flowchart 2700 further includes step 2812 shown in FIG. 28. In step 2812, the variable resistor is configured. In an embodiment, the variable resistor includes at least one resistor and a switch corresponding to each of the at least one resistor. For example, resistor 2104 includes second resistor 2304 and first switch 2308. In an embodiment, step 2812 includes the step where the corresponding switch is coupled across each of the at least one resistor. For example, first switch 2308 is coupled across second resistor 2304.

Figure 29:
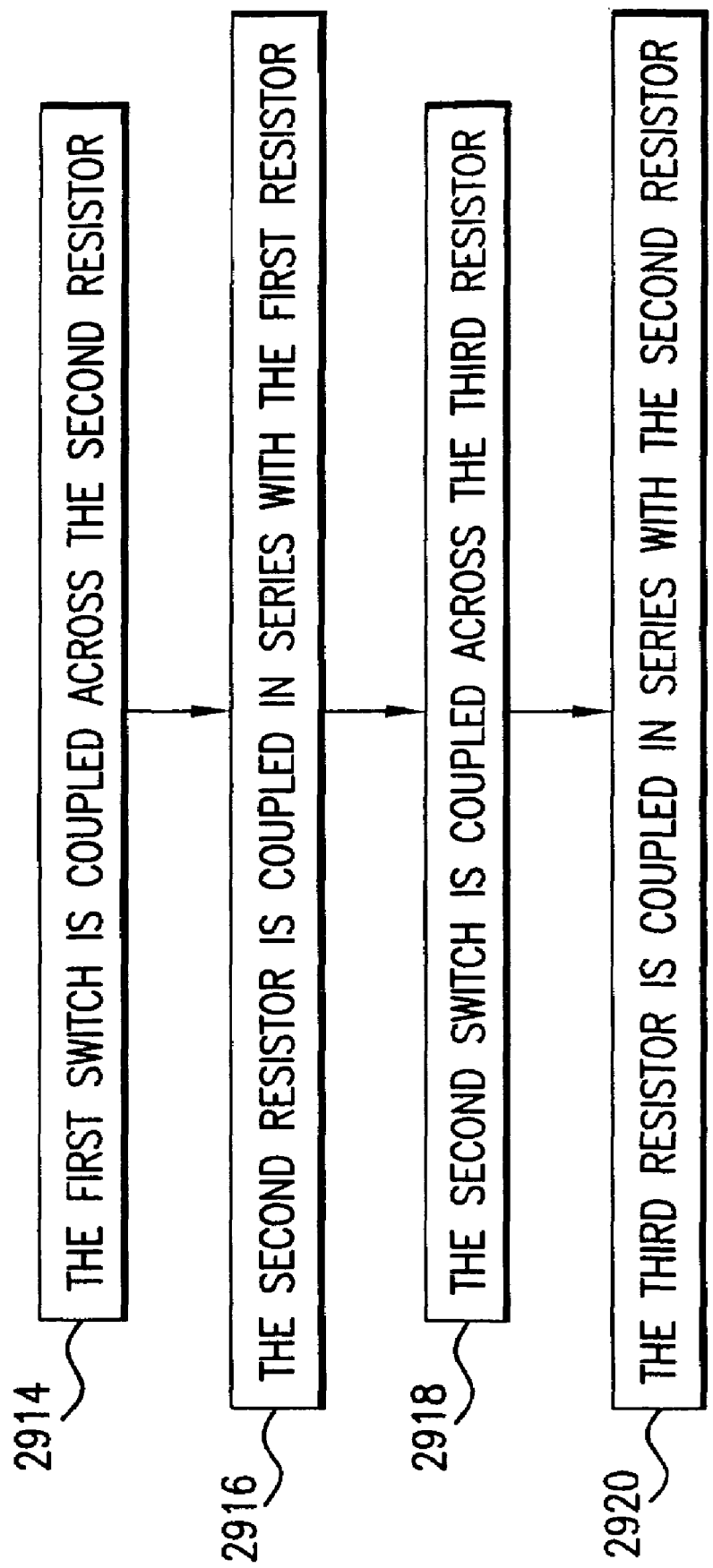

In an embodiment, the variable resistor includes a first resistor, a first switch, a second resistor, a second switch, and a third resistor. For example, resistor 2104 includes first resistor 2302, first switch 2308, second resistor 2304, second switch 2310, and third resistor 2306. In an embodiment, step 2812 includes the following steps, which are shown in FIG. 29:

In step 2914, the first switch is coupled across the second resistor. For example, first switch 2308 is coupled across second resistor 2304.

In step 2916, the second resistor is coupled in series with the first resistor. For example, second resistor 2304 is coupled in series with first resistor 2302.

In step 2918, the second switch is coupled across the third resistor. For example, second switch 2308 is coupled across third resistor 2306.

In step 2920, the third resistor is coupled in series with the second resistor. For example, third resistor 2306 is coupled in series with second resistor 2304.

Figure 33:
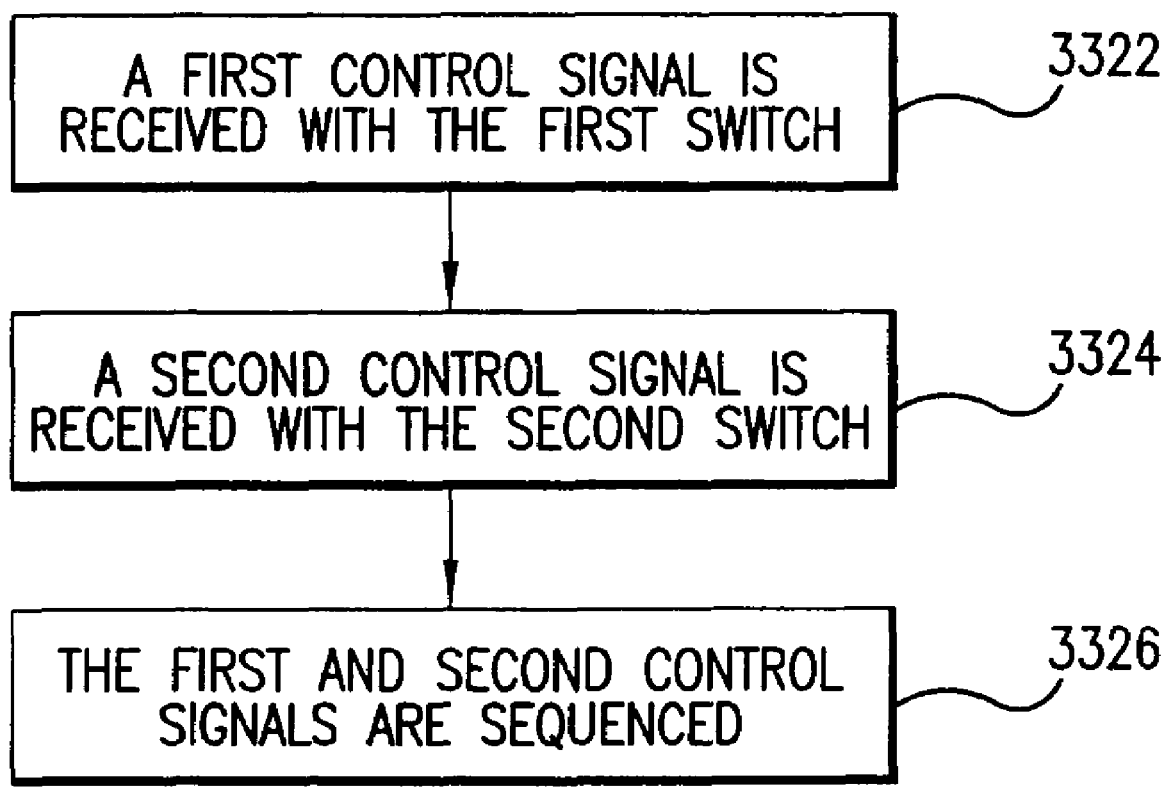

In embodiments, one or more control signals may be supplied to the switches in the variable resistor. The control signals control the opening and closing of the switches, which in turn alters the resistance of the variable resistor. This allows the frequency response of the integrator to be varied. For example, in an embodiment, step 2812 further includes the following steps, which are shown in FIG. 33:

In step 3322, a first control signal is received with the first switch. For example, first switch 2308 is received by first control signal 2312.

In step 3324, a second control signal is received with the second switch. For example, second switch 2310 is received by second control signal 2314.

In step 3326, the first and second control signals are sequenced according to Table 1, as shown above.

In an embodiment, step 3326 includes the step where the first and second control signals are sequenced according to the time periods shown in Table 1, where the first time period is in the range of 4 to 6 microseconds, and where the second time period is in the range of 55 to 128 microseconds.

Figure 34:
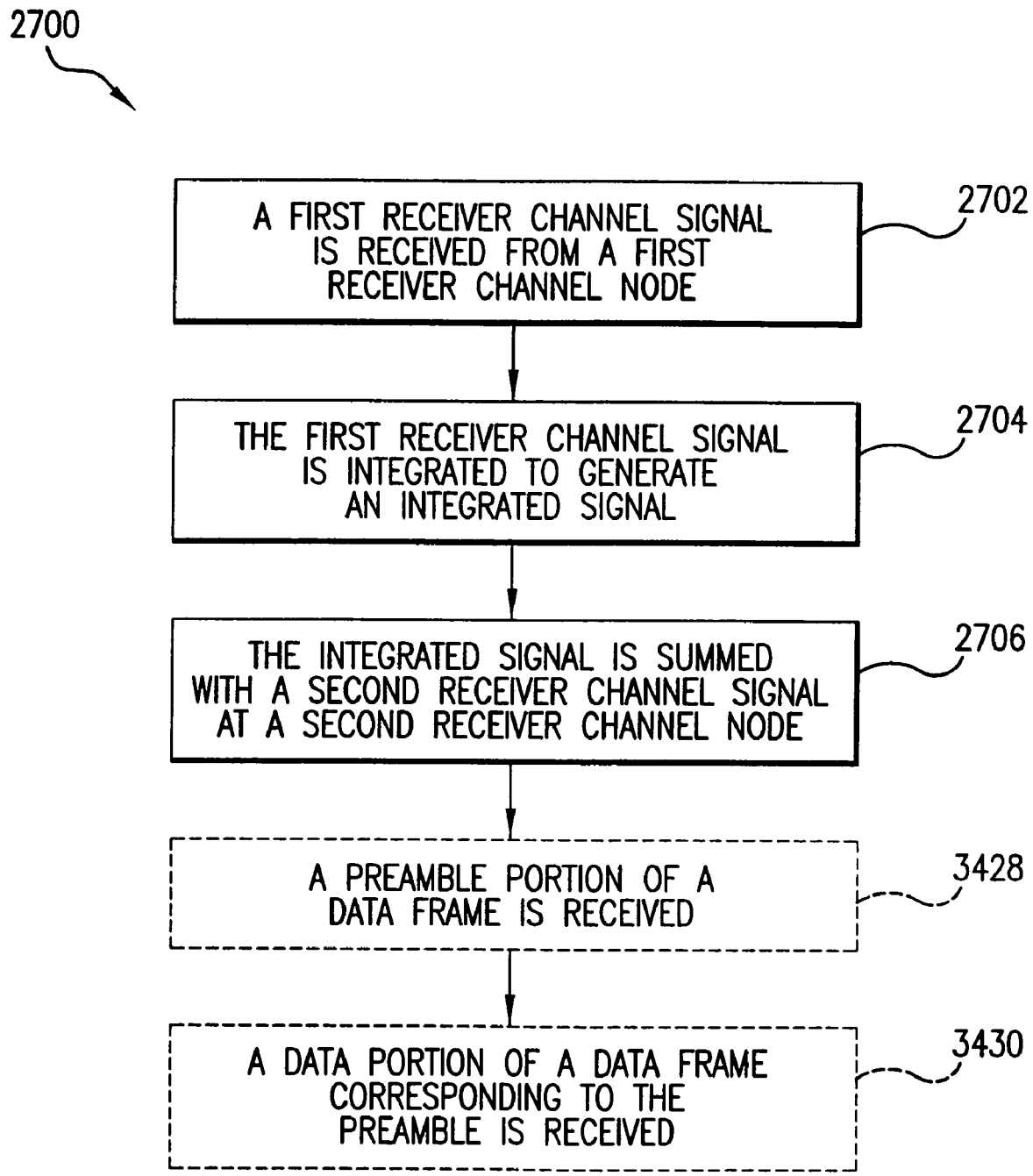

FIG. 34 shows flowchart 2700 with additional optional steps, according to an embodiment of the present invention. In FIG. 34, optional steps are indicated by dotted lines. In step 3428, a preamble is received during the first and second time periods. For example, a 802.11 WLAN DSSS data frame preamble may be received by a receiver channel incorporating feedback loop 1900, such as receiver channels 1600, 1700, during the first and second time periods. The preamble may be short or long. The receiver may perform diversity switching during these time periods. The present invention is also applicable to receiving additional signal types and formats.

In step 3430, a data portion of a data frame corresponding to the preamble is received during the third time period. For example, a data portion of the 802.11 WLAN DSSS data frame may be received during the third time period.

In an embodiment, step 2706 includes the step where the second receiver channel signal is received, where the second receiver channel signal is a radio frequency signal. In an alternative embodiment, step 2706 includes the step where the second receiver channel signal is received, where the second receiver channel signal is an intermediate frequency signal. For example, receiver channel signal 1912 may be a radio frequency or intermediate frequency signal.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. For example, in variable frequency response embodiments of the present invention, a plurality of frequency responses for feedback loop 1900 may be sequenced between as necessary to acquire DC offset and receive signal packets of any communication standard type. The invention is intended and adapted to include such alternate embodiments.

4.4 Embodiments for Cancellation of DC Offset by Open Feedback Loop

According to embodiments of the present invention, DC offset voltages may be reduced or eliminated (in a receiver channel, for example) using open loop DC offset voltage subtraction. In embodiments, a DC offset voltage at a particular receiver channel node may be captured and stored using a closed feedback loop. Once the DC offset voltage is captured, the feedback loop may be opened, and the captured DC offset voltage may be subtracted from the receiver channel.

The open feedback loop configuration has numerous advantages. These include a reduction in circuit components compared to other techniques, an ease in implementation, and a corresponding reduction in power consumption. Furthermore, the open feedback loop configuration can acquire the DC offset voltage rapidly. In embodiments, the DC offset voltage may be acquired in less than 2 μS.

FIG. 52 shows an open loop circuit 5200 for reducing DC offsets in a receiver channel, according to an embodiment of the present invention. Open loop circuit 5200 includes a summing node 5202, an AGC amplifier 5222, an output node 5204, a switch 5206, and a storage device 5208. Storage device 5208 is shown as a capacitor 5210 in FIG. 52, but may be an alternative type of storage device. The direction of signal flow in the receiver channel is shown by arrow 5218.

Generally, open loop circuit 5200 measures a DC offset voltage at an output node 5204 located in the receiver channel, and stores a charge proportional to this voltage in storage device 5208 when switch 5206 is closed. This charge or voltage is then de-coupled from output node 5204 by opening switch 5206, and subtracted from a receiver channel signal 5218 at summing node 5202. This has the effect of removing the DC offset voltage that would otherwise appear in output signal 5220. The DC offset voltage may be due, for example, to non-ideal circuit components prior to open loop circuit 5200 in the receiver channel and between summing node 5202 and output node 5204. Preferably, the receiver channel input to open loop circuit 5200 is squelched or nulled while the DC offset voltage is being acquired, such that receiver channel signal 5218 contains DC signal content to be subtracted out. The nulling of the receiver channel is described more fully in the following sub-section 4.4.1.

Summing node 5202 is located in the receiver channel. Receiver channel signal 5218 is coupled as an first input to summing node 5202.

The receiver channel DC offset is measured at output node 5204 and stored in storage device 5208 (this is further described in section 4.4.1). Output node 5204 is located in the receiver channel, downstream from summing node 5202.

Switch 5206 is coupled between output node 5204 and storage device 5208. Switch 5206 receives a control signal, DC voltage acquire signal 5216. When DC voltage acquire signal 5216 is high, switch 5206 is closed, and switch 5206 couples output node 5204 to storage device 5208. In this state, a voltage at output node 5204 is stored in storage device 5208. When DC voltage acquire signal 5216 is low, switch 5206 is opened, which isolates output node 5204 from storage device 5208. In this state, storage device 5208 holds the stored voltage.

Storage device 5208 outputs a stored DC voltage output signal 5214. Stored DC voltage output signal 5214 is coupled as a second input to summing node 5202. Summing node 5202 may be merely a signal node, or may include circuit components for combining stored DC voltage output signal 5214 and receiver channel signal 5218. Stored DC voltage output signal 5214 includes the DC offset voltage stored by storage device 5208, that is to be removed from the receiver channel. In an embodiment, summing node 5202 removes the stored DC offset voltage from the receiver channel by subtracting stored DC voltage output signal 5214 from receiver channel signal 5218. Alternatively, stored DC voltage output signal 5214 may be inverted, such that summing node 5202 adds stored DC voltage output signal 5214 to receiver channel signal 5218. Summing node 5202 outputs summed signal 5212.

AGC amplifier 5222 receives summed signal 5212, and amplifies summed signal 5212 according to AGC signal 5224. One or more amplifiers and other circuit components may be coupled between summing node 5202 and output node 5204. As described above, open loop circuit 5200 operates to eliminate or reduce DC offsets produced by these circuit components in the receiver channel. In the example embodiment shown in FIG. 52, AGC amplifier 5222 is coupled between summing node 5202 and output node 5204. Alternatively, non-AGC amplifiers may be coupled between summing node 5202 and output node 5204 in addition to, or instead of AGC amplifier 5222.

Output node 5204 is coupled to the output of AGC amplifier 5222. Output node 5204 provides the output signal, output signal 5220, of open loop circuit 5200. Output signal 5220 is further coupled to subsequent downstream components of the receiver channel.

Open loop circuit 5200 may be used, for example, to reduce DC offsets in receiver channel 1600, shown in FIG. 16. For example, open loop circuit 5200 may be configured around either one of, or both of first and second AGC amplifiers 1610 and 1604, and/or any other amplifiers in the receiver channel.

In an embodiment, the acquisition of the DC offset voltage that occurs according to DC voltage acquire signal 5216 is performed while AGC amplifier 5222 is operating at a maximum gain setting. The input DC offset voltage and DC offset voltage of AGC amplifier 5222 are stored by capacitor 5210. However, this value is reduced by the closed loop gain, $A_{cl}$, of AGC amplifier 5222, as shown below:

$$V_{corr} = V_{os}A_{cl} = \frac{V_{os}A_{ol}}{(1+A_{ol})}$$

where: $V_{corr}$=actual DC offset voltage correction
$V_{os}$=total DC voltage offset
$A_{ol}$=open loop gain of AGC amplifier 5222

This results in a DC offset correction error, $V_{err}$:

$$V_{err} = V_{os} - V_{corr} = V_{os} - V_{os}A_{cl} = V_{os}(1-A_{cl})$$

The output DC offset voltage, $V_{out}$, is equal to the correction error multiplied by the open loop, dynamic gain, $A_{ol\_d}$:

$$V_{out} = \frac{A_{ol\_d}V_{os}}{(1+A_{ol})}$$

Hence, in a worst case, the output DC offset is about equal to the worst case DC offset of AGC amplifier 5222. The DC offset correction error, $V_{err}$, may be reduced by increasing the open loop gain.

The open loop output DC offset voltage, $V_{out1}$, for open loop circuit 5200 is shown as follows:

$$V_{out1}(A_{ol\_d}) = A_{ol\_d}\left[V_{osi}e^{\frac{-tr}{\tau}} + V_{osl}\left[\frac{1+A_{ol\_s}e^{\frac{-tr}{\tau}}}{1+A_{ol\_s}}\right]\right]$$

where: $V_{osi}$=input DC offset voltage
$V_{osl}$=DC voltage offset contribution of AGC amplifier 5222
$A_{ol\_s}$=static open loop gain of AGC amplifier 5222
$\tau$=time constant related to capacitor 5210

This equation provides an illustration of a problem in subtracting a DC offset in the presence of varying gain. Note that further configurations may include a feedback amplifier in open loop circuit 5200, and/or two or more cascaded stages similar to open loop circuit 5200, for example. In such configurations, the problem with subtracting a DC offset is typically exacerbated, and the corresponding open loop DC offset voltage equation is more complicated. Such open loop DC offset voltage configurations and corresponding equations would be know to persons skilled in the relevant art(s) from the teachings herein.

FIG. 53 shows an alternative embodiment for open loop circuit 5200, according to the present invention. Open loop circuit 5200 in FIG. 53 includes a second amplifier 5302 and a second switch 5304 coupled between output node 5204 and storage device 5208. When DC voltage acquire signal 5216 is high, first switch 5206 and second switch 5304 are closed, and output node 5204 is coupled to storage device 5208 through second amplifier 5302. In this state, a voltage at output node 5204 is amplified by second amplifier 5302, and stored in storage device 5208. When DC voltage acquire signal 5216 is low, first switch 5206 and second switch 5304 are opened, which isolates output node 5204 from storage device 5208, and isolates second amplifier 5302. In this state, storage device 5208 holds the amplified/stored voltage. First switch 5206 is optional in such a configuration.

As stated above, stored DC voltage output signal 5214 may be inverted by an amplifier located prior to or following storage device 5208 in open loop circuit 5200. When amplifier 5302 is present, it may be configured in an inverting amplifier configuration to invert the DC offset voltage stored in storage device 5208, so that stored DC voltage output signal 5214 may be added to receiver channel signal 5218 to remove the DC offset.

FIG. 54 shows a differential open loop circuit 5400, according to an embodiment of the present invention. Differential open loop circuit 5400 is a differential version of open loop circuit 5200, which is shown as single-ended for exemplary purposes. Differential open loop circuit 5400 includes a differential AGC amplifier 5402, a first switch 5404, a second switch 5406, a first capacitor 5408, a second capacitor 5410, a first resistor 5412, and a second resistor 5414.

Generally, differential open loop circuit 5400 operates similarly to open loop circuit 5200 as described above. A DC voltage acquire signal 5418 is received by first and second switches 5404 and 5406. In a first mode, DC voltage acquire signal 5418 is high, closing first and second switches 5404 and 5406. In this mode, differential open loop circuit 5400 receives DC voltages at output nodes 5424 and 5426 located in the receiver channel, and stores these voltage in first and second capacitors 5408 and 5410, respectively.

In a second mode, while switches 5404 and 5406 are open, the voltages stored in first and second capacitors 5408 and 5410 during the first mode are subtracted from differential receiver channel signal 5420 at first and second summing nodes 5428 and 5430. This has the effect of reducing or removing DC offset voltages due to components prior to differential open loop circuit 5400 in the receiver channel, and due to components between first and second summing nodes 5428 and 5430 and output nodes 5424 and 5426, that would otherwise appear in a differential output signal 5422.

Differential AGC amplifier 5402 is shown coupled between first and second summing nodes 5428 and 5430, and output nodes 5424 and 5426. Differential AGC amplifier 5402 receives first and second summed signals 5432 and 5434, and amplifies first and second summed signals 5432 and 5434 according to AGC signal 5416. Output nodes 5424 and 5426 are coupled to the output of differential AGC amplifier 5402. Output nodes 5424 and 5426 provide the output signal, differential output signal 5422, of open loop circuit 5400. Output signal 5220 is further coupled to subsequent downstream components of the receiver channel.

One or more amplifiers and other circuit components may be coupled between first and second summing node 5428 and 5430 and output nodes 5424 and 5426 other than, or in addition to differential AGC amplifier 5402.

Note that AGC amplifiers coupled between the summing and output nodes may undergo changes in gain due to changes in the level of the AGC signals. The level of a DC offset voltage passing through an AGC amplifier will be amplified according to the new gain setting, and thus will be changed. If a gain change in the AGC amplifier occurs after the DC offset voltage has been stored, the stored DC offset voltage may become out-dated and incorrect. Accordingly, the gain function(s) of the loop can be dynamically adjusted to accommodate AGC adjustments.

In some applications, it is desireable to remove DC offset of the baseband signal prior to the first AGC function. Accordingly, FIG. 68 shows a block diagram of an alternative implementation 6800 of the block diagram illustrated in FIG. 52. In FIG. 68, the AGC amplifier 5222 is implemented outside of the DC offset correction loop. Implementation 6800 allows for maximization of fixed gain with DC offset removed, prior to a baseband AGC function. This allows the system to obtain the largest reasonable fixed gain in the process, prior to the AGC function, such that other receiver figures of merit are not sacrificed. Maximization of this pre-AGC gain is subject to radio design criteria, such as, for example, and without limitation, intercept point and noise figure. Note that one or more fixed gain amplifiers may be inserted between summing node 5202 and output node 5204 in the implementation of 6800 to provide additional fixed gain.

Generally, maximization of AGC is desireable, provided that overall dynamic range (e.g., noise figure and intercept point) is preserved in the process. Hence, RF AGC, under certain scenarios dominated by DC offset control, should be adjusted at a greater rate than the corresponding baseband AGC.

It should be understood that the above examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

As described above, preferably, the receiver channel is nulled while the DC offset voltage is being acquired or measured, such that receiver channel signal 5218 mainly contains the DC signal content to be subtracted out. The nulling of the receiver channel is described more fully in the next subsection. Examples of the operation of open feedback loop embodiments of the present invention are then described in the following sub-section.

4.4.1 Nulling the Receiver Channel Input Signal

This subsection describes the nulling of the receiver channel input signal while a DC offset voltage is being stored. Although the nulling of the input signal may be discussed in reference to one or the other of open loop circuits 5200 and 5400, the following description is applicable to both configurations.

As described above, referring to FIG. 52, the control signal for switch 5206, DC voltage acquire signal 5216, controls whether or not open loop circuit 5200 is in a DC offset voltage storing mode. When DC voltage acquire signal 5216 is high, open loop circuit 5200 is in a DC offset storing mode. In this mode, switch 5206 is closed, closing the feedback loop, and a voltage at output node 5204 is stored in storage device 5208. During this period, receiver channel signal 5218 should be nulled so that primarily, a DC offset voltage is received at output node 5204. In this manner, the DC offset voltage can be more accurately stored, without interference from extraneous receiver channel signals.

When DC voltage acquire signal 5216 is low, open loop circuit 5200 is in a non-DC offset storing mode. Switch 5206 is opened, opening the feedback loop of open loop circuit 5200. In this mode, the DC offset voltage that was acquired and stored in storage device 5208 is applied to summing node 5202, and subtracted out from the receiver channel. During this period, receiver channel signal 5218 no longer needs to be nulled, and instead may provide an RF/IF/baseband input signal to open loop circuit 5200. In this manner, the acquired DC offset is removed from the receiver channel.

To "null" receiver channel signal 5218, an input RF/IF/baseband signal in an upstream portion of the receiver channel is cut off. The receiver channel is thus caused to be substantially equal to ground or other reference voltage, with only DC offset voltage(s) due to receiver channel components being present. In other words, any signal of interest is removed, while the DC characteristics of the receiver channel are retained so that the DC offset may be removed (including thermal drift of DC offset). In this manner, open loop circuit 5200 only stores a DC offset voltage.

For example, an antenna (such as antenna 1614) for the receiver channel may be switched off or otherwise disconnected or "nulled" so that no RF signal is received by the receiver channel from the antenna. Alternatively, any receiver channel signal prior to open loop circuit 5200 may be coupled to ground or reference voltage. Note that the further upstream in the receiver channel that nulling takes place, the greater the number of receiver channel circuit components that can have their DC offset voltages nulled.

In another alternative configuration for nulling receiver channel signal 5218, a gain setting of an AGC amplifier that precedes summing node 5202 in the receiver channel may be reduced during the time period that the DC offset voltage is being stored. For example, second AGC signal 1620 may provide a signal that causes second AGC amplifier 1604 to not pass a signal. The gain setting for second AGC amplifier 1604 may be reduced to be substantially equal to zero during the time period. In this manner, second AGC amplifier 1604 does not pass a signal, and only the DC offset voltage of second AGC amplifier 1604 and any intervening components reaches open loop circuit 5200.

Another way of nulling receiver channel signal 5218 is to turn off a frequency down-converter that precedes open loop circuit 5200 in the receiver channel. For example, a control signal coupled to the down-converter module may be set to inactive during the time period.

In an example embodiment of a receiver channel, a universal frequency down-conversion (UFD) module may be located in the receiver channel preceding receiver channel signal 5218 to perform frequency down-conversion. The UFD module may be located in down-converter 1606, for example, shown in FIG. 16. The UFD module may include a switch and a storage element, with the switch receiving a control signal. The control signal may be set to an inactive state, causing the UFD module to output only a DC offset voltage of the UFD module, nulling receiver channel 5218. For example, FIG. 30 shows a differential UFD module 3000 that may precede open loop circuit 5200 in a receiver channel. Differential UFD module 3000 includes a switch 3002, and a first and second capacitor 3004 and 3006. Switch 3002 receives a control signal 3012. Control signal 3012 may be set to an inactive state, causing switch 3002 to close and short out differential down-converted signal 3010. Hence, only a DC offset voltage of UFD module 3000 will be substantially present in differential down-converted signal 3010.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments. For example, for illustrative purposes, an example receiver channel portion that incorporates embodiments of the present invention is described in detail in the following subsection.

4.4.1.1 Example Sampled Baseband Channel Embodiment

FIG. 57 illustrates a baseband portion of a receiver channel 5700 that includes embodiments of the present invention. Receiver channel portion 5700 includes first and second variable gain differential amplifiers 5702 and 5704 (although receiver channel portion 5700 is shown in a single-ended form in FIG. 57) coupled in series. An output amplifier 5706 is coupled in receiver channel portion 5700 down-stream from second open loop amplifier 5702.

First and second open loop amplifiers 5702 and 5704 each have a gain range. For example, in an embodiment, first and second open loop amplifiers 5702 and 5704 may each have a gain range of at least 36 dB, that extends from −6 dB to +30 dB. Output amplifier 5706 has a fixed gain. In the current example, the gain for output amplifier 5706 is a fixed gain of 6 dB. Receiver channel portion 5700 may be included in a receiver channel that receives WLAN signals, and/or receives RF signals formatted according to further communication schemes.

Each of first and second open loop amplifiers 5702 and 5704 are configured similarly to differential open loop circuit 5400 shown in FIG. 54, and described above. First and second open loop amplifiers 5702 and 5704 respectively include an open loop circuit 5708 and 5710. Open loop circuits 5708 and 5710 provide an input DC offset removal mechanism that not only reduces the corresponding open loop amplifier's own DC offset voltage, but also a DC offset present at an input to a respective sampling capacitor 5712 and 5714, at each stage. The offset removal by each of open loop circuits 5708 and 5710 is activated by a reset signal 5716. Reset signal 5716 is similar to DC voltage acquire signal 5418, shown in FIG. 54 and described above.

Furthermore, a high pass filter 5722 is located in receiver channel portion 5700 between open loop amplifier 5704 and output amplifier 5706. High pass filter 5722 reduces DC offset due to drift, and reduces low frequency noise. High pass filter 5722 is also initialized by reset signal 5716.

First and second auxiliary amplifiers 5718 and 5720 may be present in open loop circuits 5708 and 5710, respectively. First and second auxiliary amplifiers 5718 and 5720 are optional. When present, first and second auxiliary amplifiers 5718 and 5720 provide additional gain in the respective feedback loop, and can be used to enhance removal of the internal DC offsets of first and second open loop amplifiers 5702 and 5704, respectively. In the present example, first and second auxiliary amplifiers 5718 and 5720 contribute an additional 40 dB to the loop gain of open loop circuits 5708 and 5710, which yields an effective 70+ dB for DC offset removal.

In an embodiment, for nominal device parameters and matched components in receiver channel portion 5700, the output DC offset of receiver channel portion 5700 should be equal to that of output amplifier 5706, amplified by the gain of output amplifier 5706. To enhance common mode noise rejection and improve differential signal gain, receiver channel portion 5700 is constructed with fully differential elements. In alternative embodiments, however, some or all components of receiver channel portion 5700 may be single-ended, depending on the particular application.

FIG. 58 illustrates an example variable gain amplifier 5800 that may be used for first and second open loop amplifiers 5702 and 5704 of FIG. 57. Variable gain amplifier 5800 includes a differential pair of NMOS FETs, MOSFETs 5810 and 5812, with an active/passive load. A variable gain function is accomplished by operating MOSFETs 5810 and 5812 in the linear region rather than the traditional saturated region. A second NMOS pair, MOSFETS 5802 and 5804, operate as voltage followers to control the drain voltage of MOSFETs 5810 and 5812, and consequently control the gain of variable gain amplifier 5800. MOSFETS 5802 and 5804 are also referred to as a cascode cell herein. Operation in this manner allows for the gain to be varied using few components, thereby minimizing side effects such as noise, non-linearity, etc.

The resulting voltage gain of variable gain amplifier 5800 is a function of a control voltage 5814, which is also referred to herein as $V_{gain}$. In the present example, the resulting gain is proportional to the square of control voltage 5814. Hence, a square-root pre-distortion function may be used on control voltage 5814 so that the resulting gain is more linearly proportional to an input control voltage. The square-root pre-distortion function is described in further detail below.

A load of variable gain amplifier 5800 includes a pair of PMOS devices, MOSFETs 5806 and 5808, which form a common mode load, and first and second resistors 5816 and 5818, which form a differential load. In the present example, these loads are used because they provide the ability to control the output common mode level with minimal components, while allowing a sufficient impedance to achieve the desired gain with low capacitance.

In an embodiment, variable gain amplifier 5800 may be buffered. For example, a class A bipolar output stage may be used to buffer variable gain amplifier 5800 to produce increased drive capability for a subsequent capacitive load, while minimizing a capacitive load detected by variable gain amplifier 5800. An example of variable gain amplifier 5800 with output buffer stages 5902 is shown in FIG. 59, according to an embodiment of the present invention. As shown in the example of FIG. 59, buffer stages 5902 are class A bipolar buffer stages that are coupled to the differential outputs of variable gain amplifier 5800. Each buffer stage 5902 includes a diode-connected NPN transistor 5910. Each diode-connected NPN transistor 5910 drives an NPN transistor 5904 configured to operate as a voltage follower. Note that in an alternative embodiment, a PNP transistor follower-to-NPN transistor follower configuration may be used, or further buffer configurations. In the present example, the NPN transistor-to-NPN transistor follower configuration is used due to $V_{BE}$ matching considerations. Furthermore, diode-connected NPN transistor 5910 is configured such that the input resistance seen by variable gain amplifier 5800 is still quite high, relative to the load resistance.

Buffer stages 5902 have an input resistance. In the present example, the input resistance to buffer stages 5902 may be approximately 300 KΩ. Current sources 5906 and 5908 bias the bipolar devices of buffer stages 5902. For example, current source 5906 may be configured to provide 20 μA to each of diode-connected NPN transistors 5910, while current source 5908 may be configured to provide twice this amount, 40 μA, to each of output NPN transistors 5904. For example, the area of NPN transistors 5904 may be twice that of a diode-connected NPN transistor 5910, which allows them to have the same current density and thus equal base-emitter voltages ($V_{BE}$).

Note that these buffer stage component types and parameter values are provided for illustrative purposes, and are not intended to limit the invention. The present invention is applicable to further component types and parameter values, as would be understood to persons skilled in the relevant art(s) from the teachings herein.

FIG. 60 illustrates receiver channel portion 5700 with example gain values, according to an embodiment of the present invention. As shown in FIG. 60, a combined gain range of receiver channel portion 5700 is −6 dB to +66 dB. In the open-loop configuration of receiver channel portion 5700, this gain is distributed among open-loop amplifiers 5702 and 5704, having −6 dB to +30 dB gain each, and closed loop output amplifier 5706, having a fixed gain of +6 dB. In the present example, each of open loop amplifiers 5702 and 5704 may be configured to have a maximum gain of −6 dB at a minimum control voltage of 0V, and a minimum gain of +30 dB at a maximum control voltage of 1.2V.

As described above, each of open-loop amplifiers 5702 and 5704 is a variable gain amplifier, such as variable gain amplifier 5800, shown in FIG. 58. Variable gain amplifier 5800 exhibits a non-linear gain as a function of control voltage 5814 ($V_{gain}$). Variable gain amplifier 5800 is biased such that the input pair, MOSFETs 5810 and 5812, operate in the linear, or triode, region. This allows for high achievable gain, with a low supply voltage, such as 3.3V. The gain of variable gain amplifier 5800 is determined by the ratio of the transconductance of the input pair to the conductance of the differential load resistors 5816 and 5818, which is dominated by the resistance value of load resistors 5816 and 5818, shown as $R_L$, in FIG. 58. The gain of variable gain amplifier 5800 may be represented as follows in Equation 1:

$$A_v = g_m/g_o \quad \text{Equation 1}$$

Where:

$A_v$=gain of variable gain amplifier 5800

$g_m$=transconductance of MOSFETs 5810 and 5812

$g_o$=conductance of the differential load resistors 5816 and 5818

By operating the input pair, MOSFETs 5810 and 5812, in the linear region, their transconductance is controlled by their drain-to-source voltage ($V_{DS}$). Thus, the transconductance of the input pair is given by:

$$g_m = \beta_{5,6} V_{DS_{5,6}} = k'_n \frac{W_{5,6}}{L_{5,6}} V_{DS_{5,6}} \quad \text{Equation 2}$$

Where:

$$\beta_{5,6} = k'_n \frac{W_{5,6}}{L_{5,6}}$$

$W_{5,6}$ and $L_{5,6}$=width and length parameters of MOSFETS 5810 and 5812

$k'_n$=constant related to MOSFETs 5810 and 5812

The transfer function of Equation 2 is dominated by the square-law behavior of MOSFETs 5802 and 5804 that are present in the cascode cell of variable gain amplifier 5800. The drain voltage presented to MOSFETs 5810 and 5812 is regulated by MOSFETs 5802 and 5804, and follows the gain control voltage 5814. The drain voltage is approximately equal to:

$$V_d(V_{gain}) = V_{gain} - \left(\frac{I_{ss}L_{3,4}}{k'_n W_{3,4}}\right)^{1/2} - V_{thn} \qquad \text{Equation 3}$$

Where:
V$_{gain}$=control voltage 5814
I$_{ss}$=current of current source 5820 shown in FIG. 58
V$_{thn}$=threshold voltage
k'$_n$=constant related to MOSFETs 5802 and 5804

FIG. 61 shows an example detailed schematic of variable gain amplifier 5800, according to an embodiment of the present invention. FIG. 62 shows a plot 6200 of the gain (in dB) of variable gain amplifier 5800 of FIG. 61, where the gain is plotted as a function of control voltage 5814. A square-law characteristic for the gain is visible in a range 6202 of control voltage 5814, which extends approximately from 1.5V to 2.2V. Range 6202 is a desirable operating region for this particular implementation of variable gain amplifier 5800. However, note that at approximately 2.3V for control voltage 5814, saturation of the MOS devices of variable gain amplifier 5800 begins, and the increase in gain of variable gain amplifier 5800 diminishes.

In the present example, it would be desirable to have a gain control signal that is input to receiver channel portion 5700 be a linear voltage ranging from 0V to 1.2V. However, FIG. 63 illustrates a relationship of the gain of variable gain amplifier 5800 and control voltage 5814. As shown in FIG. 63, the gain of variable gain amplifier 5800 is proportional to the square of the difference in control voltage (and a threshold voltage). To produce a linear gain transfer function in dB in response to a linear input control voltage, the input control voltage must be conditioned.

FIG. 64 illustrates a process for conditioning an applied gain control voltage 6402 to generate control voltage 5814, according to an embodiment of the present invention. As illustrated in FIG. 64, in the present example, an applied gain control voltage 6402 may be scaled, raised to the ½ power, and offset to render a near linear gain function. Hence, variable gain amplifier 5800 will resultantly respond in a linear fashion to a linear variation in applied gain control voltage 6402.

As shown in FIG. 64, in a first stage 6404, applied gain control voltage 6402 (V$_{agc}$) may be scaled down in voltage, to match a high gain response of variable gain amplifier 5800. In a second stage 6406, the scaled control voltage may be pre-distorted with a function inversely related to the square law gain response of variable gain amplifier 5800. To counter the square law gain response, an inverse square law response, or square root function, may be applied. In a third stage 6410, an inherent offset, which is an undesired threshold voltage added to the control voltage during second stage 6406, may be removed. The undesired threshold voltage added during second stage 6404 is represented as being added to the control voltage by an adder 6408 in FIG. 64. In a fourth stage 6412, the control signal may be offset to an appropriate DC common mode level for the cascode portion of variable gain amplifier 5800. As shown in FIG. 64, control signal 5814 is output from fourth stage 6412. In a fifth stage (not shown in FIG. 64), control signal 5814 may be temperature compensated to counter an inherent temperature dependent behavior of the gain function of variable gain amplifier 5800.

In embodiments, any one or more of the stages shown in FIG. 64 may be used to condition 5814 control signal prior to being input to variable gain amplifier 5800, as well as alternative and additional conditioning stages.

To counteract the square-law gain function of variable gain amplifier 5800, a square root function in second stage 6406 is used. Hence, control signal 5814 is preconditioned by second stage 6406 such that a square root characteristic is included. Control signal 5814 is input to the cascode cell of variable gain amplifier 5800, and renders the desired response for amplifier 5800, i.e., a linear gain (in dB) versus a linear applied gain control signal 6402.

FIG. 65 illustrates an example square root function generator 6500, according to an embodiment of the present invention. Square root function generator 6500 has a square law characteristic similar to that of the cascode cell of variable gain amplifier 5800. The structure and operation of square root function generator 6500 is now described. As shown in FIG. 65, applied gain control signal 6402 is input to an amplifier 6502, which together with a MOSFET 6504, converts the input voltage of applied gain control signal 6402 to a current. The current is injected into a diode-connected MOSFET 6506, shown as an NMOS transistor, through a current mirror that includes MOSFETs 6508 and 6510. MOSFETs 6508 and 6510 are shown as PMOS transistors in FIG. 65. An output voltage 6512 of square root function generator 6500 is equal to the drain-to-source voltage of MOSFET 6506. The drain-to-source voltage of MOSFET 6506 is equal to the sum of the threshold voltage of MOSFET 6506 and the saturation voltage thereof, the latter being proportional to the square root of the current injected therein. Hence, output voltage 6512 is representative of the square root of applied gain control signal 6402, plus an offset voltage equal to the threshold voltage of MOSFET 6506. Output voltage 6512, V$_{out}$, is shown in Equation 4:

$$\begin{aligned}V_{out} &= V_{dsat4} + V_{thn} \qquad \text{Equation 4}\\ &= \sqrt{\frac{2I_4}{k'_n W_4/L_4}} + V_{thn}\\ &= \sqrt{\frac{2V_{agc}}{R_1 k'_n W_4/L_4}} + V_{thn}\end{aligned}$$

Where:
V$_{dsat4}$=Saturation voltage of MOSFET 6506
V$_{thn}$=threshold voltage of MOSFET 6506
I$_4$=Vagc/R1=current though MOSFET 6506
W$_4$ and L$_4$=width and length parameters of MOSFET 6506
k$_n$=constant related to MOSFET 6506

Offset subtraction may be used to remove any added DC voltage, which is primarily the threshold voltage of MOSFET 6506. For example, the offset subtraction may be accomplished by third stage 6410, as shown in FIG. 64 and described above.

Referring back to FIG. 57, note that after completion of a DC offset absorption or reduction period controlled by reset signal 5716, the reset switches in open loop circuits 5708 and 5710 are turned off, and auxiliary amplifiers 5718 and 5720 will be decoupled from open loop amplifiers 5702 and 5704.

During this potentially "abrupt" decoupling event, unwanted charge may be injected into storage capacitors 5712 and 5714 by the reset switches. Thus, attention to the charge injection properties of the reset switches in open loop circuits 5708 and 5710 may be important, and is further discussed as follows.

Charge injection primarily emanates from the reset switches at the outputs of auxiliary amplifiers 5718 and 5720, which are used to couple and decouple the outputs of auxiliary amplifiers 5718 and 5720 to and from the inputs to open loop amplifiers 5702 and 5704. When reset signal 5716 transitions to a low logic level, an offset voltage induced due to the resulting charge injection will approximately be shown by Equation 5 below:

$$V_{os\_inj} = \frac{1}{2} \frac{C_s}{C_s + C_H} \Delta V \qquad \text{Equation 5}$$

Where:

$V_{os\_inj}$=resulting charge injection $C_S$=stray capacitance appearing between gate of the reset switch to the respective one of capacitors 5712 and 5714

$C_H$=capacitance value of respective one of capacitors 5712 and 5714

$\Delta V$=change in voltage on reset signal 5716 due to transition

The "½" factor of Equation 5 is present because the path for charge injection from the gate to the hold capacitance forms approximately half of a particular switch's total gate to source/drain capacitance.

Although the offset voltage induced by charge injection is ideally added to both nodes of a differential signal (note that both differential nodes are not shown in the receiver channel path of FIG. 57), and thus would appear as a common mode signal, a reduction of charge injected offset error still may improve performance of the differential receiver channel. In the present example, an acceptable compromise with regard to the reset switches of open loop circuits 5708 and 5710 is to use reset switch size parameters of 3.84 µm/0.6 µm. These size parameters provide for a moderately conductive switch, with a gate-to-drain and gate-to-source capacitance that are acceptable from a cancellation and loading viewpoint. Using these example switch size parameters, the offset voltage created due to charge injection may be calculated as follows:

$$V_{os\_inj} = \frac{1}{2} \frac{C_s}{C_s + C_{in}} \Delta V = \frac{1}{2} \cdot \frac{0.0067 \text{ pF}}{4.0067 \text{ pF}} \cdot 3.3 \text{ V} = 2.75 \text{ mV}$$

Typically, charge injection reduction techniques include a charge cancellation MOS device (i.e., a "dummy" device) with the switching device. The gate of the charge cancellation device is driven by a complementary logic signal. The MOS dummy device may be sized at half of the area of the switching device, because about half of the charge is actually injected into the hold device, while the other half is injected into the sourcing node. The net charge injection is approximately equal to the integrated time-voltage product during which the charge is transferred. As such, a duration of the switching transient should be of little difference. However, this is true only for an ideally linear system. Some non-linear effects may change the results. Furthermore, bandwidth limitations may limit the temporal response, preventing complete charge accumulation. For these reasons, fast switching times, and overlapping switching signals are desired. Although 50% of the area of the switching device may be used for the area of the dummy switch, second order effects may cause a value of 40% to 60% of the area to be preferable.

FIG. 66 shows an example portion of variable gain amplifier 5800, with one or more dummy switches 6602 for cancellation of charge injection, according to an embodiment of the present invention. In the present example, when one or more dummy switches 6602 are present, as shown in FIG. 66, the calculated error due to charge injection can be reduced into the range of single microvolts, a substantial improvement.

4.4.2 Operation of the Open Feedback Loop of the Present Invention

FIG. 67A shows a flowchart 6700 providing operational steps for performing embodiments of the present invention. FIGS. 67B-C provide additional operational steps for flowchart 6700, according to embodiments of the present invention. The steps of FIGS. 67A-C do not necessarily have to occur in the order shown, as will be apparent to persons skilled in the relevant art(s) based on the teachings herein. Other embodiments will be apparent to persons skilled in the relevant art(s) based on the following discussion. These steps are described in detail below.

Flowchart 6700 begins with step 6702. In step 6702, a charge is received from a first node of the receiver channel. For example, referring to FIG. 52, the charge corresponds to a voltage that includes a DC offset voltage, and is received from output node 5204. In a differential receiver channel example embodiment of FIG. 54, the charge may be received from first and second output nodes 5424 and 5426.

In step 6704, the charge is stored. For example, the charge is stored in storage device 5208. In a differential receiver channel example embodiment, the charge is stored in capacitors 5408 and 5410.

In step 6706, the stored charge is de-coupled from the first node. For example, in FIG. 52, the first node is output node 5204. Storage device 5208 may be decoupled from output node 5204 by opening switch 5206. In a differential receiver channel example embodiment of FIG. 54, the stored charges may be decoupled from output nodes 5424 and 5426 by opening switches 5404 and 5406.

In step 6708, at a second node in the receiver channel a voltage corresponding to the stored charge is summed with a receiver channel signal. For example, the second node is summing node 5202 in FIG. 52. In a differential receiver channel example embodiment, the second node is one or both of first and second summing nodes 5428 and 5430. Stored DC voltage output signal 5214 is summed with receiver channel signal 5218 at summing node 5202. In a preferred embodiment, the first node is downstream from the second node in the receiver channel. For example, output node 5204 is downstream from summing node 5202.

In an embodiment, step 6704 includes the step where the charge is stored in a capacitor. For example, the charge may be stored in capacitor 5210. In a differential receiver channel example embodiment, the charges are stored in first and second capacitors 5408 and 5410.

FIG. 67B shows flowchart 6700 with additional optional steps, according to an embodiment of the present invention. In FIG. 67B, optional steps are indicated by dotted lines. As shown in step 6704 of FIG. 67B, in an embodiment, the charge received from the first node of the receiver channel is stored in a capacitor. In step 6710, a switch is coupled between the first node and the capacitor. For example, the switch may be switch 5206, which is shown coupled between output node 5204 and capacitor 5210 in FIG. 52. In a differential receiver channel example embodiment, first switch 5404 is coupled between first output node 5424 and first summing node 5428, and second switch 5406 is coupled between second output node 5426 and second summing node 5430.

FIG. 67C shows flowchart 6700 with additional optional steps, according to an embodiment of the present invention. In FIG. 67C, optional steps are indicated by dotted lines. As shown in FIG. 67C, flowchart 6700 may further include step 6712. In step 6712, at least one amplifier in the receiver channel is coupled between the first and second nodes. In an embodiment, an automatic gain control (AGC) amplifier is coupled in the receiver channel between the first and second nodes. For example, the AGC amplifier is AGC amplifier 5222, which is coupled between summing node 5202 and output node 5204. In a differential receiver channel example embodiment, differential AGC amplifier 5402 is coupled between first and second summing nodes 5428 and 5430 and first and second output nodes 5424 and 5426. In an alternative embodiment, any type and combination of amplifiers may be coupled between the summing and output nodes.

In an embodiment, flowchart 6700 further includes step 6714 shown in FIG. 67C. In step 6714, the receiver channel signal is substantially nulled. For example, receiver channel signal 5218 is nulled such that it primarily includes a DC offset voltage signal. In a differential receiver channel example embodiment, differential input signal 5420 is nulled. In an embodiment, the nulling step includes the step where a gain setting of an AGC amplifier that precedes the summing node in the receiver channel is reduced. For example, when second AGC amplifier 1604 (shown in FIG. 16) precedes summing node 5202 anywhere in the receiver channel, it may be nulled by reducing the gain setting supplied by second AGC signal 1620. In an embodiment, the gain setting is reduced to be substantially equal to zero.

In an embodiment, the second node is preceded by a down-converter module. For example, a summing node may be preceded by down-converter 1606, shown in FIG. 16, anywhere in the receiver channel. In an embodiment, the nulling step includes the step where a control signal coupled to a down-converter module is set to inactive. In an embodiment, the down-converter module includes a universal frequency down-conversion (UFD) module. For example, the down-converter is UFD module 114 shown in FIG. 1C, or aliasing module 300 shown in FIG. 3A. In an embodiment, the UFD module includes a switch and a storage element. For example, aliasing module 300 includes a switch 308 and a capacitor 310. In an embodiment, the control signal is coupled to the switch. For example, the control signal is control signal 306, which is coupled to switch 308. In an embodiment, the control signal coupled to the switch is set to inactive. For example, control signal 306 may be set to a logical low, to open switch 308. In a differential receiver channel example embodiment, the UFD module is differential UFD module 3000, shown in FIG. 30. Differential UFD module 3000 includes switch 3002 and first and second capacitors 3004 and 3006. Switch 3002 receives control signal 3012.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

4.5 Embodiments for Automatic Gain Control

Automatic gain control may be used in a communication system receiver channel to maintain the received signal of interest at a useful level. A receiver may use an automatic gain control system to keep the output signal of the receiver at a relatively constant level, despite variations in signal strength at the antenna(s) of the receiver. Automatic gain control makes it possible to range from a weak input signal to a strong input signal without having amplifiers in the receiver channel become saturated. It is important for a receiver to automatically vary the gain of the receiver in such a manner that the receiver will receive a weak signal with high sensitivity but a strong signal with low sensitivity.

Generally in an automatic gain control system, as described briefly above in section 4.2, a level detector monitors a downstream receiver channel signal. When the downstream receiver channel signal increases or decreases in amplitude, the level detector provides an automatic gain control (AGC) signal to an AGC amplifier upstream in the receiver channel. The AGC signal causes the AGC amplifier to attenuate or amplify the upstream receiver channel signal, accordingly. For example, FIG. 16 shows example receiver channel 1600 that includes first AGC amplifier 1610 and second AGC amplifier 1604, as described above in section 4.2. First AGC amplifier 1610 receives a first AGC signal 1626 and second AGC amplifier 1604 receives a second AGC signal 1620. First and second AGC signals 1626 and 1620 are generated by corresponding circuitry located downstream from the respective amplifiers. Typically, first and second AGC signals 1626 and 1620 are the same signal, or are generated separately. First AGC amplifier 1610 and second AGC amplifier 1604 amplify their respective receiver channel signals according to first and second AGC signals 1626 and 1620, respectively.

FIG. 17 shows a receiver channel 1700 with automatic gain control, according to an embodiment of the present invention. Receiver channel 1700 is substantially similar to receiver channel 1600 shown in FIG. 16, except for the configuration of the AGC signals. A first AGC signal 1704 is received by first AGC amplifier 1610. A second AGC signal 1706 is received by second AGC amplifier 1604. Second AGC signal 1706 is equal to first AGC signal 1704, multiplied or amplified by some amount.

In the embodiment of FIG. 17, multiplier 1702 generates second AGC signal 1706 by multiplying first AGC signal 1704 by a particular amount, shown as N in FIG. 17. This amount may be any value greater than zero (or less than zero if the receiver channel becomes inverted between AGC amplifiers). In a preferred embodiment, this amount is greater than one, and furthermore may be any integer value greater than one.

FIG. 26 shows an example embodiment for multiplier 1702. Multiplier 1702 as shown in FIG. 26 includes an operational amplifier 2602, a first resistor 2604, and a second resistor 2606 that are arranged in a single-ended non-inverting amplifier configuration. The ratio of first and second resistors 2604 (R1) and 2606 (R2) is selected to provide the gain for multiplier 1702 (1+R2/R1). As a result, multiplier 1702 amplifies first AGC signal 1704 to generate second AGC signal 1706. The present invention is applicable to other types of signal multipliers, as would be apparent to a person skilled in the relevant art(s) from the teachings herein.

When the magnitude of N is greater than 1, such as an integer value of 2, second AGC amplifier 1604 reacts more strongly to automatic gain control than does first AGC amplifier 1610, because second AGC signal 1706 has a greater amplitude than does first AGC signal 1704. For example, when second AGC amplifier 1604 is located in a radio frequency (RF) portion of the receiver channel, and the first AGC amplifier 1610 is located in an intermediate frequency (IF) or baseband portion of the receiver channel, the configuration of FIG. 17 allows for a greater reaction at the RF AGC amplifier than at the IF or baseband AGC amplifier. Hence, there is less perturbation in the receiver channel signal at the IF or baseband AGC amplifier. This provides for further advantages in DC offset acquisition and settling time in the receiver channel.

Furthermore, greater AGC reaction at RF in the receiver channel allows for a greater amplitude signal being received by down-converter 1606 in the receiver channel. Down-converter 1606 is then able to output a greater amplitude down-converted signal 1622. Thus, any DC offsets added into down-converted signal 1622 by down-converter 1606 have less impact proportionally than if down-converted signal 1622 was of lesser amplitude.

Hence, automatic gain control according to the present invention provides numerous benefits. Additionally, in embodiments, because a single source produces the AGC control signal that is the basis of AGC control for both AGC amplifiers, fewer components are required and less power may be consumed.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. For example, the present invention is applicable to AGC implementations in any communication system type, where there are two or more AGC amplifiers. Additional multipliers may be used to produce further AGC signals from the first AGC control signal. The invention is intended and adapted to include such alternate embodiments.

Examples of the operation of automatic gain control embodiments of the present invention are described in the following sub-section.

Figure 48:
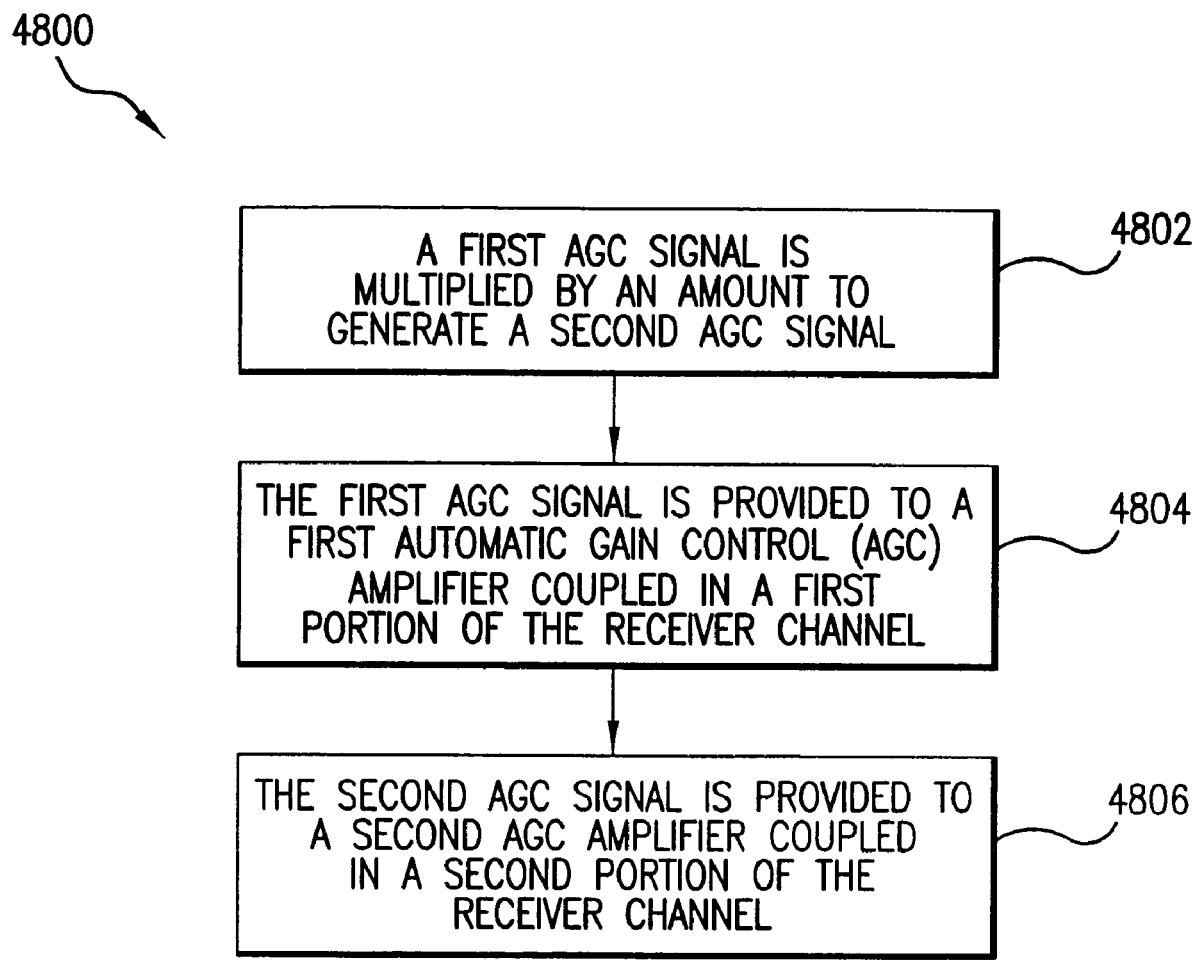
Figure 49:
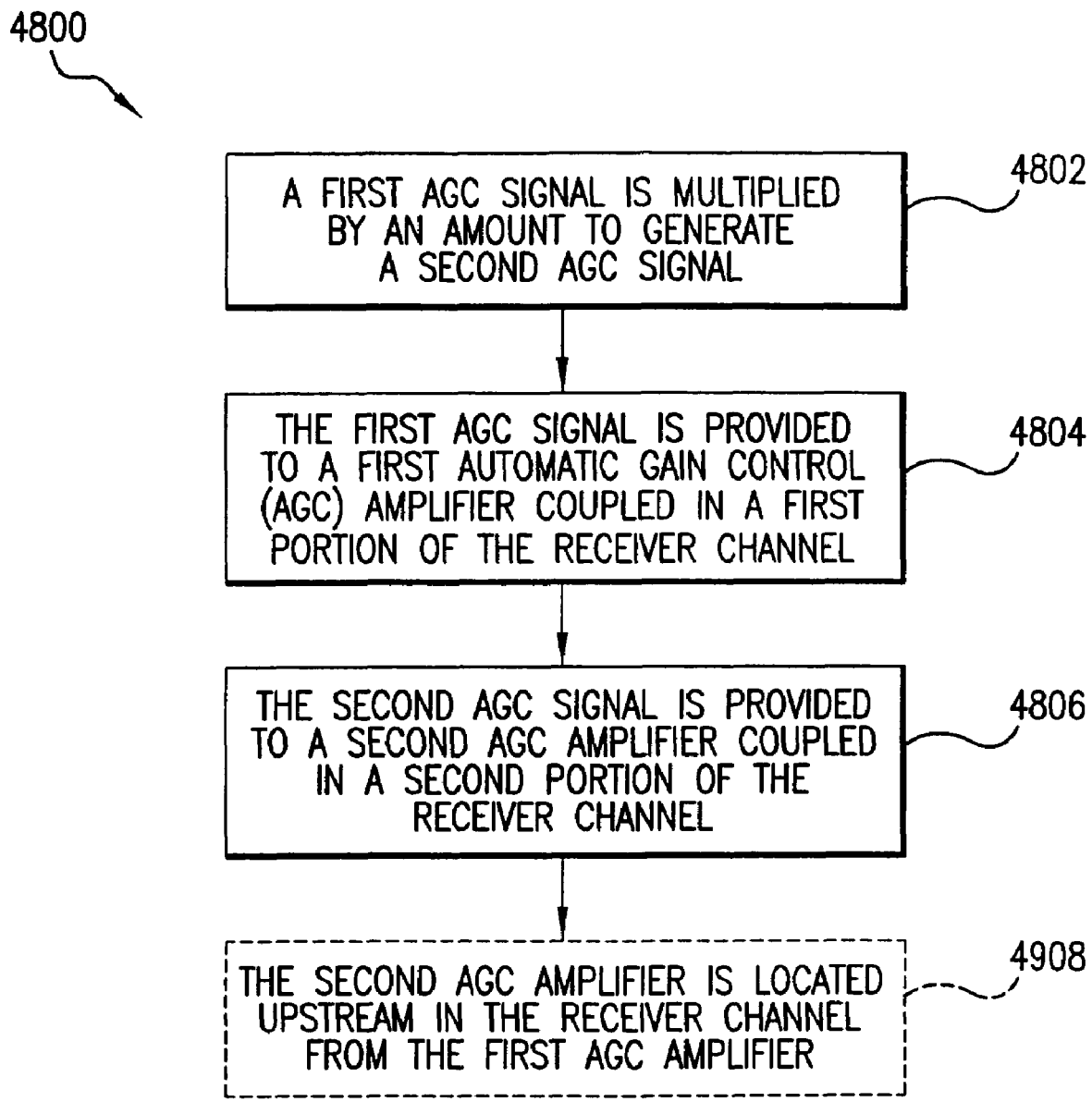

4.5.1 Operation of Automatic Gain Control Embodiments of the Present Invention FIG. 48 shows a flowchart 4800 providing operational steps for performing embodiments of the present invention. FIGS. 49, 50, and 52 provide additional operational steps for flowchart 4800, according to embodiments of the present invention. The steps shown in FIGS. 48-50 and 52 do not necessarily have to occur in the order shown, as will be apparent to persons skilled in the relevant art(s) based on the teachings herein. Other embodiments will be apparent to persons skilled in the relevant art(s) based on the following discussion. These steps are described in detail below.

As shown in FIG. 48, flowchart 4800 begins with step 4802. In step 4802, a first AGC signal is multiplied by an amount to generate a second AGC signal. For example, the first AGC signal may be first AGC signal 1704, which is multiplied to generate second AGC signal 1706.

In step 4804, the first AGC signal is provided to a first automatic gain control (AGC) amplifier coupled in a first portion of the receiver channel. For example, the first AGC amplifier may be first AGC amplifier 1610, as shown in FIG. 17.

In step 4806, the second AGC signal is provided to a second AGC amplifier coupled in a second portion of the receiver channel. For example, the second AGC amplifier may be second AGC amplifier 1604, which receives second AGC signal 1706.

FIG. 49 shows flowchart 4800 with additional optional steps, according to an embodiment of the present invention. In FIG. 49, optional steps are indicated by dotted lines. As shown in FIG. 49, flowchart 4800 may further include step 4908. In step 4908, the second AGC amplifier is positioned upstream in the receiver channel from the first AGC amplifier. For example, as shown in FIG. 17, second AGC amplifier 1604 is positioned upstream in the receiver channel from first AGC amplifier 1610.

Figure 50A:
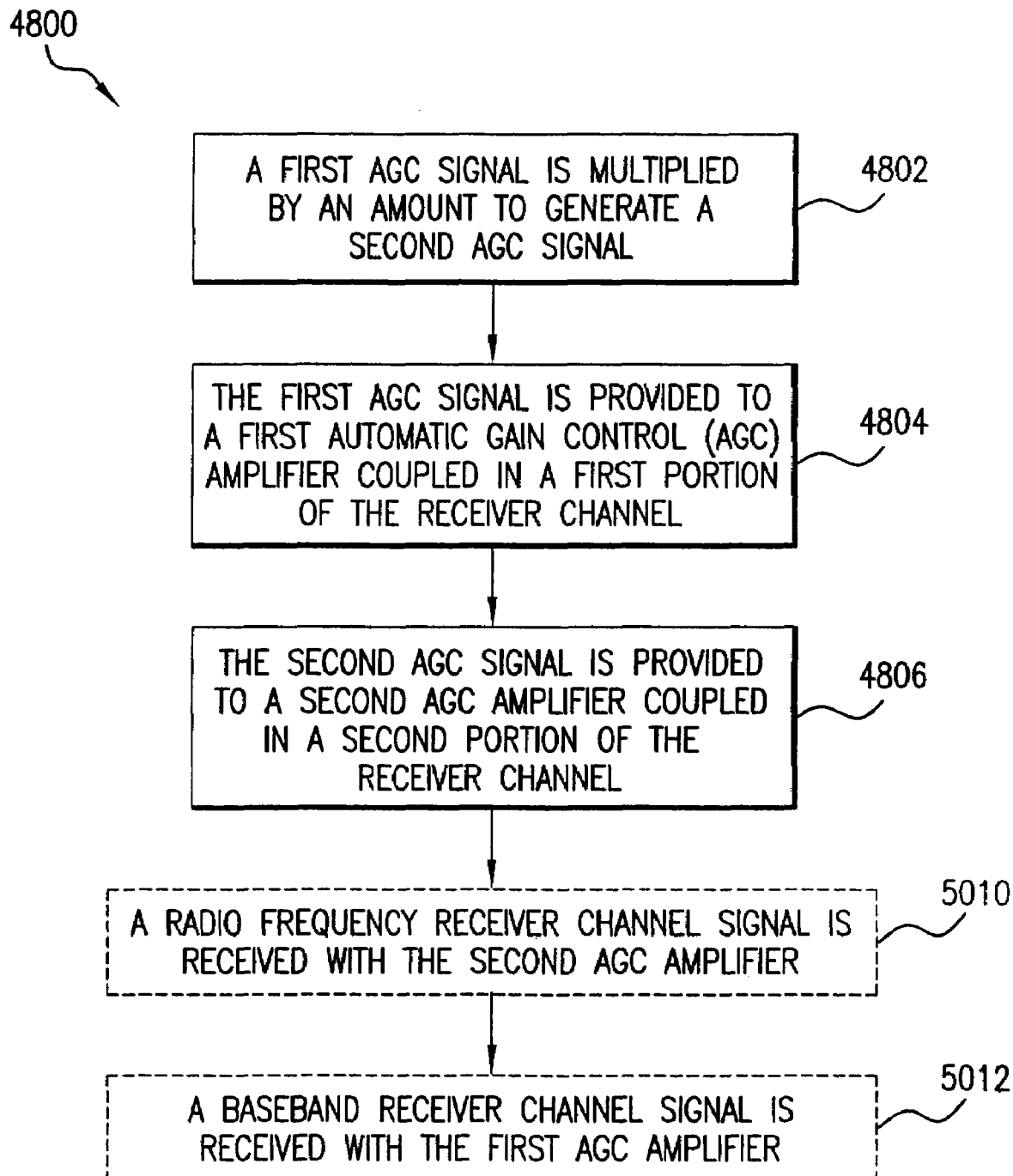

FIG. 50A shows flowchart 4800 with additional optional steps, according to an embodiment of the present invention. In FIG. 50A, optional steps are indicated by dotted lines. In step 5010, a radio frequency receiver channel signal is received with the second AGC amplifier. For example, input RF signal 1616 may be a radio frequency signal that is received by second AGC amplifier 1604.

In step 5012, a baseband receiver channel signal is received with the first AGC amplifier. For example, down-converted signal 1622 may be a baseband signal that is received by first AGC amplifier 1610.

Figure 50B:
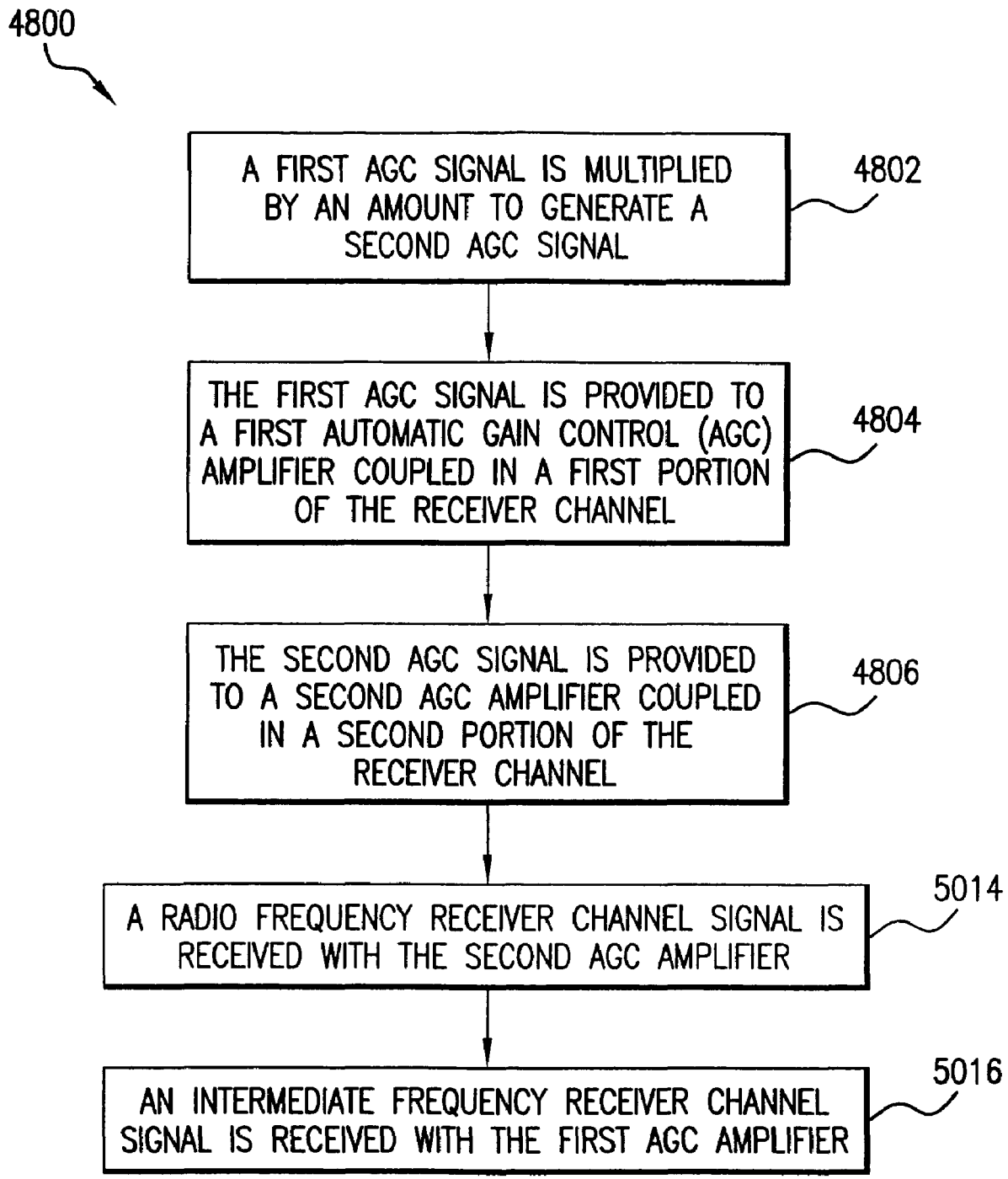

FIG. 50B shows flowchart 4800 with additional optional steps, according to an alternative embodiment of the present invention. In FIG. 50B, optional steps are indicated by dotted lines. In step 5014, a radio frequency receiver channel signal is received with the second AGC amplifier. For example, input RF signal 1616 may be a radio frequency signal that is received by second AGC amplifier 1604.

In step 5016, an intermediate frequency receiver channel signal is received with the first AGC amplifier. For example, down-converted signal 1622 may be an intermediate frequency signal that is received by first AGC amplifier 1610.

In an embodiment, step 4802 includes the step where the first AGC signal is multiplied by an integer amount to generate the second AGC signal. For example, as shown in FIG. 17, multiplier 1702 may multiply first AGC signal 1704 by an integer amount to generate second AGC signal 1706. In an embodiment, the first AGC signal is multiplied by 2 to generate the second AGC signal. For example, factor N may be equal to 2.

In an embodiment, step 4802 includes the step where the first AGC signal is amplified to generate the second AGC signal. For example, first AGC signal 1704 may be amplified by an amplifier such as shown in FIG. 23, to generate second AGC signal 1706.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

4.6 Exemplary Receiver Channel Embodiments of the Present Invention

This section provides further details about various communications system configurations in which embodiments of the present invention may be implemented, and provides further details for implementing these embodiments. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

For exemplary purposes, this section describes the present invention in the context of WLAN communications system configurations. However, the invention is applicable to additional communication system environments. For instance, the invention as disclosed herein is applicable to any type of communication system receiver. These include wireless personal area network (WPAN) receivers (including the Bluetooth standard), wireless metropolitan area network (WMAN) receivers, code division multiple access (CDMA) receivers including wideband CDMA receivers, Global System for Mobile Communications (GSM) standard compatible receivers, and $3^{rd}$ Generation (3G) network receivers.

In actual implementations, one or more embodiments of the present invention may be located in a WLAN receiver channel, such as either of receiver channels 1600 and 1700. The receiver channels may be configured to receive packets formatted according to any WLAN 802.11 standard format, such as direct sequence spread spectrum (DSSS) (including high rate DSSS) and frequency hopping spread spectrum (FHSS). The data rates for these formats include 1, 2, 5.5, and 11 Mbps. Another possible format, orthogonal frequency division multiplexing (OFDM), includes data rates ranging from 6 Mbps to 54 Mbps. Received WLAN signals may have carrier frequencies of 2.4 and 5.0 GHz, and others. The modulation techniques used for these various formats include phase shift keying (PSK), differential binary phase shift keying (DBPSK), differential quadrature phase shift keying (DQPSK), Gaussian frequency shift keying (GFSK), 16- and 64-quadrature amplitude modulation (QAM), packet binary convolutional coding (PBCC) modulation, and complementary code keying (CCK) modulation.

Receiver channels according to the present invention may have a variety of configurations. The embodiments of the present invention described above are adaptable to being implemented in either single-ended or differential receiver channels. It is noted that even-order inter-mod products may be more effectively canceled in differential implementations. Hence, in some applications, differential implementations may be desirable.

FIGS. 31A and 31B show further details of receiver channel 1700, according to an exemplary embodiment of the present invention. FIGS. 31A and 31B also incorporate examples of feedback loop 1900 and automatic gain control, according to embodiments of the present invention. FIG. 31A shows a first portion of receiver channel 1700, including an antenna 1614, optional low noise amplifier 1602, second AGC amplifier 1604, down-converter 1606, and first amplifier/filter section 1608. FIG. 31B shows a second portion of receiver channel 1700, including first AGC amplifier 1610, second optional amplifier/filter section 1612, and multiplier 1702.

As shown in FIG. 31A, down-converter 1606 may be a UFD module. The UFD module receives a control signal 3106. Alternative types of down-converters may be used for down-converter 1606, according to embodiments of the present invention.

Amplifier-filter section 1608 is shown including a first amplifier 3110, a filter 3112, and a feedback loop 1900a. First amplifier 3110 provides for gain in amplifier-filter section 1608. Filter 3112 provides for filtering in amplifier-filter section 1608. Feedback loop 1900a provides for gain and for DC offset voltage reduction in amplifier-filter section 1608. Feedback loop 1900a includes a first amplifier 1902a, a second amplifier 1908a, and an integrator 1904a. The elements of feedback loop 1900a operate as described for the similarly designated elements of feedback loop 1900 shown in FIG. 19. Feedback loop 1900a measures a DC offset voltage at output node 1914a, and subtracts the measured DC offset voltage from the receiver channel at summing node 1906a.

Integrator 1904a provides for a variable frequency response, similarly to that of integrator 1904 shown in FIG. 23. Integrator 1904a receives two control signals, ACQ1 3104 and ACQ2 3102, that control the opening and closing of switches 2308a and 2310a in integrator 1904a, in order to vary the frequency response of feedback loop 1900a.

Second amplifier 1908a provides for receiver channel gain between summing node 1906a and output node 1914a. First amplifier 1902a provides for gain in the feedback loop.

As stated above, receiver channel 1700 shown in FIGS. 31A and 31B include automatic gain control features of the present invention. The AGC features of the present invention are more fully described in section 4.5. As shown in FIG. 31B, multiplier 1702 receives first AGC signal 1704 and generates second AGC signal 1706. Second AGC signal 1706 is input to second AGC amplifier 1604 in FIG. 31A. First AGC signal 1704 is input to first AGC amplifier 1610 in FIG. 31B. Multiplier 1702 is shown in FIG. 31B as an operational amplifier implemented in a non-inverting configuration, but may be implemented in alternative configurations. The AGC signals for second AGC amplifier 1604 and first AGC amplifier 1610 are based upon a single AGC signal source. Furthermore, multiplier 1702 allows for faster gain control in second AGC amplifier 1604 than in first AGC amplifier 1610, by amplifying first AGC signal 1704 to generate a greater amplitude second AGC signal 1706.

Amplifier-filter section 1612 is shown to include feedback loop 1900b in FIG. 31B. Feedback loop 1900b provides for gain and for DC offset voltage reduction in amplifier-filter section 1612. Feedback loop 1900b includes a first amplifier 1902b, a second amplifier 1908b, and an integrator 1904b. The elements of feedback loop 1900b operate as described for the similarly designated elements of feedback loop 1900 shown in FIG. 19. Feedback loop 1900b measures a DC offset voltage at output node 1914b, and subtracts the measured DC offset voltage from the receiver channel at summing node 1906b.

Integrator 1904b provides for a variable frequency response, similarly to that of integrator 1904 shown in FIG. 23. Integrator 1904b receives the two control signals ACQ1 3104 and ACQ2 3102, that control the opening and closing of switches 2308b and 2310b (and of switches 2308a and 2310a in integrator 1904a shown in FIG. 31A) in integrator 1904b of FIG. 31B, in order to vary the frequency response of feedback loop 1900b.

Second amplifier 1908b provides for receiver channel gain between summing node 1906b and output node 1914b. First amplifier 1902b provides for gain in the feedback loop.

The present invention is applicable to any 802.11 WLAN receiver implementations, including differential receiver channel configurations. FIGS. 32A and 32B show further details of receiver channel 1700, according to an example differential receiver channel embodiment of the present invention. FIGS. 32A and 32B incorporate embodiments of feedback loop 1900 and automatic gain control, according to embodiments of the present invention. FIG. 32A comprises FIGS. 32A-1, 32A-2, 32A-3, 32A-4, and FIG. 32B comprises FIGS. 32B-1, 32B-2, and 32B-3. FIGS. 32A-1, 32A-2, 32A-3, and 32A-4 show a first portion of receiver channel 1700, including second AGC amplifier 1604, first amplifier/filter section 1608, and multiplier 1702. FIGS. 32B-1, 32B-2, and 32B-3 show a second portion of receiver channel 1700, including first AGC amplifier 1610 and second optional amplifier/filter section 1612. An antenna and down-converter are not shown in the portions of receiver channel 1700 shown in FIGS. 32A-1, 32A-2, 32A-3, 32A-4, 32B-1, 32B-2, and 32B-3. FIG. 30 shows a differential UFD module that may be used as a differential down-converter in down-converter 1606 shown in FIGS. 16 and 17, according to embodiments of the present invention. The invention is also applicable to other types of differential down-converters.

As shown in FIG. 32A-3, an input differential signal 3210 is received by second AGC amplifier 1604. Input differential signal 3210 is a differential signal, and second AGC amplifier 1604 is a differential AGC amplifier. Input differential signal 3210 may be a differential version of a received RF signal or IF signal, for example.

Amplifier-filter section 1608 is shown as a first amplifier 3202, a second amplifier 3204, a first filter 3206, a second filter 3208, and feedback loop 1900c. First and second amplifiers 3202 and 3204 receive the differential output of second AGC amplifier 1604, and provide gain to the + and − components of this signal. First and second filters 3206 and 3208 provide for filtering of the + and − components of the differential output of second AGC amplifier 1604.

Feedback loop 1900c provides for gain and for DC offset voltage reduction for the differential signal output by first and second filters 3206 and 3208. Feedback loop 1900c includes a first amplifier 1902c, a second amplifier 1908c, and an integrator 1904c. The elements of feedback loop 1900c operate as described for the similarly designated elements of feedback loop 1900 shown in FIG. 19. Feedback loop 1900c receives the amplified and filtered differential signal output of second AGC amplifier 1604 at summing node 1906c. Feedback loop 1900c measures a DC offset voltage at output node 1914c, and subtracts the measured DC offset voltage from the receiver channel at summing node 1906c.

Second amplifier 1908c provides for receiver channel gain between summing node 1906c and output node 1914c. Second amplifier 1908c includes two amplifiers configured differentially in series.

First amplifier 1902c provides for gain in the feedback loop. First amplifier 1902c receives a receiver channel differential signal 3212 that is output from second amplifier 1908c, and outputs a single-ended output signal 1920.

Integrator 1904c provides for a variable frequency response, similarly to that of integrator 1904 shown in FIG. 23. Integrator 1904c receives single-ended output signal 1920. Integrator 1904c also receives two control signals, ACQ1 3104 and ACQ2 3102, that control the opening and closing of switches 2308c and 2310c in integrator 1904c, in order to vary the frequency response of feedback loop 1900c.

As stated above, receiver channel 1700 shown in FIGS. 32A and 32B include automatic gain control features of the present invention. These features are more fully described in section 4.5. As shown in FIG. 32A-1, multiplier 1702 receives first AGC signal 1704 and generates second AGC signal 1706. Second AGC signal 1706 is input to second AGC amplifier 1604 in FIG. 32A-3. First AGC signal 1704 is input to first AGC amplifier 1610 in FIG. 32B-1. Multiplier 1702 is shown in FIG. 32A-1 as an operational amplifier implemented in a non-inverting configuration, but may be implemented in alternative configurations. The AGC signals for second AGC amplifier 1604 and first AGC amplifier 1610 are based upon a single AGC signal source that generates first AGC signal 1704. Furthermore, multiplier 1702 allows for faster gain control in second AGC amplifier 1604 than in first AGC amplifier 1610, by amplifying first AGC signal 1704 to generate a greater amplitude second AGC signal 1706.

In FIG. 32B-1, first AGC amplifier 1610 receives receiver channel differential signal 3212, and outputs an amplified differential signal.

Amplifier-filter section 1612 includes feedback loop 1900d. Feedback loop 1900d provides for gain and for DC offset voltage reduction in amplifier-filter section 1612. Feedback loop 1900d includes a first amplifier 1902d, a second amplifier 1908d, and an integrator 1904d. The elements of feedback loop 1900d operate as described for the similarly designated elements of feedback loop 1900 shown in FIG. 19. Feedback loop 1900d receives the amplified differential signal output of first AGC amplifier 1610 at summing node 1906d. Feedback loop 1900d measures a DC offset voltage at output node 1914d, and subtracts the measured DC offset voltage from the receiver channel at summing node 1906d.

Second amplifier 1908d provides for receiver channel gain between summing node 1906d and output node 1914d. Second amplifier 1908d includes four amplifiers configured differentially in series, with a single-ended output, output signal 1628.

First amplifier 1902d provides for gain/attenuation in the feedback loop. First amplifier 1902d is shown in FIG. 32B-3 as a resistor voltage-divider circuit. First amplifier 1902d receives and attenuates output signal 1628 according to the voltage divider, and outputs an attenuated output signal 1920d.

Integrator 1904d provides for a variable frequency response, similarly to that of integrator 1904 shown in FIG. 23. Integrator 1904d receives the two control signals ACQ1 3104 and ACQ2 3102, that control the opening and closing of switches 2308d and 2310d (and switches 2308c and 2310c in integrator 1904c shown in FIGS. 32A-2 and 32A-1) in integrator 1904d of FIGS. 32B-1, 32B-2, and 32B-3, in order to vary the frequency response of feedback loop 1900d.

FIGS. 35-37 show exemplary frequency response waveforms for receiver channel 1700 configured as shown in FIGS. 31A-B and 32A-B, when the frequency response is varied. The frequency responses shown in FIGS. 35-37 for receiver channel 1700 may be varied as needed by the particular application, by selecting the circuit components accordingly. As stated above, a down-converter is not present in the portion of the receiver channel shown in FIGS. 32A-B, so frequency down-conversion does not occur in the portion of receiver channel 1700 shown in FIGS. 32A-B.

FIG. 35 shows a first frequency response waveform 3500 resulting when ACQ1 3104 and ACQ2 3102 are both set to high. This setting indicates a short time constant has been selected for integrators 1904a and 1904b in FIGS. 31A-B, or for integrators 1904c and 1904d in FIGS. 32A-1, 32A-2, 32B-1, 32B-2, and 32B-3. As can be seen in FIG. 35, a high-pass corner frequency for first frequency response waveform 3500 is located near 2.5 MHz.

FIG. 36 shows a second frequency response waveform 3600 resulting when ACQ1 3104 is set to a high level and ACQ2 3102 is set to a low level. This setting indicates a medium time constant has been selected for integrators 1904a and 1904b in FIGS. 31A-B, or for integrators 1904c and 1904d in FIGS. 32A-1, 32A-2, 32B-1, 32B-2, and 32B-3. As can be seen in FIG. 36, a high-pass corner frequency for second frequency response waveform 3600 is located near 269 KHz.

FIG. 37 shows a third frequency response waveform 3700 resulting when ACQ1 3104 and ACQ2 3102 are both set to low levels. This setting indicates a long time constant has been selected for integrators 1904a and 1904b in FIGS. 31A-B, or for integrators 1904c and 1904d in FIGS. 32A-1, 32A-2, 32B-1, 32B-2, and 32B-3. As can be seen in FIG. 37, a high-pass corner frequency for third frequency response waveform 3700 is located near 21.6 KHz.

In alternative embodiments, receiver channel 1700 shown in FIGS. 31A-32B may include one or more implementations of open loop circuit 5200, 5400, shown in FIGS. 52 and 54, respectively, for receiver channel gain and DC offset voltage reduction. For example, one or more of open loop circuit 5200 may be used in addition to, or instead of feedback loops 1900*a* and 1900*b* shown in FIGS. 31A and 31B. Furthermore, one or more of open loop circuit 5400 may be used in addition to, or instead of feedback loops 1900*c* and 1900*d* shown in FIGS. 32A and 32B.

FIG. 55 shows an example open loop circuit pair 5500 that may be implemented in receiver channel 1700 as shown in FIGS. 31A and 31B. Open loop circuit pair 5500 may replace, or be used in addition to feedback loops 1900*a* and 1900*b*. Open loop circuit pair 5500 includes a first open loop circuit 5200*a*, a second open loop circuit 5200*b*, and an amplifier 5502 coupled in series. By cascading multiple stages of open loop circuit 5200, greater receiver channel gains may be attained, and DC offset voltages may be better reduced.

First open loop circuit 5200*a* receives and amplifies receiver channel signal 5504. Second open loop circuit 5200*b* receives and amplifies the output of first open loop circuit 5200*a*. Amplifier 5502 receives and amplifies the output of second open loop circuit 5200*b*, and outputs an output signal 5506. Amplifier 5502 is optional.

First and second open loop circuits 5200*a* and 5200*b* also receive DC voltage acquire signal 5418, which controls the storing of a DC offset voltage present in their respective output signals. First open loop circuit 5200*a* stores a DC offset voltage that is present in receiver channel signal 5504 and amplified by AGC amplifier 5222*a*, and also stores a DC offset voltage due to AGC amplifier 5222*a*. The stored DC offset voltage is subtracted from receiver channel signal 5504 at summing node 5202*a*. Accordingly, a DC offset voltage is reduced by first open loop circuit 5200*a* as reflected in output signal 5220*a*.

Likewise, second open loop circuit 5200*b* stores a DC offset voltage that is present in first open loop circuit output signal 5220*a* and amplified by AGC amplifier 5222*b*, and also stores a DC offset voltage due to AGC amplifier 5222*b*. This stored DC offset voltage is subtracted from output signal 5220*a* at summing node 5202*b*. Accordingly, a DC offset voltage is reduced by second open loop circuit 5200*b* as reflected in output signal 5220*b*. The operation of first and second open loop circuits 5200*a* and 5200*b* is described in further detail in section 4.4 above.

FIG. 56 shows a differential open loop circuit pair 5600 that may be implemented in receiver channel 1700 as shown in FIGS. 32A and 32B. Differential open loop circuit pair 5600 may replace, or be used in addition to feedback loops 1900*c* and 1900*d*. Differential open loop circuit pair 5600 includes a first differential open loop circuit 5400*a*, a second differential open loop circuit 5400*b*, and an amplifier 5602 coupled in series. Amplifier 5602 is arranged in a differential amplifier configuration. By cascading multiple stages of differential open loop circuit 5400, greater receiver channel gains may be attained, and DC offset voltages may be better reduced.

First differential open loop circuit 5400*a* receives and amplifies differential receiver channel signal 5604. Second differential open loop circuit 5400*b* receives and amplifies the output of first differential open loop circuit 5400*a*. Amplifier 5602 receives and amplifies the output of second differential open loop circuit 5400*b*, and outputs a differential output signal 5606. Amplifier 5602 is optional.

First and second differential open loop circuits 5400*a* and 5400*b* also receive DC voltage acquire signal 5418, which controls the timing of the storage of the DC offset voltage present in their respective output signals. First differential open loop circuit 5400*a* stores a DC offset voltage that is present in differential receiver channel signal 5604 and amplified by AGC amplifier 5402*a*, and also stores a DC offset voltage due to AGC amplifier 5402*a*. The stored DC offset voltage is subtracted from differential receiver channel signal 5604 at summing nodes 5432*a* and 5434*a*. Accordingly, a DC offset voltage is reduced by first differential open loop circuit 5400*a* as reflected in differential output signal 5422*a*.

Likewise, second differential open loop circuit 5400*b* stores a DC offset voltage that is present in first differential open loop circuit output signal 5422*a* and amplified by AGC amplifier 5402*b*, and also stores a DC offset voltage due to AGC amplifier 5402*b*. This stored DC offset voltage is subtracted from differential output signal 5422*a* at summing nodes 5432*b* and 5434*b*. Accordingly, a DC offset voltage is reduced by second differential open loop circuit 5400*b* as reflected in differential output signal 5422*b*. The operation of first and second open loop circuits 5400*a* and 5400*b* is described in further detail in section 4.4 above.

Note that in the example embodiments shown in FIGS. 55 and 56, during operation of the receiver channel, a change in the gain of a first open loop circuit may cause the DC offset correction performed by the second open loop circuit to become incorrect. For example, a change in the gain of first differential open loop circuit 5400*a* may occur due to a change in the level of AGC signal 5416. This may change the level of differential output signal 5422*a* that is input to second differential open loop circuit 5400*b*. This change may appear as a DC offset to second differential open loop circuit 5400*b*. If this gain change occurs without reacquiring the DC offset voltage in the second open loop circuit, the DC offset due to the gain change may not be removed by the second open loop circuit, and may instead be amplified, increasing the level of unwanted DC offset.

The embodiment of open loop circuit 5200 shown in FIG. 53 may be used to better maintain DC offset correction with varying gain in cascaded stages such as shown in FIGS. 55 and 56. To better maintain DC offset correction with varying gain in cascaded stages, the DC offset correction error in each stage must be reduced. This may be accomplished by increasing the open loop gain for each amplifier.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

4.6.1 Using the Receiver Channel of the Present Invention to Receive a WLAN Signal Packet The section provides examples of how embodiments of the present invention may be used to receive signal frames or packets, and in particular, to receive WLAN signal packets. WLAN signal frames are briefly described. Selection of antenna diversity is described, and the use of variable frequency response according to the present invention is described in relation to receiving a WLAN signal frame. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

As mentioned above, receiver channels 1600 and 1700 may be used to receive WLAN signals. For example, as described as follows, receiver channel 1700 may receive a transmitted WLAN DSSS frame modulated according to DQPSK, and having a short preamble. The short preamble portion of the frame is received first, and includes a 56 bit SYNC field that a receiver uses to acquire the subsequent portions of the signal. In this example, the preamble data rate is 1 Mbps. After receiving the preamble, a portion of the frame called a SFD follows. The SFD field contains information marking the start of the PSDU frame. The PSDU is the data field for the DSSS frame.

FIG. 39 shows an example timeline 3900 for receiving a DSSS frame. Timeline 3900 includes a first time segment 3902, a second time segment 3904, a third time segment 3906, a fourth time segment 3908, a fifth time segment 3910, a sixth time segment 3912, and a seventh time segment 3914. In the example of FIG. 39, the receiver includes two switchable antennas (i.e., dual diversity). During time segments shown in FIG. 39, the receiver switches between the two antennas, labeled antennas A and B, to determine which antenna is best suited to receive the remainder of the frame. In FIG. 39 each of the time segments, except for first time segment 3902, last for 10 μs. In alternative embodiments, there may be more or fewer time segments, and they may last for longer or shorter segments of time. For example, if the preamble was a long preamble (128 bits), there may be the same number of time segments, but they could each last for 20 μs instead of 10 μs. Alternatively, there could be a larger number of time segments.

As shown in FIG. 39, during first time segment 3902, which lasts 2 μs, the transmitted signal ramps up. During first time segment 3902 and second time segment 3904, which lasts 10 μs, the first antenna, antenna A, is selected to receive the transmitted signal. During third time segment 3906, which lasts 10 μs, the second antenna, antenna B, is selected to receive the transmitted signal. During fourth time segment 3908, which lasts 10 μs, antenna A, is again selected to receive the transmitted signal. During fifth time segment 3910, which lasts 10 μs, antenna B is again selected to receive the transmitted signal. During sixth time segment 3912, which lasts 14 μs, the one of antennas A and B, that was chosen to receive the transmitted signal is selected to receive the transmitted signal frame. During seventh time period 3914, the SFD frame portion and remainder of the DSSS frame are received using the chosen antenna.

FIG. 38 shows example waveforms related to the operation of receiver channel 1700 as shown in FIGS. 32A-B in a WLAN environment, according to an embodiment of the present invention. The waveforms of FIG. 38 relate to receiving the preamble of the above described DSSS frame. The waveforms shown in FIG. 38 are output signal 1628, second AGC signal 1706, integrator output signal 1918*c*, and AGC2 3102. FIG. 38 shows integrator output signal 1918*c*, which is related to feedback loop 1900*c*, but it is understood to persons skilled in the relevant art(s) from the teachings herein that integrator output signal 1918*d* is similar, even though not shown.

Receiver channel 1700 as shown in FIGS. 32A and 32B provides for gain, filtering, and DC offset voltage reduction for input differential signal 3210. Output signal 1628, shown in FIG. 32B-3, is the output signal for receiver channel 1700. As can be seen in the embodiment of FIG. 38, output signal 1628 is an approximately 1 MHz information signal.

ACQ2 3102 is shown as a logical high from 0 to about 4 is (FIG. 38 shows ACQ2 3102 transitioning to a logic low at about 4 μs). During this period, ACQ1 3104 is also high (not shown), so feedback loops 1900*c* and 1900*d* are causing receiver channel 1700 to operate with a frequency response similar to first frequency response 3500 shown in FIG. 35 (i.e., fast time constant). First frequency response 3500 shows low gain as DC is approached, so DC offset acquisition by feedback loops 1900*c* and 1900*d* is not as significant during this time period. For example, integrator output signal 1918*c* in FIG. 38, shows the amount of DC offset being fed back to be subtracted from the receiver channel signal at summing node 1906*c*. This time period coincides roughly with first time segment 3902 and a portion of second time segment 3904 shown in FIG. 39.

ACQ2 3102 transitions to a logical low level at around 4 μs, as shown in FIG. 38. ACQ1 3104 remains high (not shown), so feedback loops 1900*c* and 1900*d* are causing receiver channel 1700 to operate with a frequency response similar to second frequency response 3600 shown in FIG. 36 (i.e., medium time constant). Receiver channel 1700 retains this frequency response for most of the remainder of the timeline 3900. Second frequency response 3600 shows moderate gain as DC is approached, so DC offset acquisition by feedback loops 1900*c* and 1900*d* is more significant during this time period. Integrator output signal 1918*c* shown in FIG. 38, operates with improved DC offset accuracy during this time period, due to the medium time constant selection.

While ACQ2 3102 and ACQ1 3104 remain in this state, receiver channel 1700 begins to switch between antennas A and B to determine which is best suited to receive the incoming DSSS frame. During the time period of approximately 4 μs through 14 μs, corresponding to second time segment 3904 shown in FIG. 39, antenna A is selected. During this time period, second AGC signal 1706 ramps up to increase the gain of first AGC amplifier 1908*c*. This increase in gain is reflected in output signal 1628, which increases in amplitude. Second AGC signal 1706 is increased because downstream processing determined that the amplitude of output signal 1628 was initially too low, with antenna A as the input antenna.

The amount of DC offset detected also increases during this time period, due to the increase in gain, as reflected in integrator output signal 1918*c*. During the time period from about 4 μs to about 12 μs, it can be seen that the absolute offset of output signal 1628 from zero volts, which initially is significant (the center of output signal 1628 is at about −0.2 V at 4 μs), is reduced to be essentially equal to zero volts. This decrease is caused by an increase in integrator output signal 1918*c* during this time period, which feeds back the DC offset to be summed with the receiver channel.

During the time period of approximately 14 μs through 24 μs, corresponding to third time period 3906 shown in FIG. 39, antenna B is selected. During this time period, second AGC signal 1706 is decreased to decrease the gain of first AGC amplifier 1908*c*. This decrease in gain is reflected in output signal 1628, which initially increases sharply with the switch to antenna B, and then decreases in amplitude. Second AGC signal 1706 is decreased because downstream processing determined that the amplitude of output signal 1628 was initially too high, with antenna B as the input antenna.

The amount of DC offset detected also decreases during this time period, due to the decrease in gain, as reflected in integrator output signal 1918*c*. During the time period from about 14 μs to about 18 μs, it can be seen that the absolute offset of output signal 1628 initially increases, and then is decreased. The offset of output signal 1628 was initially significant (the center of output signal 1628 is at about 0.5 V at 16 μs), is reduced to be essentially equal to zero volts. This decrease is caused by an decrease in integrator output signal 1918*c* during this time period, which feeds back the DC offset to be summed with the receiver channel.

The process of switching between antenna A and antenna B continues during the next two time periods of 24 μs to 34 μs, and 34 μs to 44 μs. These correspond to fourth and fifth time segments 3908 and 3910 shown in FIG. 39. Similar results are found during these two time periods as occurred during the previous two.

As shown in the following time period, 44 μs to 54 μs, which corresponds to sixth time segment 3912, antenna B is selected to receive the DSSS frame. At the beginning of the next time period, corresponding to seventh time segment 3914 shown in FIG. 39, ACQ2 3104 will transition to a logical low level while ACQ1 3104 remains low (not shown in FIG. 38). In this state, feedback loops 1900*c* and 1900*d* will cause receiver channel 1700 to operate with a frequency response similar to third frequency response 3700 shown in FIG. 37 (i.e., slow time constant). Receiver channel 1700 retains this frequency response for the remainder of the DSSS frame. Third frequency response 3700 shows relatively greater gain as DC is approached, so DC offset acquisition by feedback loops 1900*c* and 1900*d* is even more significant during this time period. In other words, feedback loops 1900*c* and 1900*d* will track the DC offset with greater accuracy, due to the slow time constant selection.

It should be understood that the above examples are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

4.6.2 Embodiments for Generating Control Signals for a Receiver Channel According to the Present Invention This section provides embodiments for generating control signals used to vary the frequency response of a receiver channel, according to embodiments of the present invention. For example, this section relates to circuits and modules used to generate first and second control signals 2312 and 2314 shown in FIG. 23 and generating ACQ1 3104 and ACQ2 3102 shown in FIGS. 31A-32B. Varying the frequency response of a receiver channel may be used to enhance DC offset reduction, as described above. A window comparator for monitoring the level of DC offset is described. A state machine for sequencing the control signals is also described. The state machine may receive the output of the window comparator as an input, among other input signals.

4.6.2.1 Window Comparator for Monitoring DC Offset

A window comparator according to the present invention may be used to monitor a signal in a receiver channel, and determine whether the level of DC offset in the receiver channel is within an acceptable range. FIG. 41 shows a high level view of a window comparator module 4100, according to an embodiment of the present invention. The implementations for window comparator module 4100 below are described herein for illustrative purposes, and are not limiting. In particular, window comparator module 4100 as described in this section can be achieved using any number of structural implementations, including hardware, firmware, software, or any combination thereof.

Window comparator module 4100 receives an I channel input signal 4102 and a Q channel input signal 4104. For example, I channel input signal 4102 and Q channel input signal 4104 may be output signals of respective receiver channels, such as output signal 1628 shown in FIGS. 16 and 17, or may be upstream signals in the respective receiver channels. Window comparator module 4100 determines whether a DC offset in each of I channel input signal 4102 and Q channel input signal 4104 is within an acceptable range. Window comparator module 4100 outputs window compare (WC) signal 4106, which indicates whether both of I channel input signal 4102 and Q channel input signal 4104 are within acceptable ranges.

Window comparator module 4100 as shown in FIG. 41 accepts as input I and Q channel signals, but in alternative embodiments may accept a single channel signal as input, or may accept additional input channel signals.

FIG. 42 shows further detail of an exemplary window comparator module 4100, according to an embodiment of the present invention. Window comparator module 4100 includes a prefilter 4202, a window comparator 4204, a filter 4208, a magnitude comparator 4212, and an AND gate 4216. FIG. 42 shows the components of a window comparator module 4100 used to provide the window compare function for I channel input signal 4102. AND gate 4216 is optional, and may be present when more than one receiver channel signal is input to window comparator module 4100, as in the embodiment shown in FIG. 41.

Prefilter 4202 receives and filters I channel input signal 4102, and outputs a filtered signal 4220. Prefilter 4202 is optional, and is present when I channel input signal 4102 requires filtering. For example, prefilter 4202 may be used to remove data/symbol variance. Prefilter 4202 may be any suitable filter type.

Window comparator 4204 receives filtered signal 4220 and voltage reference 4206. Window comparator 4204 compares the voltage level of filtered signal 4220 to determine whether it is within a voltage range centered upon the voltage value of voltage reference 4206. For example, voltage reference 4206 may be zero when zero is the reference value for the receiver channel, or may be another value such as 1.5 volts, or any other reference voltage value. In one example, the voltage range may be ±50 mV around the value of voltage reference 4206. Window comparator 4204, for example, may include two analog comparators. The first analog comparator may determine whether filtered signal 4220 is above a maximum value of the voltage range, and the second analog comparator may determine whether filtered signal 4220 is below a minimum value of the voltage range. Preferably, window comparator outputs a logical output signal, compare value 4222. For example, compare value 4222 may be a logical high value when the voltage level of filtered signal 4220 is within the voltage range, and a logical low level when the voltage level of filtered signal 4220 is outside the voltage range.

Filter 4208 receives compare value 4222 and clock 4210. Filter 4208 outputs a value providing an indication of how well I channel input signal 4102 is remaining within the voltage range. For example, filter 4208 may provide an output that indicates how many clock cycles of clock 4210 that filter signal 4220 was found to be within the voltage range, during some number of the last clock cycles. In embodiments, filter 4208 may be a finite impulse response (FIR) or an infinite impulse response (IIR) filter. Preferably, filter 4208 outputs a logical output value, filter output 4222, that provides the indication.

FIG. 43 shows an example embodiment for window comparator module 4100, where filter 4208 includes a FIR filter. The FIR filter of filter 4208 includes a plurality of registers 4302a through 4302k (12 registers in this example) that store and shift values of compare value 4222 during each cycle of clock 4210. In the embodiment of FIG. 43, clock 4210 is shown to be an 11 MHz clock, but may instead be of alternative clock cycles rates. Registers 4302a through 4302k provide register output signals 4304a through 4304k, which are the shifted and stored values of compare value 4222. In embodiments, register output signals 4304a through 4304k may be weighted (not shown). Register output signals 4304a through 4304k are summed by summer 4306. Summer 4306 outputs a summed signal 4224, which is essentially a sum of the previous k values of compare value 4222.

As shown in FIG. 43, filter 4208 may receive a WC reset signal 4308 that is used to reset registers 4302a through 4302k to a low logical output value. WC reset signal 4308 may be used at power up, and at other times during the operation of a receiver channel, when it is desired to re-start the monitoring of a receiver channel signal for DC offset.

As shown in FIGS. 42 and 43, magnitude comparator 4212 receives summed signal 4224 and a threshold value 4214. Magnitude comparator 4212 compares the value of summed signal 4224 to threshold value 4214. If summed signal 4224 is greater than threshold value 4214, magnitude comparator 4212 outputs a logical high value on a I channel WC signal 4226, indicating that a DC offset voltage level in I channel input signal 4102 has been determined to be within an acceptable voltage range for enough of the designated length of time. If summed signal 4224 is less than or equal to threshold value 4214, I channel WC signal 4226 is a logical low value, indicating that a DC offset voltage level in I channel input signal 4102 has been determined to be outside of an acceptable voltage range for too much of the designated length of time. In the example of FIG. 43, threshold 4214 is shown in be equal to 7 (out of 12 cycles), but may be equal to other values.

When AND 4216 is present, AND 4216 receives I channel WC signal 4226 and comparable signal for every other channel being monitored by window comparator module 4100. AND 4216 outputs WC signal 4106 that indicates whether all receiver channels have acceptable DC offset values. FIG. 42 shows AND 4216 receiving I channel WC signal 4226 for the I channel, and Q channel WC signal 4218 for the Q channel. When both of I and Q channel WC signals 4226 and 4218 are equal to a high logical value, indicating that both channels are within the acceptable DC offset voltage range, AND 4216 outputs a logical high value on WC signal 4106. When either or both of I and Q channel WC signals 4226 and 4218 are not equal to a logical high value, WC signal 4106 is a logical low value.

FIG. 44 shows example waveforms related to the operation of window comparator 4100, according to an embodiment of the present invention. FIG. 44 shows waveforms for I channel input signal 4102, filtered signal 4220, and I channel WC signal 4226 of FIG. 43.

I channel input signal 4102 is an I channel receiver signal to be monitored, which is shown as a data signal that is triangle modulated with DC offset. Filtered signal 4220 is a filtered version of I channel input signal 4102, where the higher frequency oscillating data information is filtered out, and the lower frequency DC offset voltage remains. For the example of FIG. 44, reference voltage 4206 is equal to 1.65 V, and the desired DC offset voltage range is 1.6 V to 1.7 V (±0.05V around 1.65V).

As shown in I channel WC signal 4226, as filtered signal 4220 moves above 1.7 V, and moves below 1.6 V, for a long enough period of time, I channel WC signal 4226 is a logical low level, indicating an unacceptable amount of DC offset. As long as I channel WC signal 4226 remains between 1.6 V and 1.7 V, I channel WC signal 4226 is a logical high signal, indicating an acceptable amount of DC offset.

It should be understood that the above examples for window comparator module 4100 are provided for illustrative purposes only. The invention is not limited to this embodiment. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

4.6.2.2 State Machine for Generating Control Signals

FIG. 45 shows an example state machine module 4500 for generating and sequencing control signals of the present invention, such as first and second control signals 2312 and 2314 shown in FIG. 23, and ACQ1 3104 and ACQ2 3102 shown in FIGS. 31A-32B. Implementations for state machine 4500 are described herein for illustrative purposes, and are not limiting. In particular, state machine 4500 as described in this section can be achieved using any number of structural implementations, including hardware, firmware, software, or any combination thereof.

State machine module 4500 according to the present invention may receive one or more of a variety of inputs that are used to generate control signals. FIG. 45 shows an embodiment of state machine module 4500 that receives WC signal 4106, a PCM signal 4502, a diversity signal 4504, and a clock signal 4506. State machine 4500 generates ACQ1 3104 and ACQ2 3102. In alternative embodiments, state machine module 4500 may receive fewer or more inputs, and may generate fewer or more outputs than shown in FIG. 45.

In an embodiment, PCM signal 4502 provides one or more bits of data to state machine module 4500 that indicate the mode or state of the communication system that includes the receiver channel. Hence, PCM signal 4502 provides information that indicates whether state machine module 4500 needs to be operating, for example. For instance, in an embodiment, PCM signal 4502 provides a two bit-wide signal to state machine module 4500, in the form of bits PCM1 and PCM2. The communication system modes provided to state machine module 4500 via PCM1 and PCM2 are shown in the table below:

TABLE 2

| Mode | PCM1 | PCM2 |
|---|---|---|
| Off | 0 | 0 |
| Standby | 0 | 1 |
| Transmitting | 1 | 0 |
| Receiving | 1 | 1 |

"Off" mode is where the communication system that includes the receiver channel is not operating. "Standby" mode is where the communication system is in a standby or wait state. "Transmitting" mode is where the communication system is currently in a transmitting state. "Receiving" mode is where the communication system is in a receiving state. In an embodiment, state machine module 4500 only needs to be active when the communication system is in receiving mode. Hence, in such an embodiment, state machine module 4500 will only be active when PCM1 and PCM2 are both equal to a logical high level, as shown in the above table.

In an embodiment, state machine module 4500 receives WC signal 4106, as further described in section 4.6.2.1 above. As described above, WC signal 4106 provides an indication of whether the level of DC offset in the receiver channel is within an acceptable range. WC signal 4106 is a logical high level when DC offset is within an acceptable range, and is a logical low level when DC offset is outside of the acceptable range. Hence, when state machine module 4500 receives a logical low or high level on WC signal 4106, state machine may manipulate ACQ1 3104 and ACQ2 3102 to cause the receiver channel to change the DC offset acquisition mode, as described above in section 4.3.1 in regards to first and section control signals 2312 and 2314.

For example, DC offset in receiver channel 1600 or 1700 may be drifting out of the acceptable voltage range, when the receiver channel is operating according to a slow time constant. When the receiver channel is operating according to a slow time constant, ACQ1 3104 and ACQ2 3102 are set to logical low levels. Hence, the receiver channel will have a frequency response with a relatively lower 3 dB cutoff frequency, and a relatively larger amount of 1/f noise, as shown in FIG. 40, may be passing through the receiver channel. This larger amount of 1/f noise may contribute to the DC offset drifting out of the acceptable range. Hence, when WC signal 4106 transitions to a low logical level, indicating that DC offset is out of an acceptable range, one or both of ACQ 3104 and ACQ2 3102 may be set to logical high levels in order to select a medium or faster time constant, to select a frequency response for the receiver channel with a relatively higher high-pass corner frequency. These time constants will cause the receiver channel to filter out more of the 1/f noise, and possibly allow the receiver channel to better attain and remove the DC offset, to bring the receiver channel DC offset back into an acceptable DC offset voltage range.

Furthermore, although not shown in FIG. 45, state machine module 4500 may output WC reset signal 4308, shown as an input signal to waveform comparator 4100 in FIG. 43. In FIG. 43, WC reset signal 4308 is used to reset filter 4208, which has been keeping track of how long the DC offset has been out of range. State machine module 4500 may toggle WC reset signal 4308 for various reasons, including at power up and during a transition from transmitting to receiving modes.

Diversity signal 4505 is a one or more bit wide signal that at least provides an indication of antenna diversity transitions. For example, a first bit of diversity signal 4505, b[0], may transition from a logic low to a logic high, and vice versa, when a transition from one diversity antenna to another occurs. Diversity signal 4505 may provide further bits of information that indicate the type of diversity antenna search being performed.

Clock signal 4506 is received to control the timing for state machine module 4500. Clock signal 4506 may be the same as or different from clock 4210.

FIG. 46 shows a state diagram 4600, according to an exemplary embodiment of the present invention. State diagram 4600 may be implemented in state machine module 4500 to generate signals ACQ1 3104, ACQ2 3102, and WC reset signal 4308. State diagram 4600 includes states 4602, 4604, 4606, 4608, 4610, and 4612. State diagram 4600 is particularly applicable to a WLAN environment, and is applicable to both short preamble (e.g., 56 μS) and long preamble (e.g., 128 μS) data frames, for example. Time periods are provided below for the length of time that some of the states are active.

In a WLAN environment, the time periods, and corresponding levels of ACQ1 3104 and ACQ2 3102, correspond to the time periods shown in FIG. 39 above.

In the embodiment of state diagram 4600, clock signal 4506 is used to control timing. PCM 4502 is a two bit-wide input signal formed from PCM1, PCM2, as further described above. ACQ1 3104 and ACQ2 3102 form a two-bit wide signal named ACQ in state diagram 4600, in the bit order of ACQ1 3104, ACQ2 3102. A signal TOUT is shown in state diagram 4600. When TOUT is shown equal to zero during a transition from a first state to a second state, this indicates that a time period defined by the first state has expired. In the embodiment of state diagram 4600, WC reset signal 4308 may or may not be generated, although it is shown as generated in state diagram 4600.

Diversity signal 4504 provides an antenna diversity transition indication to state diagram 4600, through b[0], as described above. A logical high or low level of signal b[0] each indicate a respective diversity antenna setting. A signal B[0] is used to represent an updated version of b[0]. The signals b[0] and B[0] are compared to detect a diversity antenna transition. When b[0] is not equal to B[0], a diversity antenna transition has just occurred. When they are equal, a diversity transition has not occurred. When a diversity antenna has finally been selected for the WLAN data frame, b[0] will become dormant.

The states of state diagram 4600 are further described as follows.

State 4602 shown in FIG. 4600 is the active state upon power-up/reset. After system power up, the active state transitions from state 4602 to state 4604 via a transition 4614. PCM is set to 00, which signifies an "off" mode for state machine module 4500. Also, at system power up, B[0] equals b[0].

When active, state 4604 is an off state for state machine module 4500. State 4606 is remained in when the communication system remains in a mode other than a receiving mode, such as "off", "standby", or "transmitting." As long as PCM does not change to 11 (receiving mode), a transition 4616 transitions from state 4604 back to state 4604. When PCM transitions to be equal to 11, (receiving mode), the active state transitions from state 4604 to state 4606 via a transition 4618.

In state 4606, ACQ is equal to 11. In other words, ACQ1 3104 and ACQ2 3102 are selecting a short time constant for DC offset acquisition. Furthermore, WC reset signal 4308 may be set equal to 1 for a clock cycle during the transition to state 4606, to reset the DC offset acquisition registers of window comparator module 4100. In an embodiment, state 4606 is active for a first time period of 6 μS. After the first time period in state 4606 expires, the active state transitions from state 4606 to state 4608 via a transition 4620.

In state 4608, ACQ is equal to 10. In other words, ACQ1 3104 and ACQ2 3102 are selecting a medium time constant for DC offset acquisition. In an embodiment, state 4608 is active for a second time period of 12 μS. If a diversity transition occurs while state 4608 is active, (i.e., B[0] is not equal to b[0]) a transition 4622 transitions from state 4608 back to state 4608. State 4608 is thus again active for a new second time period of 12 μS. However, after second time period in state 4608 expires, the active state transitions from state 4608 to state 4610 via a transition 4624.

In state 4610, ACQ is equal to 10. In other words, ACQ1 3104 and ACQ2 3102 are continuing to select a medium time constant for DC offset acquisition. In an embodiment, state 4610 is active for a third time period of 9 μS. If a diversity transition occurs while state 4610 is active (i.e., B[0] is not equal to b[0]), the active state transitions from state 4610 back to state 4608 via a transition 4626. After third time period in state 4610 expires, the active state transitions from state 4610 to state 4612 via a transition 4628.

In state 4612, ACQ is equal to 00. In other words, ACQ1 3104 and ACQ2 3102 select a long time constant for DC offset acquisition. In an embodiment, WC reset signal 4308 is equal to 0. State 4608 is active as long as a receiving mode is maintained, and a diversity transition does not occur. If a diversity transition occurs while state 4612 is active (i.e., B[0] is not equal to b[0]), the active state transitions from state 4612 back to state 4608 via a transition 4630. When PCM is set to be equal to a setting other than 11, the active state transitions from state 4612 to state 4604, via a transition 4632.

FIG. 47 shows a state diagram 4700, according to an exemplary alternative embodiment of the present invention. State diagram 4700 may be implemented in state machine module 4500 to generate signals ACQ1 3104, ACQ2 3102, and WC reset signal 4308. State diagram 4700 includes states 4702, 4704, 4706, 4708, 4710, 4712, 4734, 4736, and 4746. State diagram 4700 is similar to state diagram 4600 in using PCM and b[0]/B[0] as input signals, while additionally using WC signal 4106 (shown in FIG. 41) as an input signal. In state diagram 4700, when WC signal 4106 is received, changes to states of ACQ may occur, such that changes in the DC offset voltage acquisition time constant are made. For example, a change in WC signal 4106 may cause a change from a medium time constant to a long time constant, and vice versa. State diagram 4700 is particularly applicable to a WLAN environment, and is applicable to both short preamble (e.g., 56 μS) and long preamble (e.g., 128 μS) data frames, for example.

It should be understood that the above state machine and state diagram examples are provided for illustrative purposes only. The invention is not limited to these embodiments. Alternate embodiments (including equivalents, extensions, variations, deviations, etc., of the embodiments described herein) will be apparent to persons skilled in the relevant art(s) based on the teachings contained herein. For example, diversity signal 4505 may provide further bits of information that control the operation of state machine 4500. Diversity signal 4505 may instruct state machine 4500 to cause changes in the DC offset voltage acquisition time constant at each diversity antenna transition. For example, a change to a short time constant may be inserted at a diversity antenna transition, for a duration of 1 μS, 2 μS, or 4 μS, for instance. In another example, a setting for diversity signal 4505 may instruct state machine 4500 to use WC signal 4106 to control the DC offset voltage acquisition time constant, such that changes between short, medium, and long time constants may occur as necessary. These changes may be implemented by the addition/modification of states in state diagrams 4600 and/or 4700. The invention is intended and adapted to include such alternate embodiments.

5. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An apparatus for gain control in a communication channel, comprising:
  a multiplier that receives a first automatic gain control (AGC) signal and outputs a second AGC signal, wherein said multiplier includes an operational amplifier, a first resistor and a second resistor arranged in a non-inverting amplifier configuration;
  a first AGC amplifier that receives said first AGC signal, wherein said first AGC signal is directly coupled to said first AGC amplifier; and
  a second AGC amplifier that receives said second AGC signal.

2. The apparatus of claim 1, wherein the communication channel is a wireless local area network (WLAN) receiver channel.

3. The apparatus of claim 1, wherein said second AGC amplifier is located upstream in a receiver channel from the first AGC amplifier.

4. The apparatus of claim 1, wherein said second AGC amplifier receives a radio frequency signal and said first AGC amplifier receives a baseband signal.

5. The apparatus of claim 1, wherein said second AGC amplifier receives a radio frequency signal and said first AGC amplifier receives an intermediate frequency signal.

6. The apparatus of claim 1, wherein said multiplier multiplies said first AGC signal by an integer amount to generate said second AGC signal.

7. The apparatus of claim 1, wherein said multiplier multiplies said first AGC signal by an integer amount, and said integer amount is equal to 2.

8. A method for gain control in a communication channel, comprising the steps of:
  (1) multiplying a first automatic gain control (AGC) signal by an amount to generate a second AGC signal, wherein said multiplying step is performed using an operational amplifier, a first resistor and a second resistor arranged in a non-inverting amplifier configuration;
  (2) providing the first AGC signal to a first AGC amplifier, wherein the first AGC signal is directly coupled to the first AGC amplifier; and
  (3) providing the second AGC signal to a second AGC amplifier.

9. The method of claim 8, wherein the communication channel is a wireless local area network (WLAN) receiver channel.

10. The method of claim 8, further comprising the step of:
  positioning the second AGC amplifier upstream in a receiver channel from the first AGC amplifier.

11. The method of claim 8, further comprising the steps of:
  receiving a radio frequency receiver channel signal with the second AGC amplifier; and
  receiving a baseband receiver channel signal with the first AGC amplifier.

12. The method of claim 8, further comprising the steps of:
  receiving a radio frequency receiver channel signal with the second AGC amplifier; and
  receiving an intermediate frequency receiver channel signal with the first AGC amplifier.

13. The method of claim 8, wherein step (1) comprises the step of:
  multiplying the first AGC signal by an integer amount to generate the second AGC signal.

14. The method of claim 8, wherein step (1) comprises the step of:
  multiplying the first AGC signal by 2 to generate the second AGC signal.

15. The method of claim 8, wherein step (1) comprises the step of:
  amplifying the first AGC signal to generate the second AGC signal.

* * * * *

UNITED STATES PATENT AND TRADEMARK OFFICE
CERTIFICATE OF CORRECTION

PATENT NO. : 7,653,158 B2 Page 1 of 1
APPLICATION NO. : 11/356419
DATED : January 26, 2010
INVENTOR(S) : Rawlins et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 127 days.

Signed and Sealed this

Twenty-third Day of November, 2010

David J. Kappos
*Director of the United States Patent and Trademark Office*